(12) United States Patent
Kuwabara et al.

(10) Patent No.: US 11,581,493 B2
(45) Date of Patent: Feb. 14, 2023

(54) ORGANIC ELECTROLUMINESCENCE DEVICE AND CONDENSED POLYCYCLIC COMPOUND FOR ORGANIC ELECTROLUMINESCENCE DEVICE

(71) Applicant: Samsung Display Co., Ltd., Yongin-si (KR)

(72) Inventors: Hirokazu Kuwabara, Yokohama (JP); Ryuhei Furue, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 314 days.

(21) Appl. No.: 16/998,943

(22) Filed: Aug. 20, 2020

(65) Prior Publication Data

US 2021/0175431 A1    Jun. 10, 2021

(30) Foreign Application Priority Data

Dec. 4, 2019    (KR) .................. 10-2019-0159949

(51) Int. Cl.
  *H01L 51/00* (2006.01)
  *C07F 5/02* (2006.01)
  *H01L 51/50* (2006.01)
(52) U.S. Cl.
  CPC ...... *H01L 51/0061* (2013.01); *H01L 51/0072* (2013.01); *H01L 51/5012* (2013.01)
(58) Field of Classification Search
  None
  See application file for complete search history.

(56) References Cited

U.S. PATENT DOCUMENTS

2019/0058124 A1    2/2019    Hatakeyama et al.
2019/0181350 A1    6/2019    Hatakeyama et al.
(Continued)

FOREIGN PATENT DOCUMENTS

CN            107417715 A    12/2017
KR    10-2018-0108604 A    10/2018
(Continued)

*Primary Examiner* — Clinton A Brooks
(74) *Attorney, Agent, or Firm* — Lewis Roca Rothgerber Christie LLP

(57) ABSTRACT

An organic electroluminescence device (OLED) of an embodiment includes a first electrode, a second electrode, and an emission layer disposed between the first electrode and the second electrode The emission layer may include a condensed polycyclic compound represented by Formula 1, which is connected to two or three substituents represented by Formula 2, and the OLED may exhibit excellent luminous efficiency:

[Formula 1]

$$\begin{array}{c} W_1{=}W_2 \\ W_6 \qquad W_3 \\ W_5{-}W_4 \end{array}$$

[Formula 2]

20 Claims, 2 Drawing Sheets

(56) References Cited

U.S. PATENT DOCUMENTS

2020/0066997 A1 2/2020 Huang et al.
2020/0091431 A1 3/2020 Hatakeyama et al.

FOREIGN PATENT DOCUMENTS

| KR | 10-2019-0069295 A | 6/2019 |
| WO | WO 2016/152544 A1 | 9/2016 |
| WO | WO 2017/138526 A1 | 8/2017 |
| WO | WO 2018/095397 A1 | 5/2018 |
| WO | WO 2018/212169 A1 | 11/2018 |

ORGANIC ELECTROLUMINESCENCE DEVICE AND CONDENSED POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0159949, filed on Dec. 4, 2019, the entire content of which is hereby incorporated by reference.

BACKGROUND

1. Field

One or more aspects of embodiments of the present disclosure relate to an organic electroluminescence device and a condensed polycyclic compound used therein.

2. Description of the Related Art

Organic electroluminescence displays are recently being developed as image display devices. An organic electroluminescence display is a so-called self-luminescent display, in which holes and electrons respectively injected from a first electrode and a second electrode recombine in an emission layer to generate excitons, and the generated excitons fall to the ground state and emit light to implement display.

In the application of an organic electroluminescence device to a display device, there is a demand for an organic electroluminescence device having a low driving voltage, high luminous efficiency, and/or a long service life, and there is a demand for new materials capable of stably attaining such characteristics for an organic electroluminescence device.

Recently, in order to implement a long service life organic electroluminescence device, materials utilizing triplet state energy phosphorescence emission, delayed fluorescence triplet-triplet annihilation (TTA) (in which singlet excitons are generated by collision of triplet excitons), and/or thermally activated delayed fluorescence (TADF) are being developed.

SUMMARY

One or more aspects of embodiments of the present disclosure are directed toward an organic electroluminescence device exhibiting excellent luminous efficiency.

One or more aspects of embodiments of the present disclosure are directed toward a condensed polycyclic compound as a material for an organic electroluminescence device having excellent luminous efficiency.

One or more example embodiments of the present disclosure provide an organic electroluminescence device including a first electrode, a second electrode facing the first electrode, and an emission layer disposed between the first electrode and the second electrode, wherein the first electrode and the second electrode may each independently include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), indium (In), zinc (Zn), tin (Sn), a compound thereof, a mixture thereof, or a oxide thereof, wherein the emission layer includes a condensed polycyclic compound represented by Formula 1:

[Formula 1]

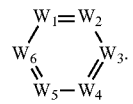

In Formula 1, $W_1$ to $W_6$ may each independently be $CR_1$ or a carbon atom connected to a substituent represented by Formula 2; $R_1$ may be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent ring to form a ring; at least two adjacent positions among $W_1$ to $W_6$ may be carbon atoms connected to the substituent represented by Formula 2, and a total of two or three of the substituent represented by Formula 2 may be connected to Formula 1

[Formula 2]

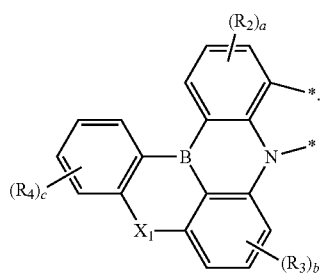

In Formula 2, $X_1$ may be O, S, or $NAr_1$; $Ar_1$ may be a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring; $R_2$ to $R_4$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring; a and b may each independently be an integer of 0 to 3; and c may be an integer of 0 to 4.

In an embodiment, the condensed polycyclic compound represented by Formula 1 may be represented by at least one of Formula 1-1 to Formula 1-5:

[Formula 1-1]

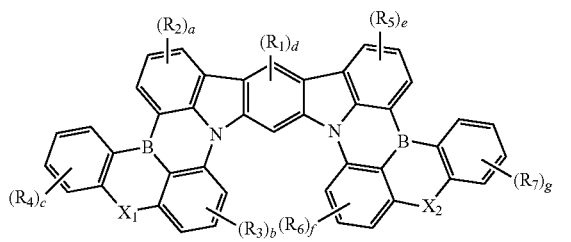

[Formula 1-2]

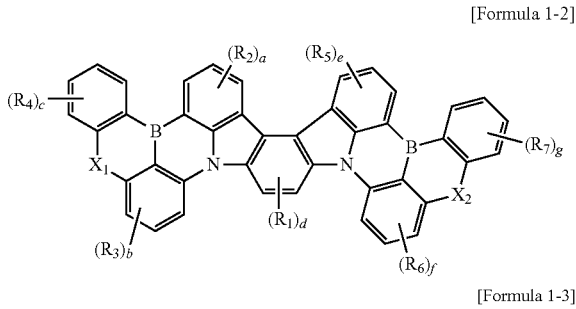

[Formula 1-3]

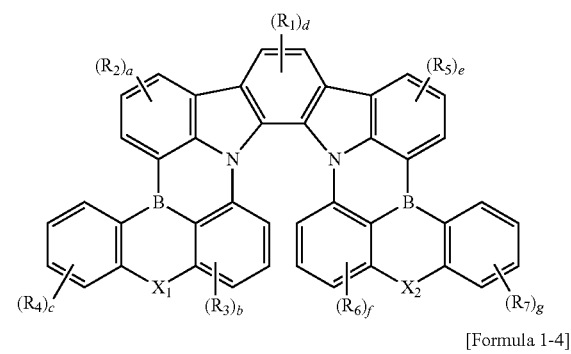

[Formula 1-4]

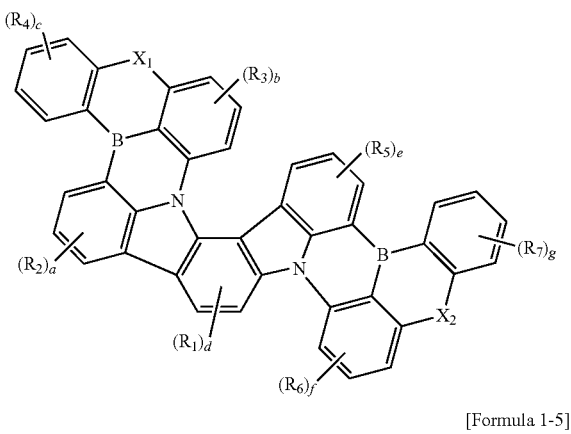

[Formula 1-5]

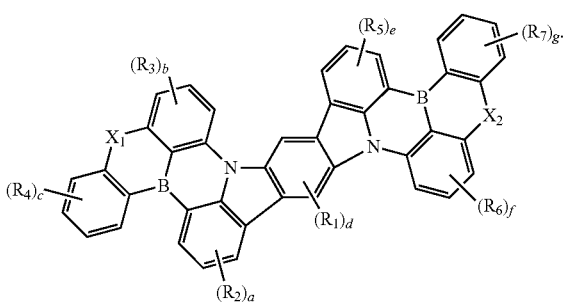

In Formula 1-1 to Formula 1-5, $X_2$ may be O, S, or $NAr_2$; $Ar_2$ may be a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring; $R_5$ to $R_7$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring; e and f may each independently be an integer of 0 to 3; g may be an integer of 0 to 4; and $X_1$, $Ar_1$, $R_1$ to $R_4$, and a to d may each independently be the same as defined in Formula 1.

In an embodiment, in Formula 1-1 to Formula 1-5, $X_1$ and $X_2$ may be the same (e.g., each be the same kind of atom).

In an embodiment, the two or three substituents represented by Formula 2 that are substituted to Formula 1 may be the same (e.g., may each have the same structure and atoms).

In an embodiment, the condensed polycyclic compound represented by Formula 1 may be represented by Formula 3:

[Formula 3]

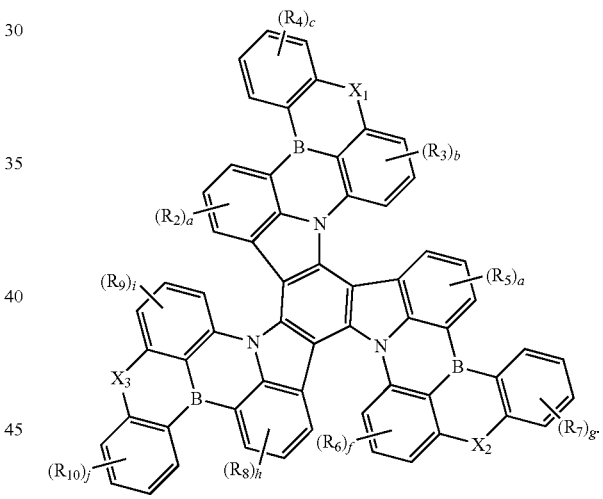

In Formula 3, $X_2$ may be O, S, or $NAr_2$; $X_3$ may be O, S, or $NAr_3$; $Ar_2$ and $Ar_3$ may each independently be a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring; $R_5$ to $R_{10}$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent ring to form a ring; e and f may each independently be an integer of 0 to 3; g may be an integer of 0 to 4; h and i may each independently be an integer of 0 to 3; j may be an integer of 0 to 4; and $X_1$, $Ar_1$, $R_1$ to $R_4$, and a to c may each independently be the same as defined in Formula 1.

In an embodiment, $X_1$, $X_2$, and $X_3$ may all be the same (e.g., the same kind of atom).

In an embodiment, $R_{10}$ may be a hydrogen atom or a substituted or unsubstituted methyl group.

In an embodiment, $R_2$ to $R_4$ may each independently be a hydrogen atom, a substituted or unsubstituted methyl group, a substituted or unsubstituted t-butyl group, a substituted or unsubstituted diphenylamine group, a substituted or unsubstituted phenyl group, or a substituted or unsubstituted carbazole group.

In an embodiment, the emission layer may be to emit a delayed fluorescence.

In an embodiment, the emission layer may include a first compound and a second compound, and the first compound may include the condensed polycyclic compound.

In an embodiment, the emission layer may be to emit light in a blue wavelength region.

In an embodiment, the condensed polycyclic compound represented by Formula 1 may be at least one of the compounds represented by Compound Group 1:

[Compound Group 1]

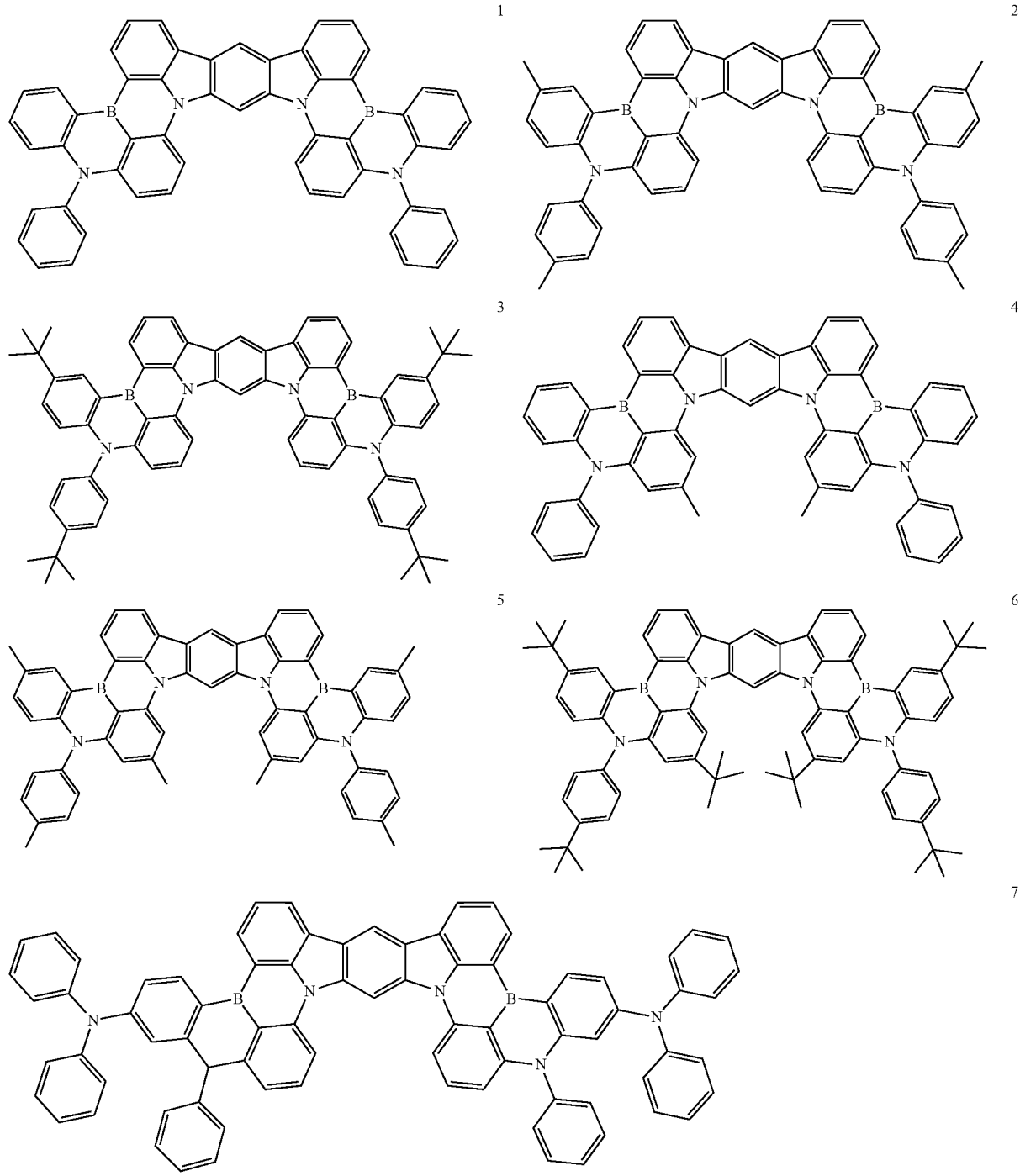

-continued
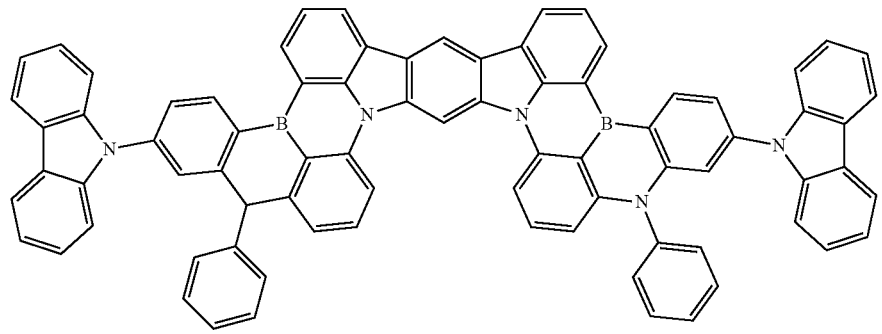
8
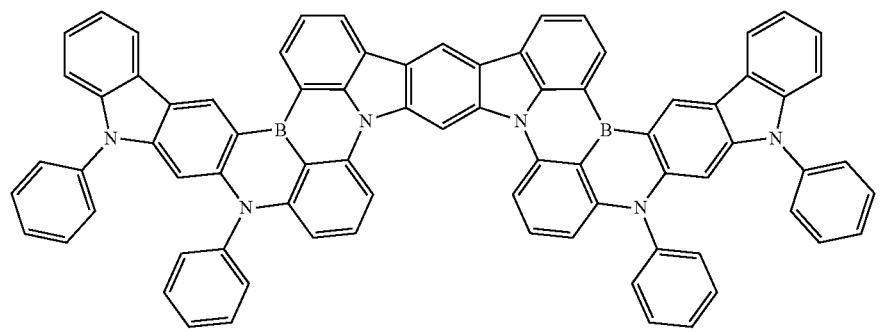
9
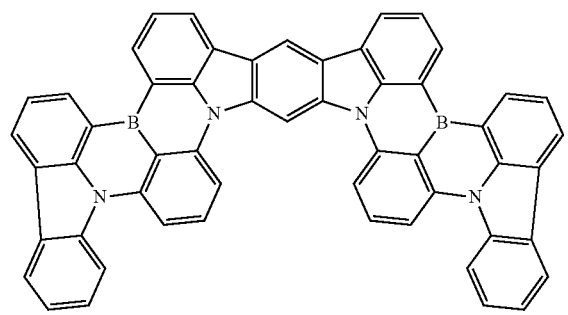
10
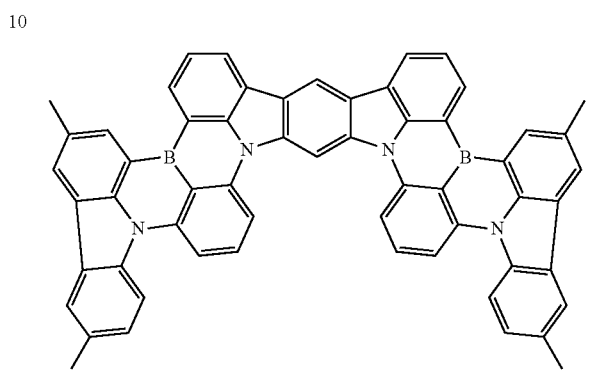
11
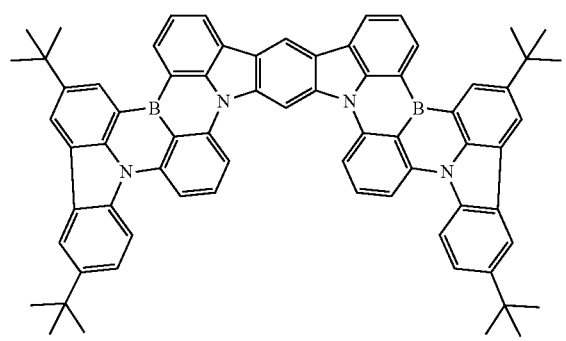
12
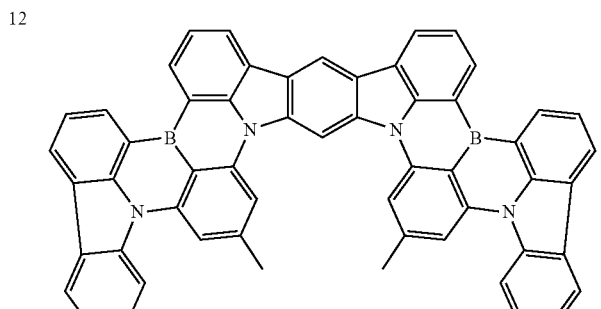
13

14
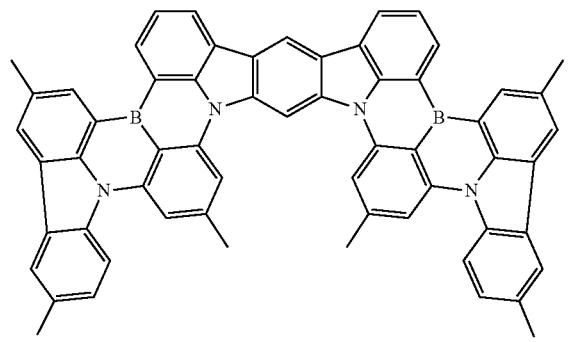
15
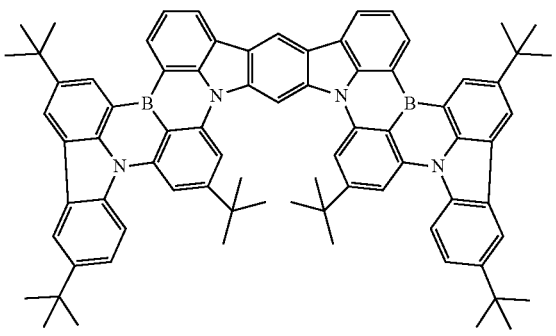
16
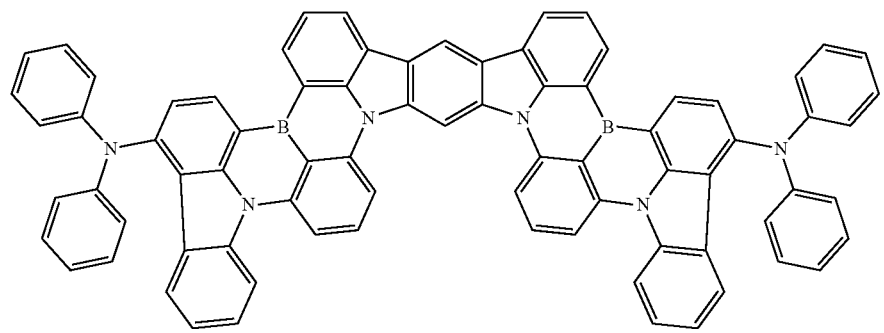
17
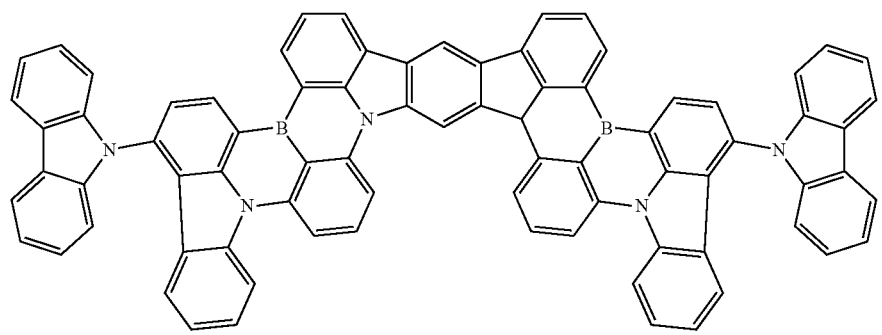
18
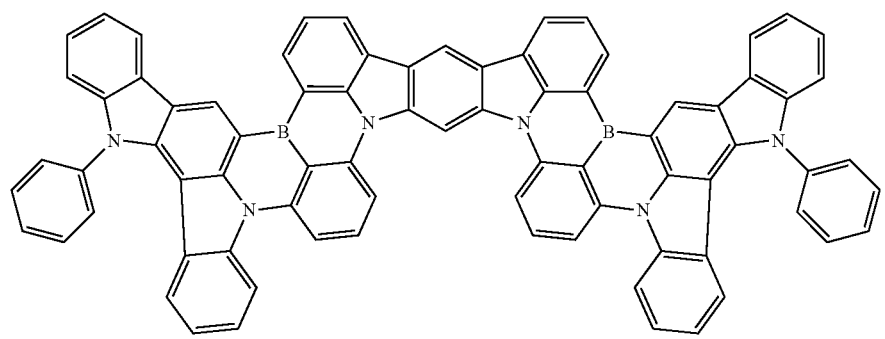

-continued
19
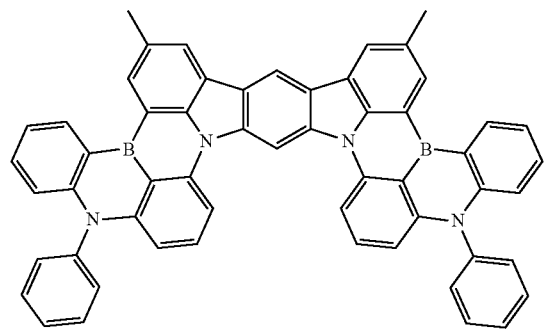
20
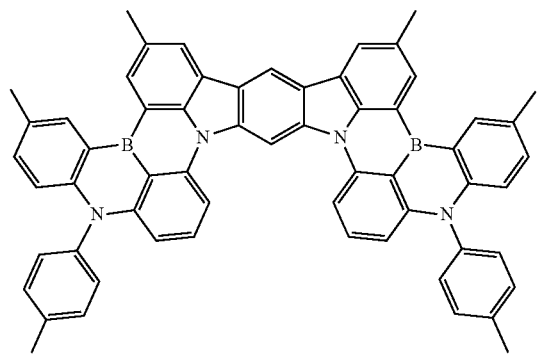
21
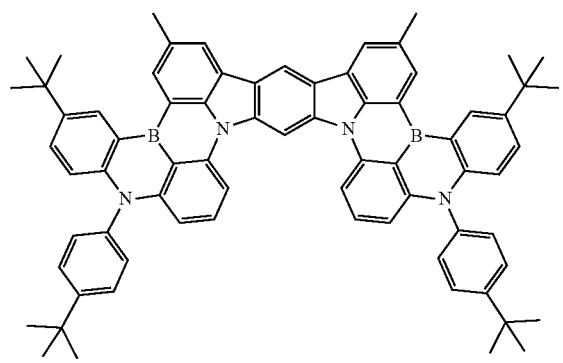
22
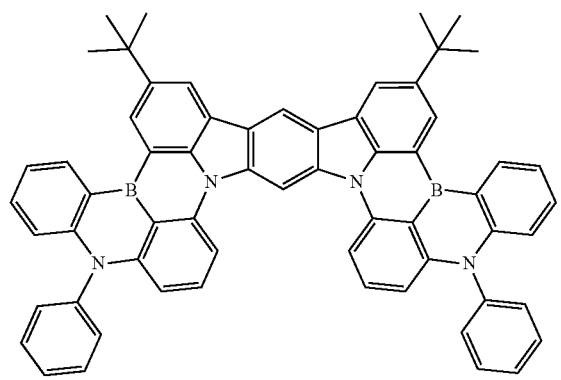
23
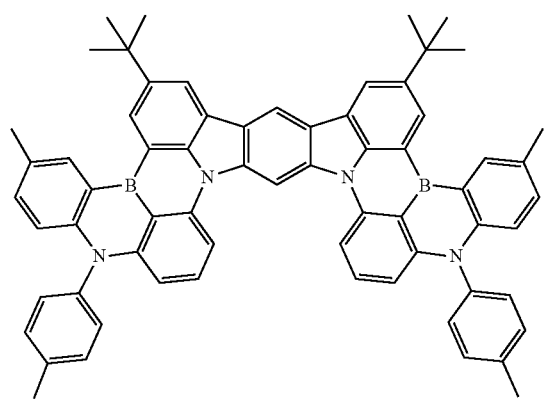
24
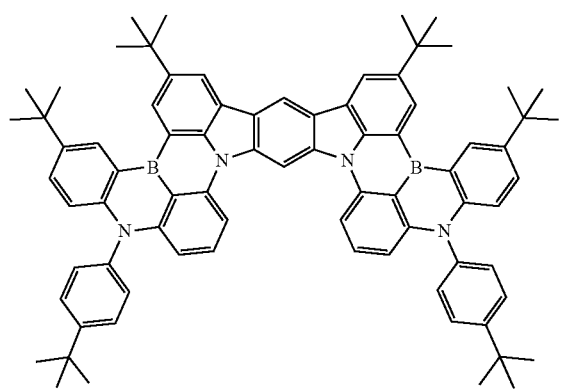
25
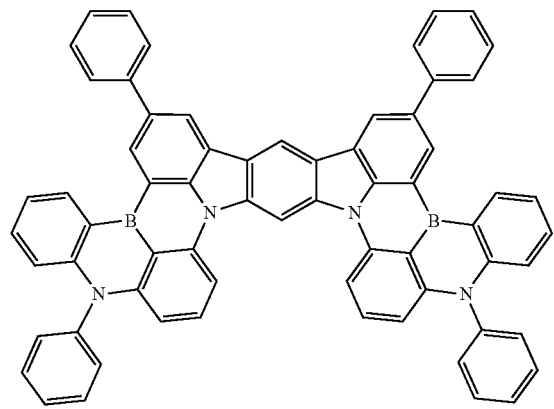
26
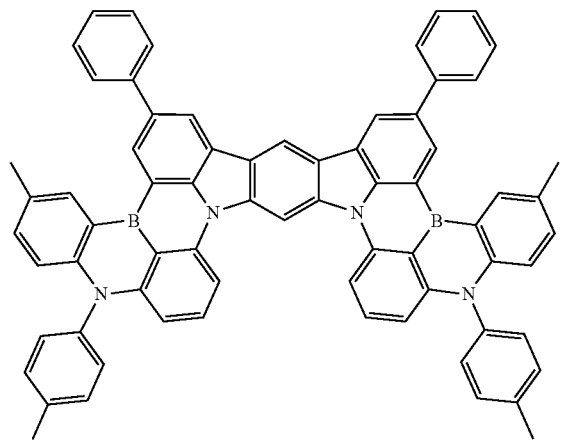

-continued
27
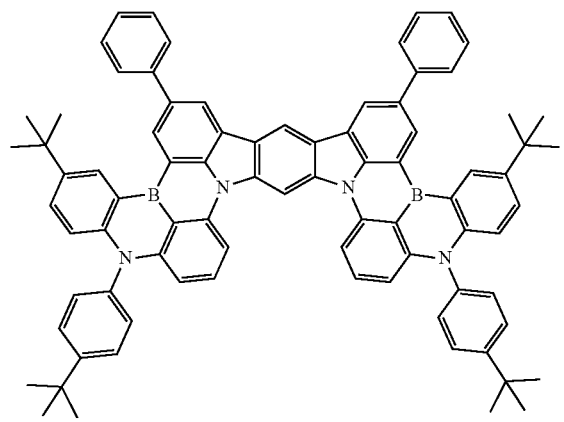
28
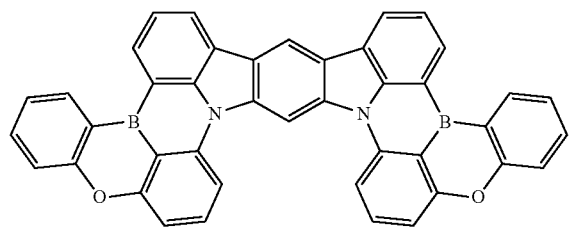
29
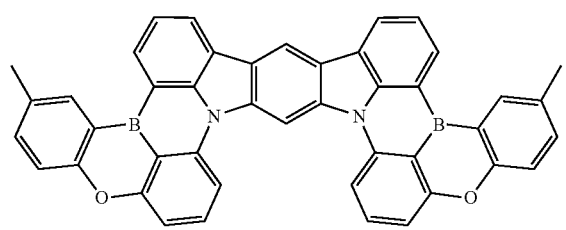
30
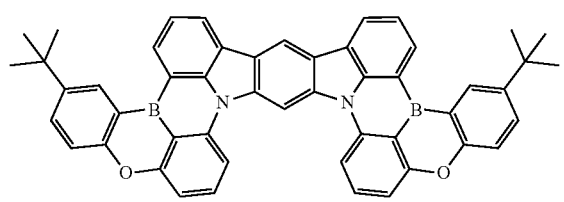
31
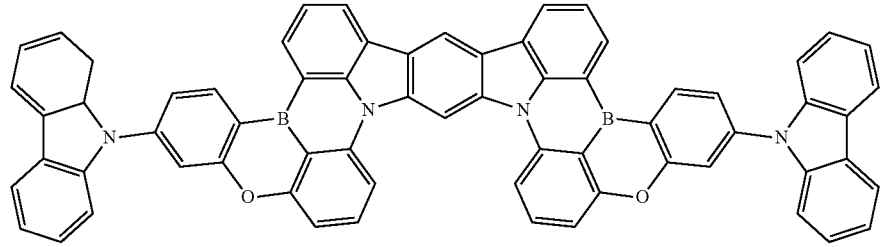
32
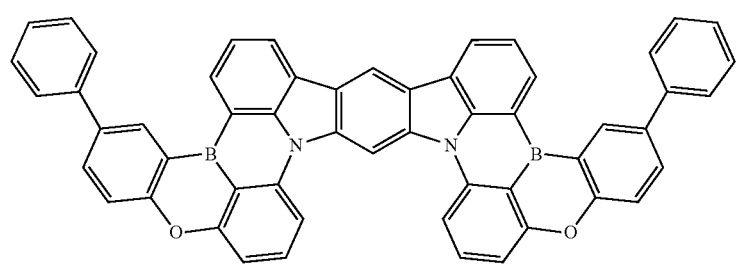
33
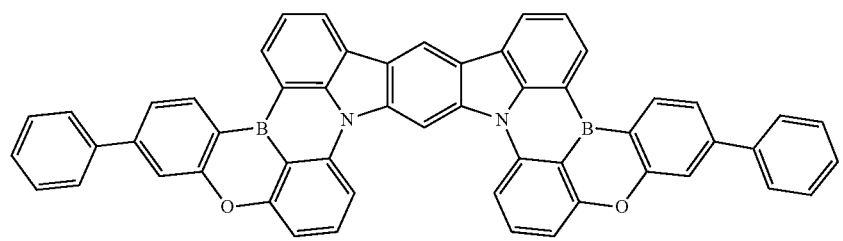

34
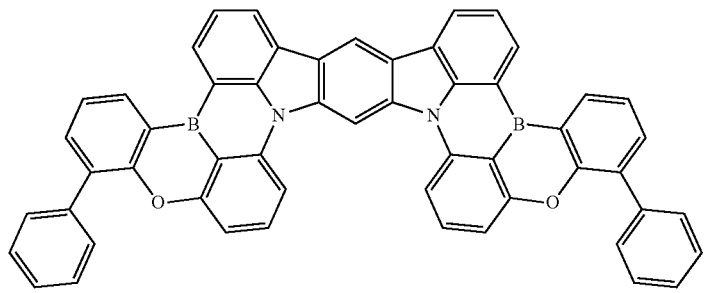
35
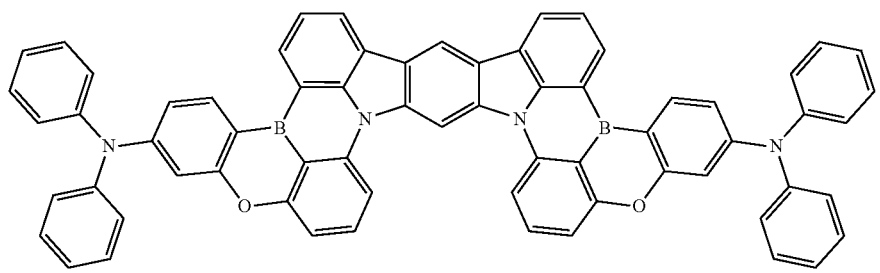
36
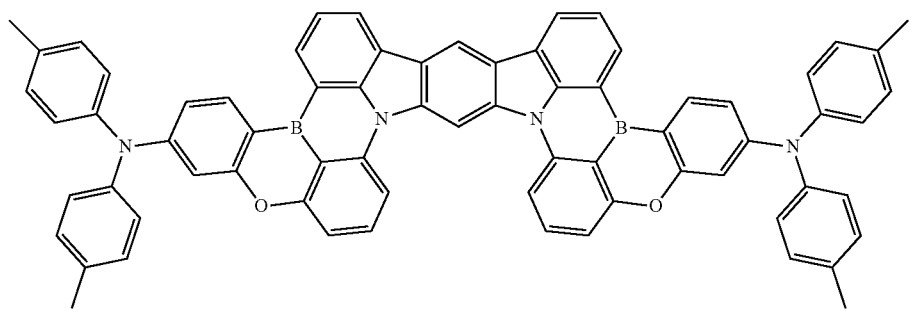
37
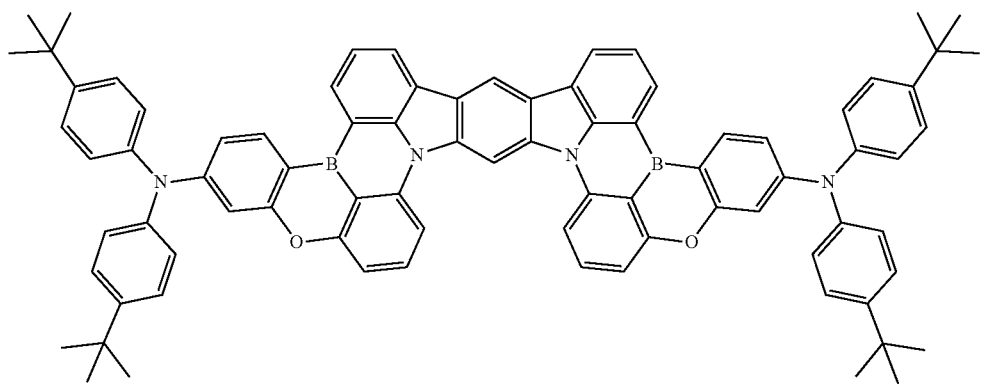
38
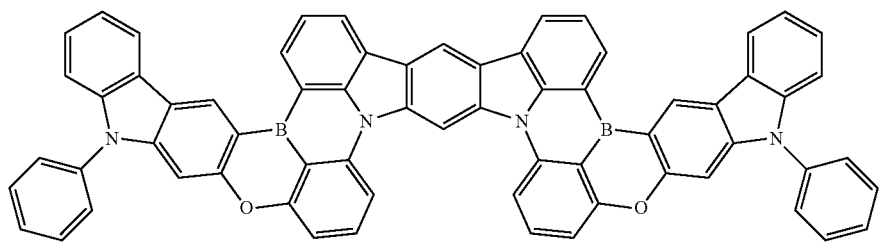

-continued
39
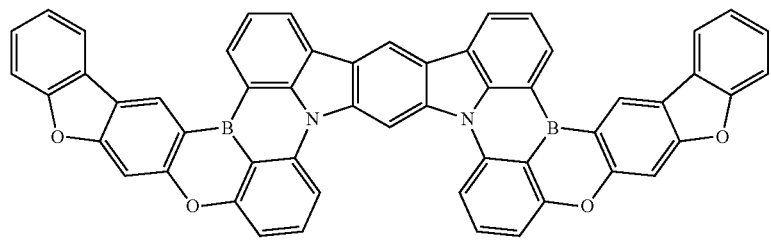
40
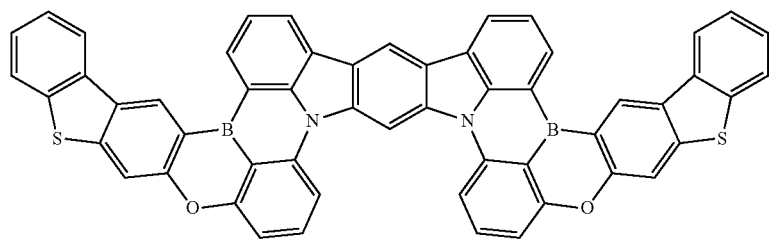
41 42
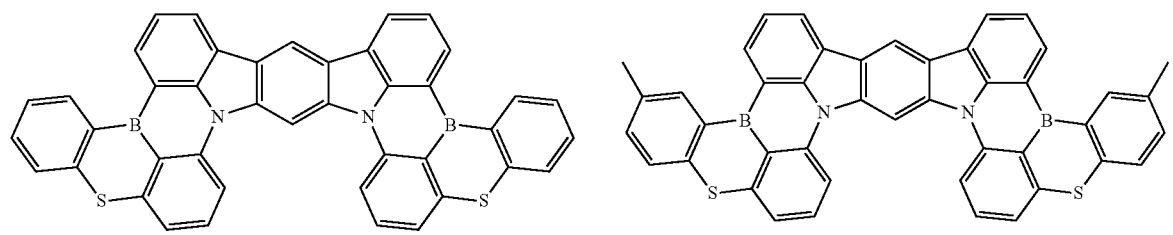
43
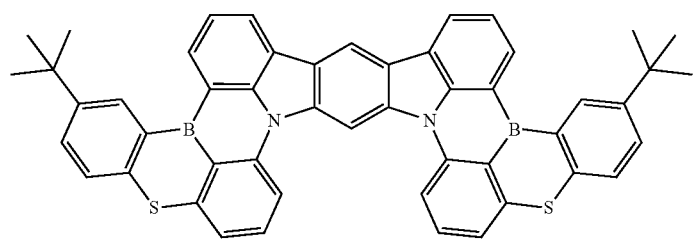
44
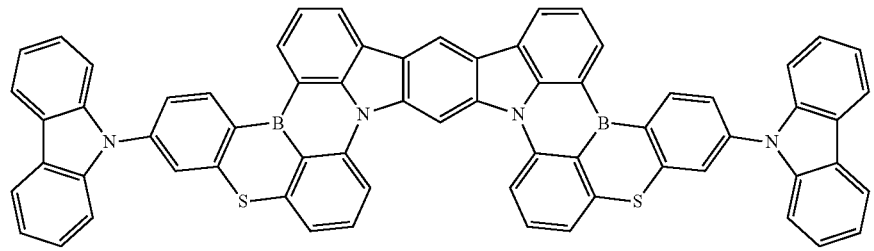
45
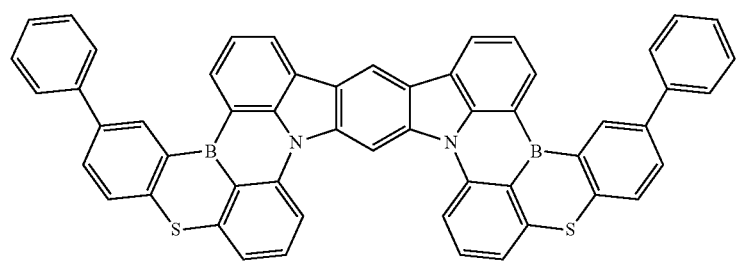

-continued
46
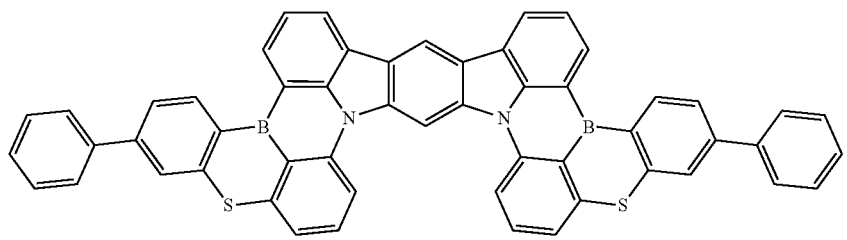
47
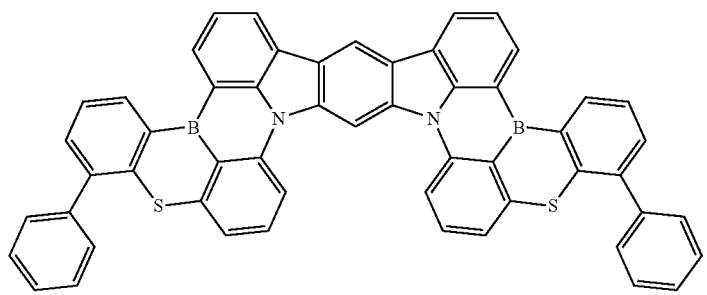
48
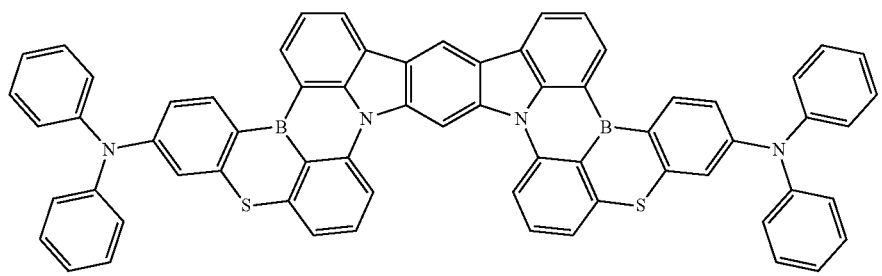
49
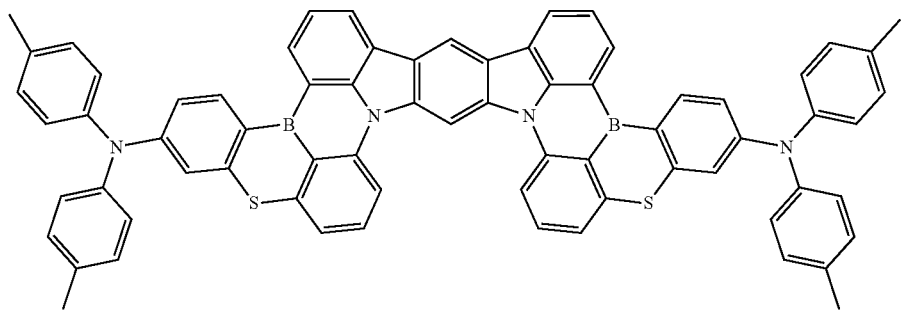
50
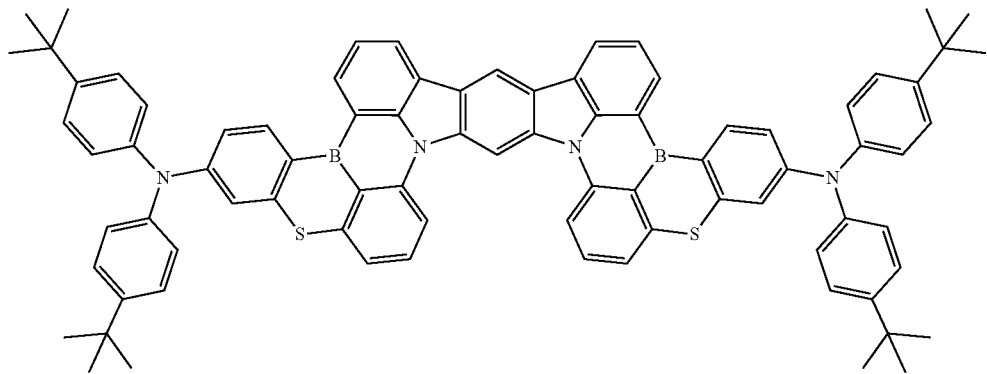

-continued
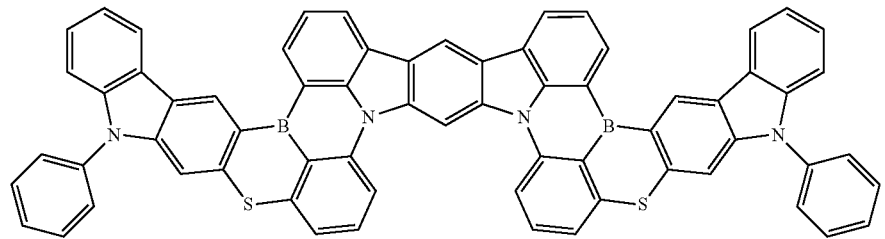
51
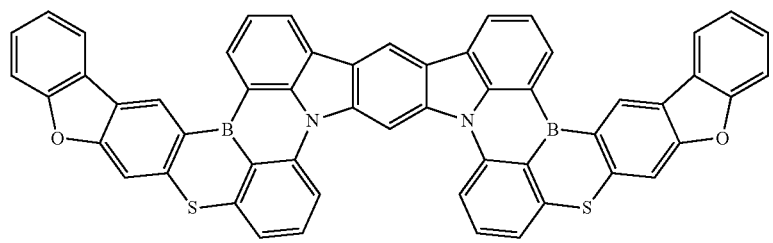
52
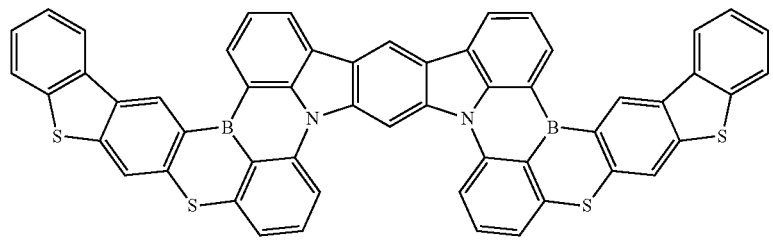
53
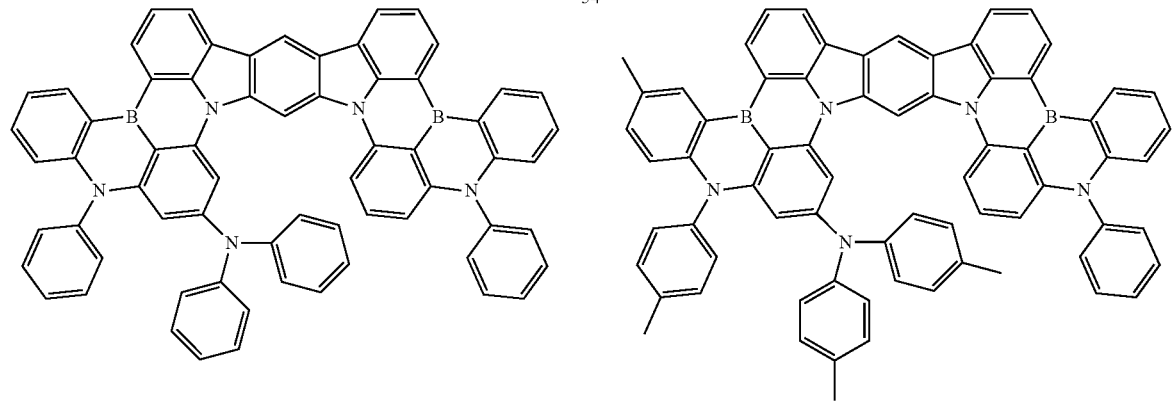
54 55
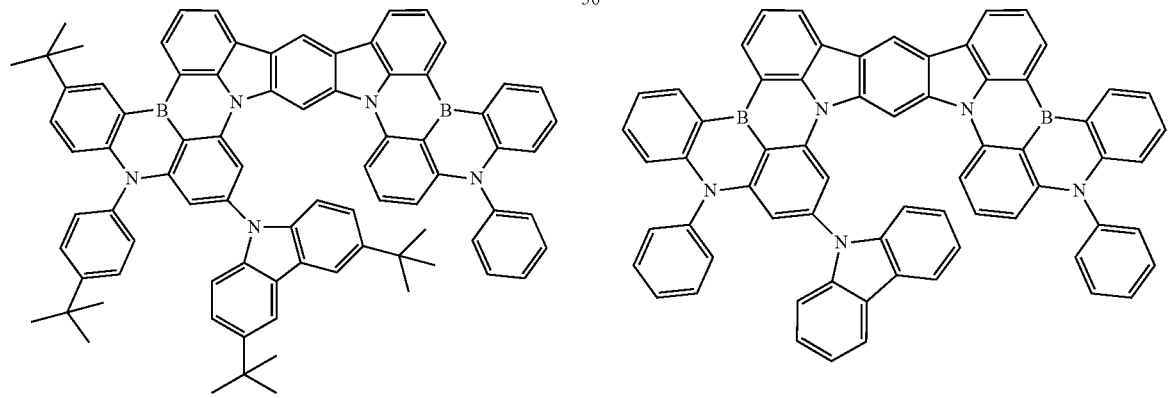
56 57

-continued
58
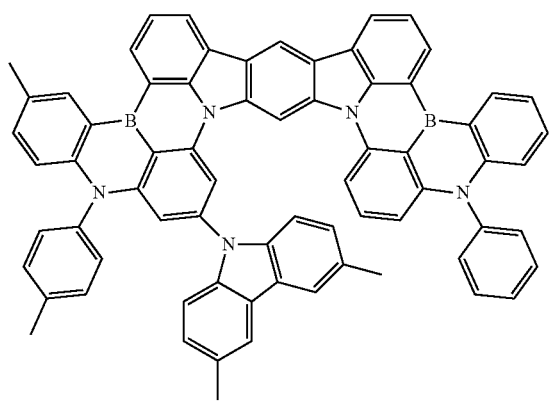
59
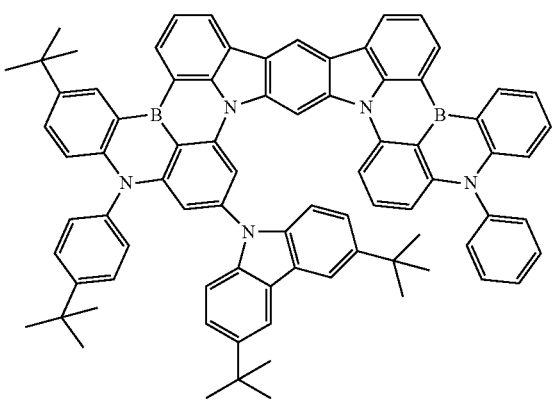
60
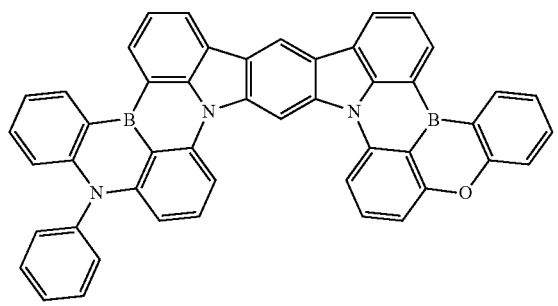
61
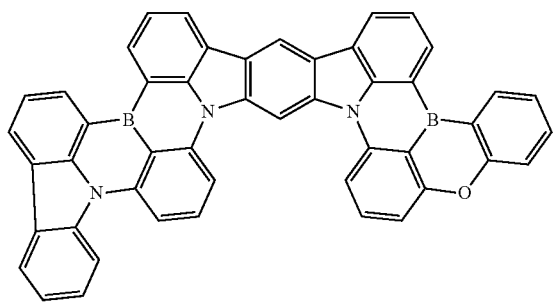
62
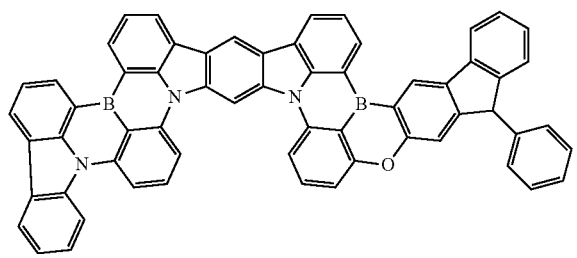
63
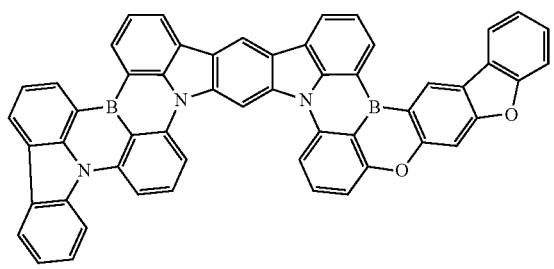
64
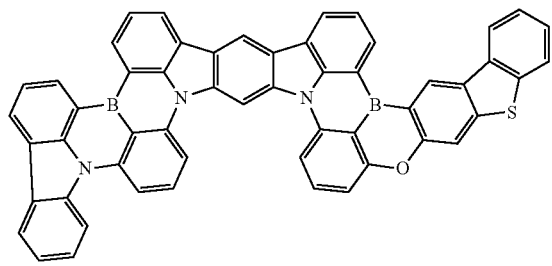
65
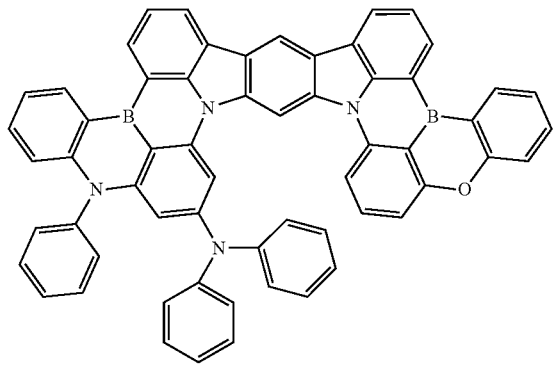

-continued
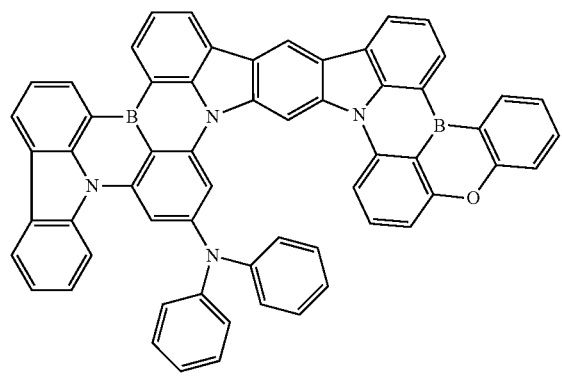
66
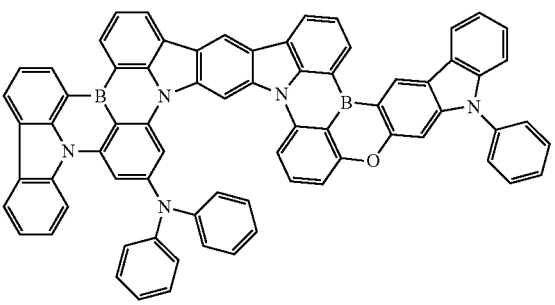
67
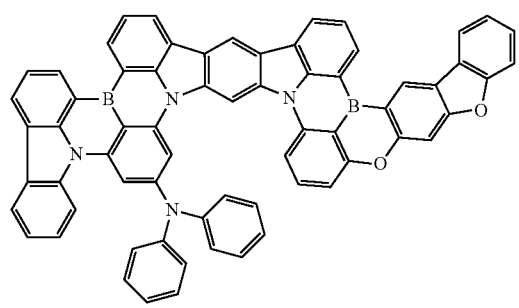
68
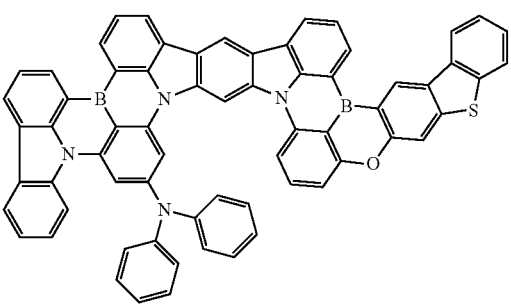
69
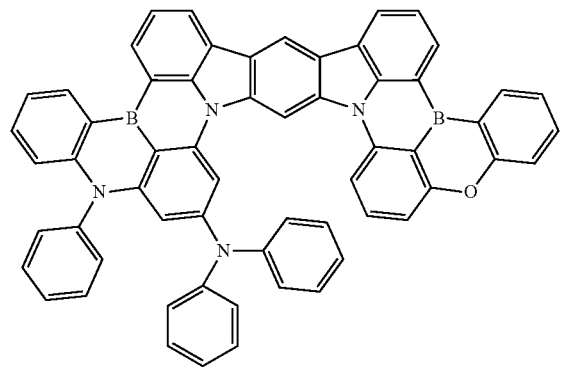
70
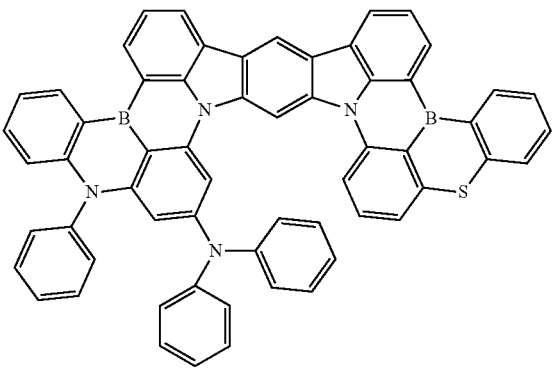
71
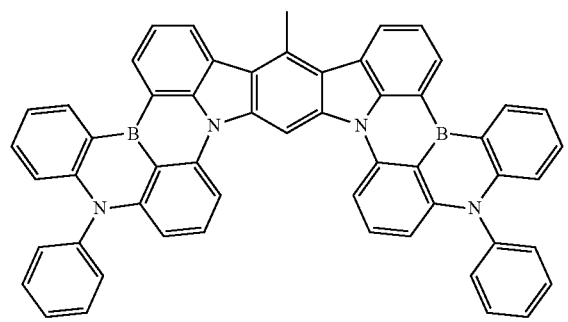
72
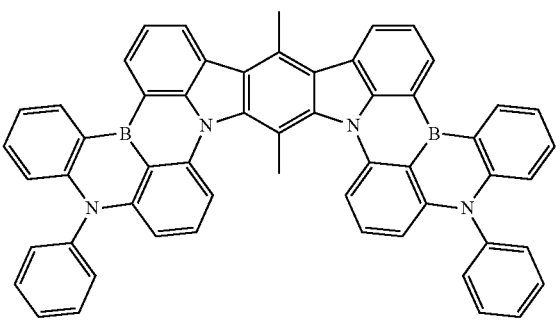
73

-continued
74
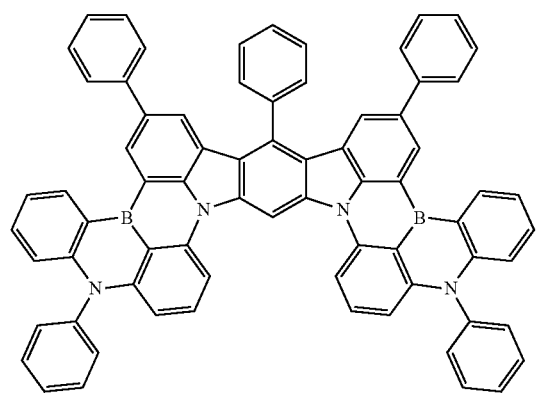
75
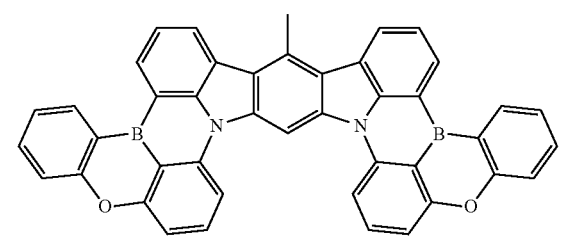
76
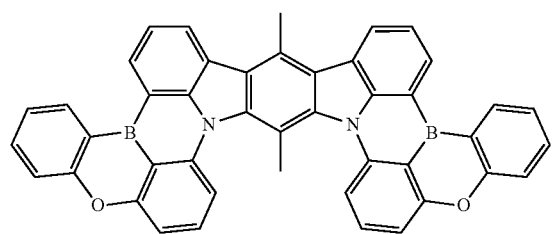
77
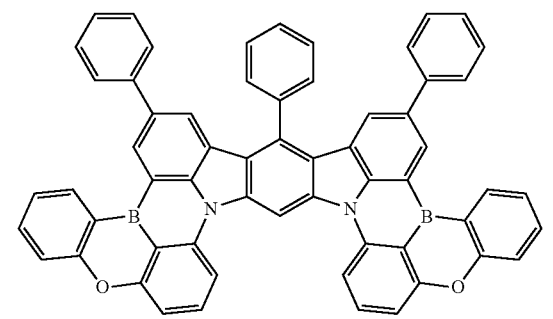
78
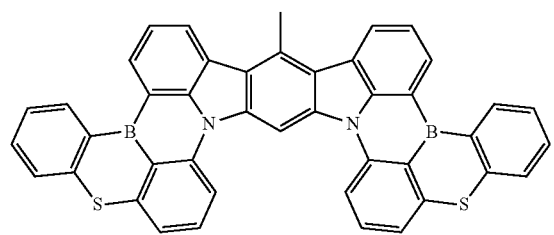
79
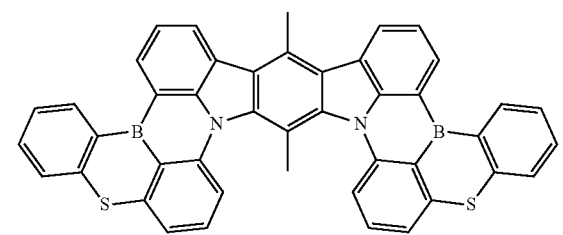
80
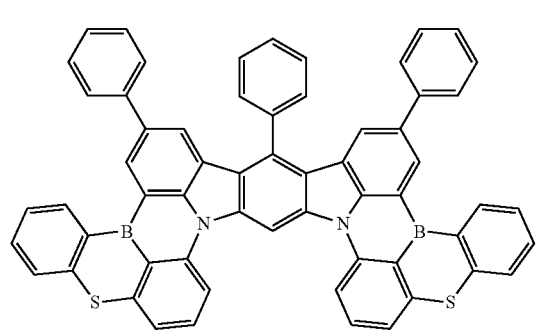
81
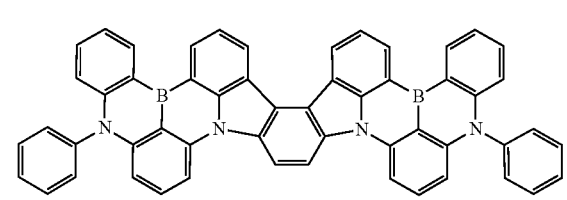
82
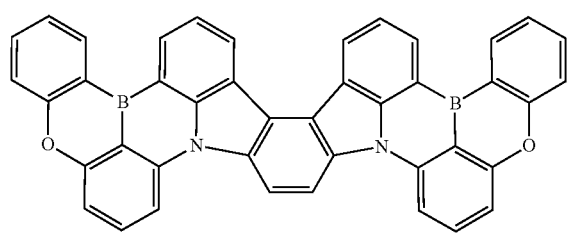
83
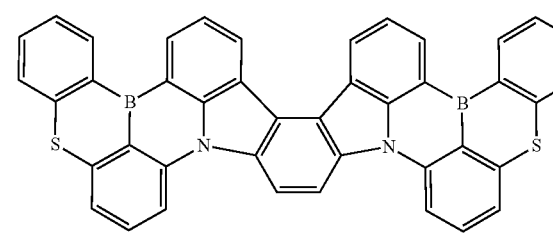

-continued
84
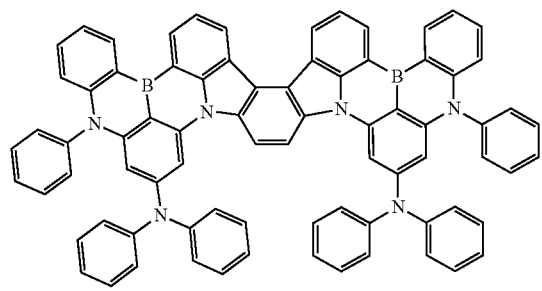
85
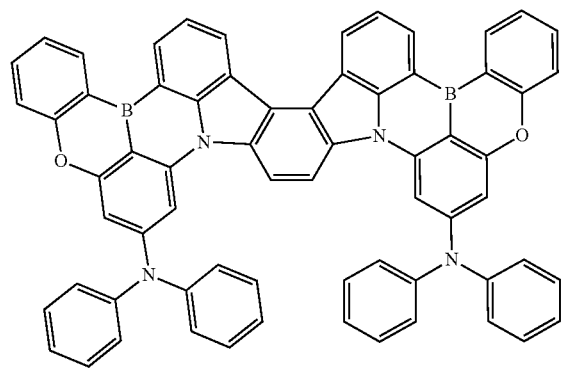
86
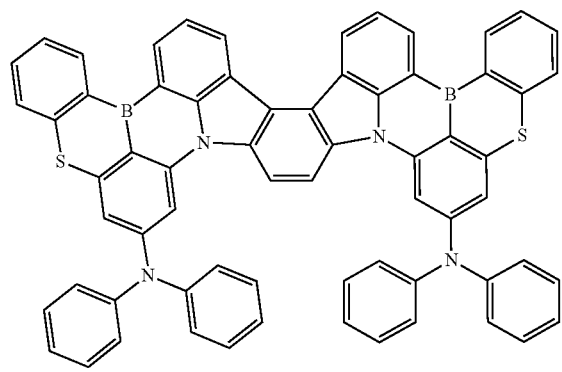
87
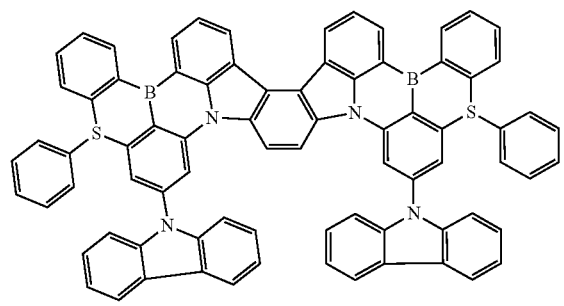
88
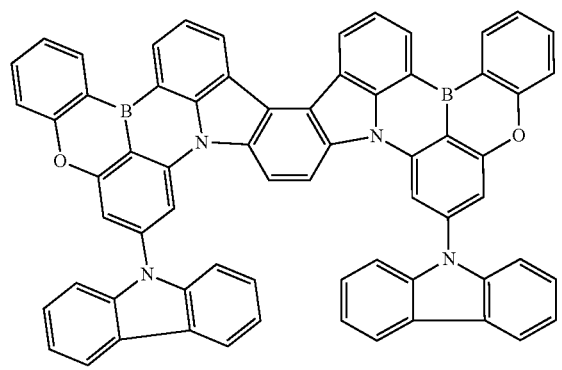
89
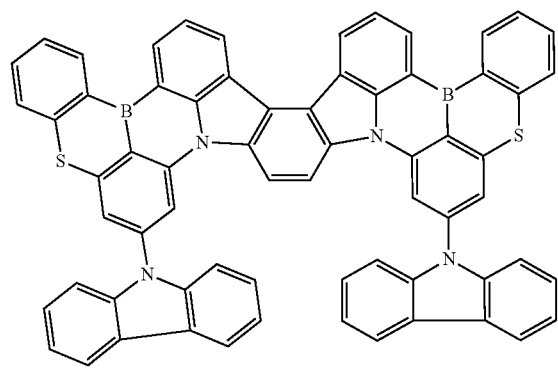
90
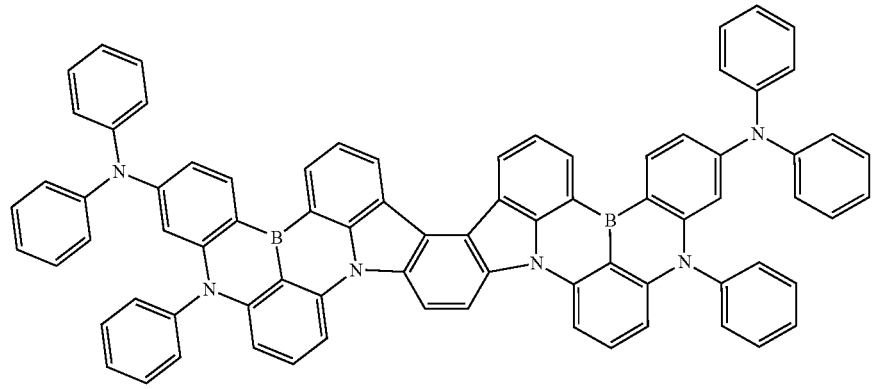

-continued
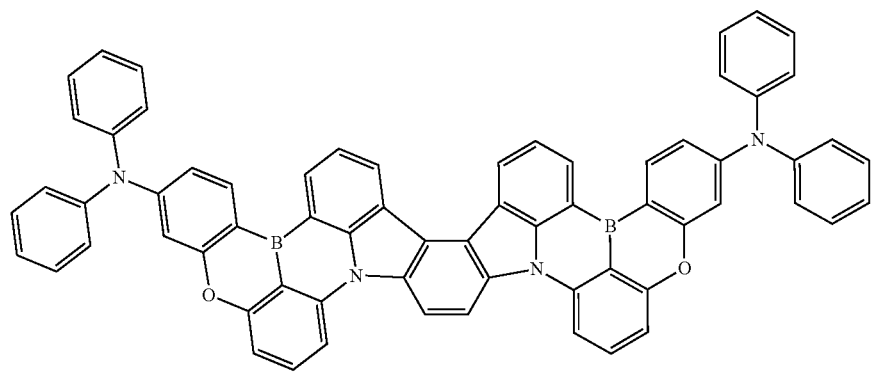
91
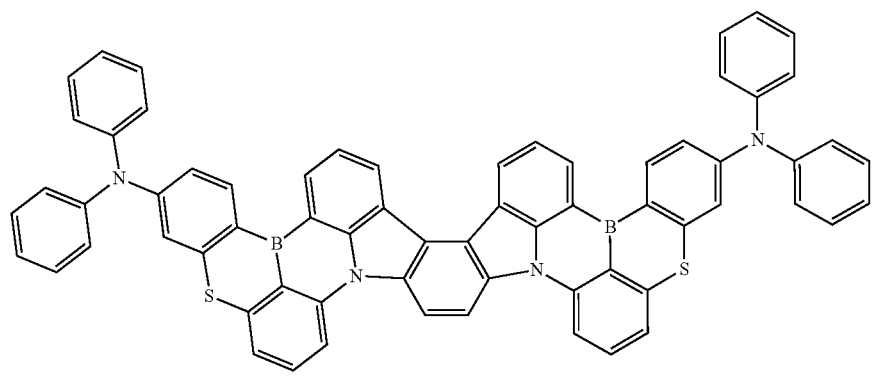
92
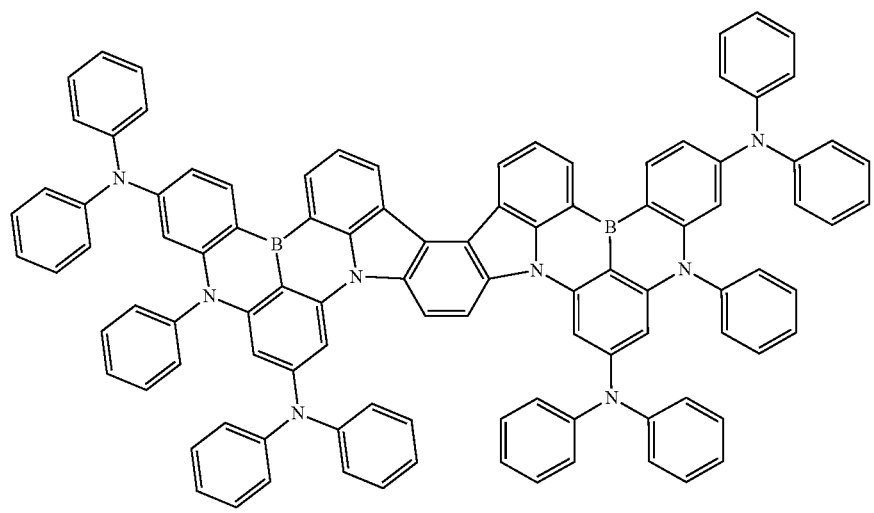
93

94
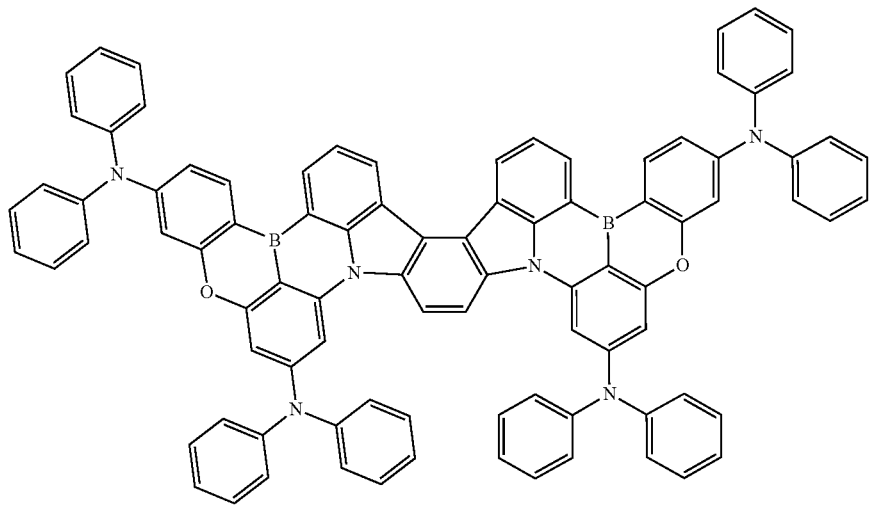
95
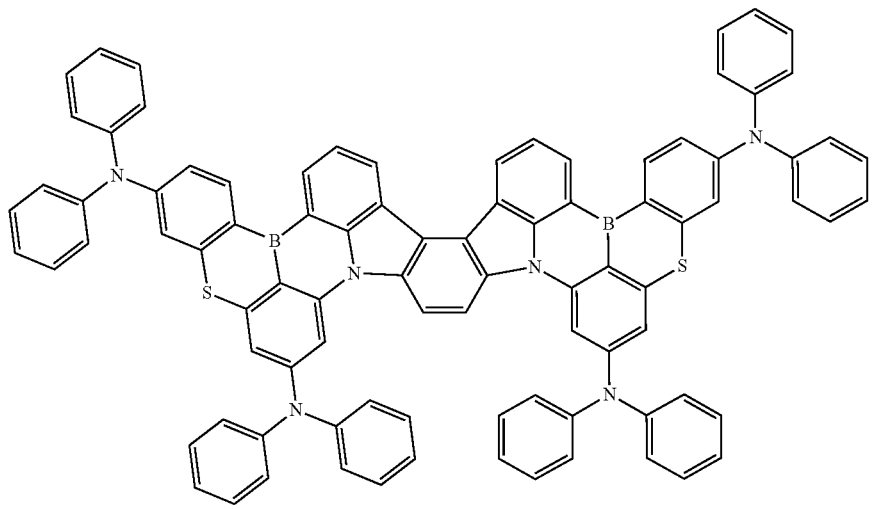
96
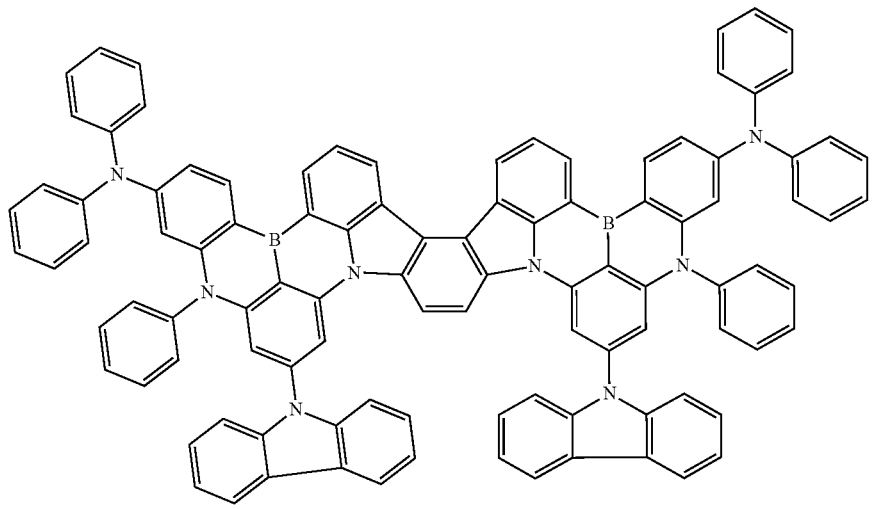

97
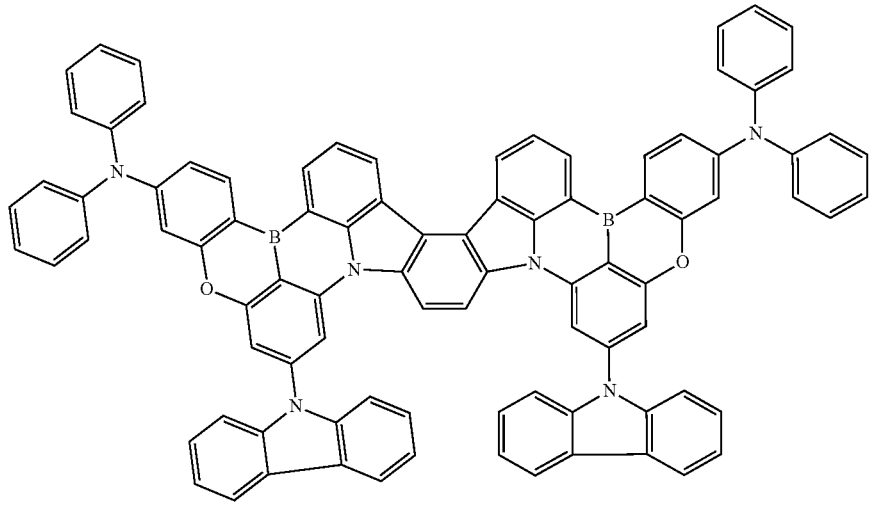
98
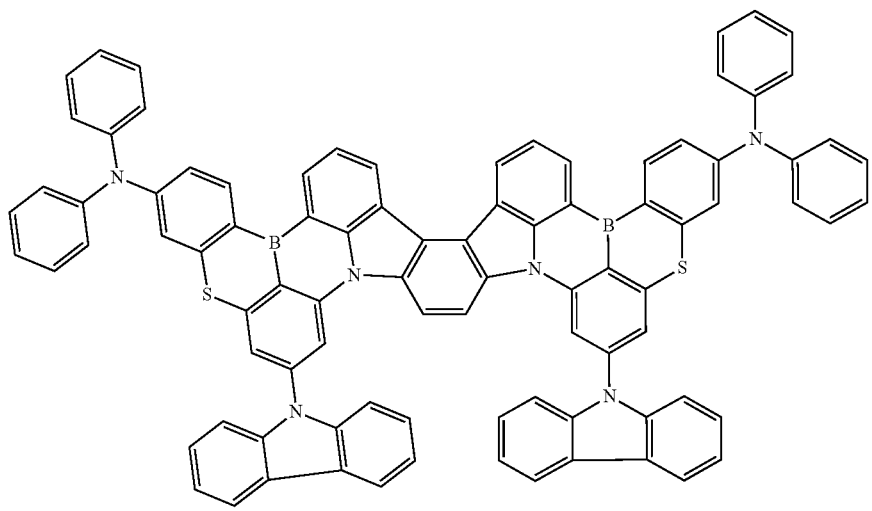
99
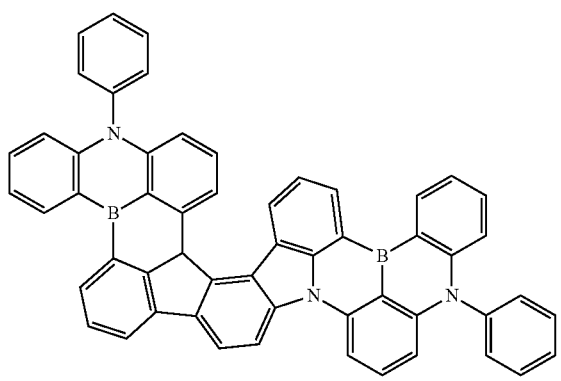
100
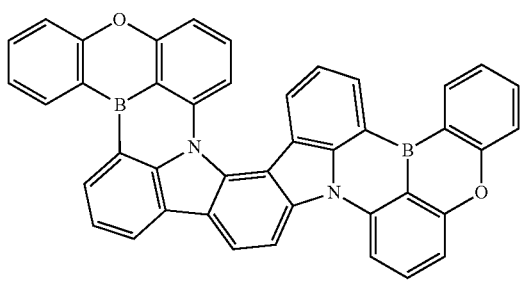

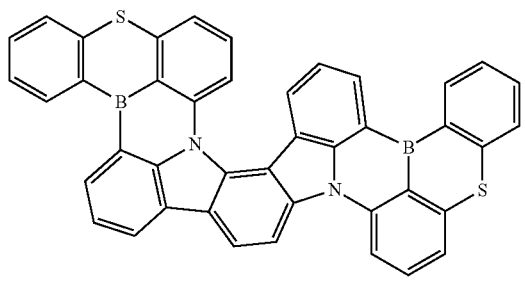
101
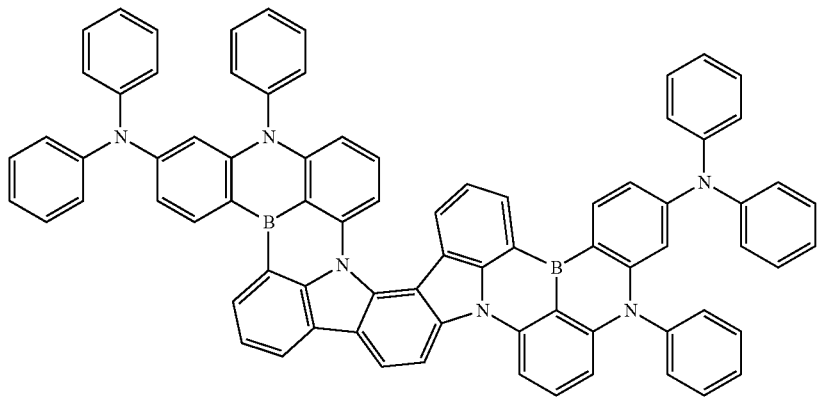
102
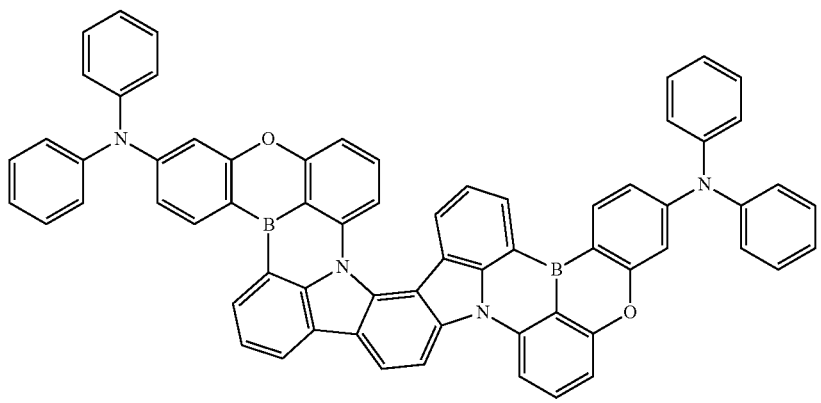
103
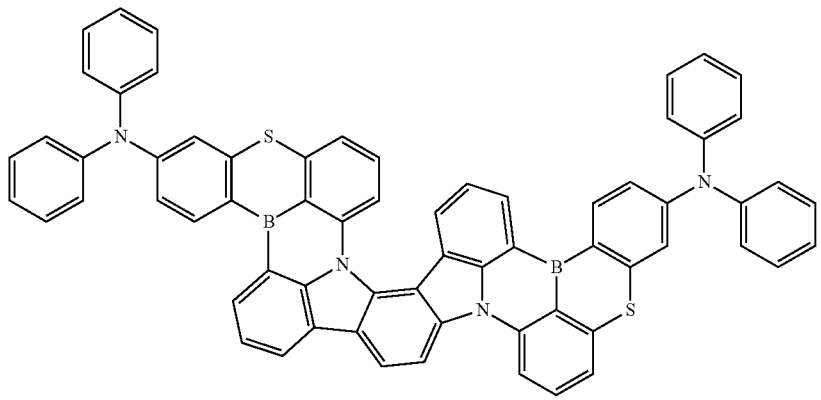
104

-continued
105
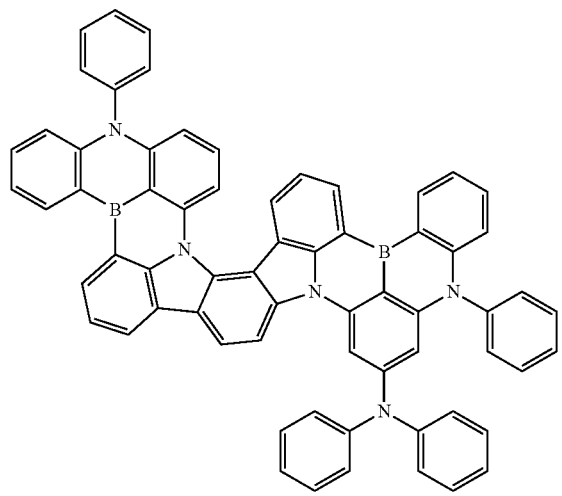
106
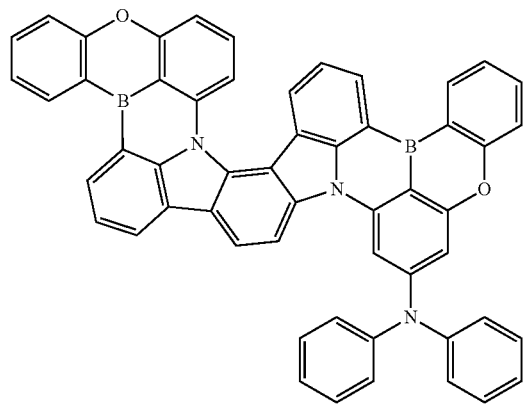
107
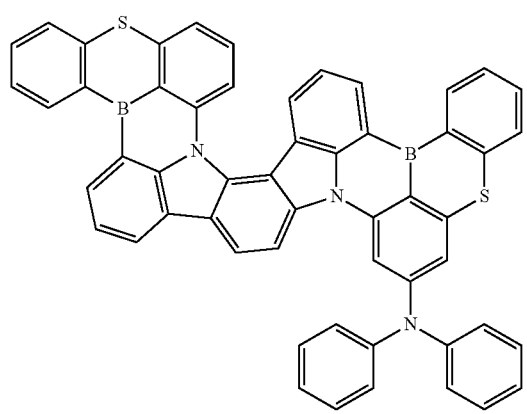
108
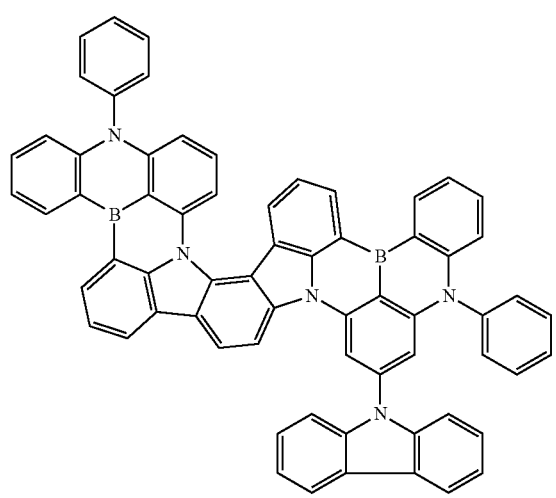
109
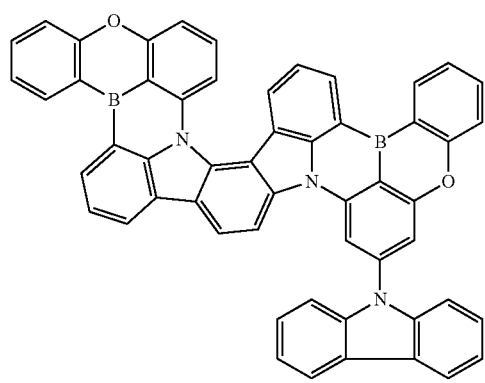
110
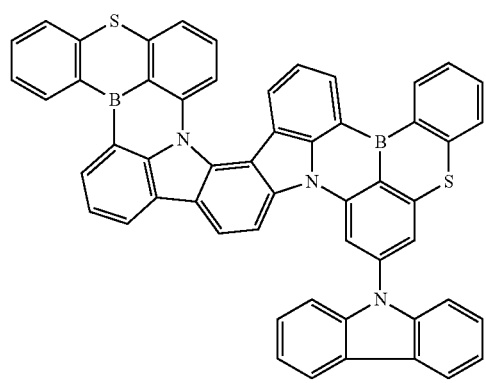

111 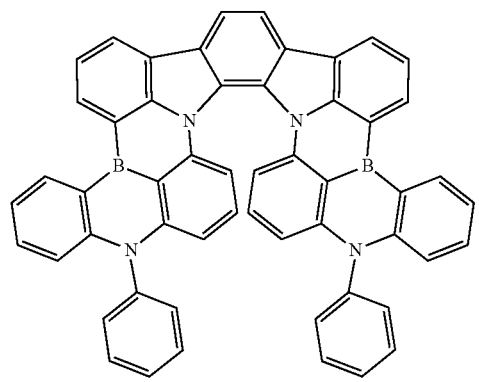
112 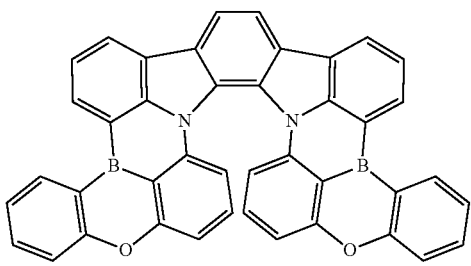
113 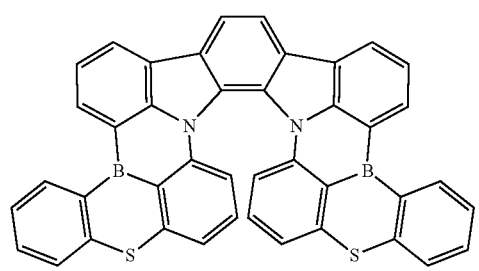
114 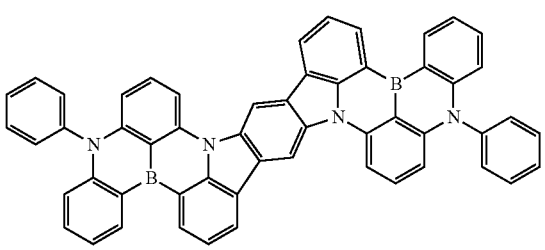
115 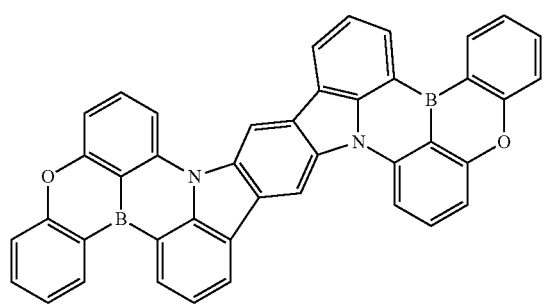
116 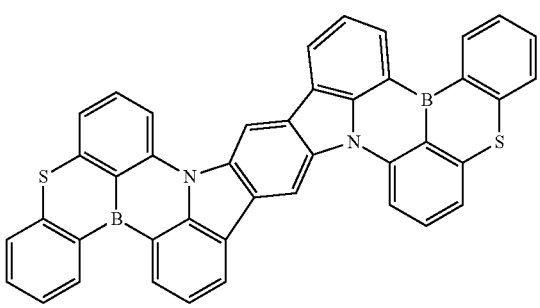
117 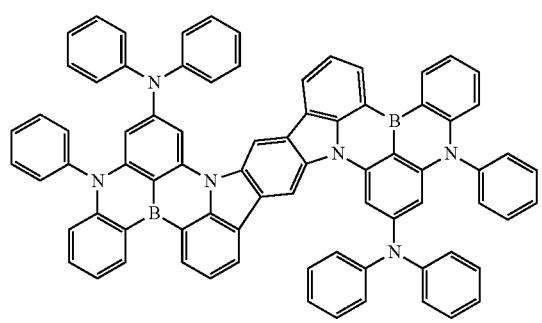
118 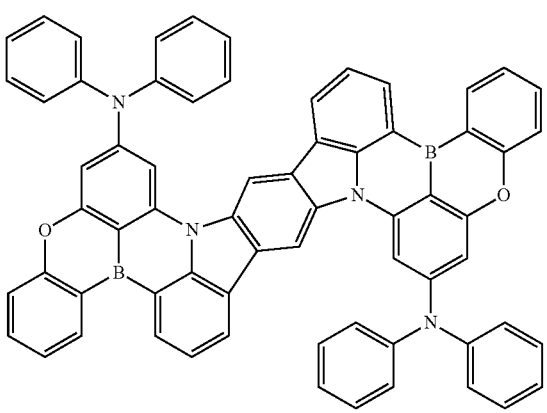

119
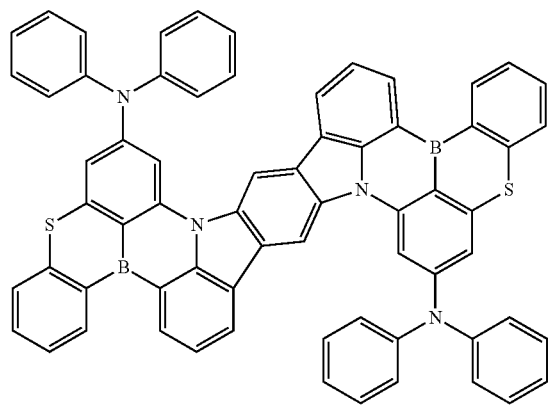
120
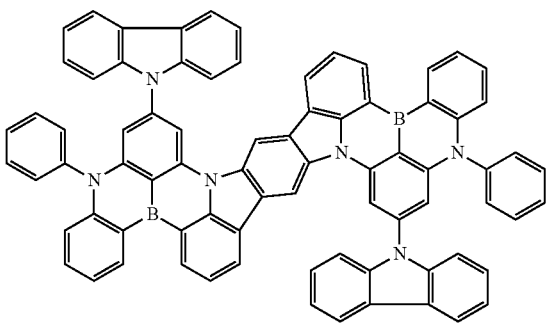
121
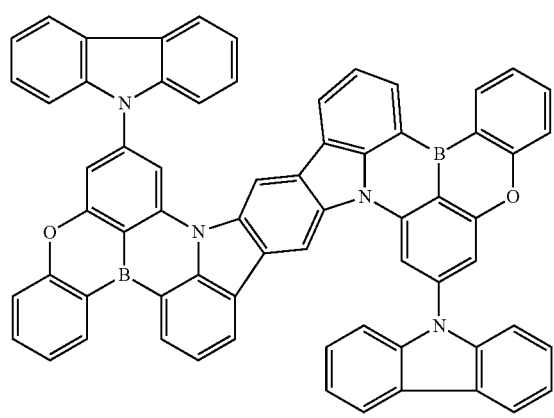
122
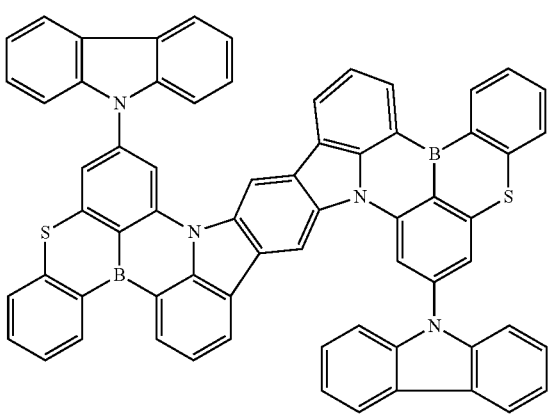
123
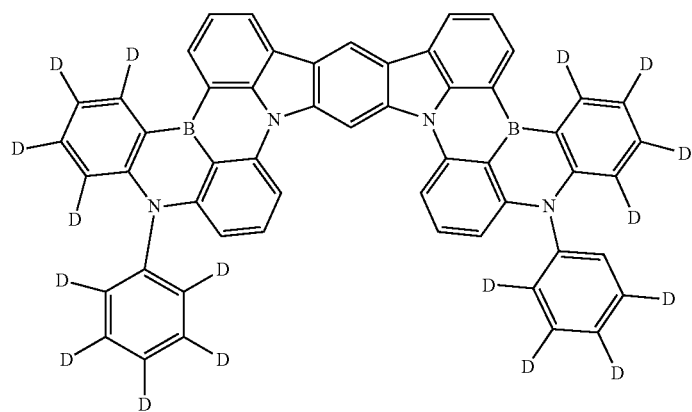

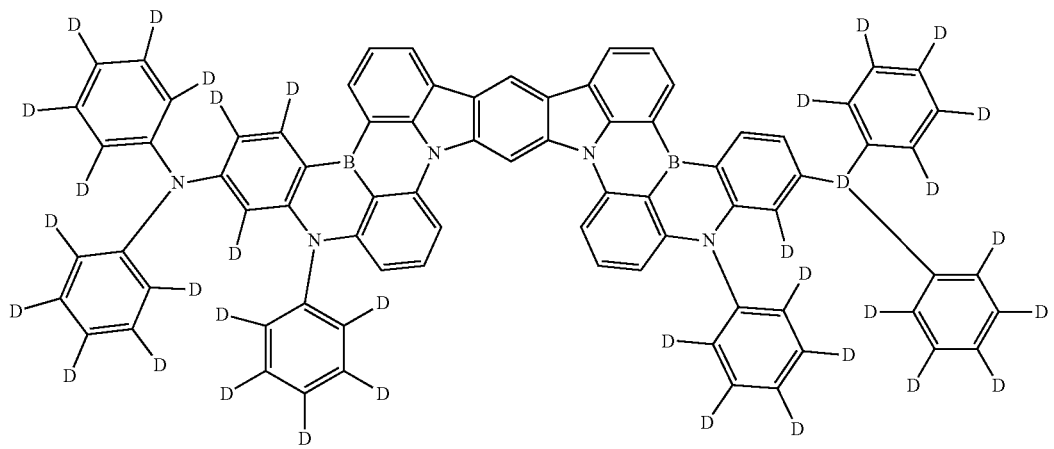
124
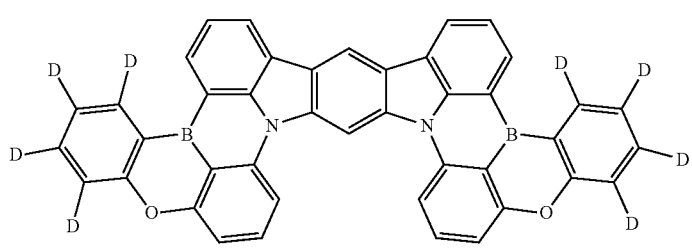
125
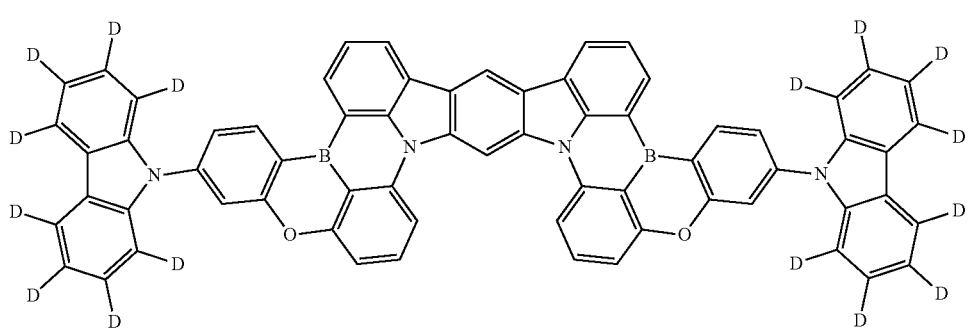
126
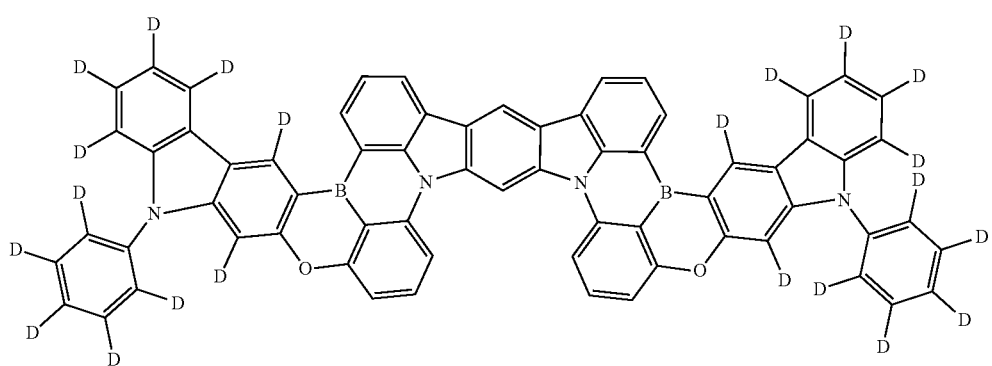
127

128
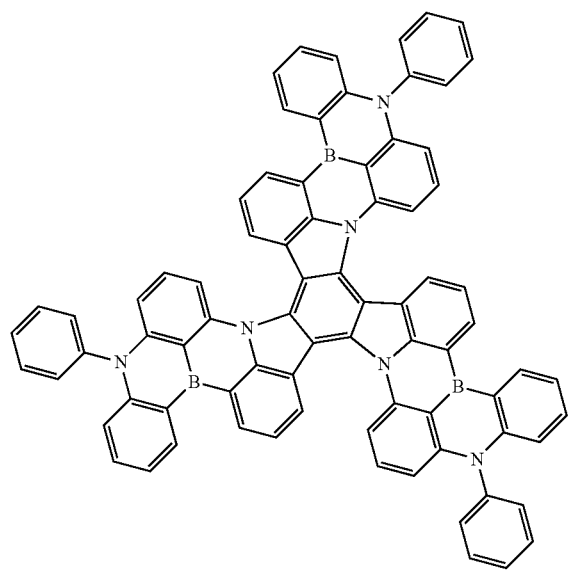
129
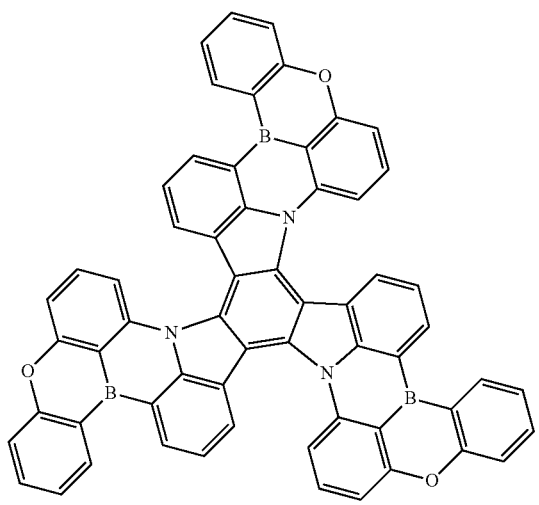
130
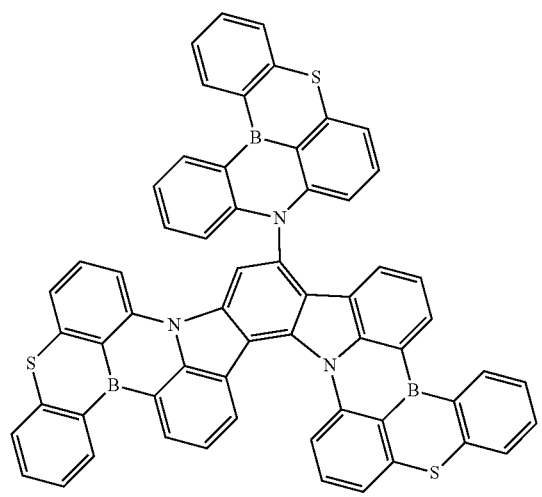
131
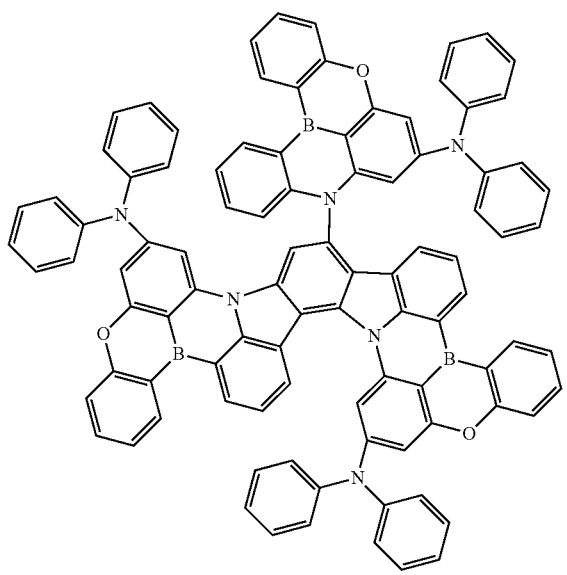

-continued

132

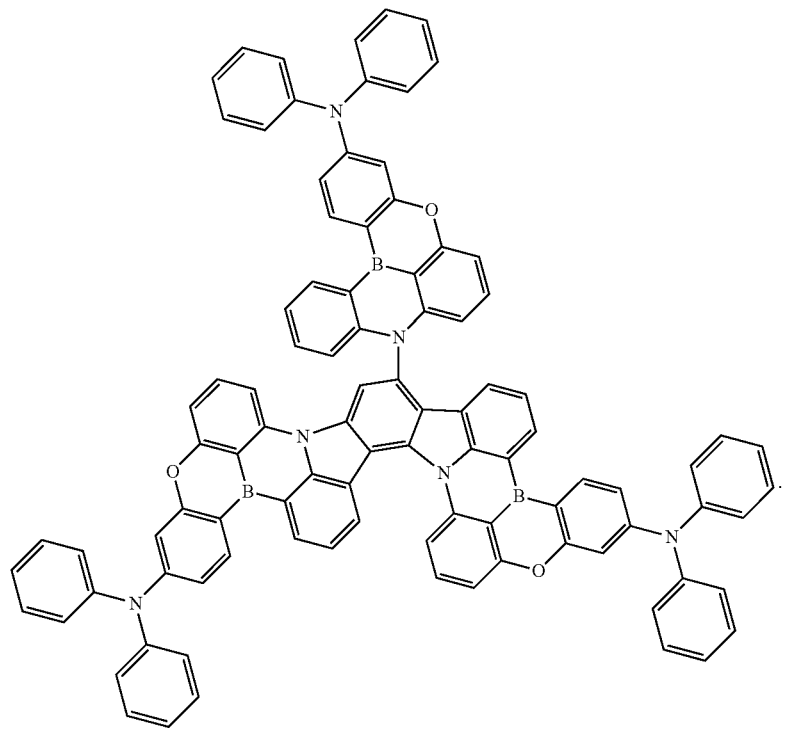

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
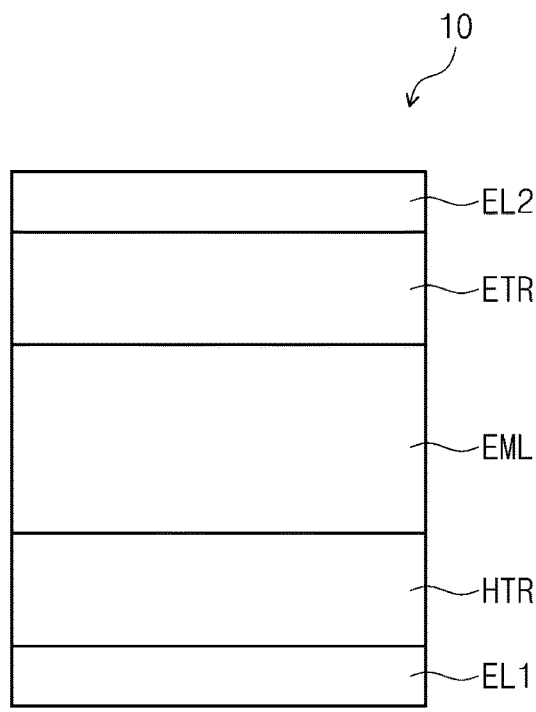
FIG. 1 is a schematic cross-sectional view illustrating an organic electroluminescence device according to an embodiment of the present disclosure.

The present disclosure may have various modifications and may be embodied in different forms, and example embodiments will be explained in detail with reference to the accompanying drawings. The present disclosure may, however, be embodied in different forms and should not be construed as being limited to the embodiments set forth herein. Rather, all modifications, equivalents, and substitutions that are included in the spirit and technical scope of the present disclosure should be included in the present disclosure.

In the description, it will be understood that when an element or layer is referred to as being "on," "connected to," or "coupled to" another element or layer, it can be directly on, connected or coupled to the other element or layer, or intervening elements or layers may be present.

Like numbers refer to like elements throughout, and duplicative descriptions thereof may not be provided. Also, in the drawings, the thickness, the ratio, and the dimensions of elements may be exaggerated for an effective description of technical contents.

As used herein, the singular forms "a," "an," and "the" are intended to include the plural forms as well, unless the context clearly indicates otherwise. As used herein, expressions such as "at least one of," "one of," and "selected from," when preceding a list of elements, modify the entire list of elements and do not modify the individual elements of the list.

The term "and/or" includes all combinations of one or more of which associated configurations may define. Further, the use of "may" when describing embodiments of the present disclosure refers to "one or more embodiments of the present disclosure".

It will be understood that although the terms "first", "second", etc. may be used herein to describe various elements, these elements should not be limited by these terms. These terms are only used to distinguish one element from another. For example, a first element could alternatively be termed a second element, and, similarly, a second element could alternatively be termed a first element, without departing from the scope of example embodiments of the present disclosure. The terms of a singular form may include plural forms unless the context clearly indicates otherwise.

In addition, terms such as "below," "lower," "above," "upper," and/or the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by those of ordinary skill in the art to which the present disclosure pertains. It is also to be understood that terms defined in commonly used dictionaries should be interpreted as having meanings consistent with meanings in the context of the related art, unless expressly defined herein, and should not be interpreted in an ideal or overly formal sense.

It should be understood that the terms includes," "including," "comprises," and/or "comprising," are intended to specify the presence of stated features, integers, steps, operations, elements, components, or combinations thereof, but do not preclude the presence or addition of one or more other features, integers, steps, operations, elements, components, or combinations thereof.

Hereinafter, an organic electroluminescence device according to an embodiment of the present disclosure and a condensed polycyclic compound of an embodiment included therein will be described with reference to the accompanying drawings.

FIGS. 1 to 4 are schematic cross-sectional views illustrating organic electroluminescence devices according to embodiments of the present disclosure. Referring to FIGS. 1 to 4, in each of organic electroluminescence devices 10, a first electrode EL1 and a second electrode EL2 are disposed to face each other, and an emission layer EML may be disposed between the first electrode EL1 and the second electrode EL2.

Each of the organic electroluminescence devices 10 may include a plurality of additional organic layers disposed between the first electrode EL1 and the second electrode EL2 with the emission layer EML. The plurality of organic layers may include a hole transport region HTR, and an electron transport region ETR. For example, each of the organic electroluminescence devices 10 according to embodiments may include the first electrode EL1, the hole transport region HTR, the emission layer EML, the electron transport region ETR, and the second electrode EL2, which are sequentially stacked. In some embodiments, the organic electroluminescence device 10 of an embodiment may include a capping layer CPL disposed on the second electrode EL2.

The organic electroluminescence device 10 of an embodiment may include a polycyclic compound according to an embodiment described below in the plurality of organic layers disposed between the first electrode EL1 and the second electrode EL2. For example, the condensed polycyclic compound according to an embodiment described below may be included in the emission layer EML and/or the electron transport region ETR. However, embodiments are not limited thereto, and the organic electroluminescence device 10 of an embodiment may include the condensed polycyclic compound according to an embodiment described below in the hole transport region HTR (which is one of the plurality of organic layers disposed between the first electrode EL1 and the second electrode EL2), or may include the condensed polycyclic compound according to an embodiment described below in the capping layer CPL disposed on the second electrode EL2, as well as in the emission layer EML and the electron transport region ETR.

Figure 2:
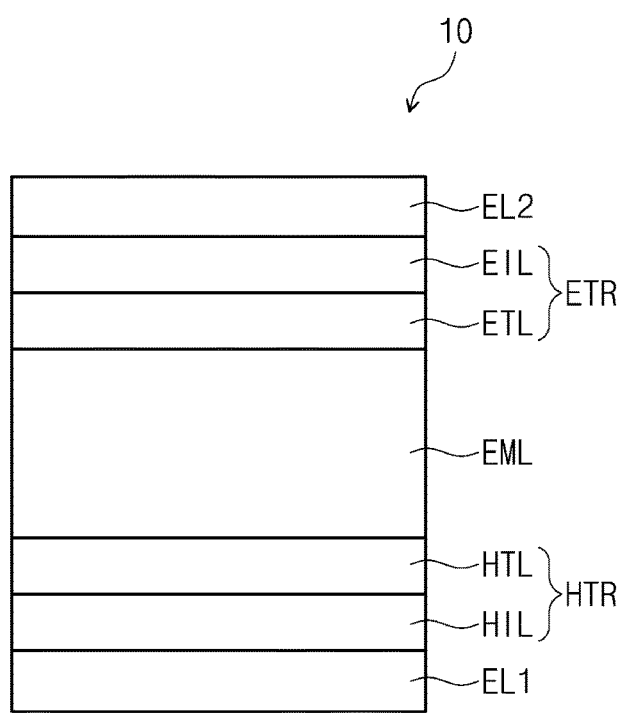
FIG. 2 is a schematic cross-sectional view illustrating an organic electroluminescence device according to an embodiment of the present disclosure.
Figure 3:
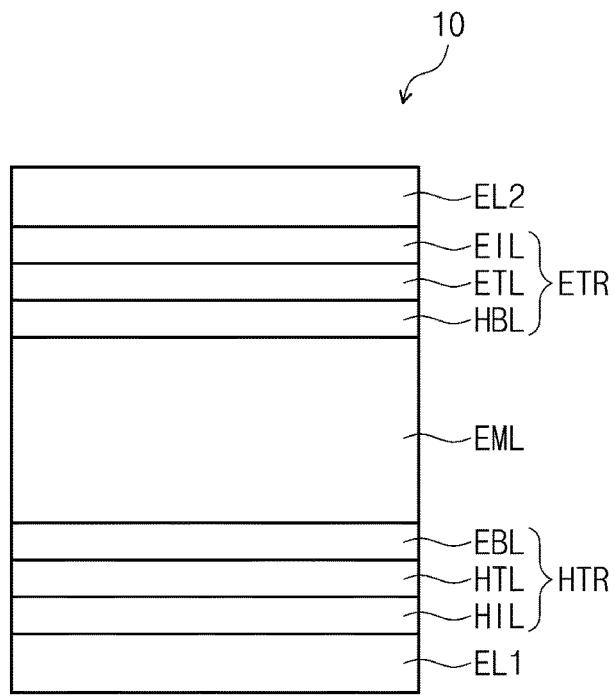
FIG. 3 is a schematic cross-sectional view illustrating an organic electroluminescence device according to an embodiment of the present disclosure.
Figure 4:
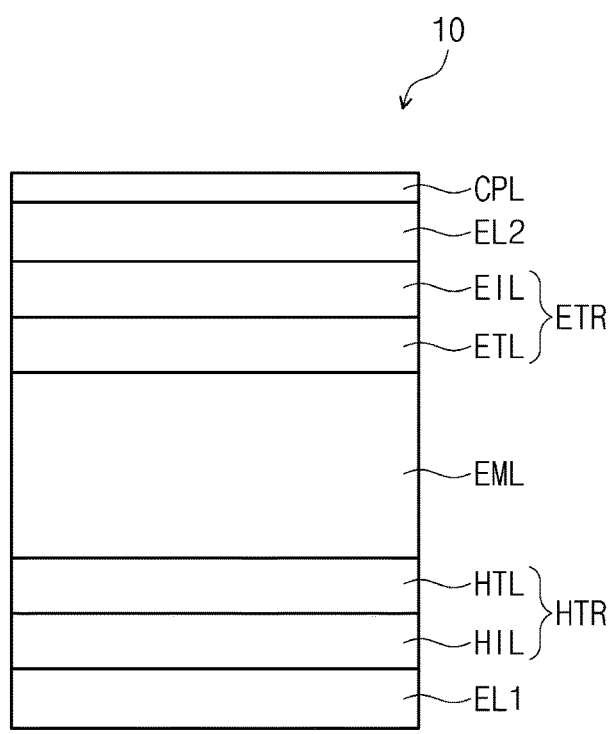
FIG. 4 is a schematic cross-sectional view illustrating an organic electroluminescence device according to an embodiment of the present disclosure.

Compared to FIG. 1, FIG. 2 illustrates a cross-sectional view of an organic electroluminescence device 10 of an embodiment, in which the hole transport region HTR includes a hole injection layer HIL and a hole transport layer HTL, and the electron transport region ETR includes an electron injection layer EIL and an electron transport layer ETL. Compared to FIG. 1, FIG. 3 illustrates a cross-sectional view of an organic electroluminescence device 10 of an embodiment, in which the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. Compared to FIG. 2, FIG. 4 illustrates a cross-sectional view of an organic electroluminescence device 10 of an embodiment including a capping layer CPL disposed on the second electrode EL2.

The first electrode EL1 may have conductivity. The first electrode EL1 may be formed of a metal alloy and/or a conductive compound. The first electrode EL1 may be an anode. In some embodiments, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide (such as, indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or a mixture thereof (e.g., a mixture of Ag and Mg). In some embodiments, the first electrode EL1 may have a multilayer structure including a reflective layer or a transflective layer formed of one or more of the above-described materials, and a transparent conductive layer formed of ITO, IZO, ZnO, ITZO, etc. For example, the first electrode EL1 may have a three-layer structure of ITO/Ag/ITO, but is not limited thereto. The thickness of the first electrode EL1 may be about 1,000 Å to about 10,000 Å, for example, about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL. The thickness of the hole transport region HTR may be, for example, about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, or a single layer structure formed of a hole injection material and a hole transport material. In some embodiments, the hole transport region HTR may have a single layer structure formed of a plurality of different materials, or a structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, which are sequentially laminated from the first electrode EL1, but embodiments are not limited thereto.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"-tris{N,-(2-naphthyl) N-phenylamino)-triphenylamine (2-TNATA), poly(3,4-ethylene dioxythiophene)/poly(4-styrene sulfonate) (PEDOT/PSS), polyaniline/dodecylbenzenesulfonic acid (PANI/DBSA), polyaniline/camphor sulfonic acid (PANI/CSA), polyaniline/poly(4-styrene sulfonate) (PANI/PSS), N,N'-di(naphthalene-1-yl)-N,N'-diphenyl-benzidine (NPD), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include, for example, carbazole derivatives (such as N-phenyl carbazole and/or polyvinyl carbazole), fluorene derivatives, N,N'-bis(3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di(naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be about 50 Å to about 15,000 Å, for example, about 100 Å to about 5,000 Å. The thickness of the hole injection layer HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed substantially uniformly or non-uniformly in the hole transport region HTR. The charge generating material may be, for example, a p-dopant. The p-dopant may be a quinone derivative, metal oxide, or cyano group-containing compound, but is not limited thereto. Non-limiting examples of the p-dopant include quinone derivatives (such as tetracyanoquinodimethane (TCNQ) and/or 2,3,5,6-tetrafluoro-7,7,8,8-tetracyanoquinodimethane (F4-TCNQ)), metal oxides (such as tungsten oxide and/or molybdenum oxide), etc.

The hole transport region HTR may further include at least one of a hole buffer layer or an electron blocking layer EBL in addition to the hole injection layer HIL and the hole transport layer HTL. The hole buffer layer may compensate for a resonance distance of the wavelength of light emitted from an emission layer EML to increase light emission efficiency. Materials that may be included in the hole transport region HTR may also be included in the hole buffer layer. The electron blocking layer EBL may prevent or reduce electrons from being injected from the electron transport region ETR to the hole transport region HTR.

The emission layer EML is provided on the hole transport region HTR. The thickness of the emission layer EML may be, for example, about 100 Å to about 1000 Å or about 100 Å to about 300 Å. The emission layer EML may be or have a single layer formed of a single material, a single layer formed of a plurality of different materials, or a multilayer structure having a plurality of layers formed of a plurality of different materials.

In the description, the term "substituted or unsubstituted" refers to a state of being unsubstituted, or substituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In some embodiments, each of these substituents may be further substituted or unsubstituted. For example, a biphenyl group may be interpreted as a named aryl group, or as a phenyl group substituted with a phenyl group.

In the description, the phrase "bonded to an adjacent group to form a ring" may refer to a state of being bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each independently be monocyclic or polycyclic. In some embodiments, the rings formed from two groups bonded to each other may be further connected to another ring to form a spiro structure.

In the description, the phrase "bonded to an adjacent ring to form a ring" may indicate that adjacent two rings are bonded to form a substituted or unsubstituted hydrocarbon ring, or a substituted or unsubstituted heterocycle.

In the description, the term "an adjacent group" may refer to a substituent on the same atom or point, a substituent on an atom that is directly connected to the base atom or point, or a substituent sterically positioned (e.g., within intramolecular bonding distance) to the corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other.

In the description, the halogen atom may be a fluorine atom, a chlorine atom, a bromine atom, or an iodine atom.

In the description, the alkyl group may be a linear, branched or cyclic alkyl group. The number of carbons in the alkyl group may be 1 to 50, 1 to 30, 1 to 20, 1 to 10, or 1 to 6. Non-limiting examples of the alkyl group include a methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the description, the term "hydrocarbon ring group" may refer to any functional group or substituent derived from an aliphatic hydrocarbon ring. The hydrocarbon ring group may be a saturated hydrocarbon ring group having 5 to 20 ring-forming carbon atoms.

In the description, the term "aryl group" may refer to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc.

In the description, the term "heterocyclic group" may refer to any functional group or substituent derived from a ring including at least one of boron (B), oxygen (O), nitrogen (N), phosphorus (P), silicon (Si), sulfur (S), or selenium (Se) as a heteroatom. The heterocyclic group may be an aliphatic heterocyclic group or an aromatic heterocyclic group. The aromatic heterocyclic group may be a heteroaryl group. The aliphatic heterocycle and the aromatic heterocycle may each independently be monocyclic or polycyclic.

When the heterocyclic group contains two or more hetero atoms, the two or more hetero atoms may be the same as or different from each other. The heterocyclic group may be a monocyclic heterocyclic group or a polycyclic heterocyclic group, and in some embodiments may be a heteroaryl group. The number of ring-forming carbon atoms in in the heterocyclic group may be 2 to 30, 2 to 20, or 2 to 10.

The number of carbons for forming a ring of the aliphatic heterocyclic group may be 2 to 30, 2 to 20, or 2 to 10. Non-limiting examples of the aliphatic heterocyclic group include an oxirane group, thiirane group, pyrrolidine group, piperidine group, tetrahydrofuran group, tetrahydrothiophene group, thiane group, tetrahydropyran group, 1,4-dioxane group, etc.

When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Non-limiting examples of the heteroaryl group include a thiophene group, furan group, pyrrole group, imidazole group, triazole group, pyridine group, bipyridine group, pyrimidine group, triazine group, triazole, acridyl group, pyridazine group, pyrazinyl group, quinoline group, quinazoline group, quinoxaline group, phenoxazine group, phthalazine group, pyrido pyrimidine group, pyrido pyrazine group, pyrazino pyrazine group, isoquinoline group, indole group, carbazole group, N-arylcarbazole group, N-heteroarylcarbazole group, N-alkylcarbazole group, benzoxazole group, benzimidazole group, benzothiazole group, benzocarbazole group, benzothiophene group, dibenzothiophene group, thienothiophene group, benzofuran group, phenanthroline group, thiazole group, isooxazole group, oxazole group, oxadiazole group, thiadiazole group, phenothiazine group, dibenzosilole group, dibenzofuran group, etc.

In the description, the term "oxy group" may refer to an alkoxy group or an aryl oxy group. The alkoxy group may include a linear, branched or cyclic alkyl chain. The number of carbon atoms in the alkoxy group is not particularly limited, but for example, may be 1 to 20 or 1 to 10. The number of ring-forming carbon atoms in the aryloxy group may be, for example, 6 to 30, 6 to 20, or 6 to 15. Non-limiting examples of the oxy group include methoxy, ethoxy, n-propoxy, isopropoxy, butoxy, pentyloxy, hexyloxy, octyloxy, nonyloxy, decyloxy, benzyloxy, etc.

In the description, the term "boryl group" may refer to an alkyl boryl group or an aryl boryl group. Non-limiting examples of the boryl group include a trimethylboryl, triethylboryl, t-butyldimethylboryl, triphenylboryl, diphenylboryl, phenylboryl, etc. Examples of the alkyl group in the alkyl boryl group may be the same as the examples of the alkyl group described above, and examples of the aryl group in the aryl boryl group may be the same as the examples of the aryl group described above.

In the description, the number of carbon atoms in an amine group is not specifically limited, but may be 1 to 30. The amine group may be an alkyl amine group or an aryl amine group. Non-limiting examples of the amine group include a methylamine group, dimethylamine group, phenylamine group, diphenylamine group, naphthylamine group, 9-methyl-anthracenylamine group, triphenylamine group, etc.

Examples of the alkyl group in the alkylamine group may be the same as the examples of the alkyl group described above.

Examples of the aryl group in the arylamine group may be the same as the examples of the aryl group described above.

In the description, the term "direct linkage" may refer to a single bond.

In the description, " ——— ✱ " refers to a point of connection.

The emission layer EML in the organic electroluminescence device 10 of an embodiment may include a condensed polycyclic compound represented by Formula 1:

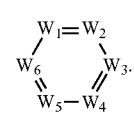

[Formula 1]

In Formula 1, $W_1$ to $W_6$ may each independently be $CR_1$ or a carbon atom connected to a substituent represented by Formula 2. For example, any two adjacent positions among $W_1$ to $W_6$ may (e.g., simultaneously) be carbon atoms connected to a substituent represented by Formula 2. For example, two or three of the substituent represented by Formula 2 may be connected to Formula 1. For example, two or three of the substituent represented by Formula 2 may be connected via two or three adjacent pairs, respectively, among $W_1$ to $W_6$.

In Formula 1, $R_1$ may be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent ring to form a ring. For example, $R_1$ may be a hydrogen atom or a substituted or unsubstituted methyl group.

[Formula 2]

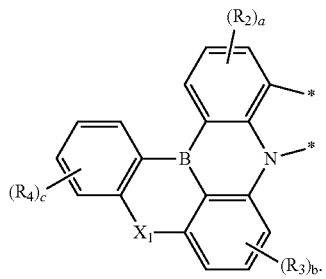

In Formula 2, $X_1$ may be O, S, or $NAr_1$.

In Formula 2, $Ar_1$ may be a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. For example, $Ar_1$ may be a substituted or unsubstituted phenyl group. For example, Ar1 may be an unsubstituted phenyl group, a phenyl group substituted with a methyl group in the para-position, a phenyl group substituted with a t-butyl group in the para-position, or a phenyl group substituted with deuterium. However, embodiments are not limited thereto. For example, $Ar_1$ may be bonded to an adjacent group to form a substituted or unsubstituted carbazole.

In Formula 2, $R_2$ to $R_4$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent ring to form a ring. For example, $R_2$ to $R_4$ may each independently be a hydrogen atom, a deuterium atom, a substituted or unsubstituted methyl group, a substituted or unsubstituted t-butyl group, a substituted or unsubstituted diphenylamine group, a substituted or unsubstituted phenyl group, or a substituted or unsubstituted carbazole group. For example, $R_2$ to $R_4$ may each independently be a diphenylamine group substituted with deuterium, or a carbazole group substituted with deuterium. However, embodiments are not limited thereto.

In Formula 2, a and b may each independently be an integer of 0 to 3. For example, a and b may each independently be 0 or 1.

In Formula 2, c may be an integer of 0 to 4. For example, c may be 0 or 1.

In an embodiment, the condensed polycyclic compound represented by Formula 1 may be represented by at least one of Formula 1-1 to Formula 1-5:

[Formula 1-1]

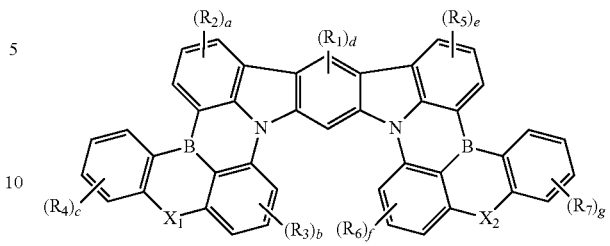

[Formula 1-2]

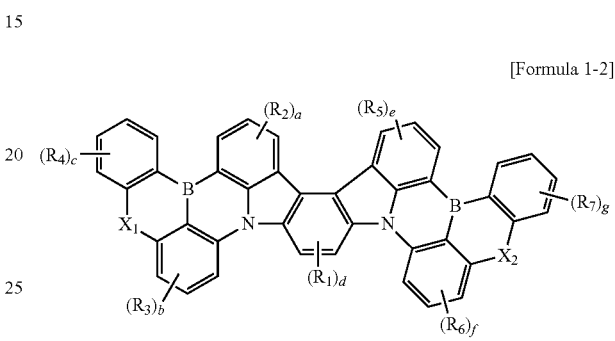

[Formula 1-3]

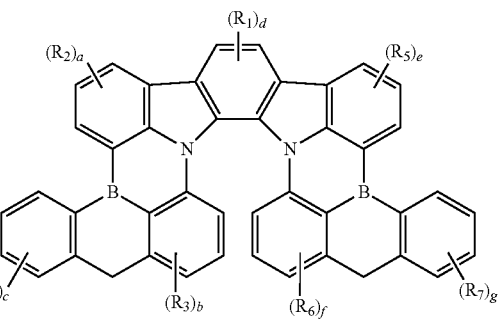

[Formula 1-4]

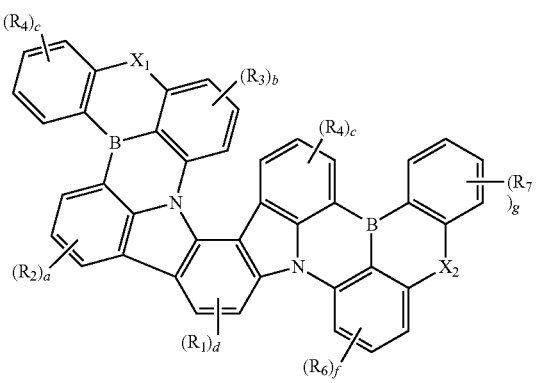

[Formula 1-5]

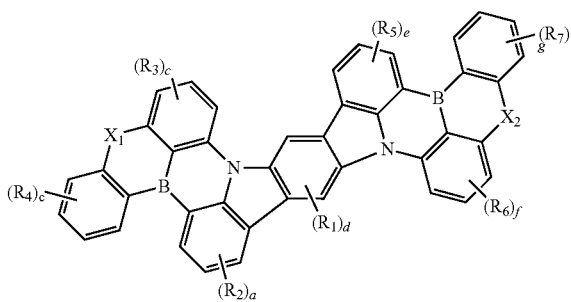

The condensed polycyclic compound represented by Formula 1-1 to Formula 1-5 is an embodiment in which two substituents represented by Formula 2 are connected to Formula 1.

Formula 1-1 is an embodiment of Formula 1 in which one substituent represented by Formula 2 is connected to $W_2$ and $W_3$, and one substituent represented by Formula 2 is connected to $W_5$ and $W_6$. Formula 1-1 may have a symmetrical structure.

Formula 1-2 is an embodiment of Formula 1 in which one substituent represented by Formula 2 is connected to $W_2$ and $W_3$, and one substituent represented by Formula 2 is connected to $W_1$ and $W_6$. Formula 1-2 may have a symmetrical structure.

Formula 1-3 is an embodiment of Formula 1 in which one substituent represented by Formula 2 is connected to $W_3$ and $W_4$, and one substituent represented by Formula 2 is connected to $W_5$ and $W_6$. Formula 1-3 may have a symmetrical structure.

Formula 1-4 is an embodiment of Formula 1 in which one substituent represented by Formula 2 is connected to $W_2$ and $W_3$, and one substituent represented by Formula 2 is connected to $W_1$ and $W_6$. Formula 1-4 may have an asymmetrical structure.

Formula 1-5 is an embodiment of Formula 1 in which one substituent represented by Formula 2 is connected to $W_2$ and $W_3$ and one substituent represented by Formula 2 is connected to $W_5$ and $W_6$. Formula 1-5 may have an asymmetrical structure.

In Formula 1-1 to Formula 1-5, $X_1$, $Ar_1$, $R_1$ to $R_4$, and a to c may each independently be the same as defined in Formula 1.

In Formula 1-1 to Formula 1-5, $X_2$ may be O, S, or $NAr_2$.

In Formula 1-1 to Formula 1-5, the description of $Ar_1$ in Formula 1 may be applied to $Ar_2$.

In Formula 1, d may be an integer of 0 to 2. In some embodiments, the condensed polycyclic compound represented by Formula 1 when d is 0 may be the same as the condensed polycyclic compound represented by Formula 1 when d is 1 and $R_1$ is a hydrogen atom. In some embodiments, when d is 1, $R_1$ may be a hydrogen atom or a substituted or unsubstituted methyl group. In an embodiment, when d is 2, a plurality of $R_1$'s may be the same as or different from each other. For example, when d is 2, both $R_1$'s may be unsubstituted methyl groups. However, embodiments are not limited thereto.

In Formula 1-1 to Formula 1-5, the description of $R_2$ to $R_4$ in Formula 1 may be applied to each of $R_5$ to $R_7$.

In Formula 1-1 to Formula 1-5, e and f may each independently be an integer of 0 to 3, and g may be an integer of 0 to 4. For example, e and f may each independently be 0 or 1. For example, g may be 0 or 1. However, embodiments are not limited thereto.

In an embodiment, $X_1$ and $X_2$ may be the same. For example, both of $X_1$ and $X_2$ may be O or S. For example, $X_1$ and $X_2$ may be $NAr_1$ and $NAr_2$, respectively, and $Ar_1$ and $Ar_2$ may be the same.

In some embodiments, in Formula 1-1 to Formula 1-5, two substituents represented by Formula 2 that are substituted to Formula 1 may be the same. For example, $X_1$ and $X_2$ may be the same. $R_2$, $R_3$, and $R_4$ may be the same as $R_5$, $R_6$, and $R_7$, respectively. a, b, and c may be the same as e, f, and g, respectively. Accordingly, the condensed polycyclic compound represented by Formula 1-1 to Formula 1-3 may have a linearly (e.g., mirror) symmetric structure based on the benzene ring in which $R_1$ is substituted. However, embodiments are not limited thereto.

In an embodiment, the condensed polycyclic compound represented by Formula 1 may be represented by Formula 3:

[Formula 3]

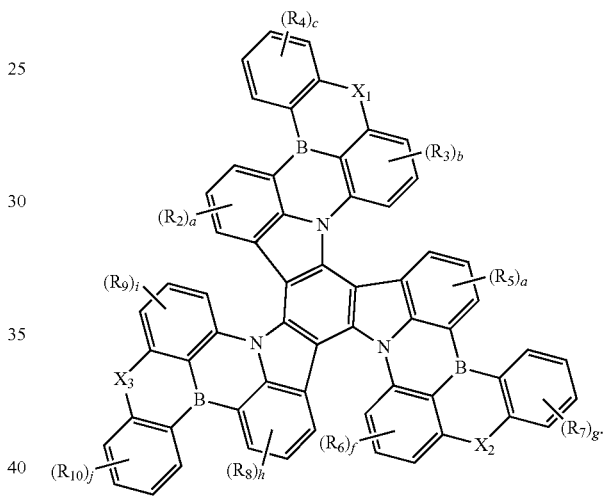

In Formula 3, $X_1$, $Ar_1$, $R_1$ to $R_4$, and a to c may each independently be the same as defined in Formula 1.

In Formula 3, $X_2$ may be O, S, or $NAr_2$, and $X_3$ may be O, S, or $NAr_3$. The description of $Ar_1$ in Formula 1 may be applied to each of $Ar_2$ and Ar.

In Formula 3, the description of $X_1$ in Formula 1 may be applied to each of $X_2$ and $X_3$.

In Formula 3, the description of $Ar_1$ in Formula 1 may be applied to each of $Ar_2$ and $Ar_3$.

In Formula 3, the description of $R_2$ to $R_4$ in Formula 1 may be applied to each of $R_5$ to $R_7$ and $R_8$ to $R_{10}$.

In Formula 1-1 to Formula 1-5, e, f, h and i may each independently be an integer of 0 to 3, and g and j may each independently be an integer of 0 to 4. For example, e, f, h and i may each independently be 0 or 1. For example, g and f may each independently be 0 or 1. However, embodiments are not limited thereto.

The polycyclic compound represented by Formula 1 may be at least one of the compounds represented by Compound Group 1:

[Compound Group 1]
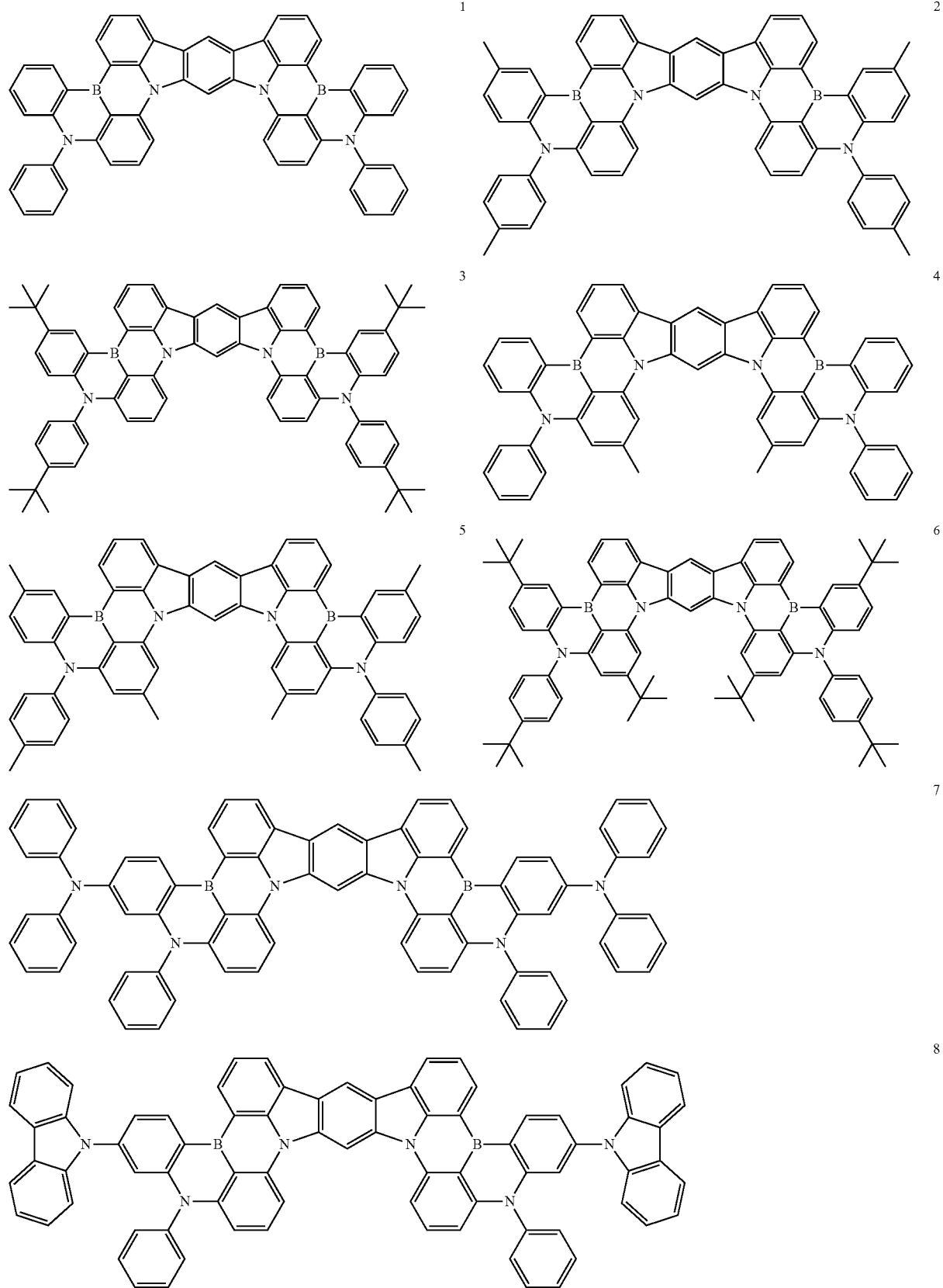

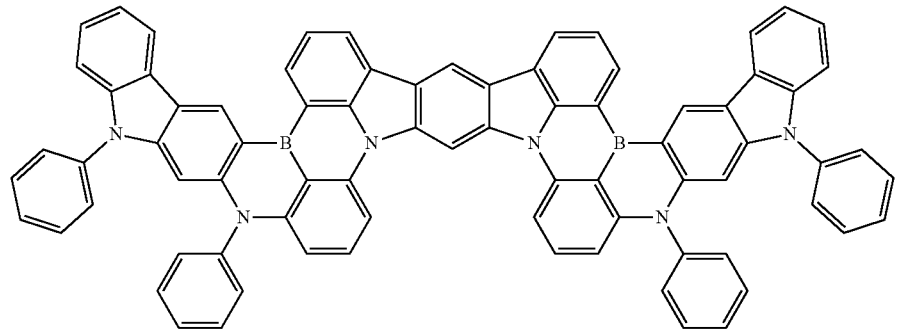
9
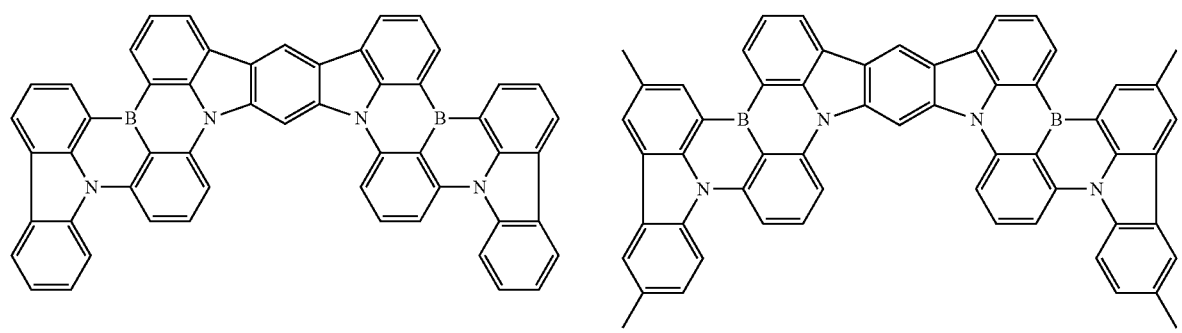
10 11
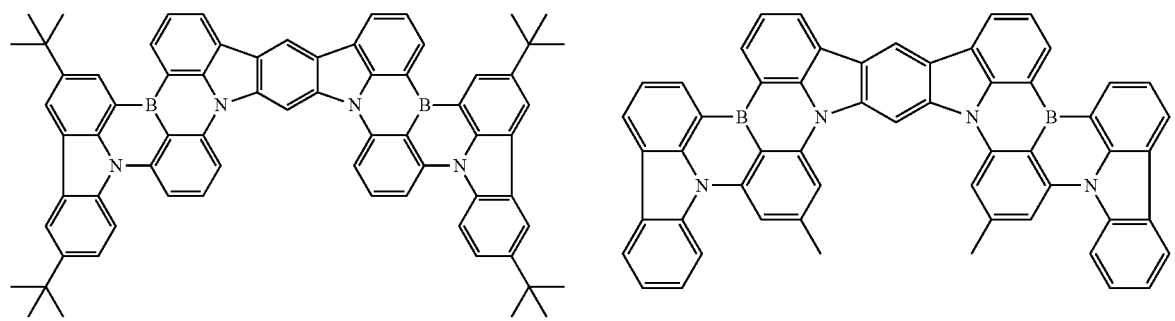
12 13
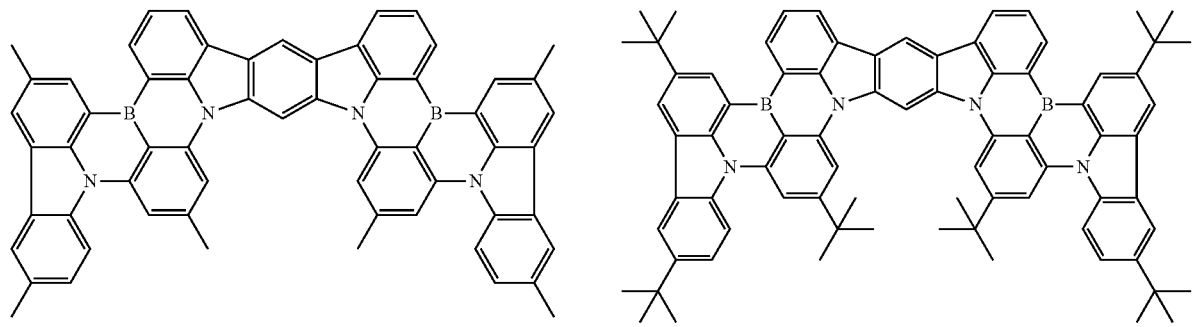
14 15

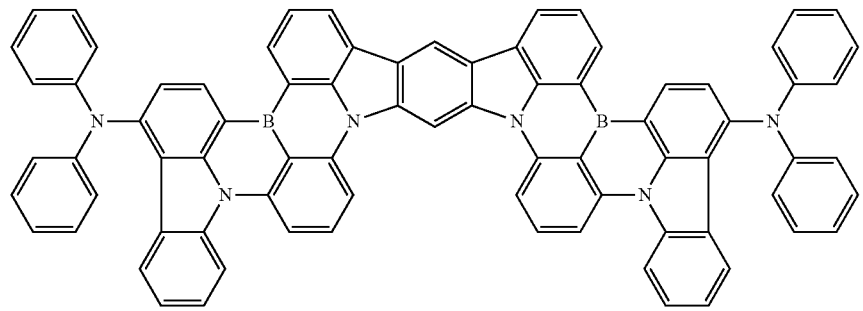
16
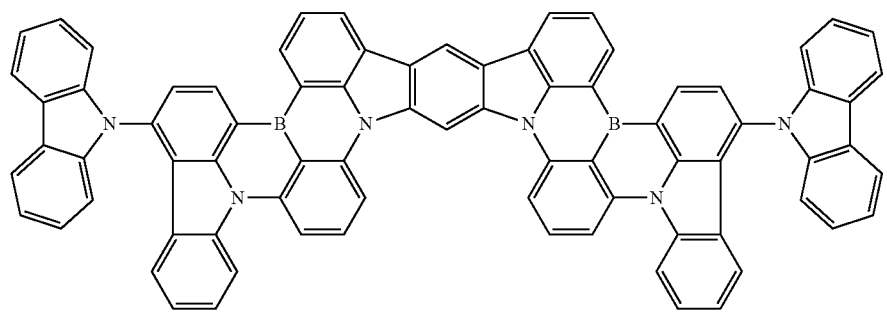
17
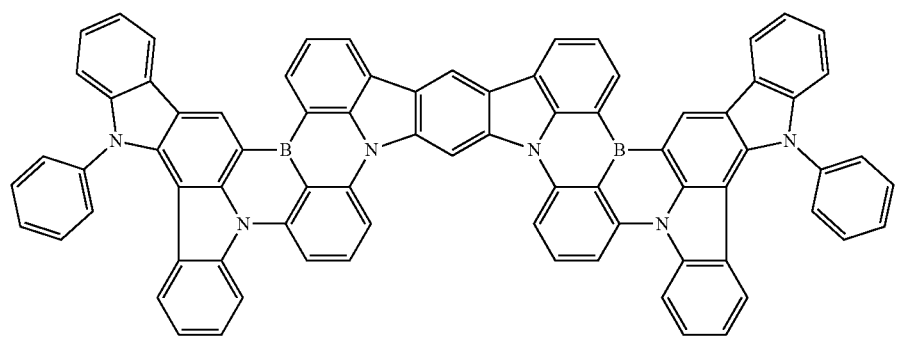
18
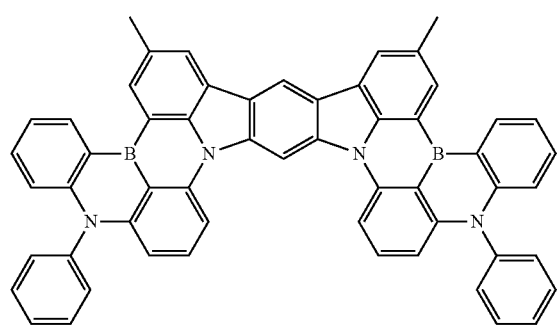
19
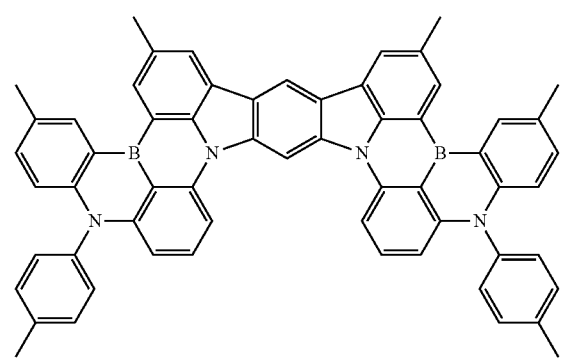
20

-continued
21
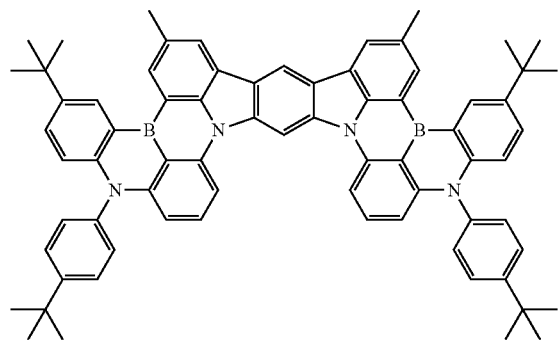
22
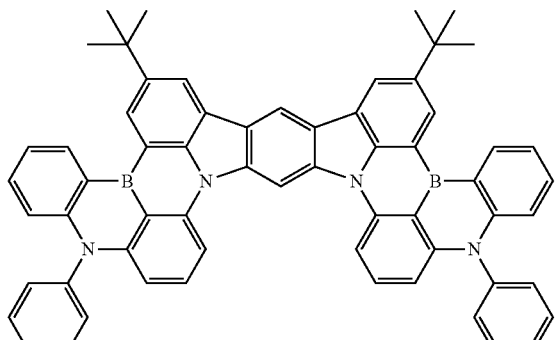
23
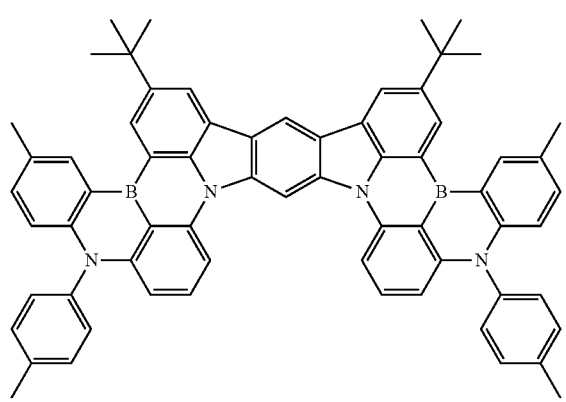
24
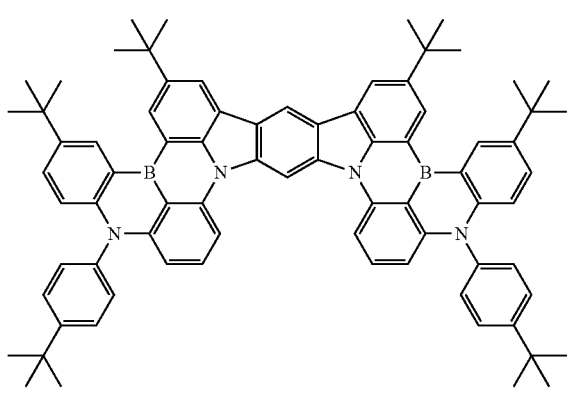
25
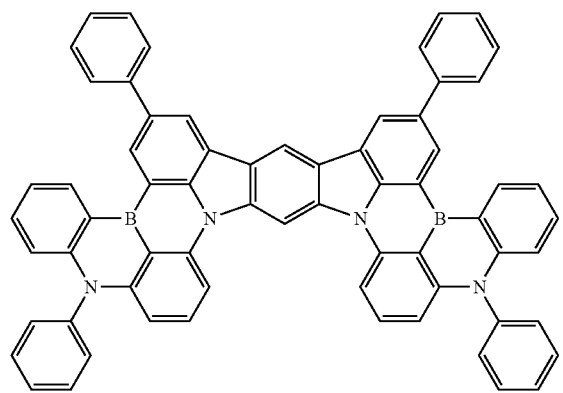
26
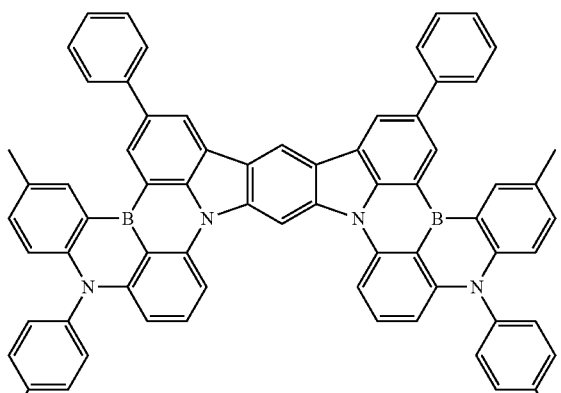
27
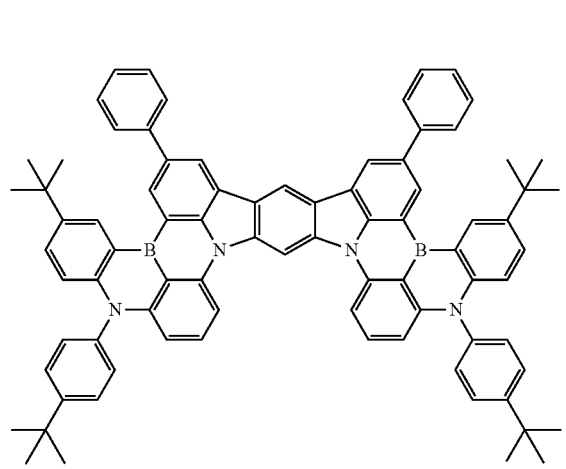
28
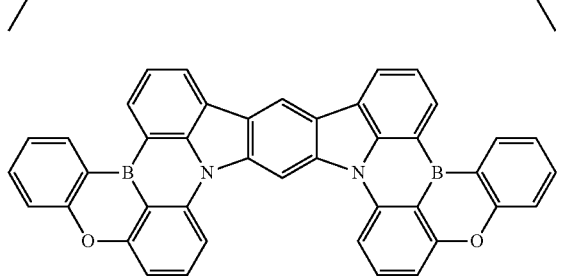

-continued
29
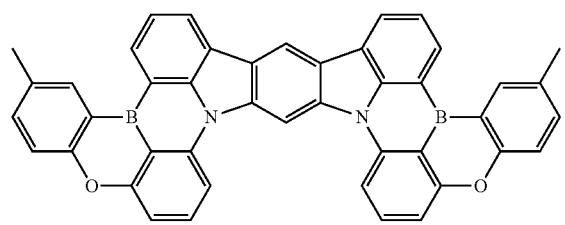
30
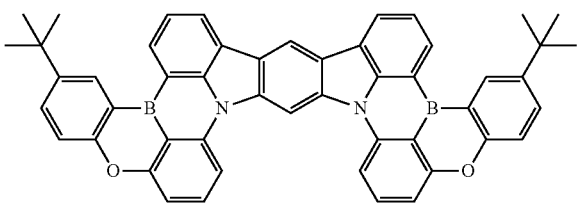
31
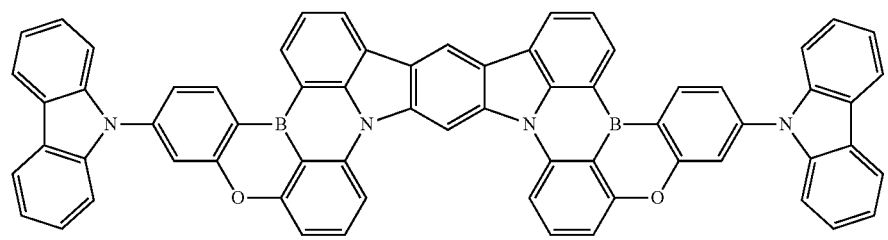
32
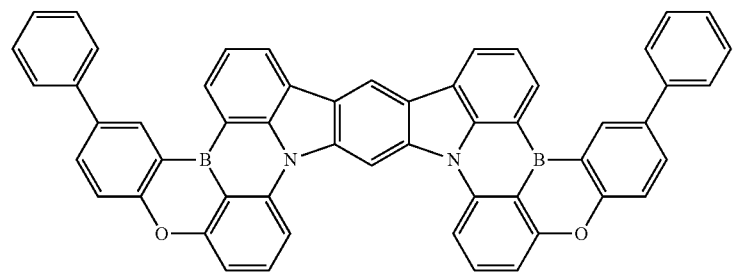
33
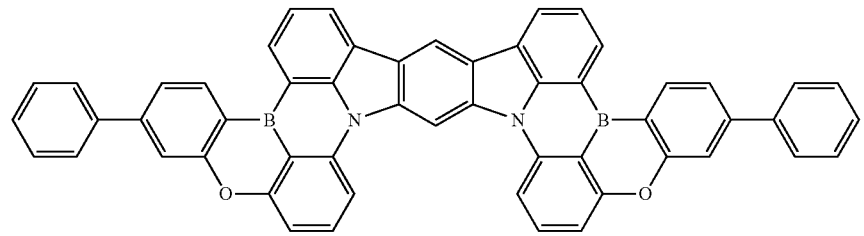
34
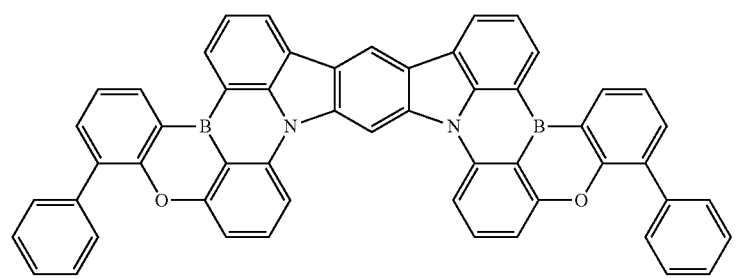
35
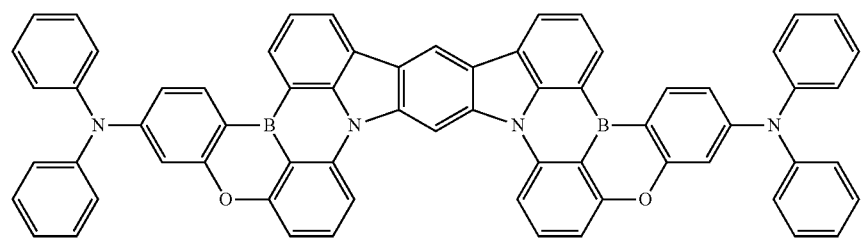

36
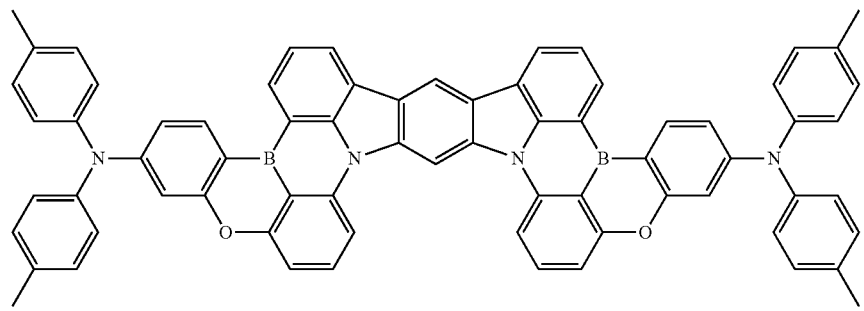
37
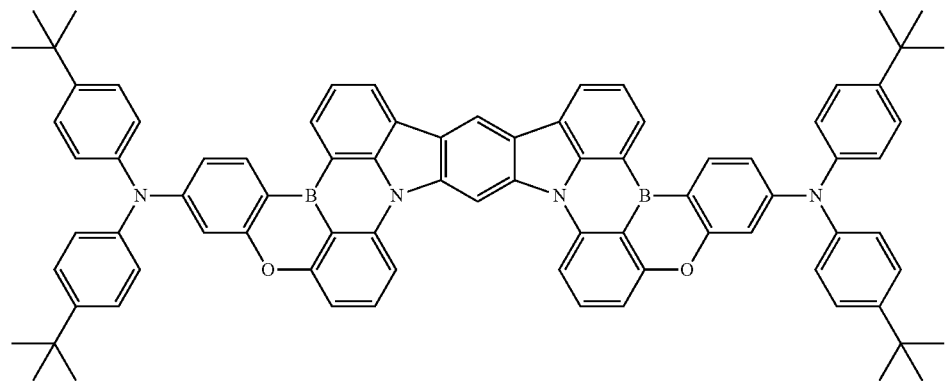
38
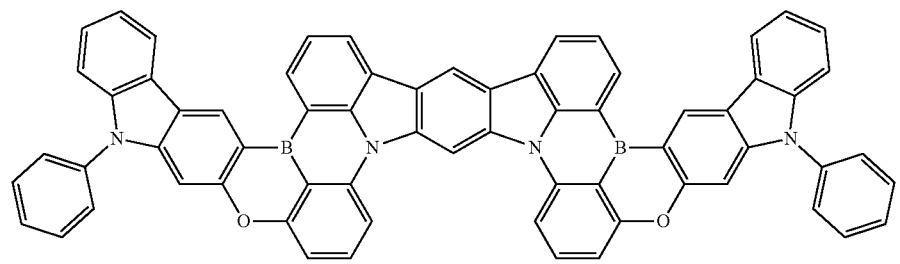
39
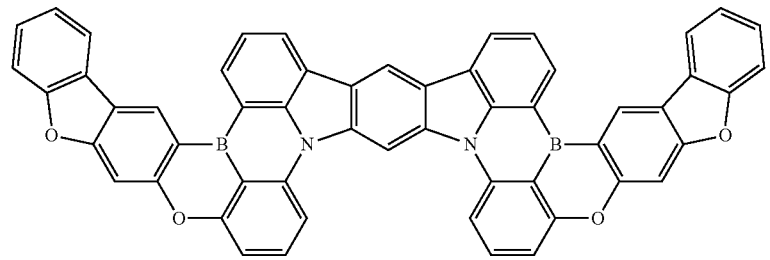
40
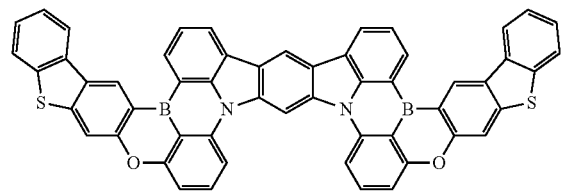
41
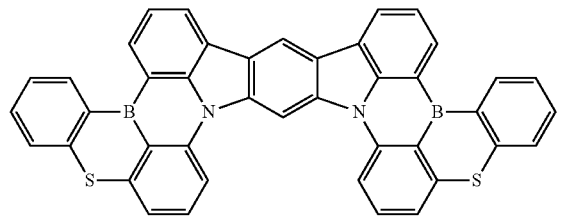

-continued
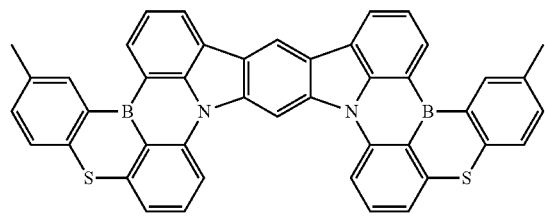
42
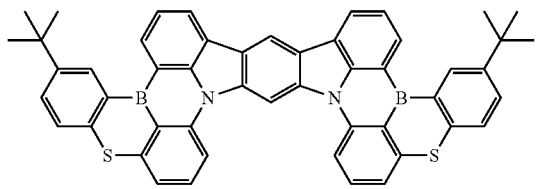
43
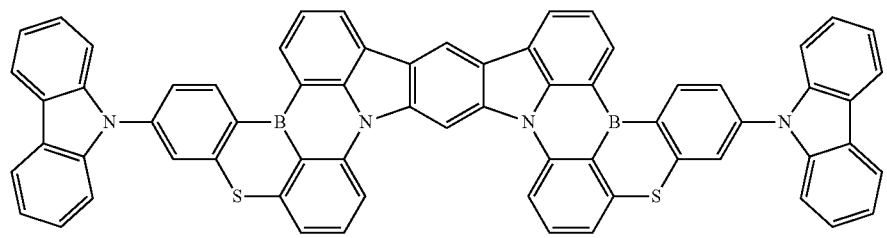
44
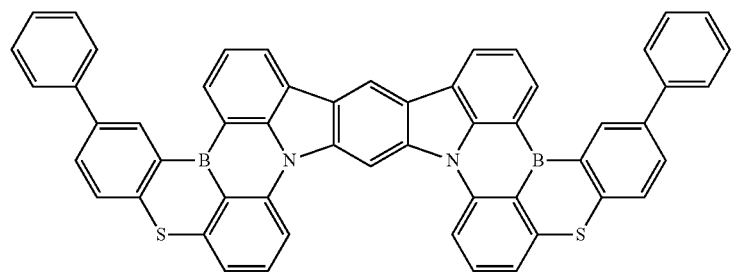
45
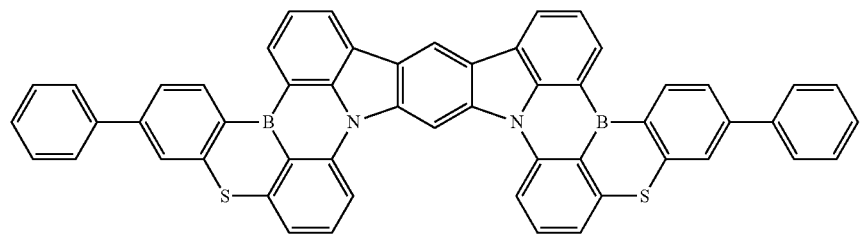
46
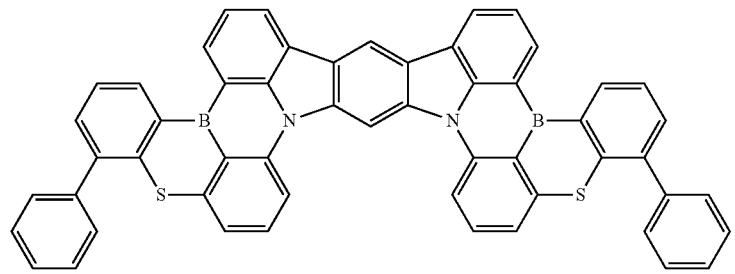
47
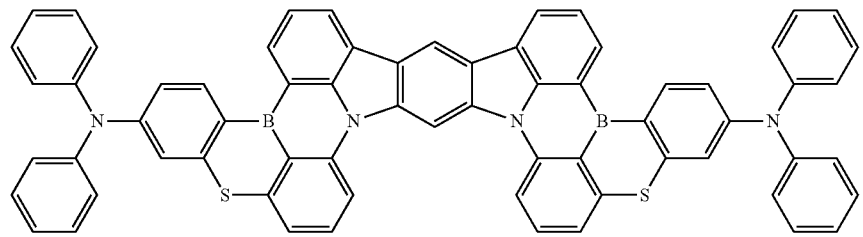
48

49
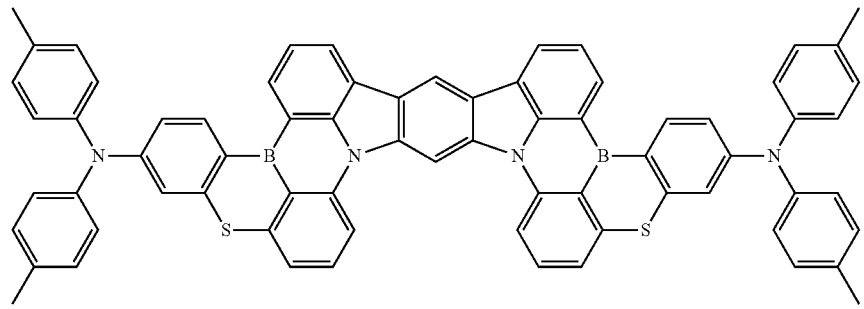
50
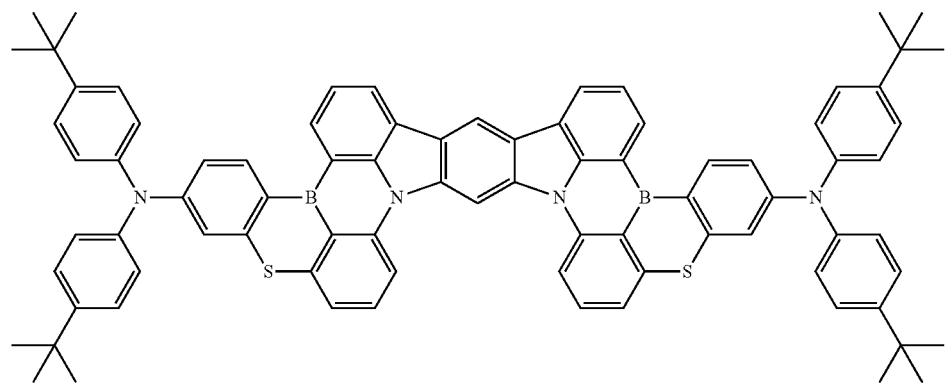
51
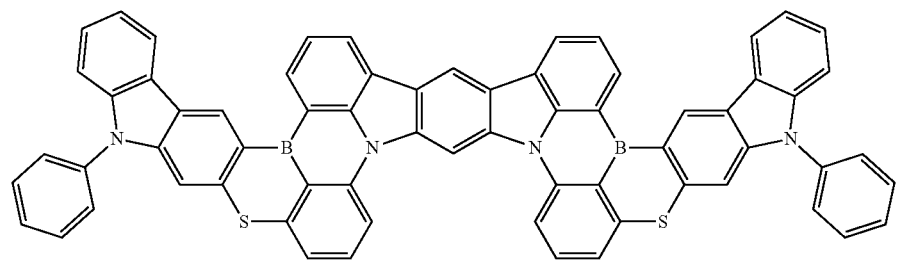
52 53
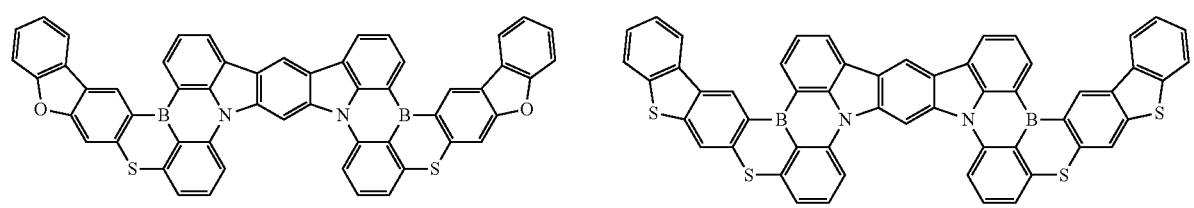
54 55
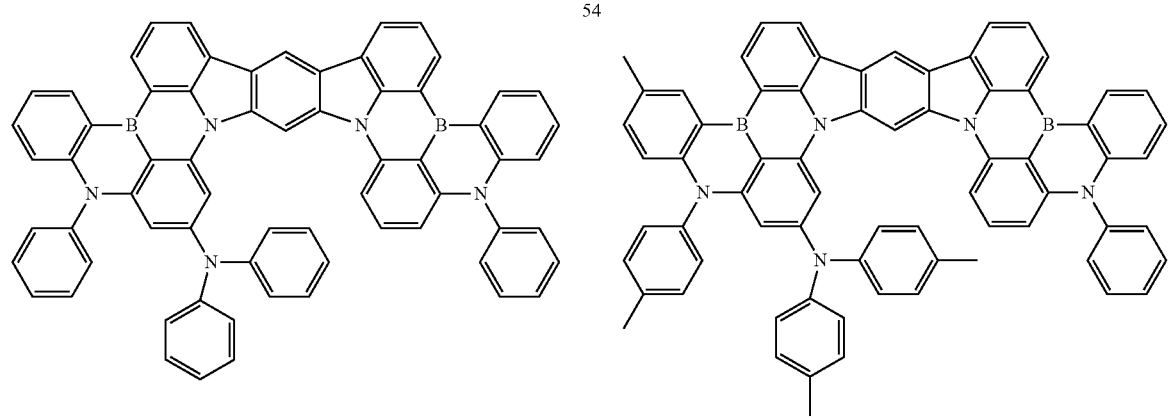

-continued
56
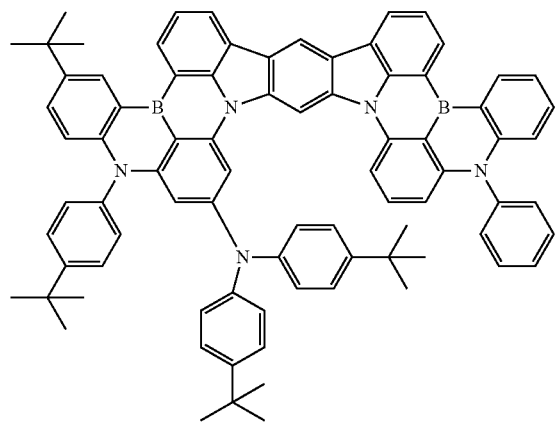
57
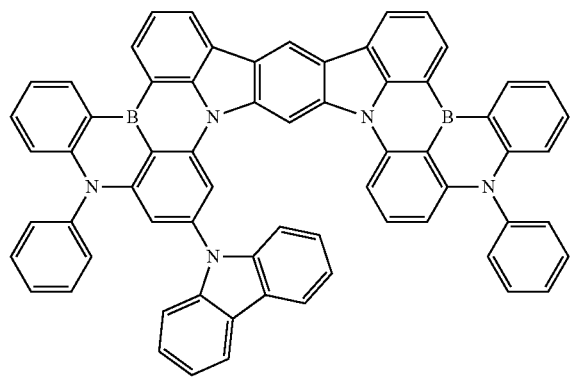
58
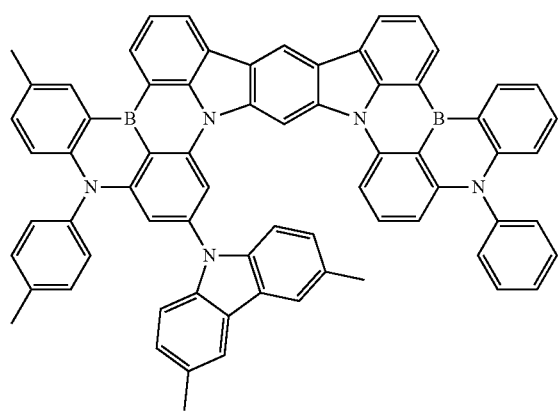
59
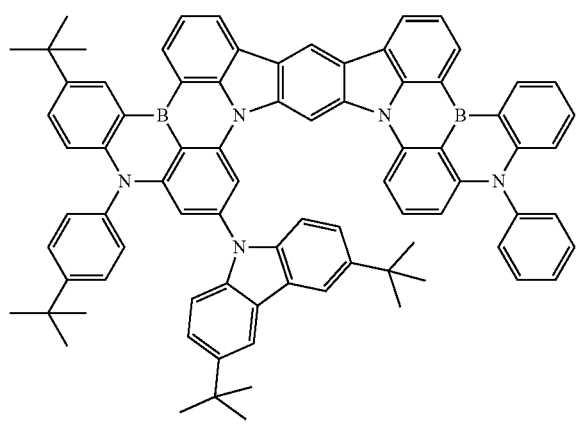
60
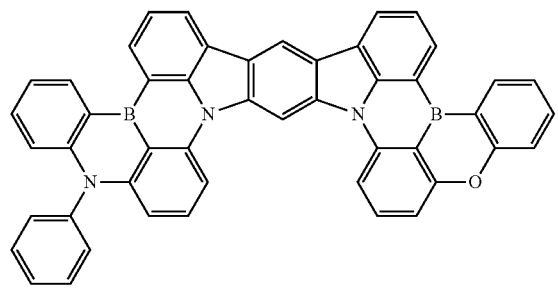
61
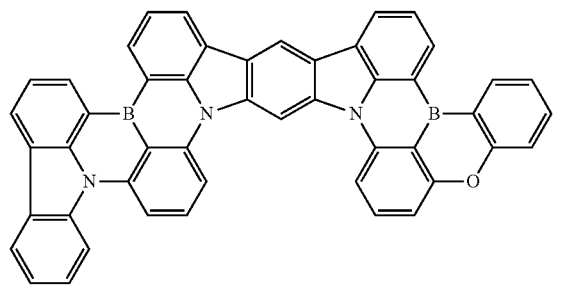
62
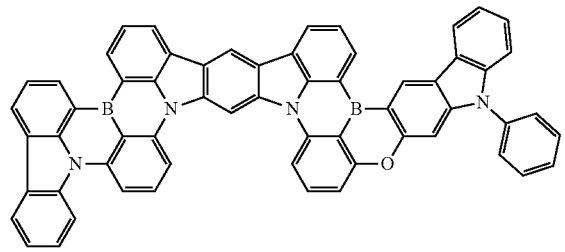
63
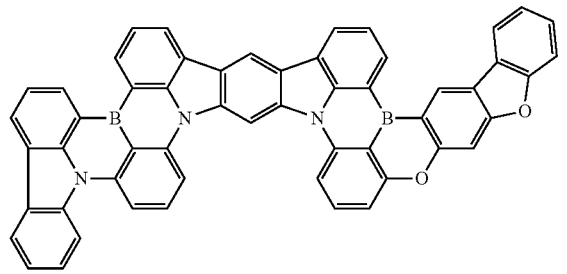

-continued
64
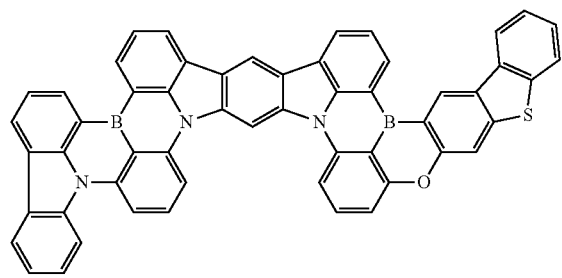
65
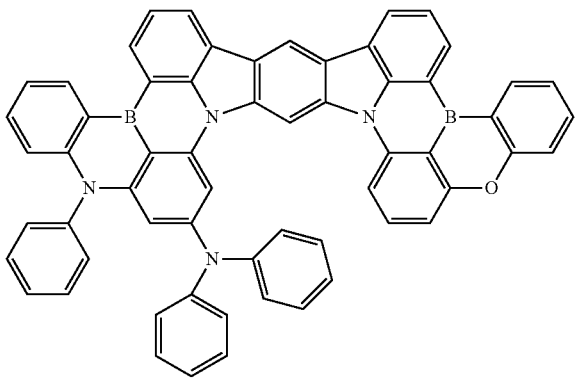
66
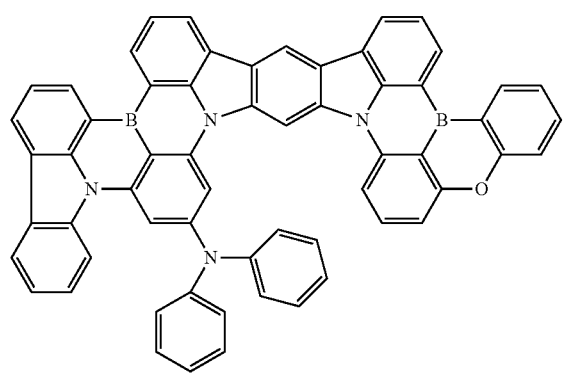
67
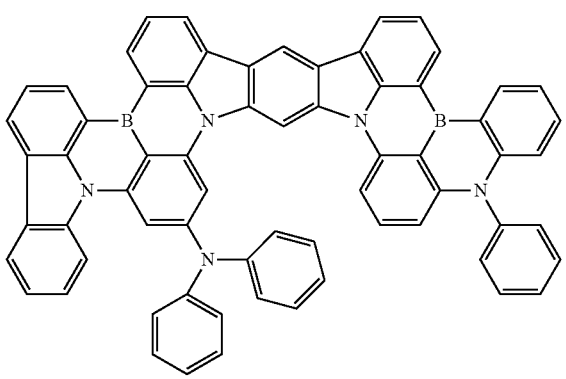
68
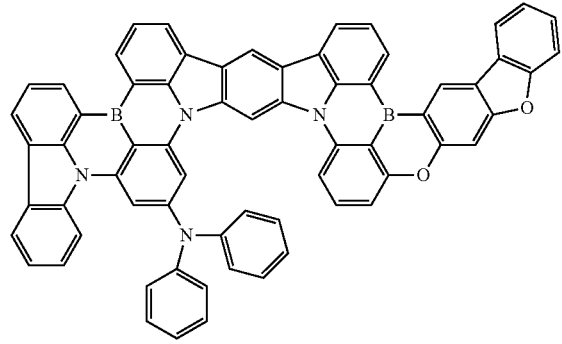
69
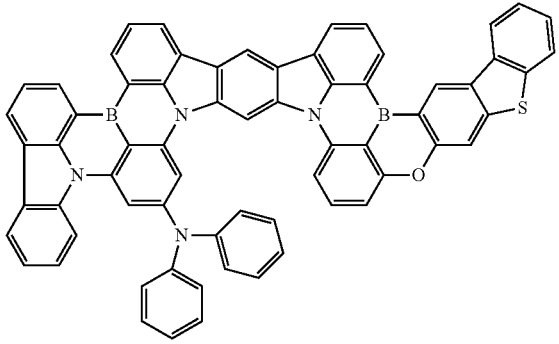
70
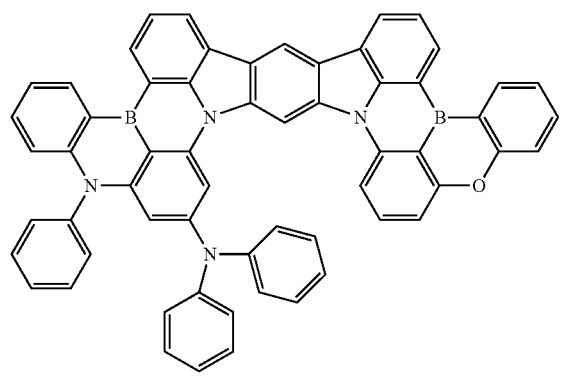
71
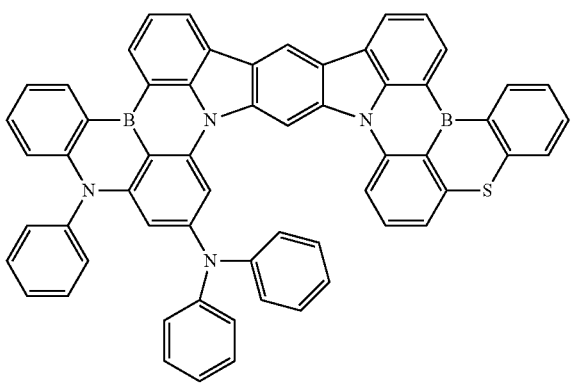

-continued
72
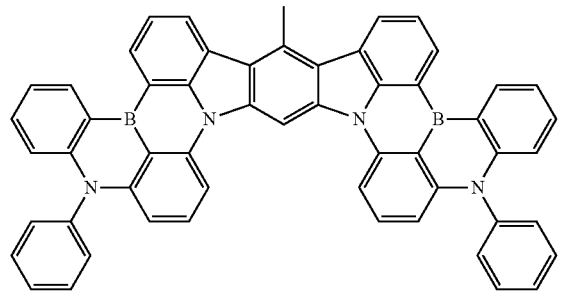
73
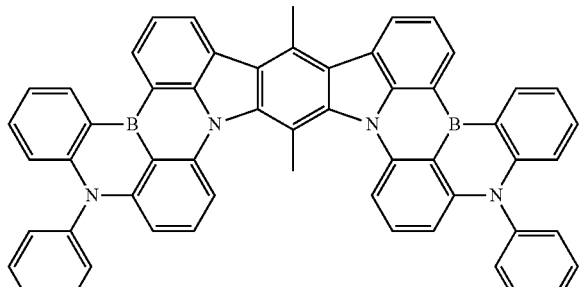
74
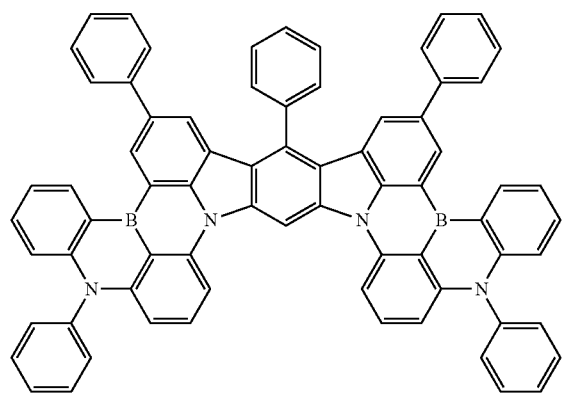
75
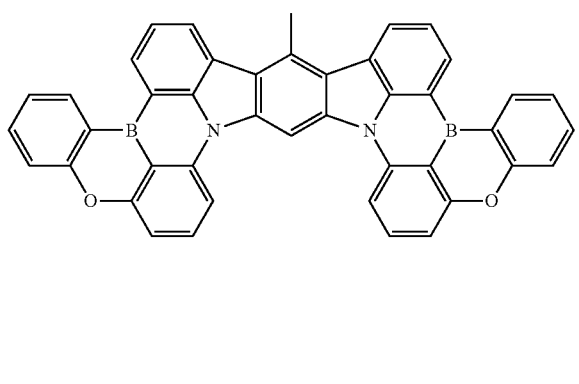
76
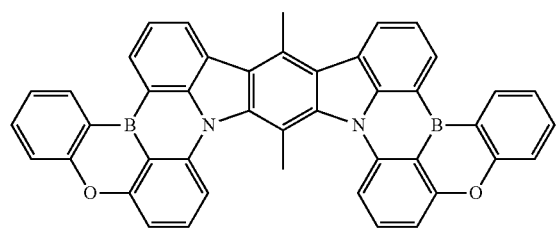
77
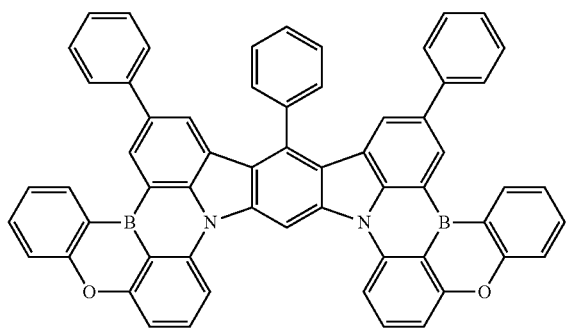
78
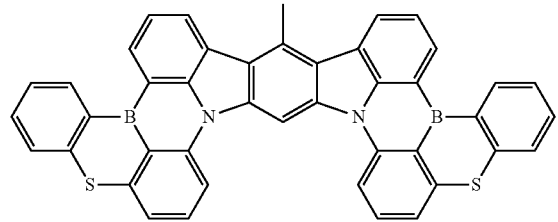
79
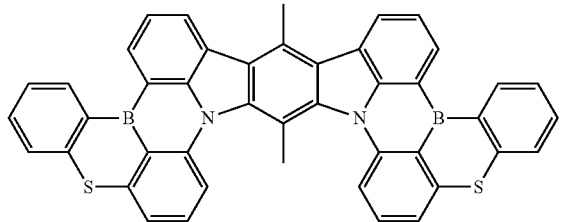
80
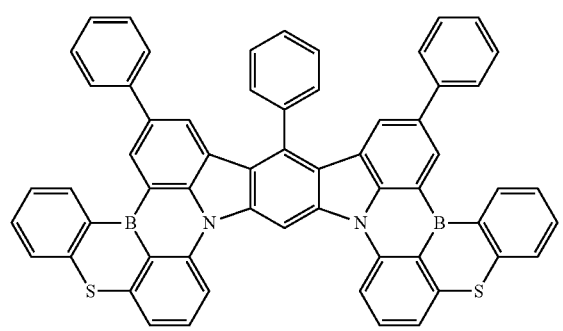
81

-continued
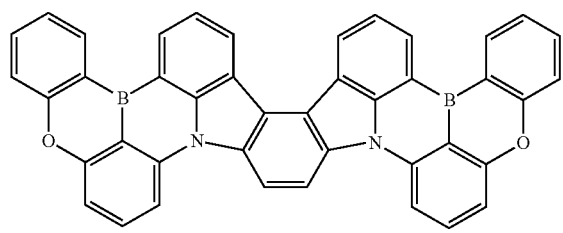
82
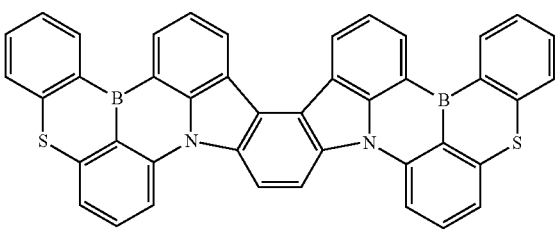
83
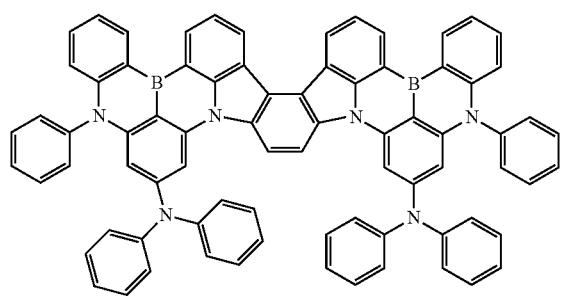
84
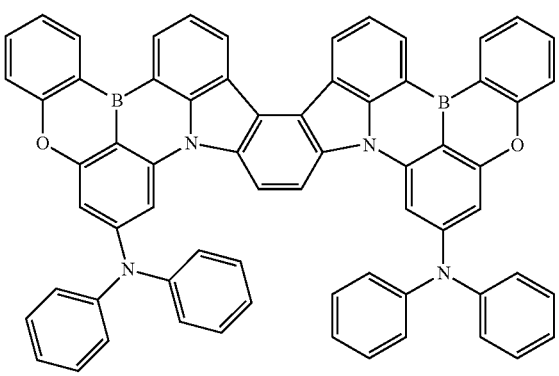
85
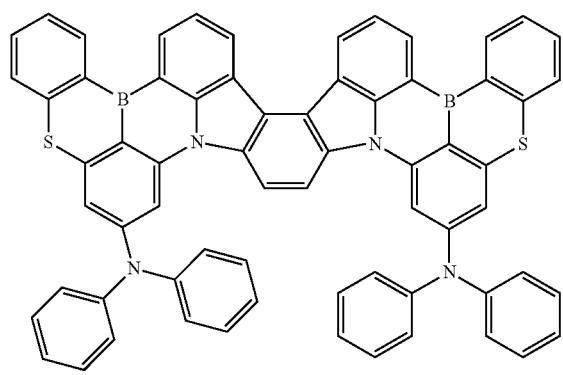
86
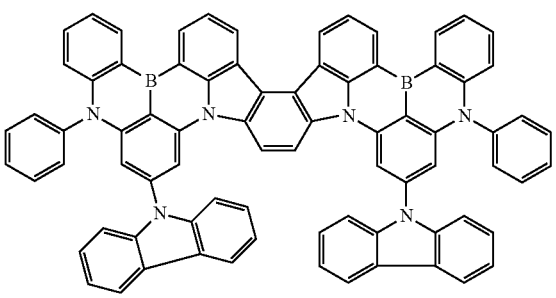
87
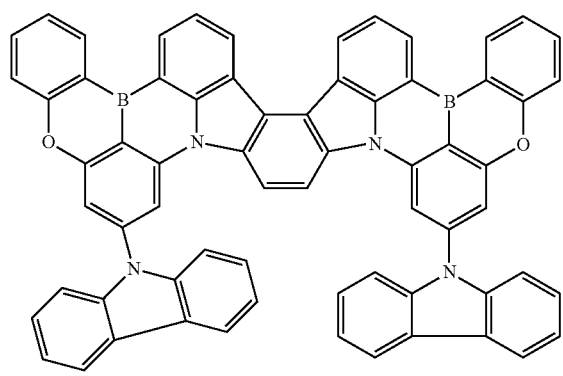
88
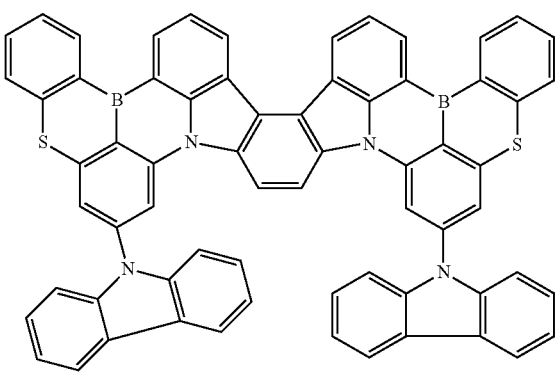
89

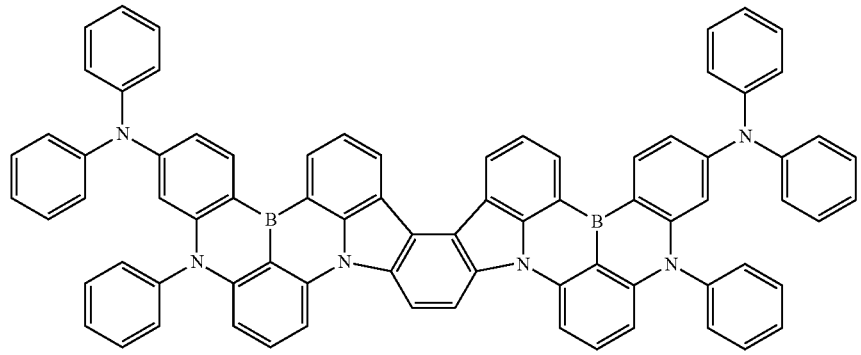
90
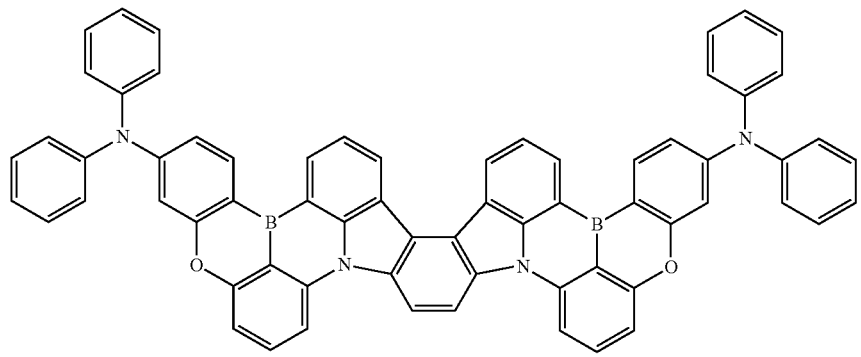
91
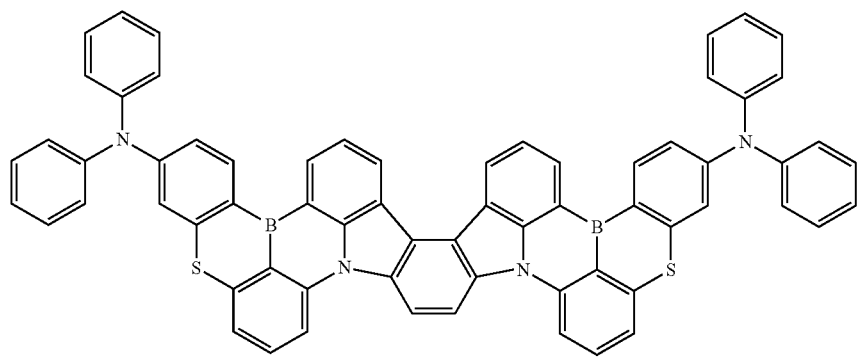
92
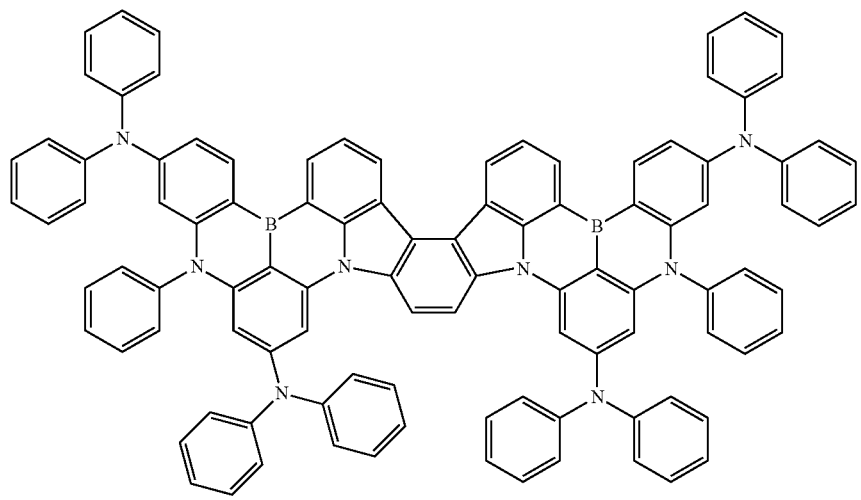
93

-continued
94
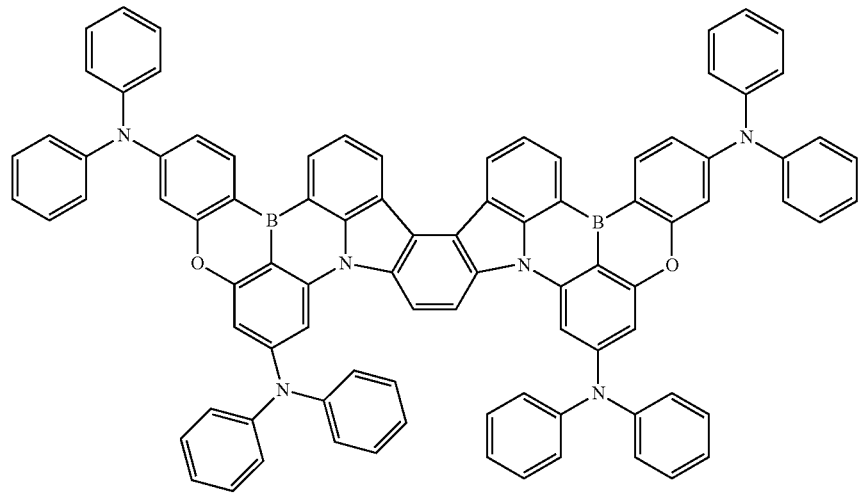
95
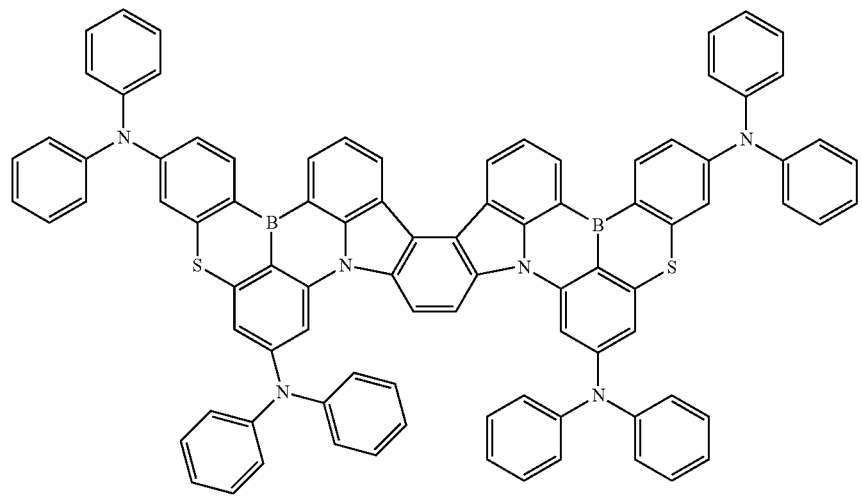
96
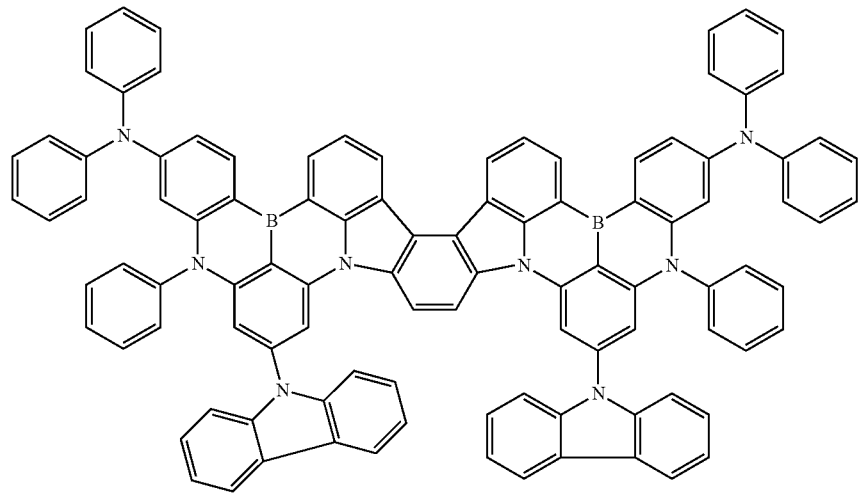

-continued
97
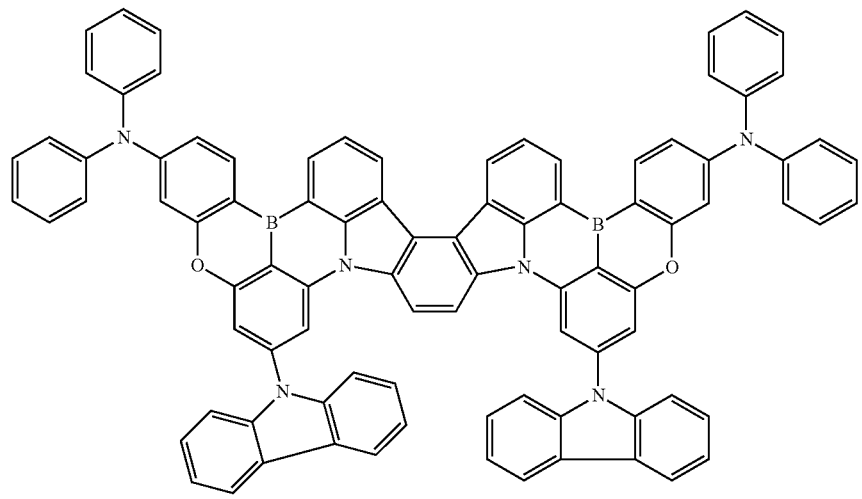
98
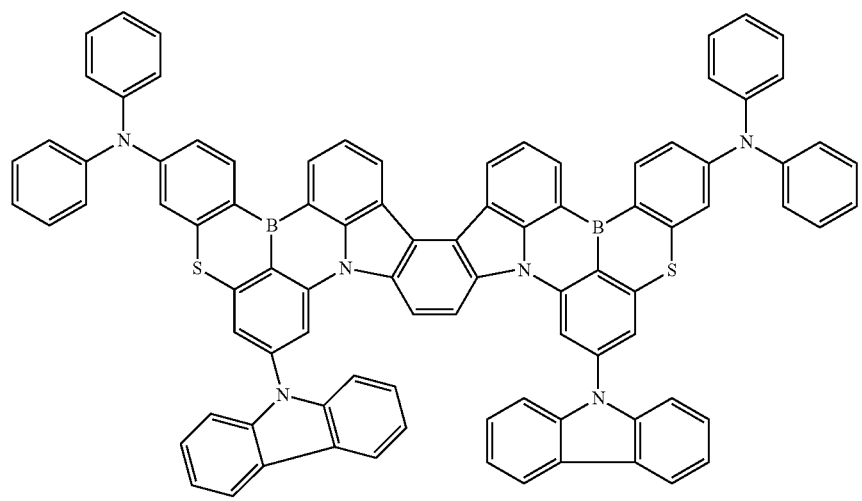
99
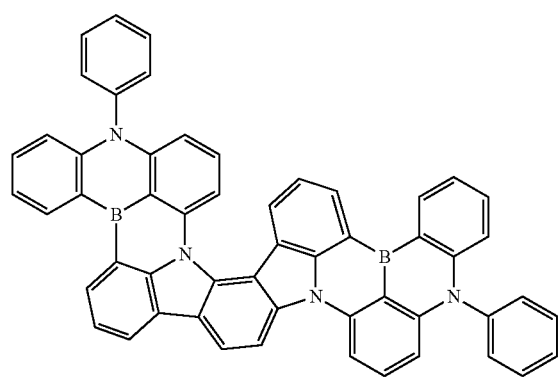
100
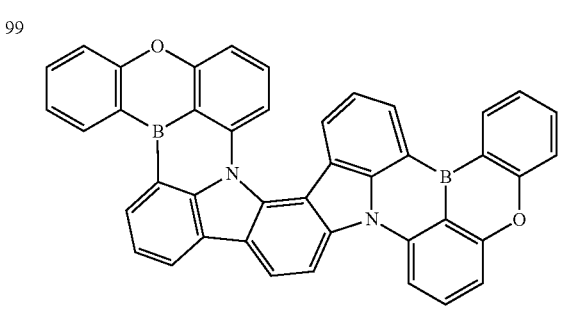
101
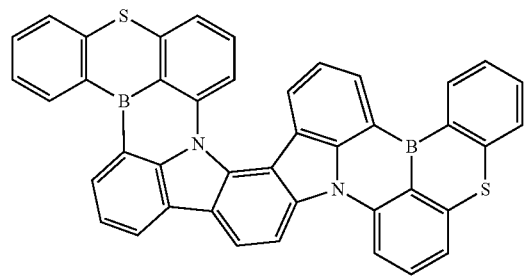

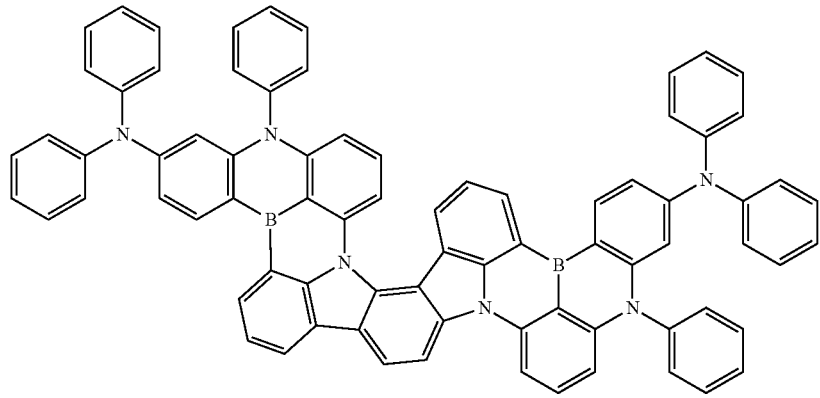
102
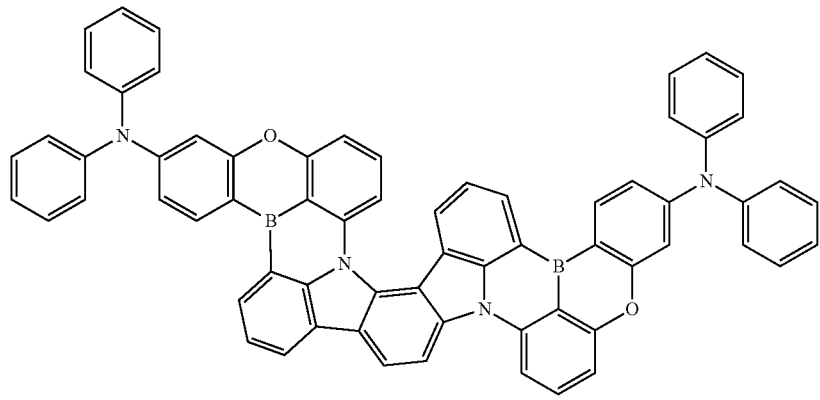
103
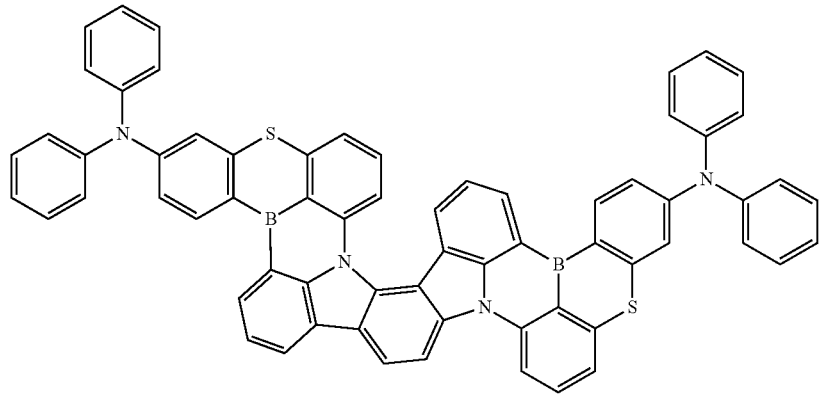
104

-continued
105
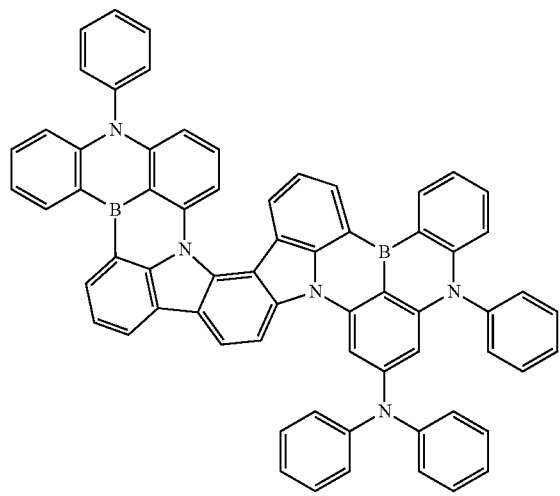
106
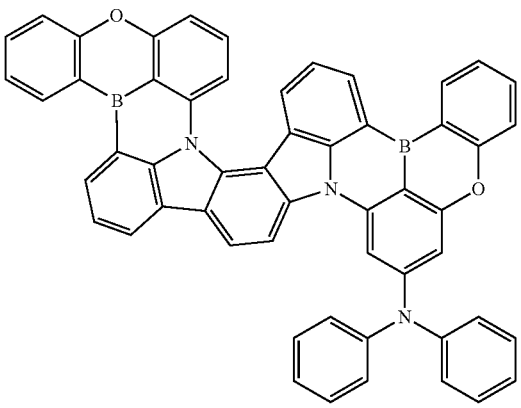
107
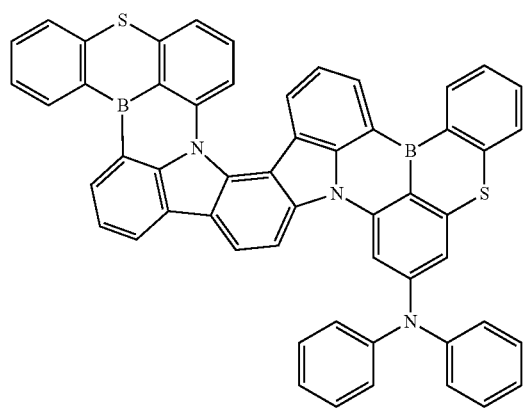
108
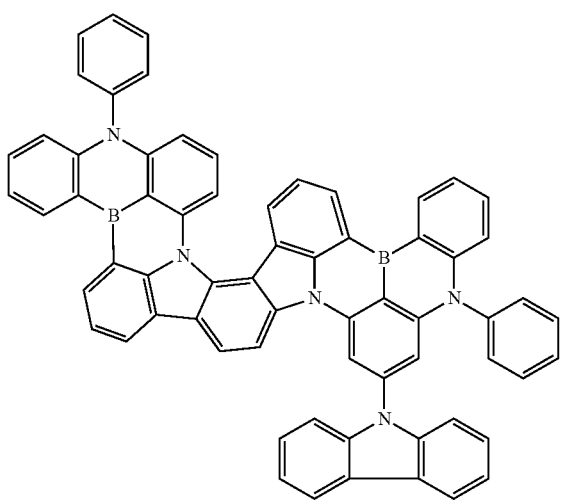
109
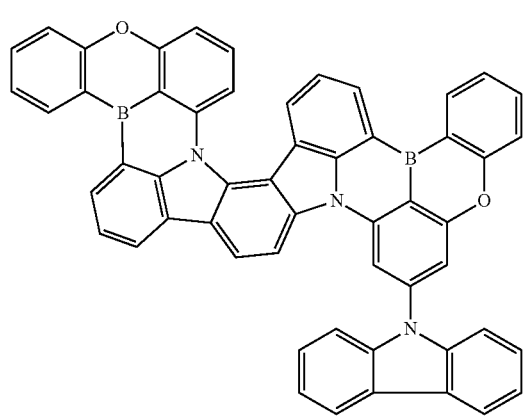
110
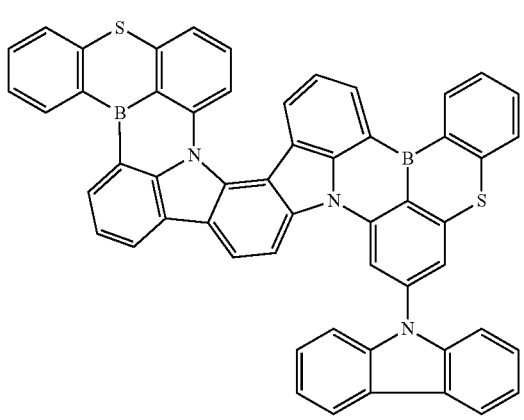

-continued
111
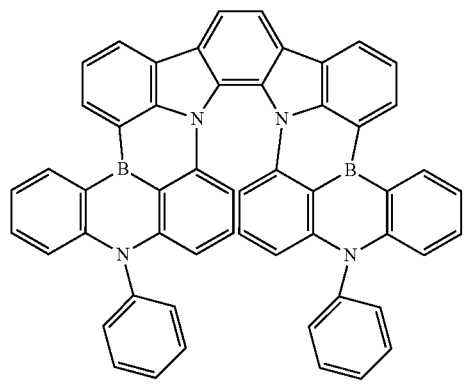
112
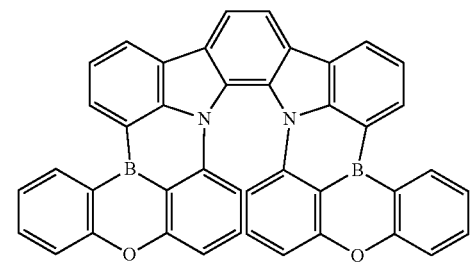
113
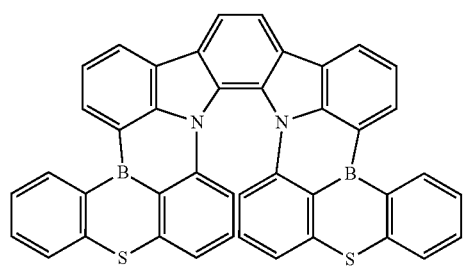
114
115
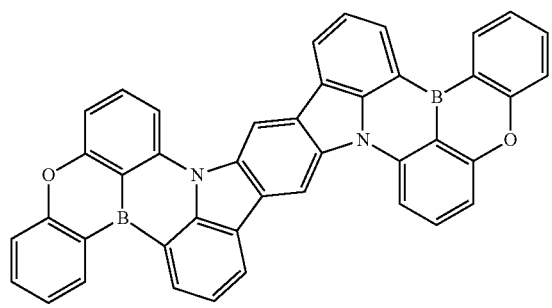
116
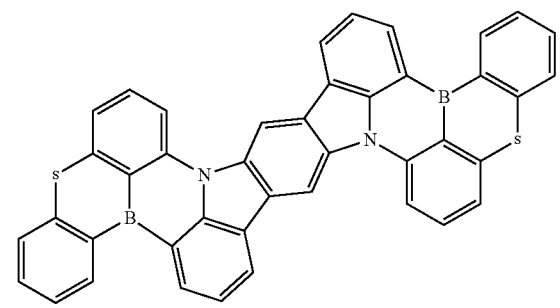
117
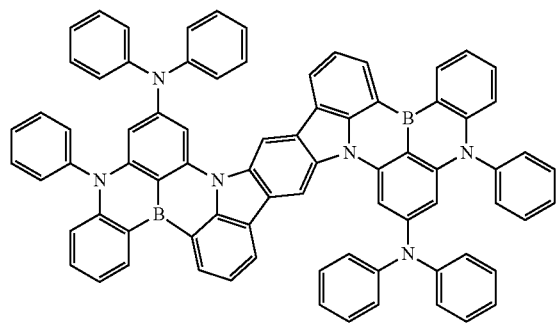
118
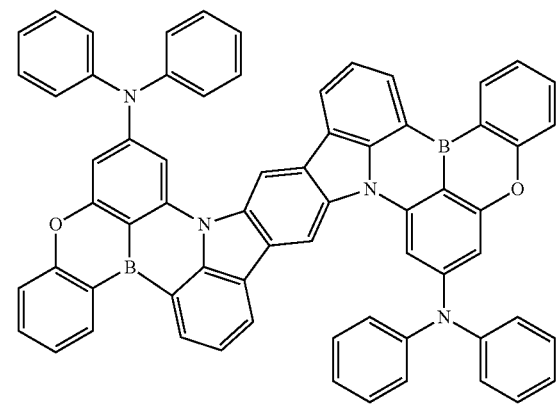

119
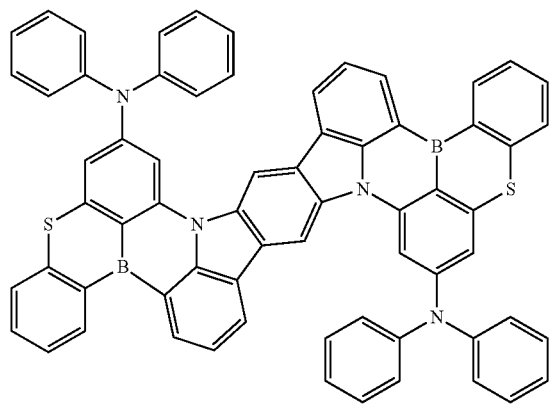
120
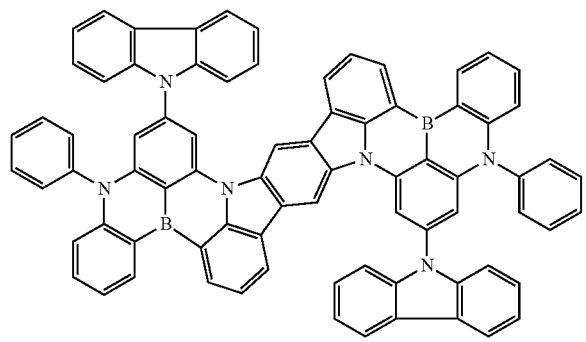
121
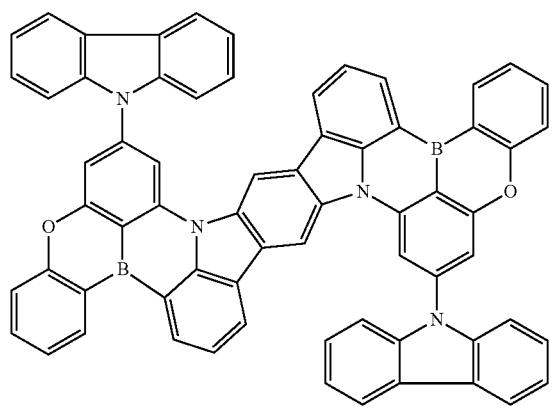
122
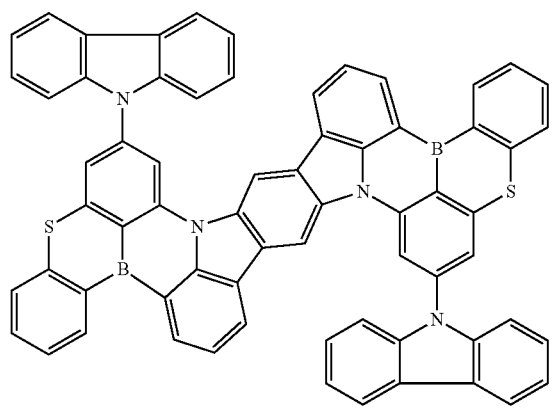
123
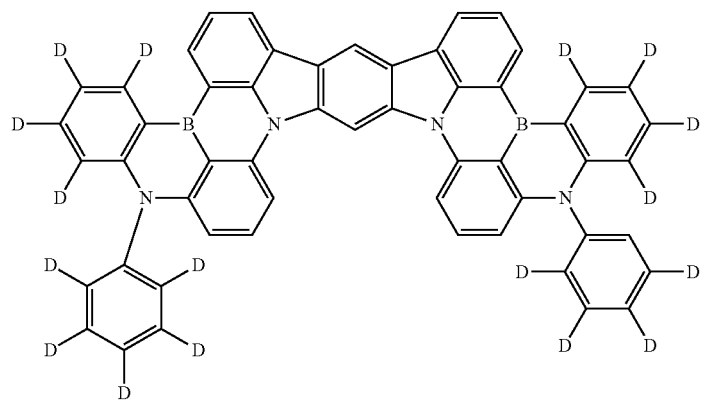

-continued
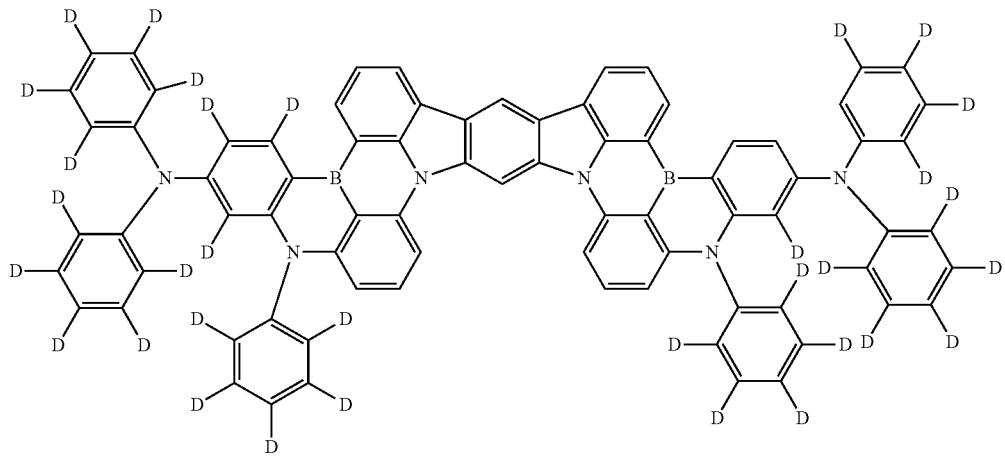
125
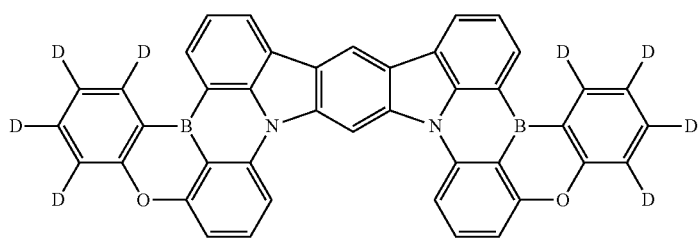
125
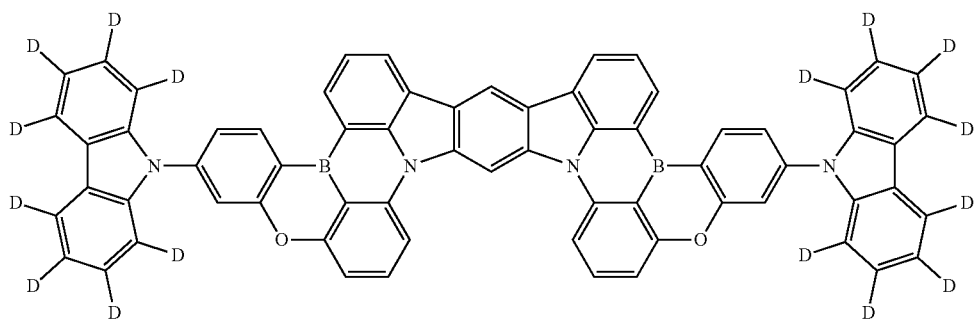
126
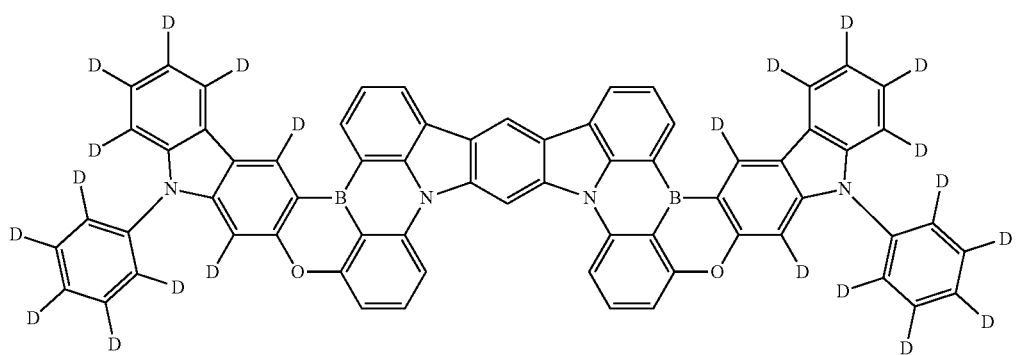
127

-continued
128
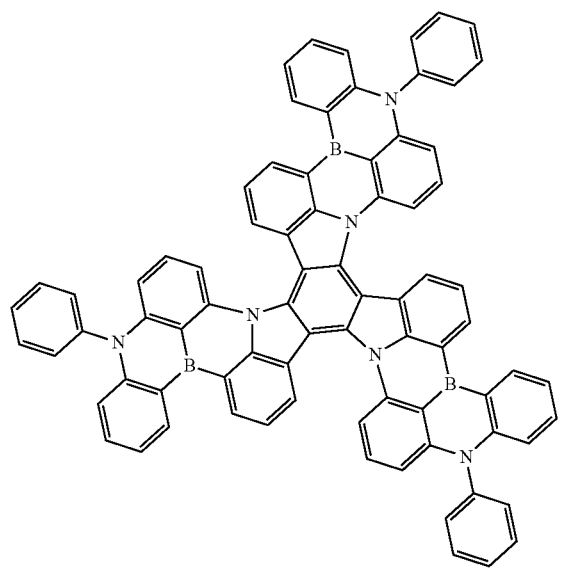
129
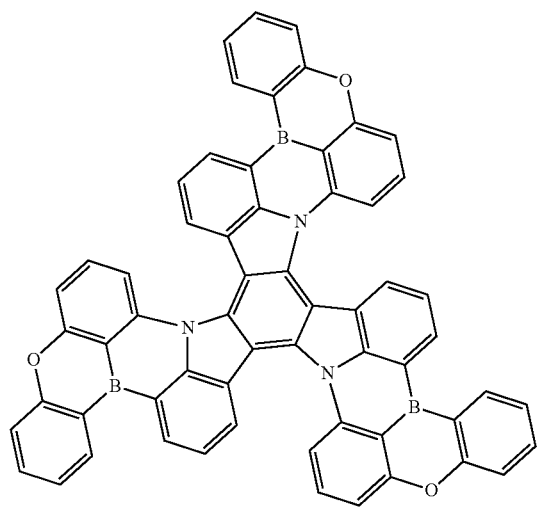
130
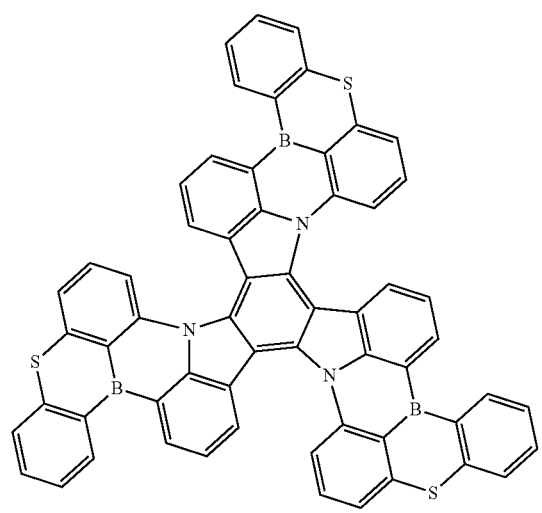
131
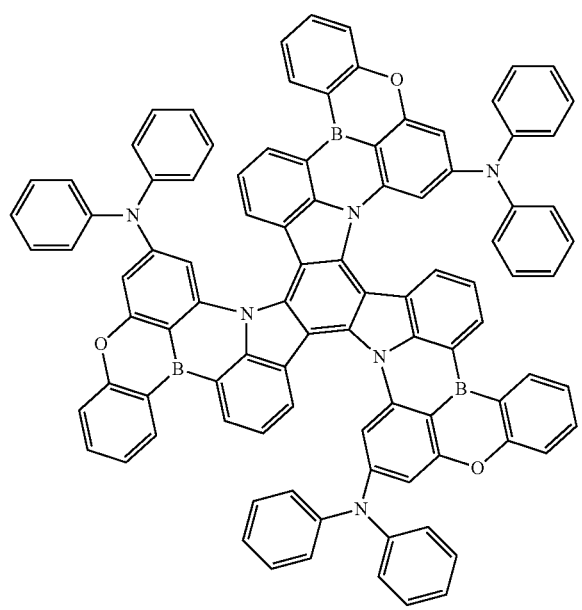

132

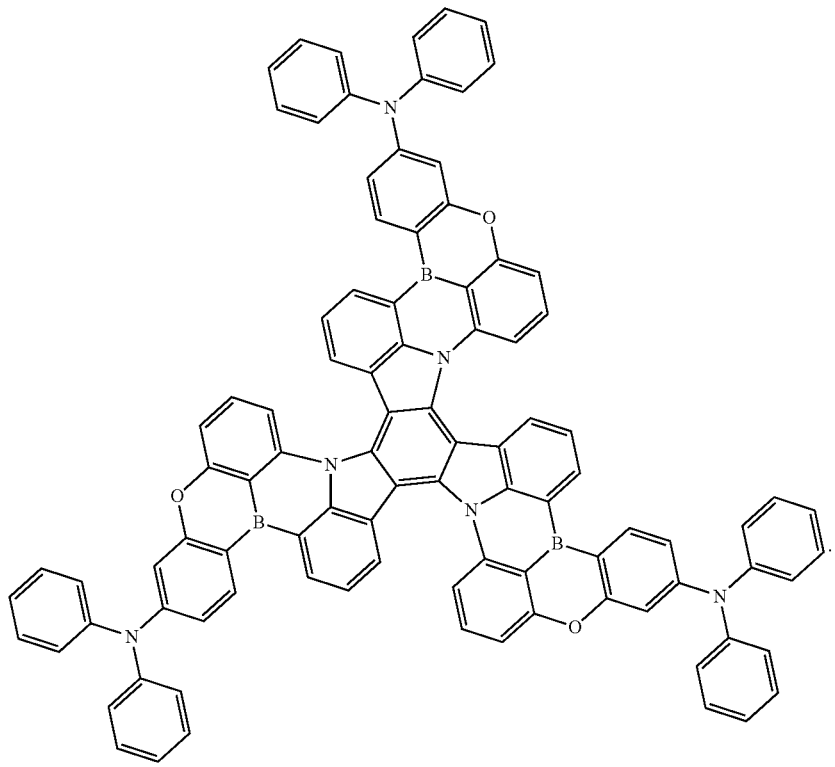

The condensed polycyclic compound of an embodiment may be used as a blue luminescence material. For example, the condensed polycyclic compound according to an embodiment may be used as a luminescence material to emit blue light having a luminescence center wavelength ($\lambda_{max}$) in a wavelength region of 485 nm or less. For example, the condensed polycyclic compound of an embodiment may be a luminescence material having a luminescence center wavelength in the 460 nm to 485 nm wavelength region. The condensed polycyclic compound represented by Formula 1 of an embodiment may be a blue thermally activated delayed fluorescence dopant.

The condensed polycyclic compound of an embodiment may have a molecular skeleton (e.g., structure or core) with multiple resonance structures, in which a plurality of 1,4-azaborine

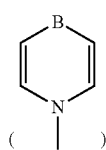

or 1,4-oxaborine

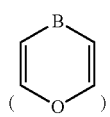

structures are condensed to a derivative of indolocarbazole. The condensed polycyclic compound of an embodiment may exhibit a high or increased lowest triplet excitation energy level (T1 level) due to a plurality of intramolecular distortions caused by having a molecular skeleton with multiple resonance structures, and may be used as a thermally activated delayed fluorescence (TADF) material to exhibit high luminous efficiency.

For example, the organic electroluminescent device of an embodiment may include the condensed polycyclic compound of an embodiment as described above in the emission layer to exhibit long service life characteristics and/or excellent color gamut.

The emission layer EML in the organic electroluminescence device 10 of an embodiment may be to emit a delayed fluorescence. For example, the emission layer EML may be to emit a thermally activated delayed fluorescence (TADF).

In some embodiments, the organic electroluminescence device 10 of an embodiment may include a plurality of emission layers. The plurality of emission layers may be sequentially stacked and provided, for example, the organic electroluminescence device 10 including the plurality of emission layers may be to emit white light. The organic electroluminescence device including a plurality of emission layers may be an organic electroluminescence device having a tandem structure. When the organic electroluminescence device 10 includes a plurality of emission layers, at least one emission layer EML may include the above-described condensed polycyclic compound of an embodiment.

The emission layer EML includes a first compound and a second compound different from the first compound, and the first compound may be the above-described condensed polycyclic compound of an embodiment. In an embodiment, the emission layer EML includes a host and a dopant, and may include the above-described condensed polycyclic compound of an embodiment as a dopant. For example, the emission layer EML in the organic electroluminescence device 10 of an embodiment may include a host to emit a delayed fluorescence and a dopant to emit a delayed fluorescence, and may include the above-described condensed polycyclic compound of an embodiment as a dopant to emit a delayed fluorescence. The emission layer EML may include at least one of the condensed polycyclic compounds represented by Compound Group 1 as a thermally activated delayed fluorescence dopant.

In an embodiment, the emission layer EML may be a delayed fluorescence emission layer, and the emission layer EML may include any suitable host material with the above-described condensed polycyclic compound of an embodiment. For example, in an embodiment, the condensed polycyclic compound may used as a TADF dopant.

The emission layer EML may include one, or two or more of the condensed polycyclic compounds of Compound Group 1.

The emission layer EML in the organic electroluminescence device 10 of an embodiment may include any suitable dopant material. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-Bis(diphenylphosphoryl)dibenzo[b,d]furan (PPF), 4,4',4''-tris(carbazol-9-yl)-triphenylamine (TcTa), or 1,3,5-tris(1-phenyl-1H-benz[d]imidazole-2-yl)benzene (TPBi). However, embodiments are not limited thereto, and for example, tris(8-hydroxyquinolino)aluminum ($Alq_3$), poly(N-vinylcarbazole) (PVK), 9,10-di(naphthalene-2-yl) anthracene (ADN), 3-tert-butyl-9,10-di(napth-2-yl)anthracene (TBADN), distyrylarylene (DSA), 4,4'-bis(9-carbazolyl)-2,2'-dimethyl-biphenyl (CDBP), 2-methyl-9,10-bis (naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as a host material.

In an embodiment, the emission layer EML may further include any suitable dopant material. In an embodiment, the emission layer EML may further include, as a dopant material, styryl derivatives (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylam ino)styryl)naphthalen-2-yl)vinyl) phenyl)-N-phenylbenz enamine (N-BDAVBi), perylene and derivatives thereof (e.g., 2,5,8,11-tetra-t-butylperylene (TBP)), pyrene and derivatives thereof (e.g., 1-dipyrene, 1,4-dipyrenylbenzene, 1,4-bis(N,N-diphenylamino)pyrene), etc.

In the organic electroluminescence device 10 of an embodiment illustrated in FIGS. 1 to 4, the electron transport region ETR is provided on the emission layer EML. The electron transport region ETR may include at least one of a hole blocking layer HBL, an electron transport layer ETL, or an electron injection layer EIL, but embodiments are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL or a hole blocking layer HBL/electron transport layer ETL/electron injection layer EIL are stacked in order from the emission layer EML, but is not limited thereto. The thickness of the electron transport region ETR may be, for example, about 1000 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, a laser induced thermal imaging (LITI) method), etc.

When the electron transport region ETR includes the electron transport layer ETL, the electron transport region ETR may include an anthracene-based compound. However, embodiments are not limited thereto, and the electron transport region may include, for example, tris(8-hydroxyquinolinato)aluminum ($Alq_3$), 1,3,5-tri[(3-pyridy)-phen-3-yl]benzene, 2,4,6-tris(3'-(pyridin-3-yl)biphenyl-3-yl)-1,3,5-triazine, 2-(4-(N-phenylbenzimidazolyl-1-yl phenyl)-9,10-dinaphthylanthracene, 1,3,5-tri(1-phenyl-1H-benz[d] imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate) (Bebq2), 9,10-di(naphthalene-2-yl)anthracene (ADN), 1,3-bis[3,5-di(pyridin-3-yl)phenyl]benzene (BmPyPhB), or a mixture thereof. The thickness of the electron transport layer ETL may be about 100 Å to about 1,000 Å, for example, about 150 Å to about 500 Å. When the thickness of the electron transport layers ETL satisfies the above-described range, satisfactory electron transport characteristics may be obtained without a substantial increase in driving voltage.

When the electron transport region ETR includes the electron injection layer EIL, the electron transport region ETR may be formed using metal halides (such as LiF, NaCl, CsF, RbCl, RbI, and/or CuI), lanthanum metals (such as Yb), metal oxides (such as $Li_2O$ and/or BaO), lithium quinolate (Liq), etc., but embodiments are not limited thereto. The electron injection layer EIL may also be formed of a mixture material of an electron transport material and an insulating organo-metal salt. The organo-metal salt may be a material having an energy band gap of about 4 eV or more. In some embodiments, the organo-metal salt may include, for example, metal acetates, metal benzoates, metal acetoacetates, metal acetylacetonates, and/or metal stearates. The thickness of the electron injection layers EIL may be about 1 Å to about 100 Å, or about 3 Å to about 90 Å. When the thickness of the electron injection layers EIL satisfies the above-described range, satisfactory electron injection properties may be obtained without a substantial increase in driving voltage.

The electron transport region ETR may include a hole blocking layer HBL as described above. The hole blocking layer HBL may include, for example, at least one of 2,9-dimethyl-4,7-diphenyl-1,10-phenanthroline (BCP) or 4,7-diphenyl-1,10-phenanthroline (Bphen), but is not limited thereto.

The second electrode EL2 is provided on the electron transport region ETR. The second electrode EL2 may be a common electrode and/or a negative electrode (cathode). The second electrode EL2 may be a transmissive electrode, a transflective electrode, or a reflective electrode. When the second electrode EL2 is a transmissive electrode, the second electrode EL2 may include a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the first electrode EL1 may have a multilayer structure including a reflective layer or a transflective layer formed of the above-described materials, and a transparent conductive layer formed of ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

In some embodiments, a capping layer CPL may be further disposed on the second electrode EL2 of the organic electroluminescence device 10 according to an embodiment. The capping layer CPL may include, for example, α-NPD, NPB, TPD, m-MTDATA, Alq$_3$, CuPc, N4,N4,N4',N4'-tetra (biphenyl-4-yl) biphenyl-4,4'-diamine (TPD15), 4,4',4"-tris (carbazol-9-yl) triphenylamine (TCTA), etc.

In the organic electroluminescence device 10, when a voltage is applied across the first electrode EL1 and the second electrode EL2, holes injected from the first electrode EL1 are moved through the hole transport region HTR to the emission layer EML, and the electrons injected from the second electrode EL2 are moved through the electron transport region ETR to the emission layer EML. The electrons and holes are recombined in the emission layer EML to generate excitons and emit light when the excitons fall to a ground state from an excited state.

The organic electroluminescence device 10 according to an embodiment of the present disclosure may include the above-described condensed polycyclic compound of an embodiment in the emission layer EML disposed between the first electrode EL1 and the second electrode EL2 to exhibit excellent luminous efficiency in a blue wavelength region. In some embodiments, the condensed polycyclic compound according to an embodiment may be a thermally activated delayed fluorescence dopant, and the emission layer EML may include the condensed polycyclic compound of an embodiment to emit a thermally activated delayed fluorescence, thereby exhibiting high luminous efficiency characteristics.

In some embodiments, the above-described compound of an embodiment may be included as a material for the organic electroluminescence device 10 in an organic layer other than the emission layer EML. For example, the organic electroluminescence device 10 according to an embodiment of the present disclosure may also include the above-described condensed polycyclic compound in at least one functional layer disposed between the first electrode EL1 and the second electrode EL2, and/or in the capping layer CPL disposed on the second electrode EL2.

The above-described condensed polycyclic compound of an embodiment may include a structure in which aromatic rings such as 1,4-azaborine

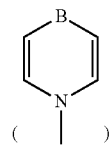

or 1,4-oxaborine

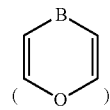

are condensed to a derivative of indolocarbazole.

Therefore, the condensed polycyclic compound of an embodiment may exhibit a high or increased lowest triplet excitation energy level due to a plurality of intramolecular distortions caused by having a molecular skeleton with multiple resonance structures, and may be used as a delayed fluorescence emitting material.

The organic electroluminescence device of an embodiment including the condensed polycyclic compound of an embodiment in the emission layer may be to emit blue light and exhibit excellent luminous efficiency.

Hereinafter, with reference to Examples and Comparative Examples, a condensed polycyclic compound according to an embodiment of this present disclosure and an organic electroluminescence device of an embodiment will be described in more detail. The Examples shown below are illustrated only for the understanding of this present disclosure, and the scope of the present disclosure is not limited thereto.

1. Synthetic Examples

A condensed polycyclic compound according to an embodiment of the present disclosure may be synthesized as, for example, as follows. The following synthetic methods of the condensed polycyclic compound are provided as examples, and are not limited to the following examples.

1-1. Synthesis of Compound 1

[Reaction Formula 1]

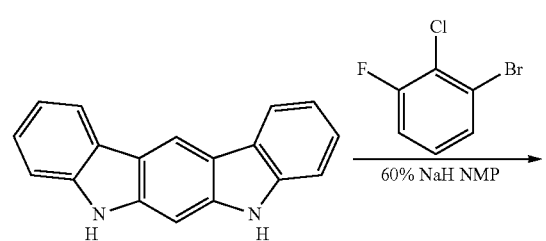

-continued

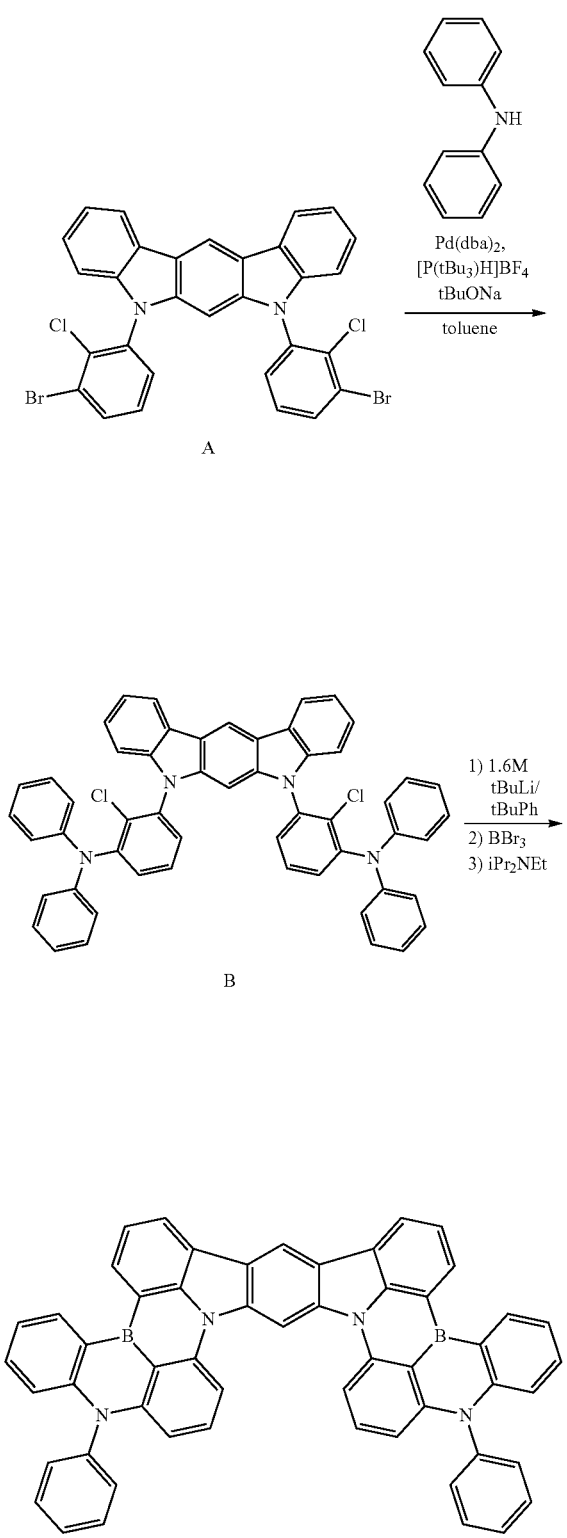

(1) Synthesis of Intermediate Compound A 5,7-dihydroindolo[2,3-b]carbazole (10.0 g, 39 mmol) was added to 1-methyl-2-pyrrolidone (NMP, 50 mL), and 60% NaH (3.90 g, 163 mmol) was added thereto and stirred at room temperature for 1 hour. 1-bromo-2-chloro-3-fluorobenzene (24.5 g, 117 mmol) was added thereto and stirred at 100° C. for 24 hours. The reaction was allowed to cool, water was added thereto, the mixture was filtered and washed with water, and the crystals were dried to obtain Intermediate Compound A (15.0 g, yield 67%).

(2) Synthesis of Intermediate Compound B

Intermediate Compound A (15.0 g, 24 mmol), diphenylamine (10.0 g, 59 mmol) bis(dibenzylidene acetone) palladium (0) (Pd(dba)$_2$ (0.81 g, 1.4 mmol), tri-tert-butylphosphonium tetrafluoroborate [P($^t$Bu)$_3$H]BF$_4$ (0.34 g, 1.89 mmol), and sodium tert-butoxide ($^t$BuONa, 6.81 g, 71 mmol) were added to toluene (120 mL) and stirred at 90° C. for 6 hours. The mixture was allowed to cool and liquid-separated by adding toluene and water. The organic layer was concentrated, purified by column chromatography (silica gel), concentrated, filtered out, and washed with hexane to obtain Intermediate Compound B (15.3 g, yield 80%).

(3) Synthesis of Compound 1

Intermediate Compound B was added to tert-butylbenzene (100 mL) and cooled to −25° C. 1.6 M tert-butyl lithium (in pentane) solution (46 mL, 74 mmol) was added thereto, heated up gradually, and stirred at 60° C. for 3 hours. The reaction solution was cooled to −10° C., and BBr$_3$ (18.5 g, 74 mmol) was added thereto. After stirring at room temperature for 1 hour, N,N-diisopropylethylamine (9.6 g, 74 mmol) was added thereto under ice cooling, and the reaction solution was stirred at 100° C. for 1 hour. The reaction was allowed to cool, toluene was added thereto, and the resultant mixture was liquid-separated by adding water to concentrate an organic layer. The concentrated organic layer was purified by column chromatography (silica gel) to obtain Compound 1 (2.8 g, yield 20%). Sublimation purification (350° C., 3.7×10$^{-3}$ Pa) was carried out and elemental analysis was performed. It was confirmed that the molecular weight was 758 (M$^+$+1) by FAB-MS (m/z) measurement.

1-2. Synthesis of Compound 7

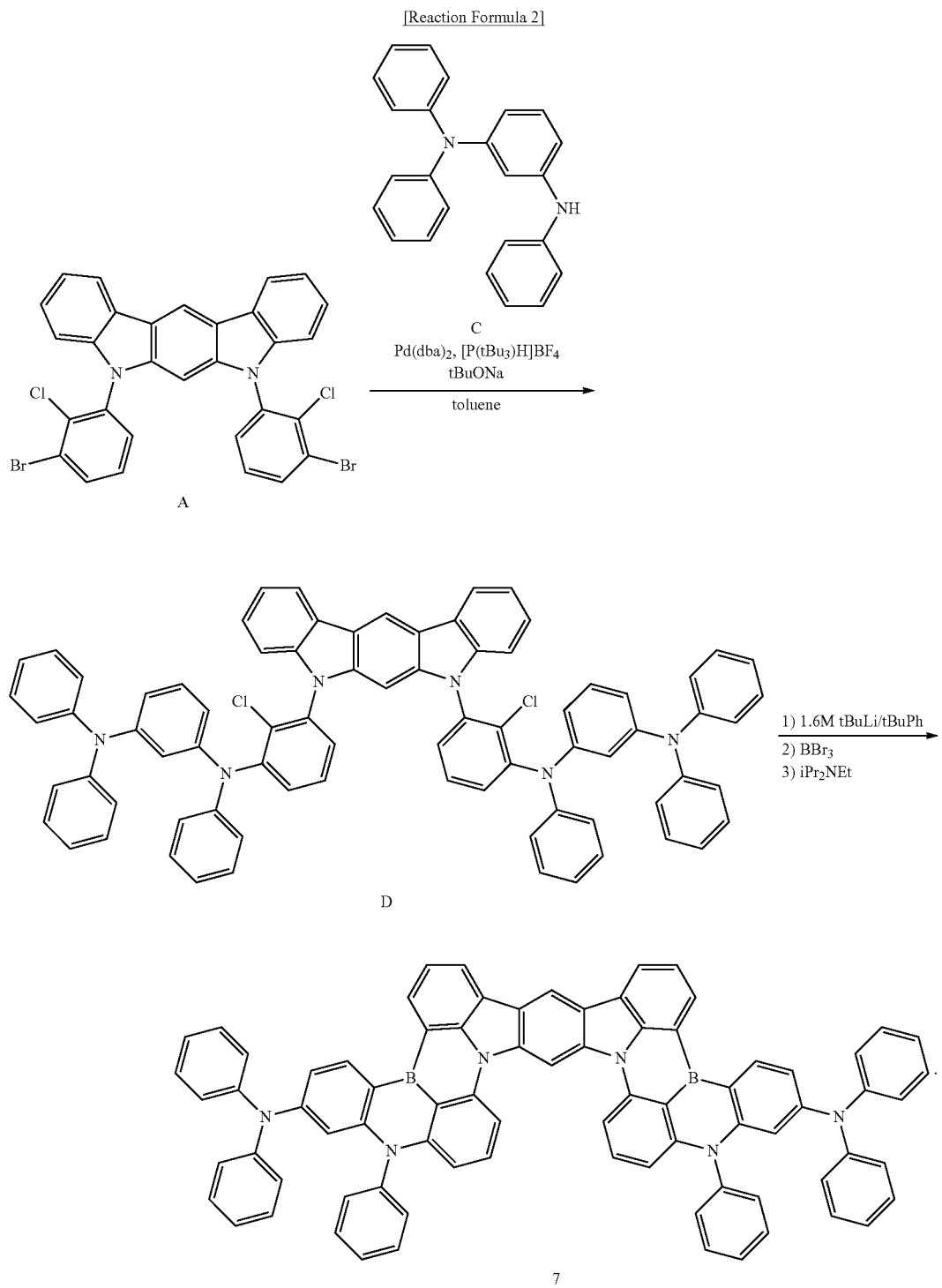

(1) Synthesis of Compound 7

Intermediate Compound D was obtained from Intermediate Compound A using substantially the same method as the synthesis of Intermediate Compound B, except for using Intermediate Compound C instead of diphenylamine. Compound 7 was obtained using substantially the same method as the synthesis of Compound 1, except for using Intermediate Compound D instead of Intermediate Compound B. Sublimation purification (420° C., 3.0×10⁻³ Pa) was carried out and elemental analysis was performed. It was confirmed that the molecular weight was 1092 (M⁺+1) by FAB-MS (m/z) measurement.

1-3. Synthesis of Compound 28

[Reaction Formula 3]

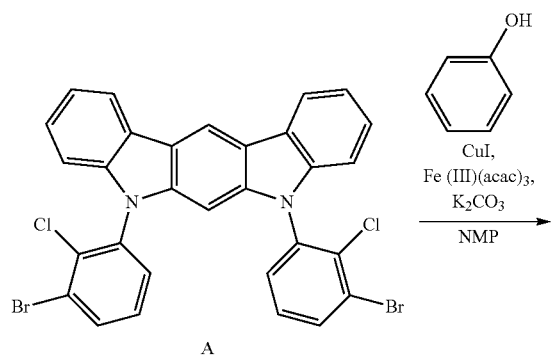

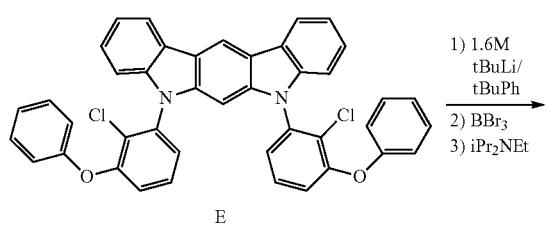

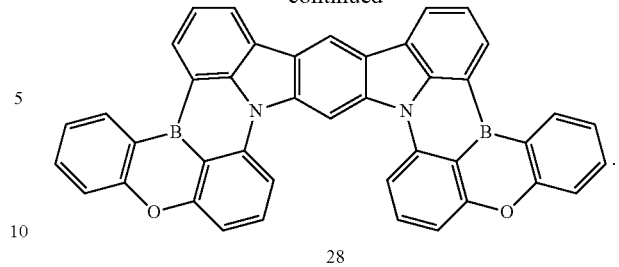

(1) Synthesis of Intermediate Compound E

Intermediate Compound A (10.0 g, 16 mmol), phenol (3.7 g, 39 mmol), CuI (0.15 g, 0.79 mmol), tris(2,4-pentanedionato) iron(III) (Fe(III)(acac)$_3$, 0.51 g, 1.6 mmol), and K$_2$CO$_3$ (8.70 g, 63 mmol) were added to NMP (50 mL) and heated and stirred at 180° C. for 24 hours. The reaction was allowed to cool, CH$_2$Cl$_2$ and water were added thereto, and the resultant mixture was subjected to liquid separation to concentrate an organic layer. The concentrated organic layer was purified by column chromatography (silica gel) to obtain Intermediate Compound E (9.2 g, yield 88%).

(2) Synthesis of Compound 28

Compound 28 was obtained using substantially the same method as the synthesis of Compound 1, except for using Intermediate Compound E instead of Intermediate Compound B. Sublimation purification (380° C., 6.2×10$^{-3}$ Pa) was carried out and elemental analysis was performed. It was confirmed that the molecular weight was 608 (M$^+$+1) by FAB-MS (m/z) measurement.

1-4. Synthesis of Compound 31

[Reaction Formula 4]

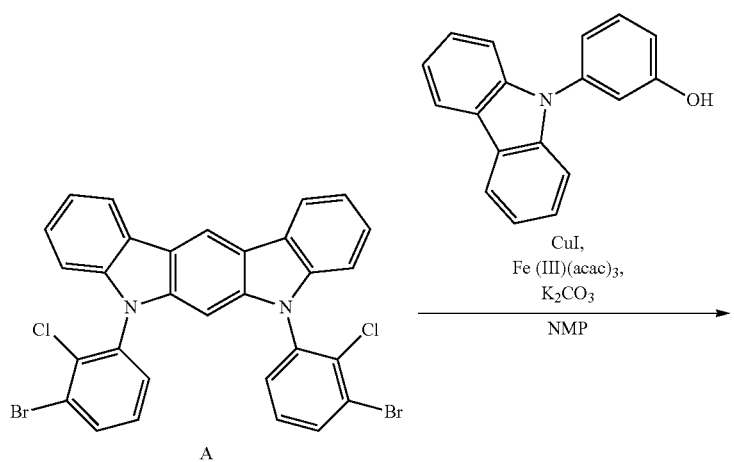

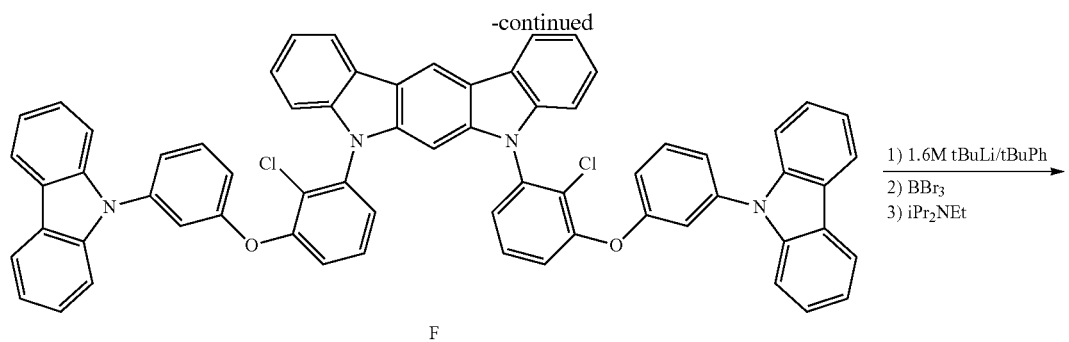

F

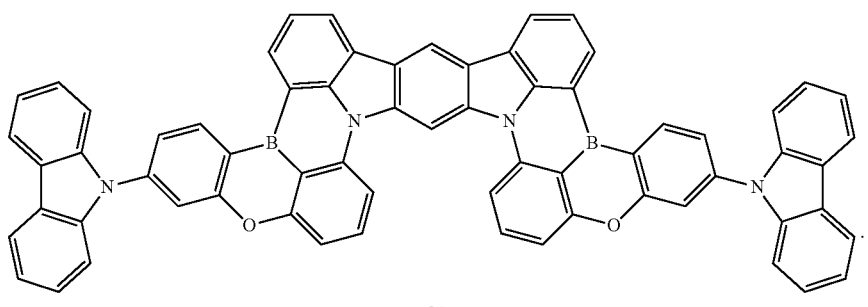

31

(1) Synthesis of Intermediate Compound F

Intermediate Compound F was obtained using substantially the same method as the synthesis of Intermediate Compound E, except for using 3-(9H-carbazol-9-yl)phenol instead of phenol.

(2) Synthesis of Compound 31

Compound 31 was obtained using substantially the same method as the synthesis of Compound 1, except for using Intermediate Compound F instead of Intermediate Compound B. Sublimation purification (410° C., 5.8×10$^{-3}$ Pa) was carried out and elemental analysis was performed. It was confirmed that the molecular weight was 938 (M$^+$+1) by FAB-MS (m/z) measurement.

1-5. Synthesis of Compound 38

[Reaction Formula 4]

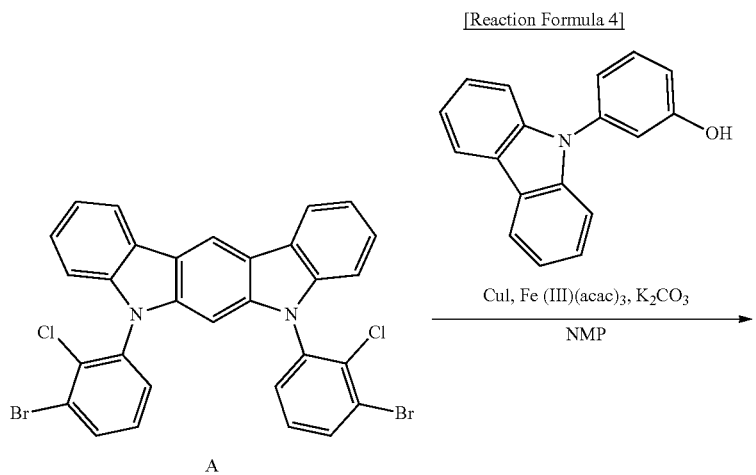

A

-continued

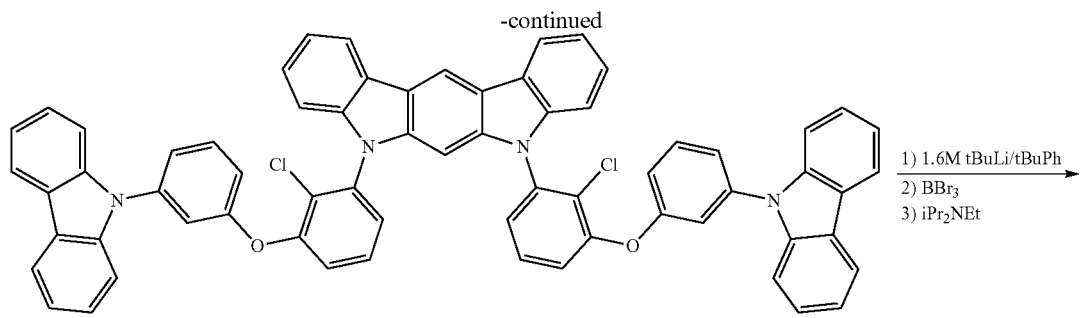

F

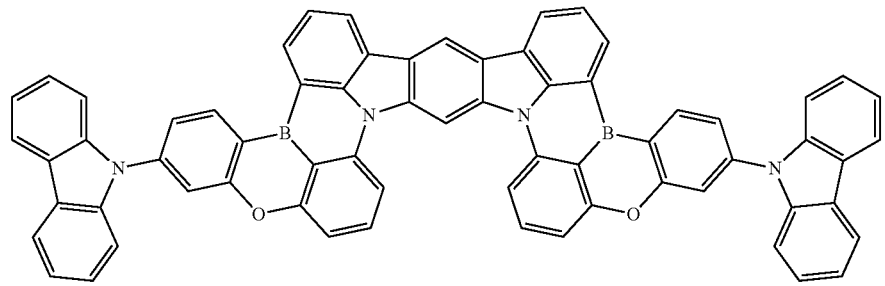

31

(1) Synthesis of Intermediate Compound G

Intermediate Compound G was obtained using substantially the same method as the synthesis of Intermediate Compound E, except for using 9-phenyl-9H-carbazol-2-ol instead of phenol.

(2) Synthesis of Compound 38

Compound 38 was obtained using substantially the same method as the synthesis of Compound 1, except for using Intermediate Compound G instead of Intermediate Compound B. Sublimation purification (415° C., 4.5×10$^{-3}$ Pa) was carried out and elemental analysis was performed. It was confirmed that the molecular weight was 938 (M$^+$+1) by FAB-MS (m/z) measurement.

1-6. Synthesis of Compound 41

[Reaction Formula 6]

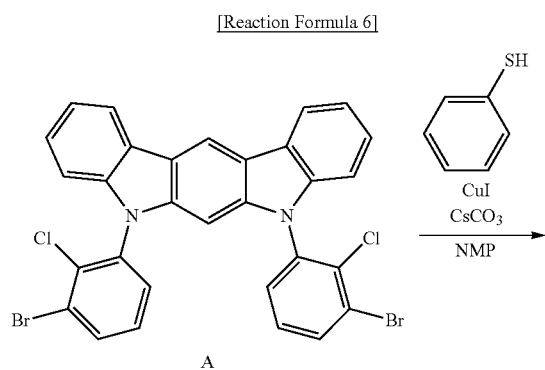

-continued

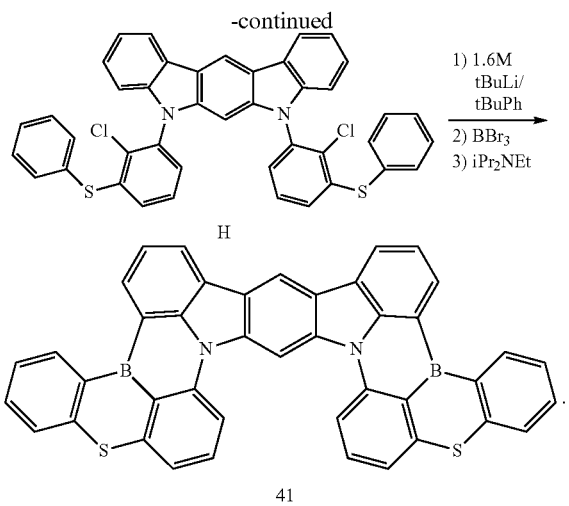

(1) Synthesis of Intermediate Compound H

Intermediate A (10.0 g, 16 mmol), benzenethiol (4.3 g, 39 mmol), CuI (0.15 g, 0.79 mmol), and CsCO$_3$ (12.1 g, 63 mmol) were added to NMP (50 mL) and stirred at 160° C. for 20 hours. The reaction was allowed to cool, CH$_2$Cl$_2$ and water were added thereto, and the resultant mixture was subjected to liquid separation to concentrate an organic layer. The concentrated organic layer was purified by column chromatography (silica gel) to obtain Intermediate Compound H (7.7 g, yield 73%).

(2) Synthesis of Compound 41

Compound 41 was obtained using substantially the same method as the synthesis of Compound 1, except for using Intermediate Compound H instead of Intermediate Compound B. Sublimation purification (350° C., 3.8×10$^{-3}$ Pa) was carried out and elemental analysis was performed. It was confirmed that the molecular weight was 640 (M$^+$+1) by FAB-MS (m/z) measurement.

1-7. Synthesis of Compound 43

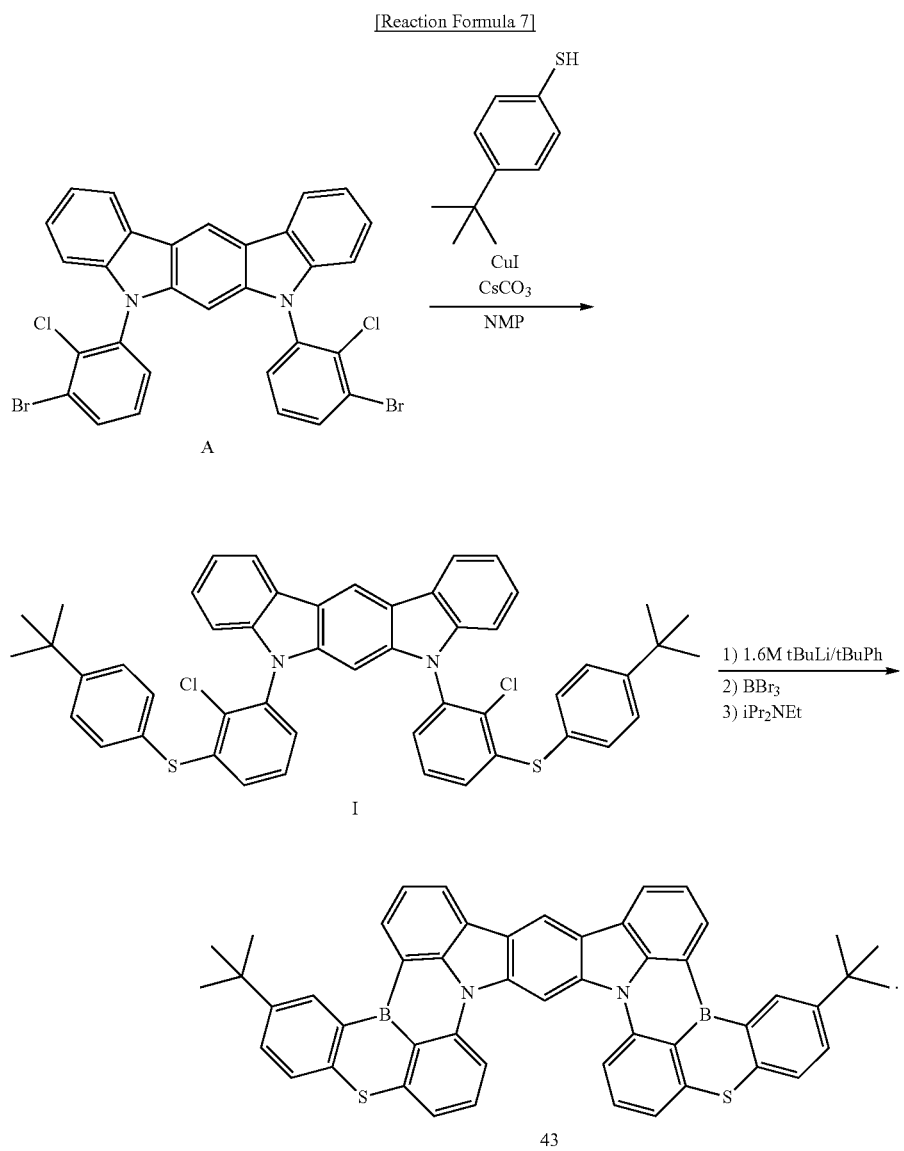

(1) Synthesis of Intermediate Compound I

Intermediate Compound I was obtained using substantially the same method as the synthesis of Intermediate Compound H, except for using 4-(t-butyl)benzenethiol instead of benzenethiol.

(2) Synthesis of Compound 43

Compound 43 was obtained using substantially the same method as the synthesis of Compound 1, except for using from Intermediate Compound I instead of Intermediate Compound B. Sublimation purification (320° C., 4.5×10$^{-3}$ Pa) was carried out and elemental analysis was performed. It was confirmed that the molecular weight was 752 (M$^+$+1) by FAB-MS (m/z) measurement.

1-8. Synthesis of Compound 51

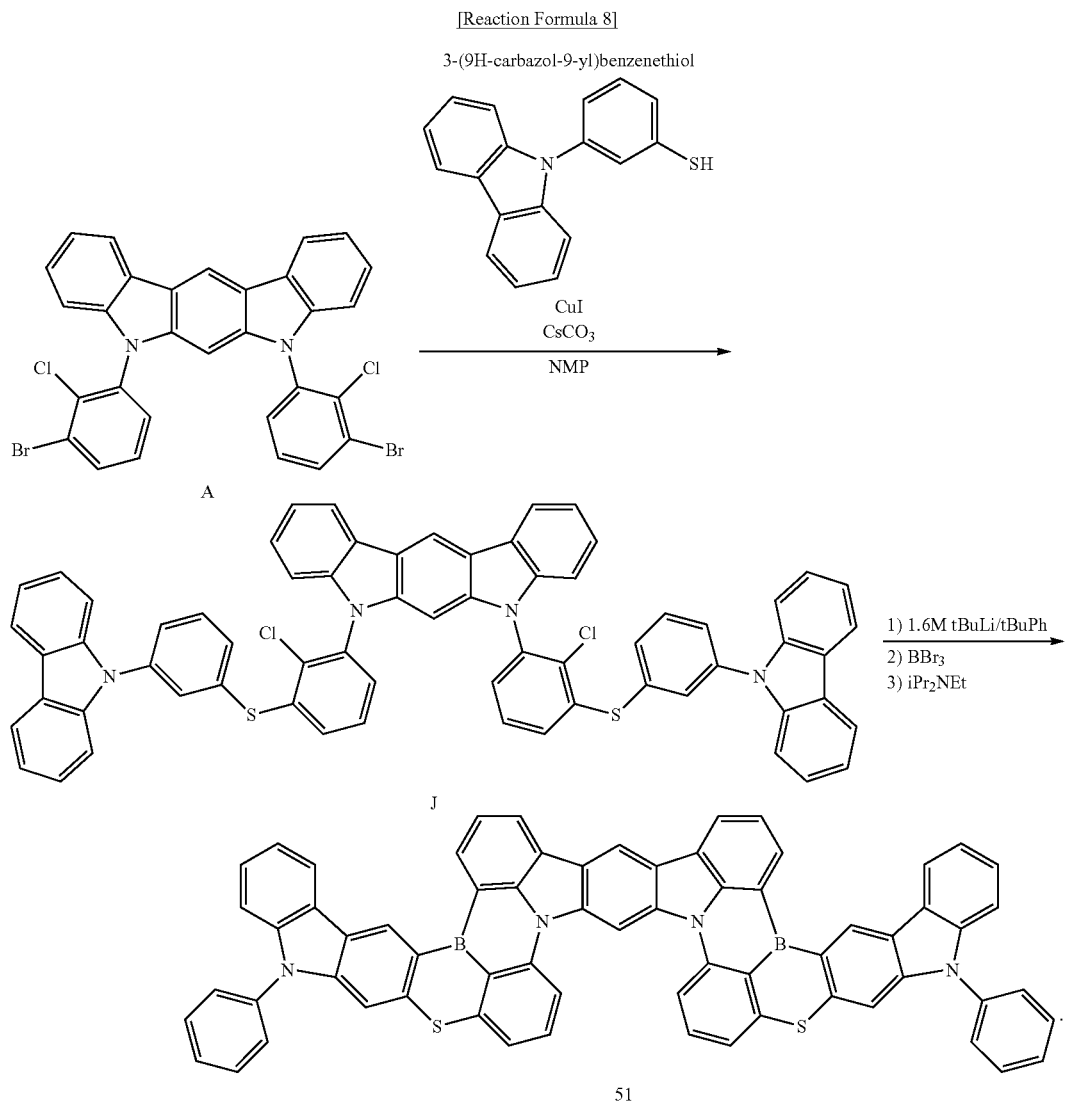

(1) Synthesis of Intermediate Compound J

Intermediate Compound J was obtained using substantially the same method as the Synthesis of Intermediate Compound H, except for using 3-(9H-carbazol-9-yl)benzenethiol instead of benzenethiol.

(2) Synthesis of Compound 51

Compound 51 was obtained using substantially the same method as the synthesis of Compound 1, except for using Intermediate Compound J instead of Intermediate Compound B. Sublimation purification (390° C., 7.7×10$^{-3}$ Pa) was carried out and elemental analysis was performed. It was confirmed that the molecular weight was 970 (M$^+$+1) by FAB-MS (m/z) measurement.

1-9. Synthesis of Compound 54

[Reaction Formula 9]

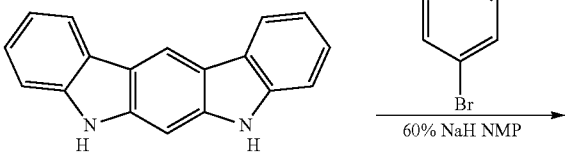

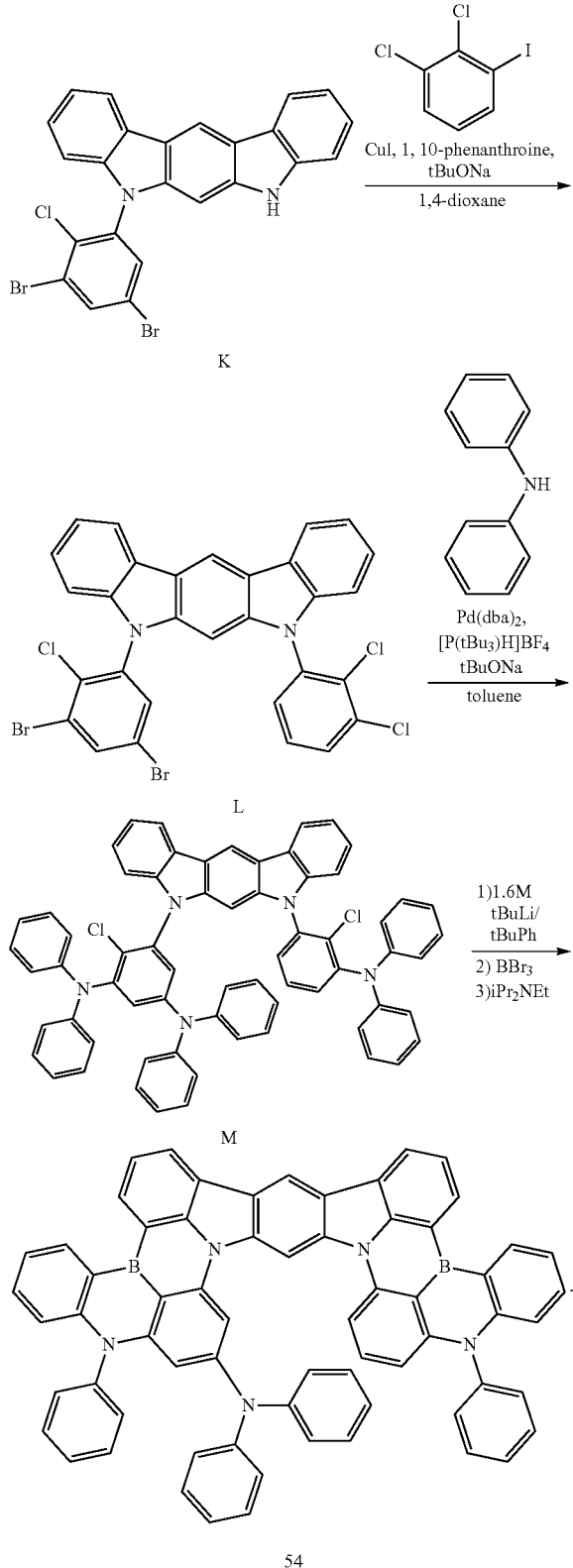

Compound A, except for using 1,5-dibromo-2-chloro-3-fluorobenzene instead of 1-bromo-2-chloro-3-fluorobenzene and using half the molar amount.

(2) Synthesis of Intermediate Compound L

Intermediate Compound K (10.0 g, 19 mmol), 1,2-dichloro-3-iodobenzene (6.2 g, 23 mmol), 1,10-phenanthroline (0.34 g, 1.9 mmol), and $^t$BuONa (6.81 g, 71 mmol) were added to 1,4-dioxane (50 mL) and heated and stirred for 24 hours. $CH_2Cl_2$ and water were added thereto and the resultant mixture was subjected to liquid separation to concentrate an organic layer. The concentrated organic layer was purified by column chromatography (silica gel) to obtain Intermediate Compound L (8.6 g, yield 68%).

(3) Synthesis of Intermediate Compound M

Intermediate Compound M was obtained using substantially the same method as the synthesis of Intermediate Compound B, except for using Intermediate Compound L instead of Intermediate Compound A.

(4) Synthesis of Intermediate Compound 54

Compound 54 was obtained using substantially the same method as the synthesis of Compound 1, except for using Intermediate Compound M instead of Intermediate Compound B. Sublimation purification (370° C., 3.6×10$^{-3}$ Pa) was carried out and elemental analysis was performed. It was confirmed that the molecular weight was 925 (M$^+$+1) by FAB-MS (m/z) measurement.

1-10. Synthesis of Compound 70

[Reaction Formula 10]

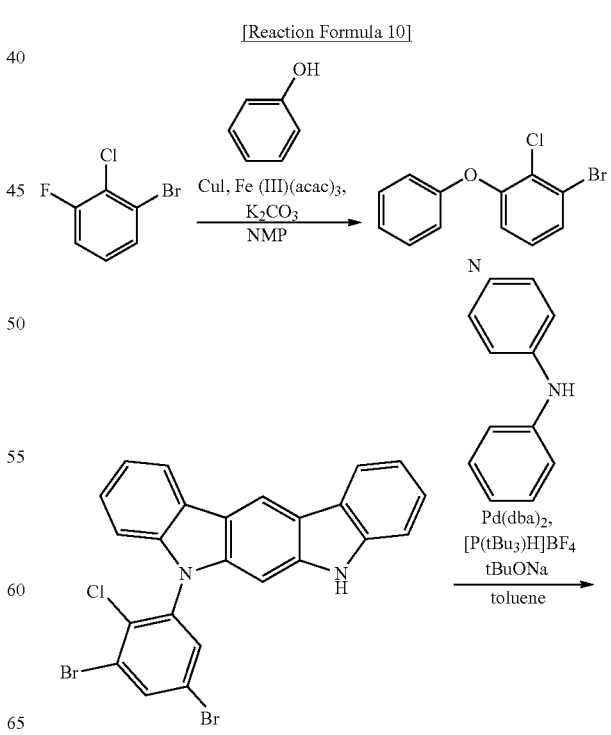

(1) Synthesis of Intermediate Compound K

Intermediate Compound K was obtained using substantially the same method as the synthesis of Intermediate -continued

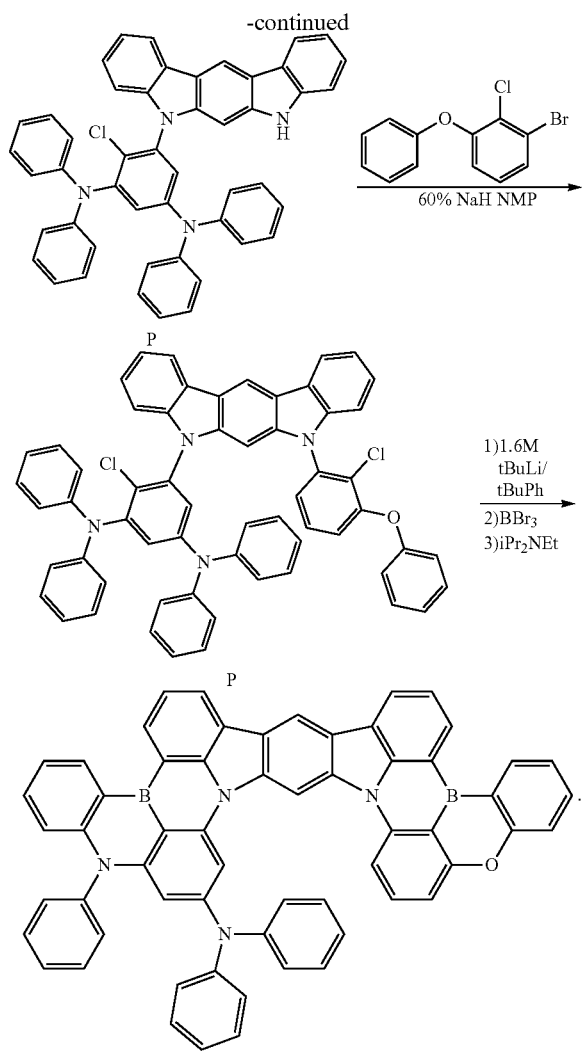

(1) Synthesis of Intermediate Compound N

Intermediate Compound N was obtained using substantially the same method as the synthesis of Intermediate Compound E, except for using 1-bromo-2-chloro-3-fluorobenzene instead of Intermediate Compound A.

(2) Synthesis of Intermediate Compound O

Intermediate Compound O was obtained using substantially the same method as the synthesis of Intermediate Compound B, except for using Intermediate Compound K instead of Intermediate Compound A.

(3) Synthesis of Intermediate Compound P

Intermediate Compound O was added to 1-methyl-2-pyrrolidone (NMP, 50 mL), and 60% NaH (3.90 g, 163 mmol) was added thereto and stirred at room temperature for 1 hour. 1-bromo-2-chloro-3-phenoxybenzene was added thereto and stirred at 100° C. for 24 hours. The reaction was allowed to cool, water was added thereto, the mixture was filtered out and washed with water, and the crystals were dried to obtain Intermediate Compound P.

(4) Synthesis of Compound 70

Compound 70 was obtained using substantially the same method as the synthesis of Compound 1, except for using Intermediate Compound P instead of Intermediate Compound B. Sublimation purification (370° C., 5.3×10$^{-3}$ Pa) was carried out and elemental analysis was performed. It was confirmed that the molecular weight was 850 (M$^+$+1) by FAB-MS (m/z) measurement.

1-11. Synthesis of Compound 84

[Reaction Formula 11]

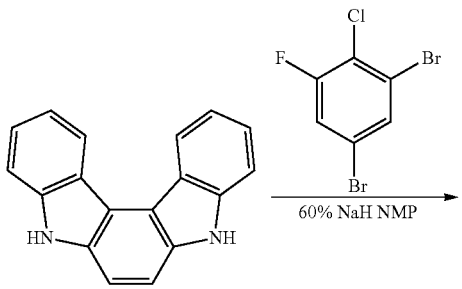

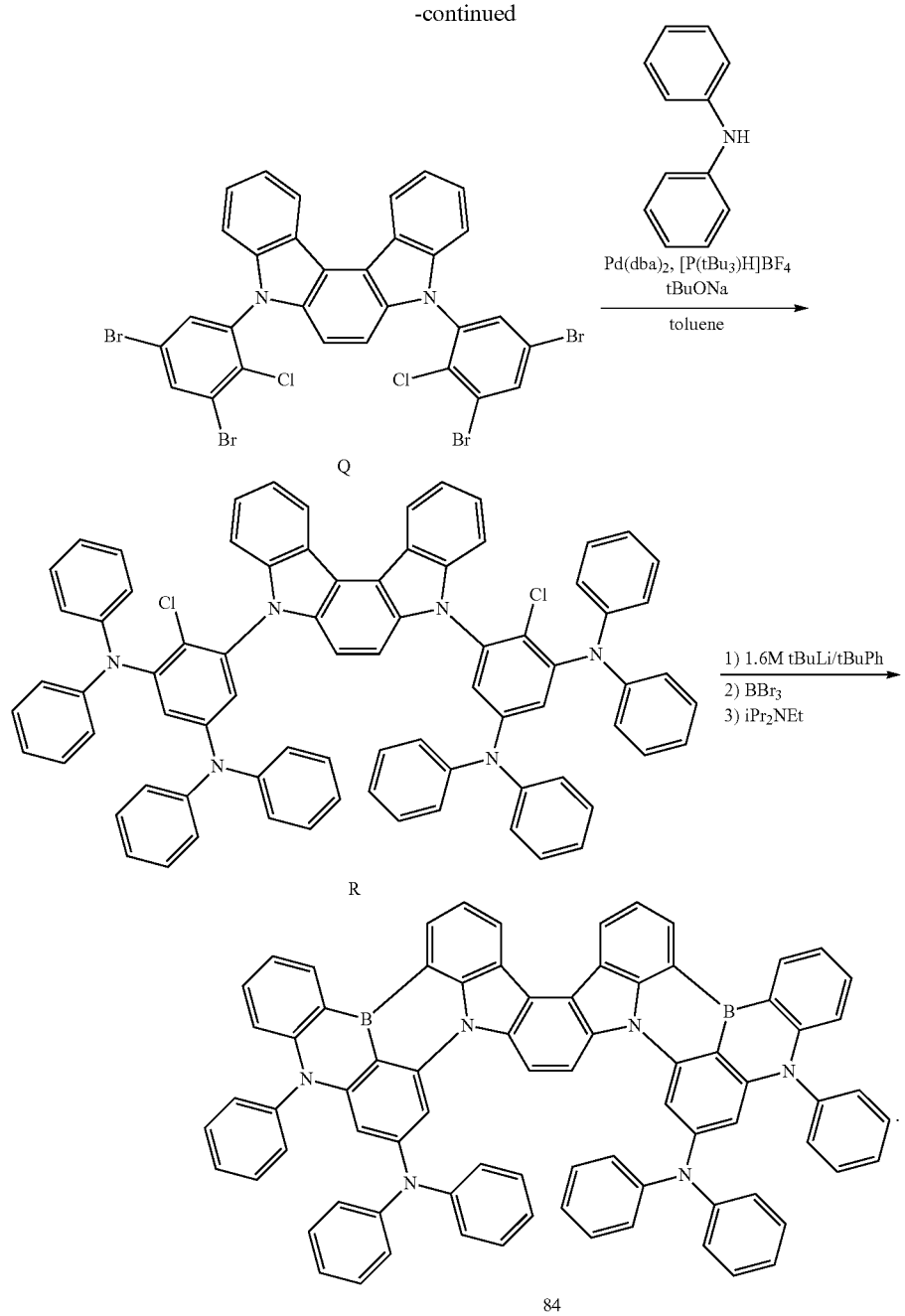

(1) Synthesis of Intermediate Compound Q

Intermediate Compound Q was obtained using substantially the same method as the synthesis of Intermediate Compound A, except for using 5,8-dihydroindolo[2,3-c]carbazole instead of 5,7-dihydroindolo[2,3-b]carbazole in the Synthesis of Intermediate Compound A.

(2) Synthesis of Intermediate Compound R

Intermediate Compound R was obtained using substantially the same method as the synthesis of Intermediate Compound B, except for using Intermediate Compound Q instead of Intermediate Compound A.

(3) Synthesis of Compound 84

Compound 84 was obtained using substantially the same method as the synthesis of Compound 1, except for using Intermediate Compound R instead of Intermediate Compound B. Sublimation purification (425° C., 3.3×10⁻³ Pa) was carried out and elemental analysis was performed. It was confirmed that the molecular weight was 1092 (M⁺+1) by FAB-MS (m/z) measurement.

1-12. Synthesis of Compound 102
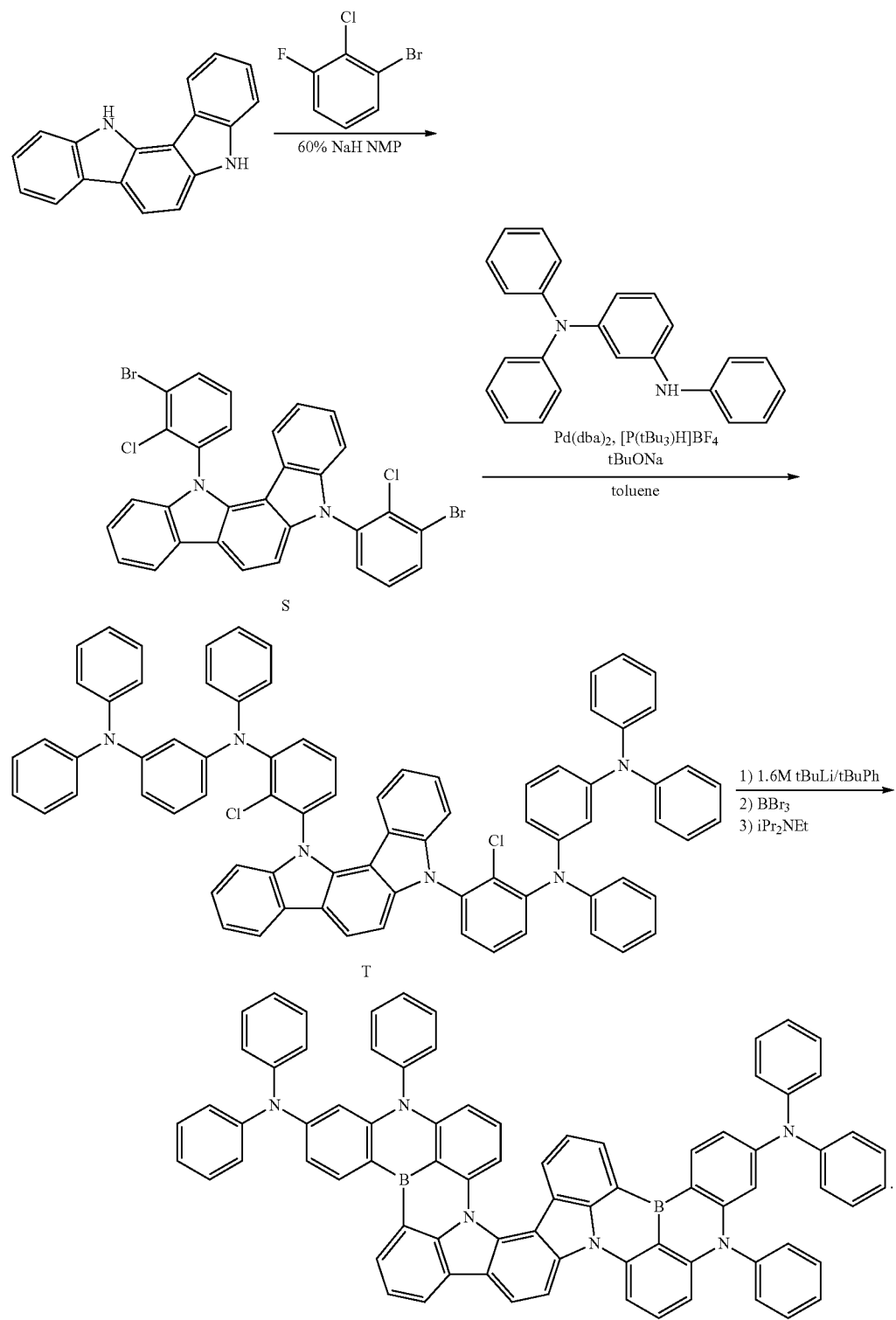

131

(1) Synthesis of Intermediate Compound S

Intermediate Compound S was obtained using substantially the same method as the synthesis of Intermediate Compound A, except for using 5,12-dihydroindolo[3,2-a]carbazole instead of 5,7-dihydroindolo[2,3-b]carbazole.

(2) Synthesis of Intermediate Compound T

Intermediate Compound T was obtained using substantially the same method as the synthesis of Intermediate Compound D, except for using Intermediate Compound S instead of Intermediate Compound A.

(3) Synthesis of Compound 102

Compound 102 was obtained using substantially the same method as the synthesis of Compound 1, except for using Intermediate Compound T instead of Intermediate Compound B. Sublimation purification (410° C., 5.6×10$^{-3}$ Pa) was carried out and elemental analysis was performed. It was confirmed that the molecular weight was 1092 (M$^+$+1) by FAB-MS (m/z) measurement.

1-13. Synthesis of Compound 117

[Reaction Formula 13]

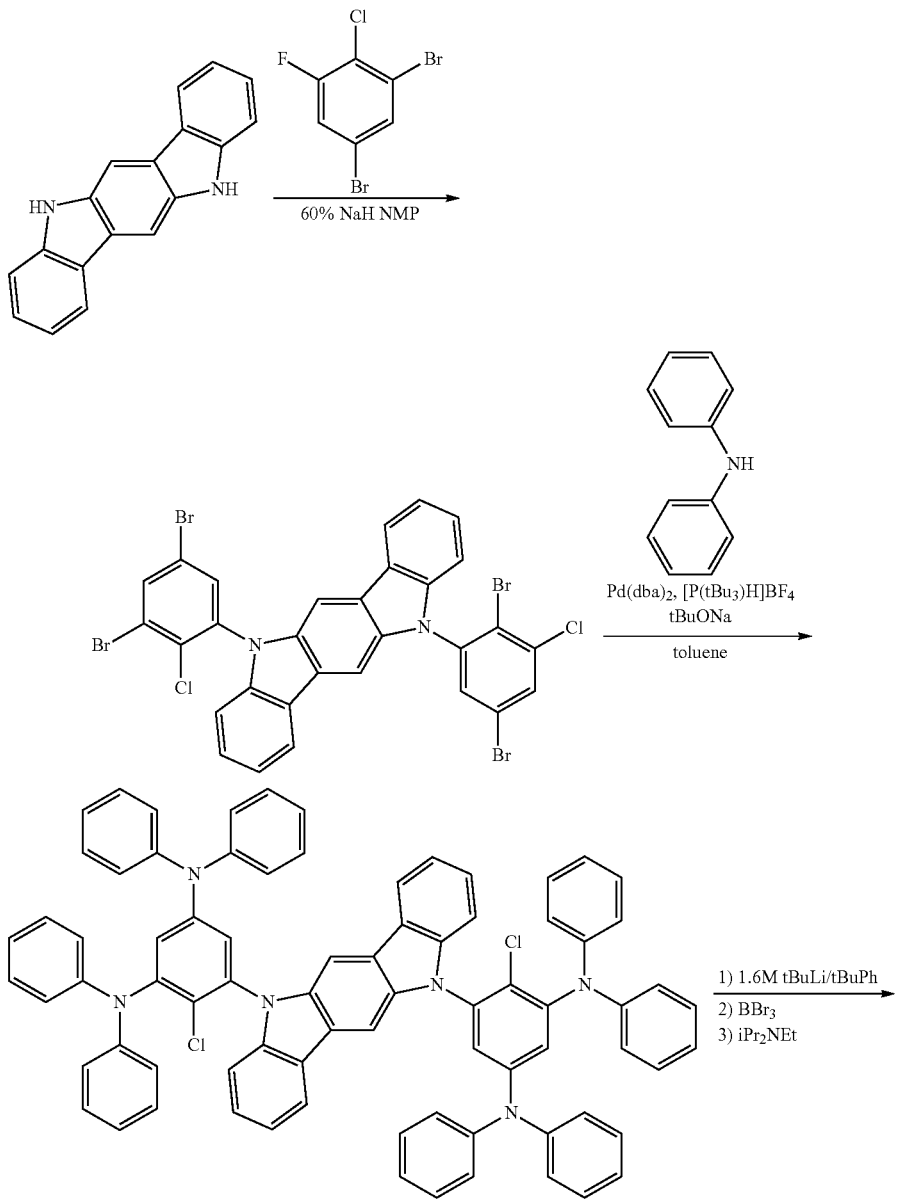

-continued

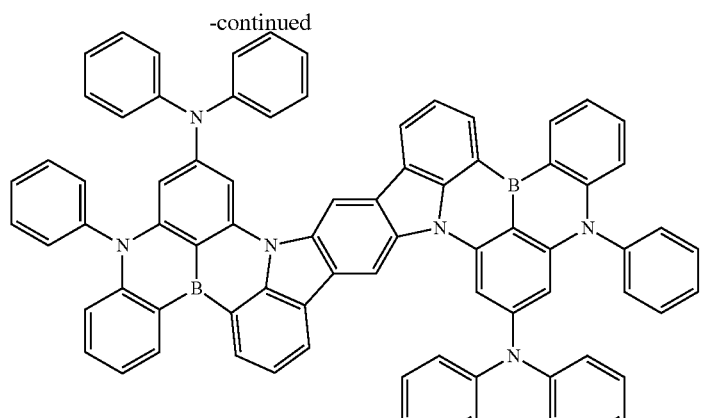
117

(1) Synthesis of Intermediate Compound U

Intermediate Compound U was obtained using substantially the same method as the synthesis of Intermediate Compound A, except for using 5,11-dihydroindolo[3,2-b]carbazole instead of 5,7-dihydroindolo[2,3-b]carbazole.

(2) Synthesis of Intermediate Compound V

Intermediate Compound V was obtained using substantially the same method as the synthesis of Intermediate Compound B, except for using Intermediate Compound U instead of Intermediate Compound A of.

(3) Synthesis of Compound 117

Compound 117 was obtained using substantially the same method as the synthesis of Compound 1, except for using Intermediate Compound V instead of Intermediate Compound B. Sublimation purification (415° C., 7.2×10$^{-3}$ Pa) was carried out and elemental analysis was performed. It was confirmed that the molecular weight was 1092 (M$^+$+1) by FAB-MS (m/z) measurement.

1-14. Synthesis of Compound 128

[Reaction Formula 14]

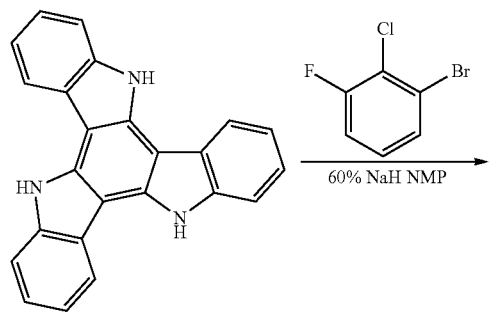

-continued
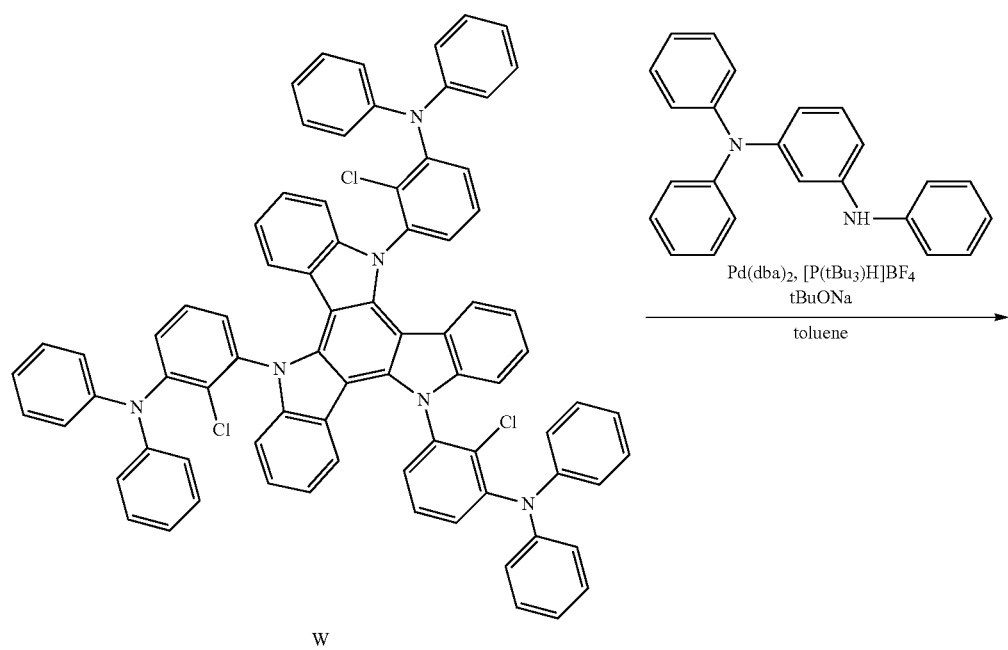
W
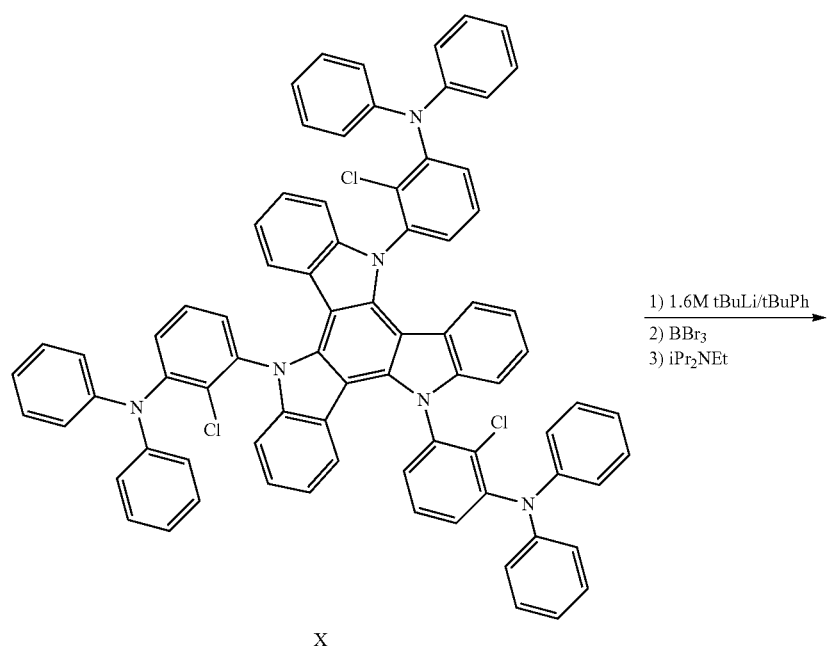
X

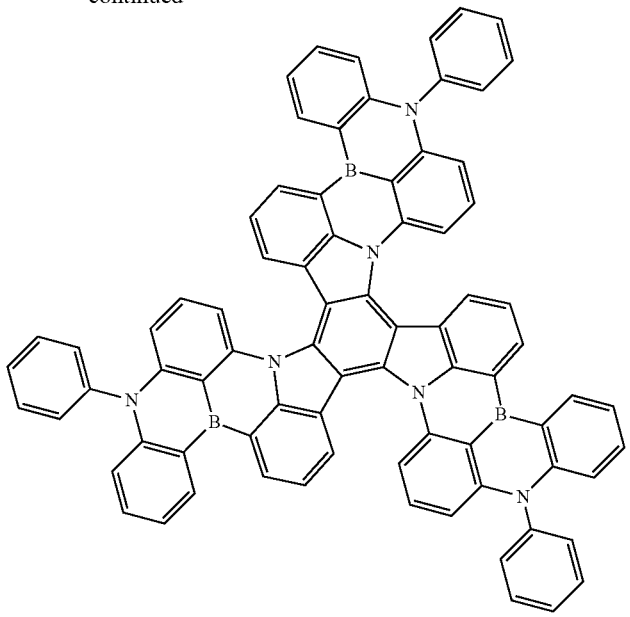

128

(1) Synthesis of Intermediate Compound W

Intermediate Compound W was obtained using substantially the same method as the synthesis of Intermediate Compound A, except for using 10,15-dihydro-5H-diindolo[3,2-a:3',2'-c]carbazole instead of 5,7-dihydroindolo[2,3-b]carbazole.

(2) Synthesis of Intermediate Compound X

Intermediate Compound X was obtained using substantially the same method as the synthesis of Intermediate Compound B, except for using Intermediate Compound W instead of Intermediate Compound A.

(3) Synthesis of Compound 128

Compound 128 was obtained using substantially the same method as the synthesis of Compound 1, except for using Intermediate Compound X instead of Intermediate Compound B. Sublimation purification (440° C., 3.1×10⁻³ Pa) was carried out and elemental analysis was performed. It was confirmed that the molecular weight was 1098 (M⁺+1) by FAB-MS (m/z) measurement.

1-15. Synthesis of Compound 129

[Reaction Formula 15]

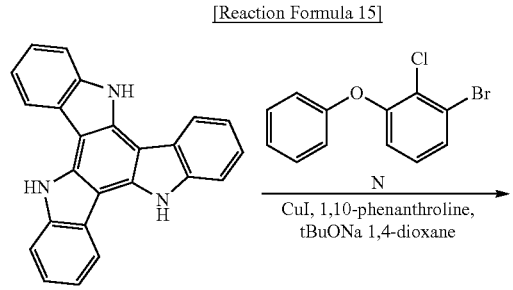

-continued

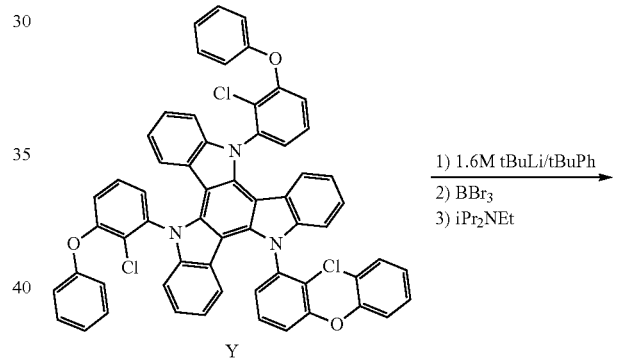

Y 1) 1.6M tBuLi/tBuPh
2) BBr₃
3) iPr₂NEt

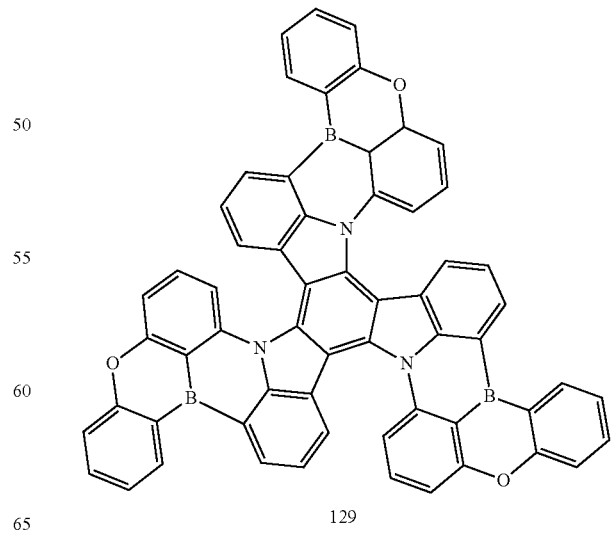

129

(1) Synthesis of Intermediate Compound Y

Intermediate Compound Y was obtained using substantially the same method as the synthesis of Intermediate Compound L, except that 10,15-dihydro-5H-diindolo[3,2-a:3',2'-c]carbazole was used instead of Intermediate Compound K and Intermediate Compound N was used instead of 1,2-dichloro-3-iodobenzene and using 1.5 times the molar amount.

(2) Synthesis of Compound 129

Compound 129 was obtained using substantially the same method as the synthesis of Compound 1, except for using Intermediate Compound Y instead of Intermediate Compound B in a suitable amount. Sublimation purification (380° C., 8.8×10$^{-3}$ Pa) was carried out and elemental analysis was performed. It was confirmed that the molecular weight was 873 (M$^+$+1) by FAB-MS (m/z) measurement.

2. Evaluation of Energy Level of Compounds

Table 1 shows a lowest triplet exciton energy level (T1 level), a lowest singlet exciton energy level (S1 level), and an energy difference between $S_1$ and $T_1$ ($\Delta E_{ST}$) with respect to the compounds of Examples 1 to 15 and Comparative Examples X1 to X5:

Example Compounds

1

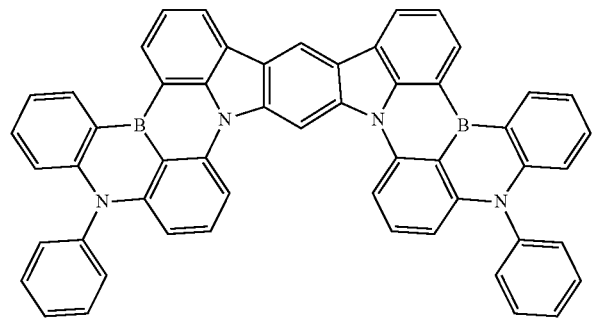

7

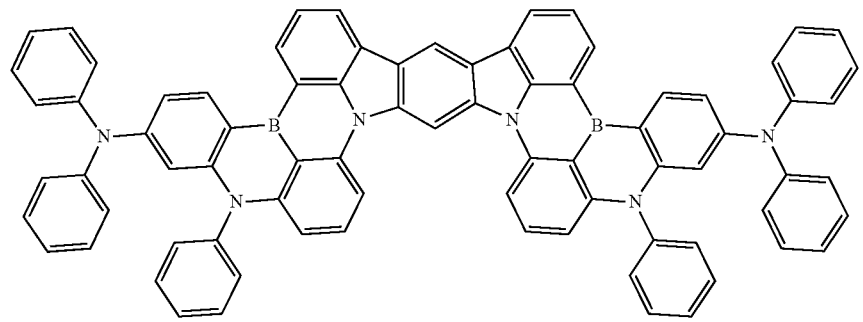

28

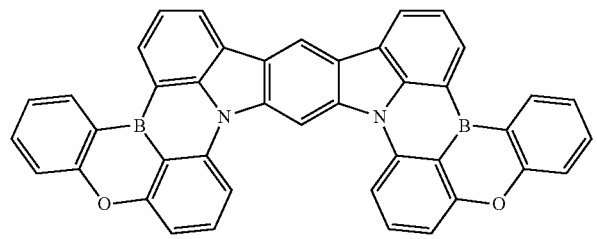

31

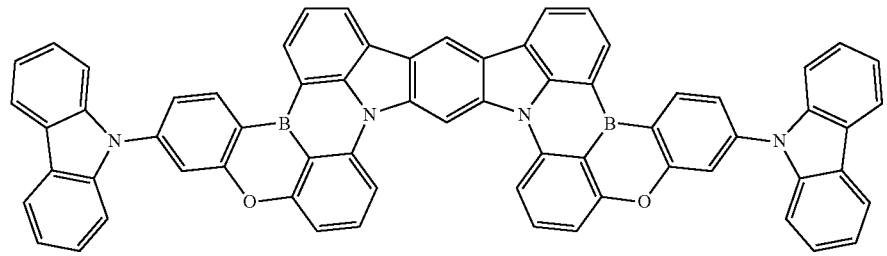

-continued
38
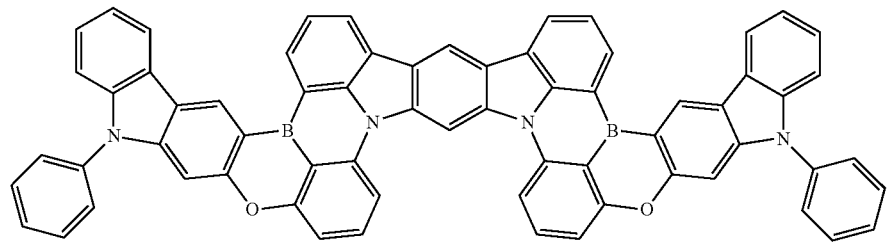
41
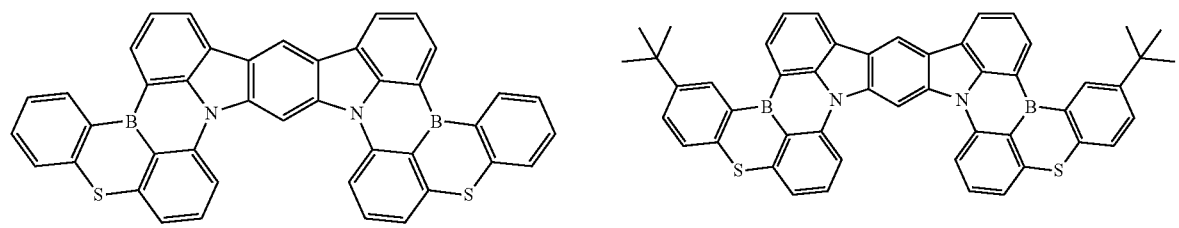
43
51
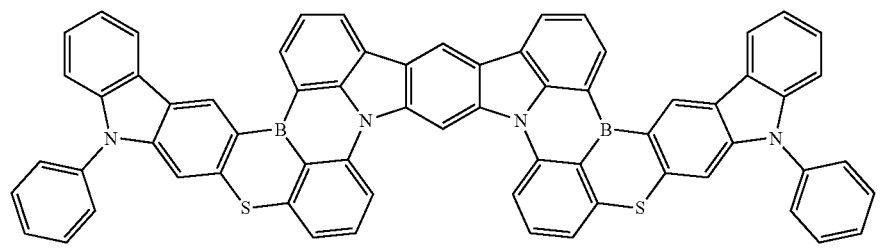
54
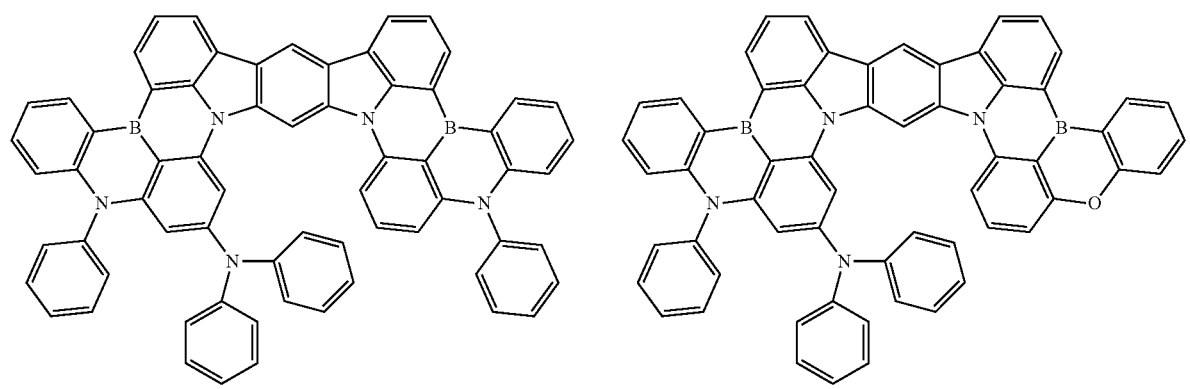
70
84
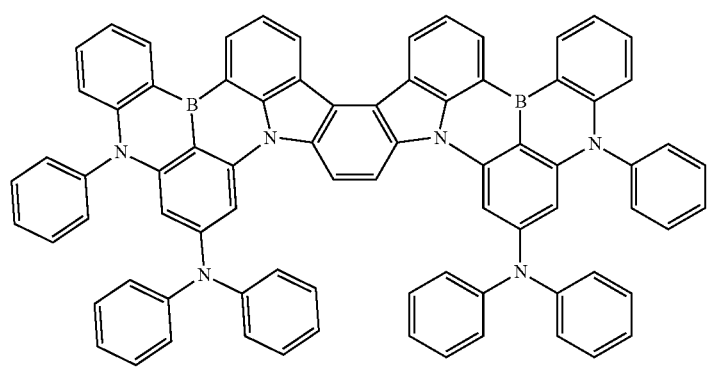

102
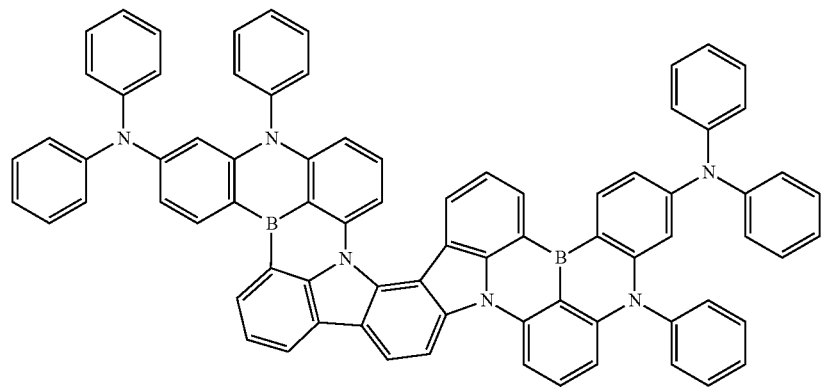
117
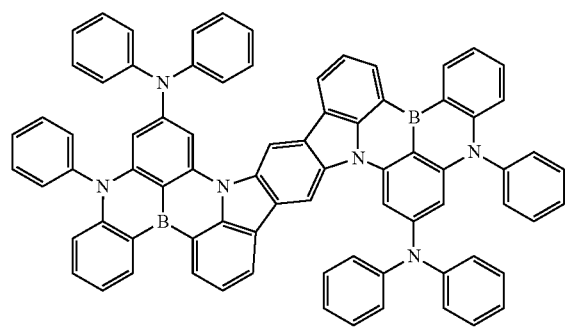
128
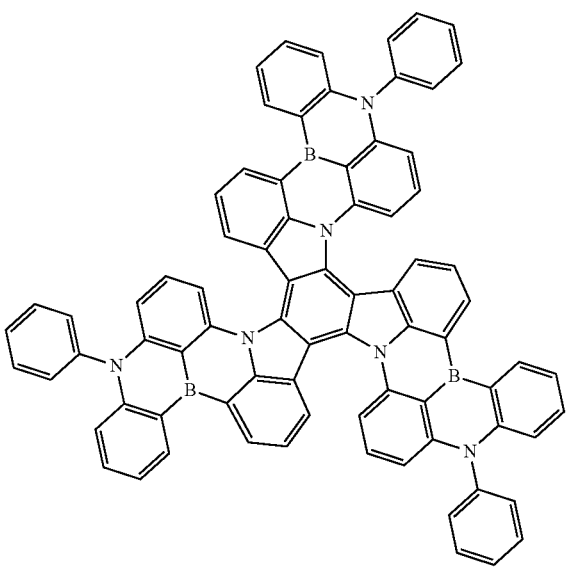
129
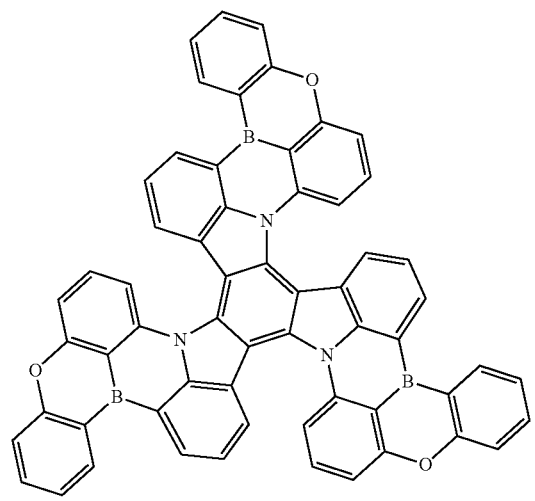

Comparative Example Compounds

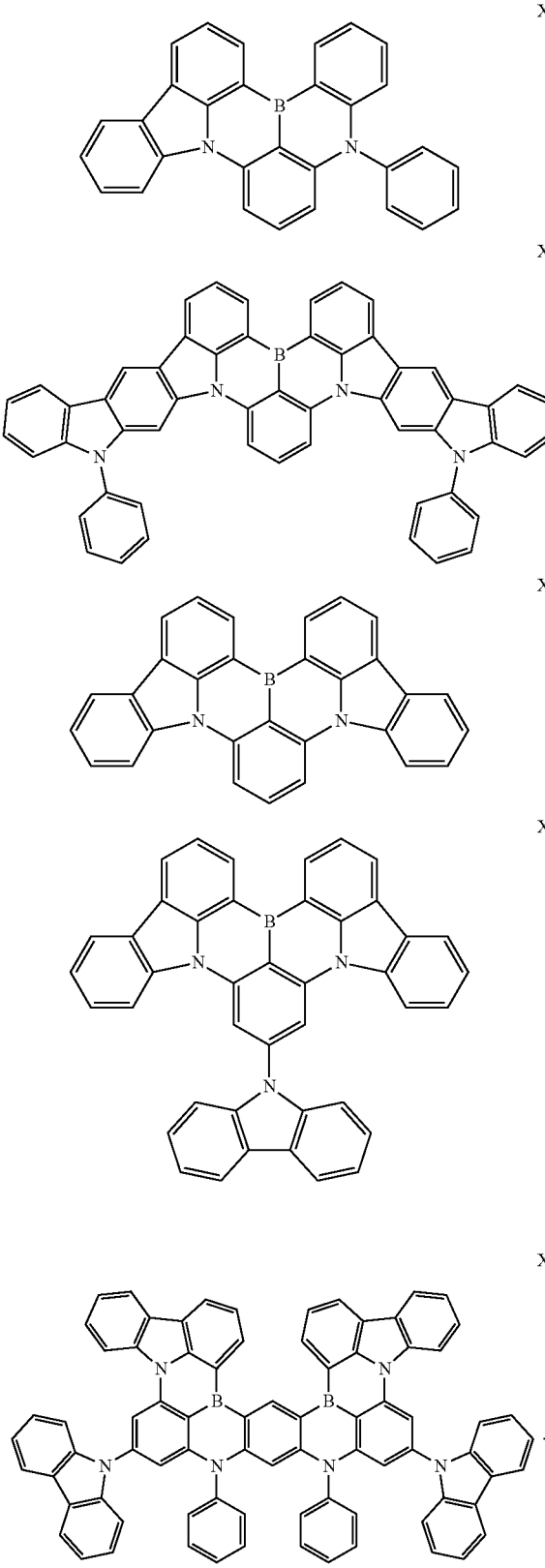

TABLE 1

| Compound | Dopant Material | T₁ level | S₁ level | ΔE_ST |
|---|---|---|---|---|
| Example 1 | Example Compound 1 | 2.51 | 2.66 | 0.15 |
| Example 2 | Example Compound 7 | 2.51 | 2.68 | 0.17 |
| Example 3 | Example Compound 28 | 2.44 | 2.61 | 0.17 |
| Example 4 | Example Compound 31 | 2.47 | 2.62 | 0.15 |
| Example 5 | Example Compound 38 | 2.46 | 2.62 | 0.16 |
| Example 6 | Example Compound 41 | 2.48 | 2.64 | 0.16 |
| Example 7 | Example Compound 43 | 2.46 | 2.63 | 0.17 |
| Example 8 | Example Compound 51 | 2.53 | 2.69 | 0.16 |
| Example 9 | Example Compound 54 | 2.46 | 2.61 | 0.15 |
| Example 10 | Example Compound 70 | 2.47 | 2.62 | 0.15 |
| Example 11 | Example Compound 84 | 2.40 | 2.56 | 0.16 |
| Example 12 | Example Compound 102 | 2.43 | 2.59 | 0.16 |
| Example 13 | Example Compound 117 | 2.46 | 2.62 | 0.16 |
| Example 14 | Example Compound 128 | 2.43 | 2.59 | 0.16 |
| Example 15 | Example Compound 129 | 2.43 | 2.59 | 0.16 |
| Comparative Example 1 | Comparative Example Compound X1 | 2.39 | 2.58 | 0.19 |
| Comparative Example 2 | Comparative Example Compound X2 | 2.40 | 2.59 | 0.19 |
| Comparative Example 3 | Comparative Example Compound X3 | 2.36 | 2.56 | 0.20 |
| Comparative Example 4 | Comparative Example Compound X4 | 2.45 | 2.66 | 0.21 |
| Comparative Example 5 | Comparative Example Compound X5 | 2.50 | 2.68 | 0.18 |

Referring to the results of Table 1, the compounds of Examples 1 to 15 have a higher average value of $T_1$ than the compounds of Comparative Examples 1 to 5. The compounds of Examples 1 to 15 have a $\Delta E_{ST}$ value of 0.17 eV or less, and the compounds of Comparative Examples 1 to 5 have a $\Delta E_{ST}$ value of 0.18-0.21 eV. It is believed that the compounds of Examples 1 to 15 and Comparative Examples 1 to 5 may be used as a thermally activated delayed fluorescence dopant albeit with different efficiencies.

It is considered that the compounds of Examples 1 to 15 have a higher $T_1$ level and a lower $\Delta E_{ST}$ value than the compounds of Comparative Examples 1 to 5, and thus, if applied to the emission layer, may exhibit higher luminous efficiency than the compounds of Comparative Examples 1 to 5.

3. Manufacture and Evaluation of Organic Electroluminescence Device Including Condensed Polycyclic Compound The emission characteristics of the organic electroluminescence device including the condensed polycyclic compound of an embodiment in the emission layer were conducted as follows. The method for manufacturing the organic electroluminescence device for the evaluation of the device is described below.

Example Compounds 1, 7, 28, 31, 38, 41, 43, 51, 54, 70, 84, 102, 117, 128, and 129 were used as emission layer dopant materials to manufacture the organic electroluminescence devices of Examples 1 to 15, respectively. Comparative Example Compounds X1, X2, X3, X4, and X5 were used as emission layer dopant materials to manufacture the organic electroluminescence devices of Comparative Examples 1 to 5, respectively.

(Manufacture of Organic Electroluminescence Device)

A 1500 Å-thick ITO was patterned on a glass substrate, and the glass substrate was washed with ultrapure water, irradiated with ultraviolet rays for about 30 minutes, and treated with ozone. Thereafter, HAT-CN was deposited to a thickness of 100 Å, α-NPD (NPD) was deposited to a thickness of 800 Å, and mCP was deposited to a thickness of 50 Å to form a hole transport region.

Next, a condensed polycyclic compound of an example or a Comparative Example Compound and mCBP were co-deposited in a ratio of 1:99 to form a 200 Å-thick emission layer. For example, the emission layer formed by co-depositing was deposited by mixing mCBP with each of Compounds 1, 7, 28, 31, 38, 41, 43, 51, 54, 70, 84, 102, 117, 128, and 129 in Examples 1 to 15, respectively, or by mixing mCBP with each of Comparative Example Compounds X1 to X5 in Comparative Examples 1 to 5, respectively.

Thereafter, a 300 Å-thick layer was formed on the emission layer with TPBi and a 50 Å-thick layer was sequentially formed with LiF to form an electron transport region. Next, a second electrode having a thickness of about 1000 Å was formed with aluminum (Al).

[Functional Layer Compound]

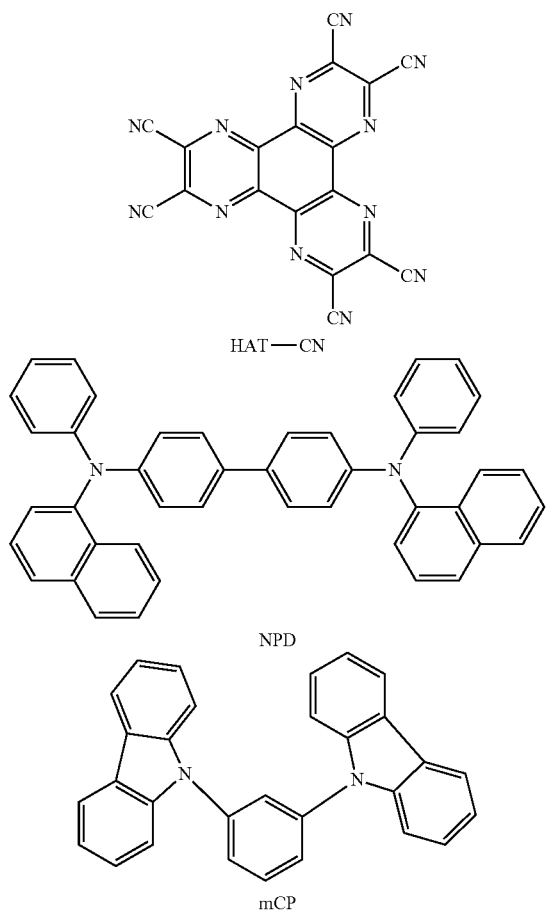

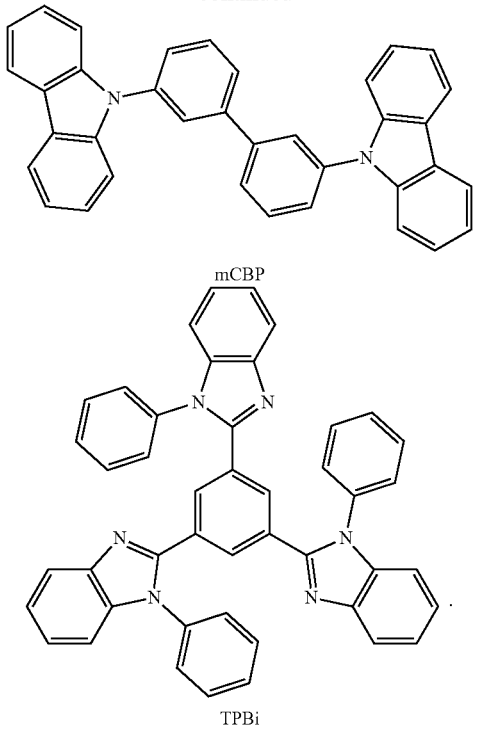

(Evaluation of Organic Electroluminescence Device Characteristics)

Evaluation results of the organic electroluminescence device of Examples 1 to 15 and Comparative Examples 1 to 5 are listed in Table 2. In the results of Table 2, the maximum emission wavelength ($\lambda_{max}$) represents the maximum wavelength value in the emission spectrum, the $EQE_{max}$ is the maximum value of the external quantum efficiency, and $EQE_{max1000nit}$ is the maximum value of the external quantum efficiency at 1000 cd/m².

TABLE 2

| Device | Dopant Material | $\lambda_{max}$ (nm) | $EQE_{max}$ (%) | $EQE_{max1000nit}$ (%) |
|---|---|---|---|---|
| Example 1 | Example Compound 1 | 473 | 20.5 | 19.4 |
| Example 2 | Example Compound 7 | 474 | 22.3 | 18.9 |
| Example 3 | Example Compound 28 | 467 | 21.5 | 18.7 |
| Example 4 | Example Compound 31 | 463 | 19.5 | 18.4 |
| Example 5 | Example Compound 38 | 475 | 19.8 | 18.3 |
| Example 6 | Example Compound 41 | 474 | 20.1 | 18.1 |
| Example 7 | Example Compound 43 | 473 | 20.8 | 17.9 |
| Example 8 | Example Compound 51 | 470 | 20.4 | 19.2 |
| Example 9 | Example Compound 54 | 472 | 19.4 | 18.9 |
| Example 10 | Example Compound 70 | 461 | 19.3 | 18.7 |
| Example 11 | Example Compound 84 | 475 | 20.2 | 18.2 |
| Example 12 | Example Compound 102 | 474 | 20.9 | 19.0 |
| Example 13 | Example Compound 117 | 485 | 20.8 | 18.9 |
| Example 14 | Example Compound 128 | 478 | 20.4 | 18.4 |
| Example 15 | Example Compound 129 | 473 | 19.4 | 18.1 |
| Comparative Example 1 | Comparative Example Compound X1 | 478 | 10.2 | 5.3 |
| Comparative Example 2 | Comparative Example Compound X2 | 479 | 14.5 | 11.3 |
| Comparative Example 3 | Comparative Example Compound X3 | 480 | 10.2 | 5.2 |
| Comparative Example 4 | Comparative Example Compound X4 | 478 | 10.3 | 7.2 |
| Comparative Example 5 | Comparative Example Compound X5 | 485 | 18.7 | 15.2 |

Referring to the results of Table 2, the organic electroluminescence devices of Examples 1 to 15 each emit light in the blue wavelength region of 460 nm to 485 nm, and have an $EQE_{max}$ value of 19% or more and an $EQE_{max1000nit}$ value of 17.9% or more to exhibit excellent external quantum efficiency. For example, the organic electroluminescence devices of Examples 1 to 15 that include the condensed polycyclic compound according to an embodiment exhibit improved luminous efficiency. In comparison, the electroluminescence devices of Comparative Examples 1, 3, and 4 emit light in the blue wavelength region, but each have an $EQE_{max}$ value close to 10% and an $EQE_{max1000nit}$ value is as low as 7.2% or less. Comparative Compounds X1, X3, and X4 each include a carbazole derivative with a 1,4-azaborine structure, but do not disclose two or more structures of 1,4-azaborine or 1,4-oxaborine condensed around an indolocarbazole derivative.

In the case of the organic electroluminescent devices of Comparative Examples 2 and 5, the $EQE_{max}$ and $EQE_{max1000nit}$ were lower than those of the organic electroluminescence devices of Examples. Comparative Example Compound X2 discloses a structure in which one 1,4-azaborine moiety is condensed to an indolocarbazole derivative, and does not disclose a structure in which two or more 1,4-azaborine or 1,4-oxaborine moieties are condensed in an indolocarbazole derivative.

Comparative Example Compound X5 includes two 1,4-azaborine moieties condensed in a benzene ring, but does not disclose a structure including two or more 1,4-azaborine or 1,4-oxaborine moieties condensed to an indolocarbazole derivative.

The condensed polycyclic compound of an embodiment may have a molecular skeleton with multiple resonance structures by condensing two or three 1,4-azaborine or 1,4-oxaborine moieties to an indolocarbazole derivative. Accordingly, a plurality of distortions may occur in the molecule to have a high lowest triplet excitation energy level and high quantum efficiency to exhibit excellent luminous efficiency.

The organic electroluminescent device of an embodiment may include the condensed polycyclic compound of an embodiment in the emission layer to exhibit excellent or suitable color characteristics in the luminous wavelength region of a blue wavelength and high luminous efficiency.

The organic electroluminescence device according to an embodiment of the present disclosure may achieve excellent or suitable luminous efficiency.

The polycyclic compound according to an embodiment of the present disclosure may be applied in the organic electroluminescence device to exhibit excellent or suitable luminous efficiency.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the present disclosure has been described with reference to example embodiments of the present disclosure, it will be understood that the present disclosure should not be limited to these example embodiments, but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the following claims and their equivalents.

What is claimed is:

1. An organic electroluminescence device comprising:
a first electrode;
a second electrode facing the first electrode; and
an emission layer between the first electrode and the second electrode,
wherein the first electrode and the second electrode each independently comprise Ag, Mg Cu, Al, Pt, Pd, Au, Ni, Nd, Ir, Cr, Li, Ca, LiF/Ca, LiF/Al, Mo, Ti, In, Zn, Sn, a compound thereof, a mixture thereof, or a oxide thereof,
wherein the emission layer comprises a condensed polycyclic compound represented by Formula 1:

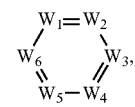

[Formula 1]

wherein, in Formula 1,
$W_1$ to $W_6$ are each independently $CR_1$ or a carbon atom connected to a substituent represented by Formula 2;
$R_1$ is a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or is bonded to an adjacent ring to form a ring;
at least two adjacent positions among $W_1$ to $W_6$ are carbon atoms connected to the substituent represented by Formula 2; and
two or three of the substituent represented by Formula 2 are connected to Formula 1;

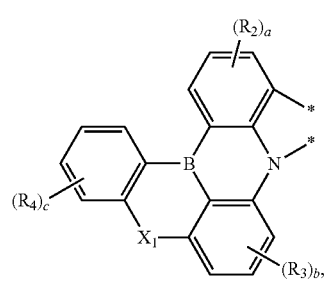

[Formula 2]

wherein, in Formula 2, $X_1$ is O, S, or $NAr_1$;

$Ar_1$ is a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring;

$R_2$ to $R_4$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent ring to form a ring;

a and b are each independently an integer of 0 to 3; and c is an integer of 0 to 4.

2. The organic electroluminescence device compound of claim 1, wherein the condensed polycyclic compound represented by Formula 1 is represented by at least one of Formula 1-1 to Formula 1-5:

[Formula 1-1]

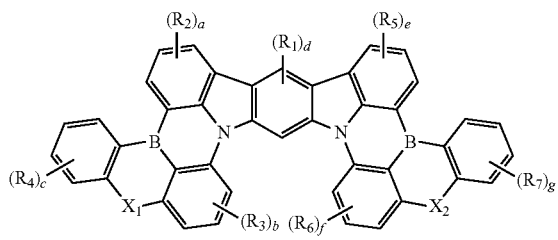

[Formula 1-2]

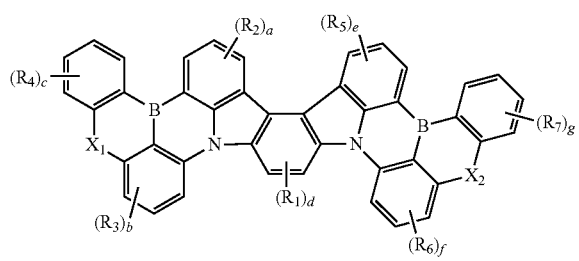

[Formula 1-3]

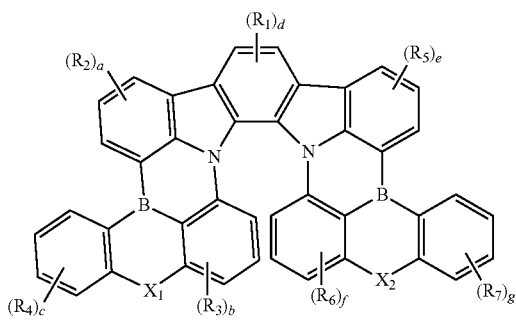

[Formula 1-4]

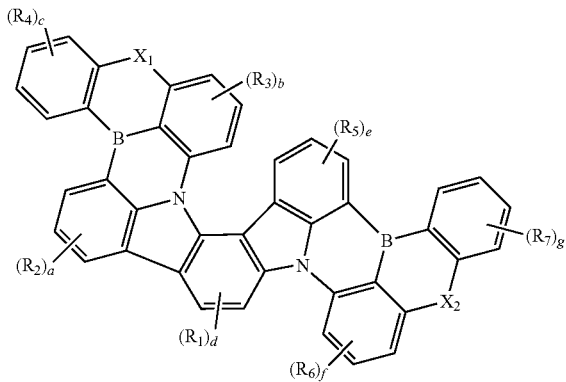

[Formula 1-5]

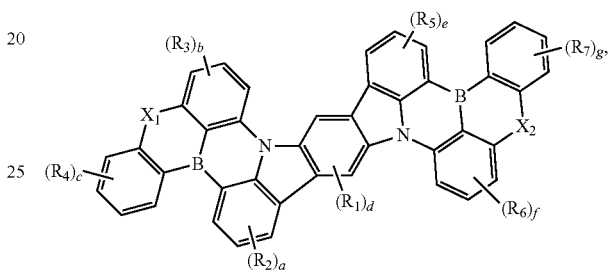

wherein, in Formula 1-1 to in Formula 1-5, $X_2$ is O, S, or $NAr_2$;

$Ar_2$ is a substituted or unsubstituted aryl group having 6 to 30 ring-forming carbon atoms, or a substituted or unsubstituted heteroaryl group having 2 to 30 ring-forming carbon atoms, and/or is bonded to an adjacent group to form a ring;

$R_5$ to $R_7$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring;

e and f are each independently an integer of 0 to 3;

g is an integer of 0 to 4; and $X_1$, $Ar_1$, $R_1$ to $R_4$, and a to d are each independently the same as defined in Formula 1.

3. The organic electroluminescence device compound of claim 2, wherein in Formula 1-1 to Formula 1-5, $X_1$ and $X_2$ are the same.

4. The organic electroluminescence device compound of claim 1, wherein the two or three of the substituent represented by Formula 2 that are substituted to Formula 1 are the same.

5. The organic electroluminescence device compound of claim 1, wherein the condensed polycyclic compound represented by Formula 1 is represented by Formula 3:

[Formula 3]

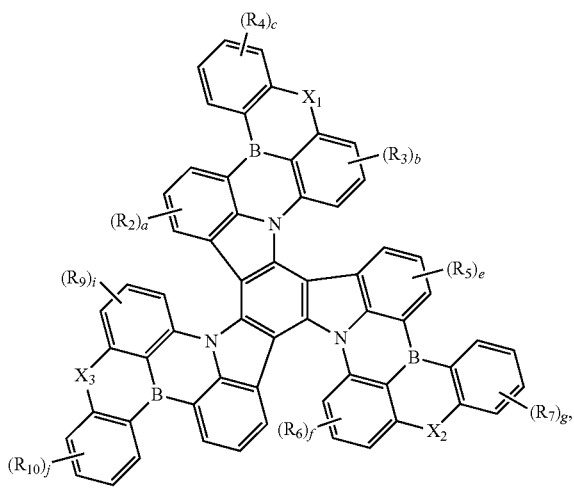

wherein, in Formula 3,
$X_2$ is O, S, or $NAr_2$;
$X_3$ is O, S, or $NAr_3$;
$Ar_2$ and $Ar_3$ are each independently substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring;
$R_5$ to $R_{10}$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent ring to form a ring;
e and f are each independently an integer of 0 to 3;
g is an integer of 0 to 4; and
h and i are each independently an integer of 0 to 3;
j is an integer of 0 to 4; and
$X_1$, $Ar_1$, $R_1$ to $R_4$, and a to c are each independently the same as defined in Formula 1.

6. The organic electroluminescence device compound of claim 5, wherein, in Formula 3, $X_1$, $X_2$, and $X_3$ are all the same.

7. The organic electroluminescence device compound of claim 1, wherein $R_{10}$ is a hydrogen atom or a substituted or unsubstituted methyl group.

8. The organic electroluminescence device compound of claim 1, wherein $R_2$ to $R_4$ are each independently a hydrogen atom, a substituted or unsubstituted methyl group, a substituted or unsubstituted t-butyl group, a substituted or unsubstituted diphenylamine group. a substituted or unsubstituted phenyl group, or a substituted or unsubstituted carbazole group.

9. The organic electroluminescence device compound of claim 1, wherein the emission layer is to emit delayed fluorescence.

10. The organic electroluminescence device compound of claim 1, wherein the emission layer comprises a first compound and a second compound, and the first compound comprises the condensed polycyclic compound.

11. The organic electroluminescence device compound of claim 1, wherein the emission layer is to emit light in a blue wavelength region.

12. The organic electroluminescence device compound of claim 1, wherein the condensed polycyclic compound represented by Formula 1 is at least one of the compounds represented by Compound Group 1:

[Compound Group 1]

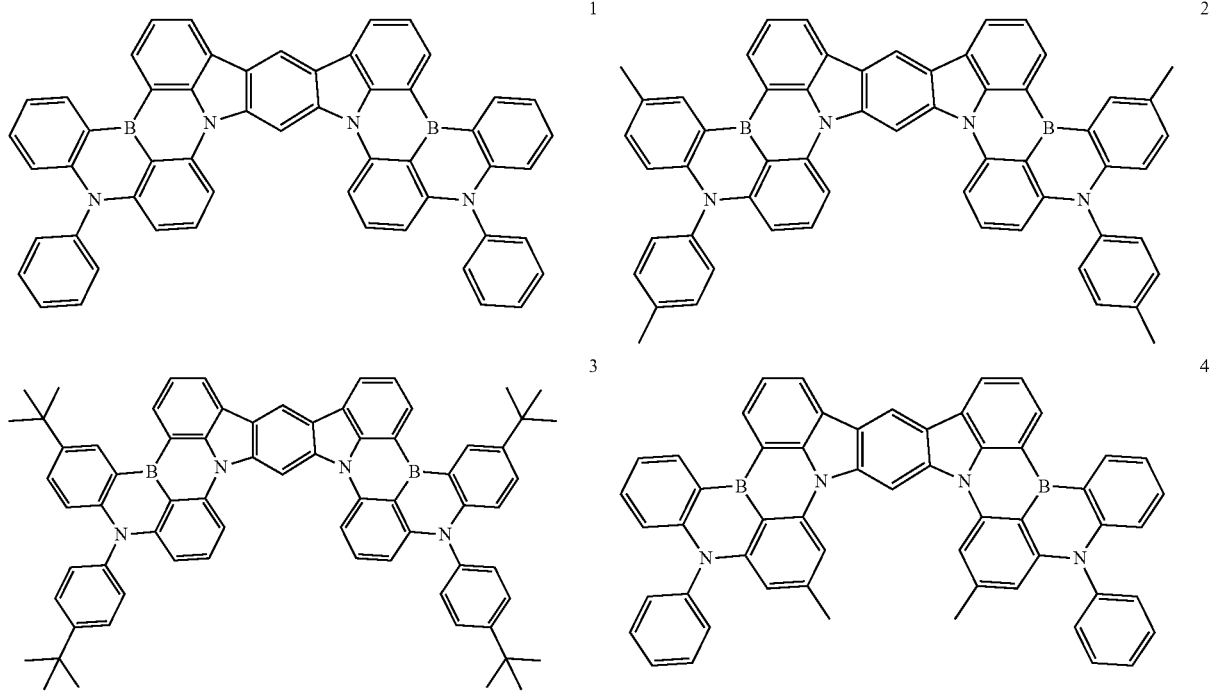

-continued
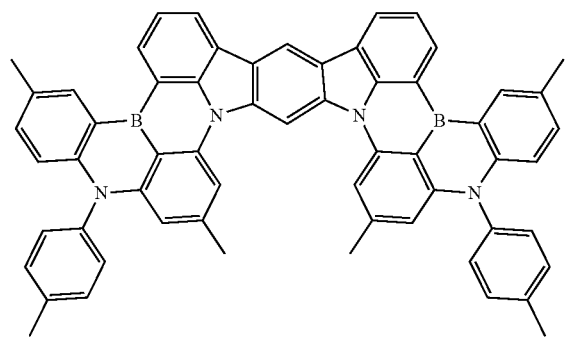
5
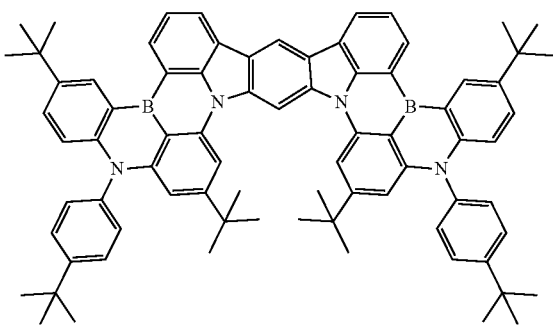
6
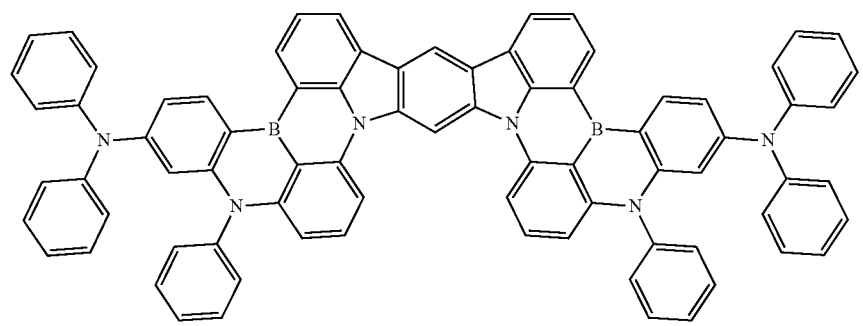
7
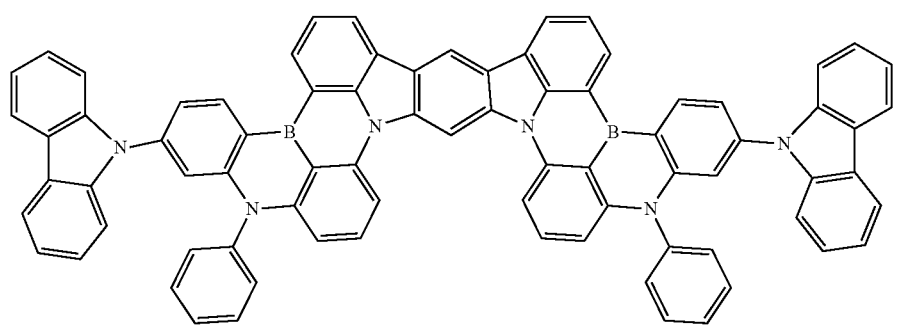
8
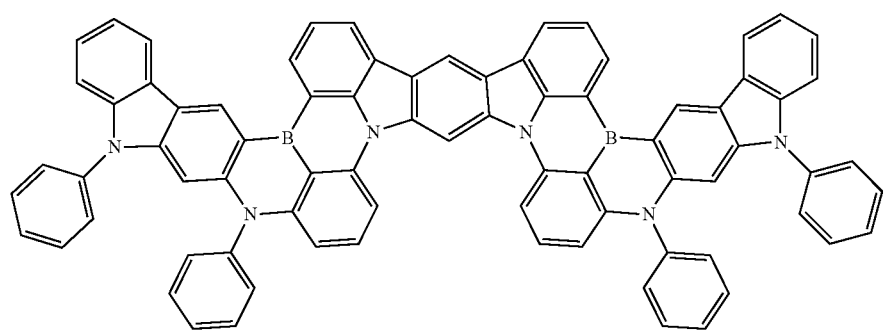
9

-continued
10
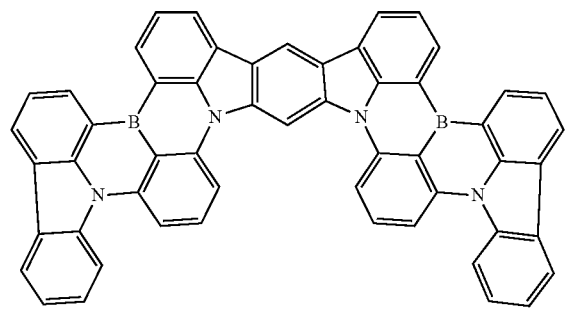
11
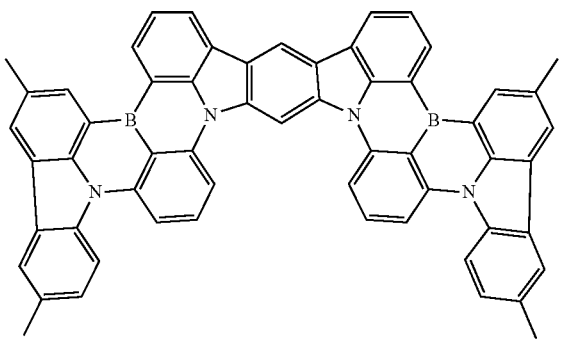
12
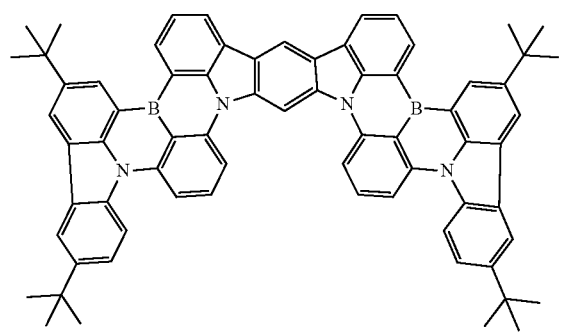
13
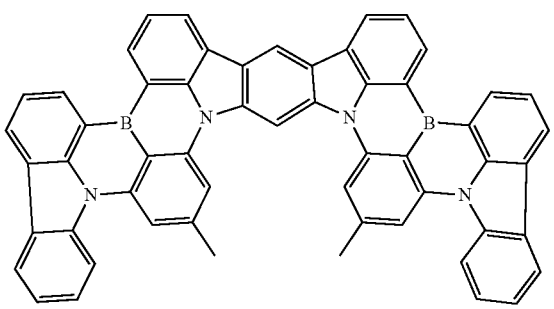
14
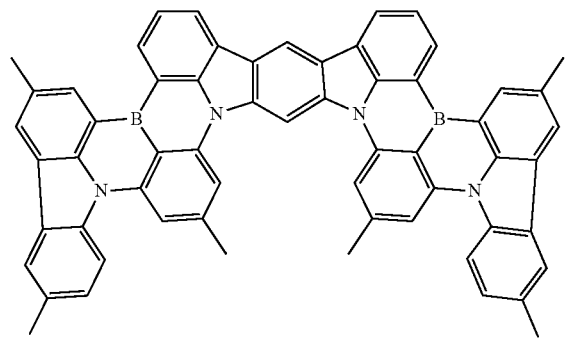
15
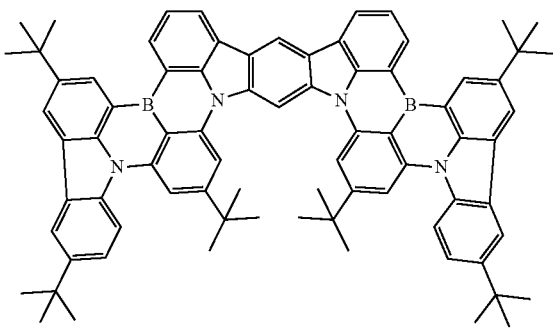
16
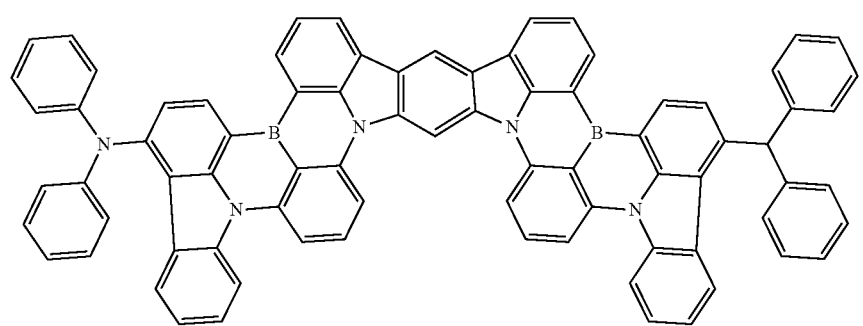

-continued
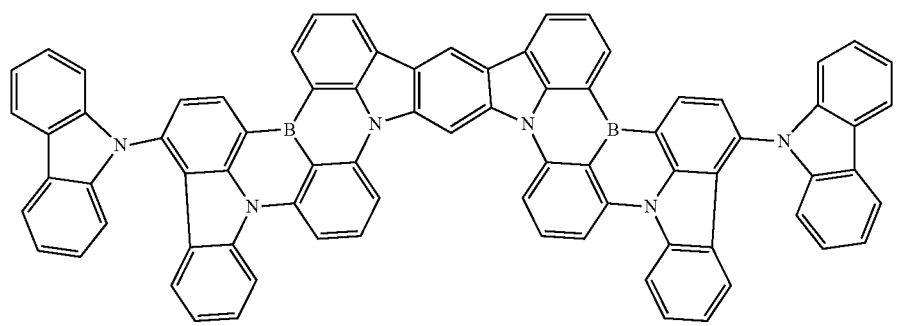
17
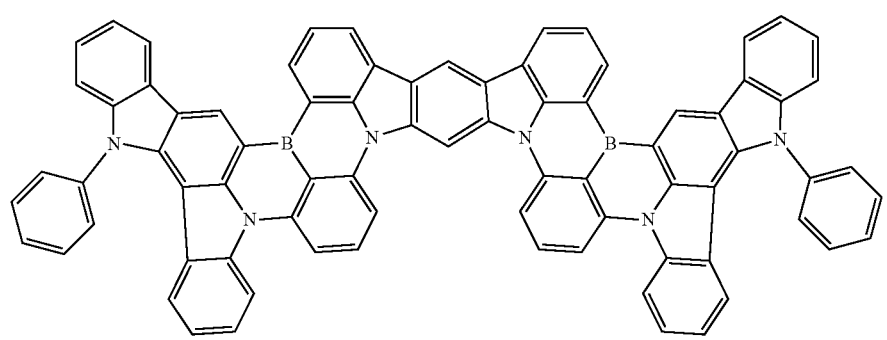
18
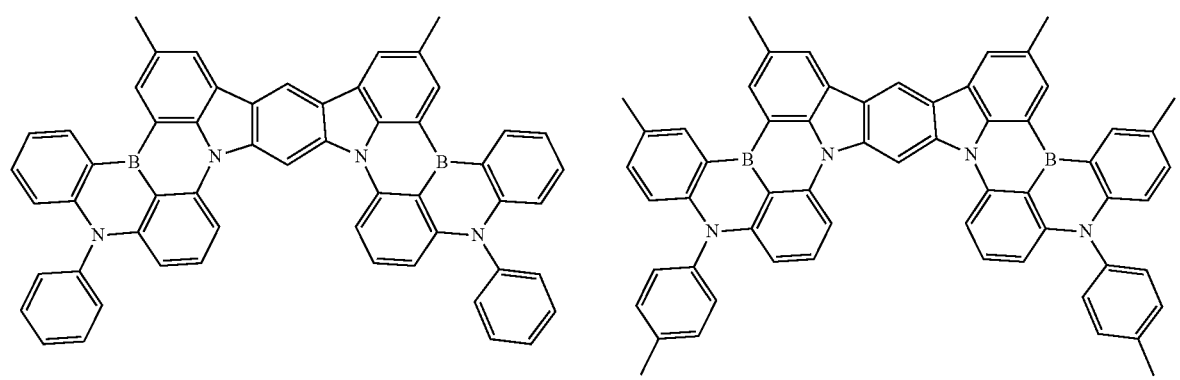
19
20
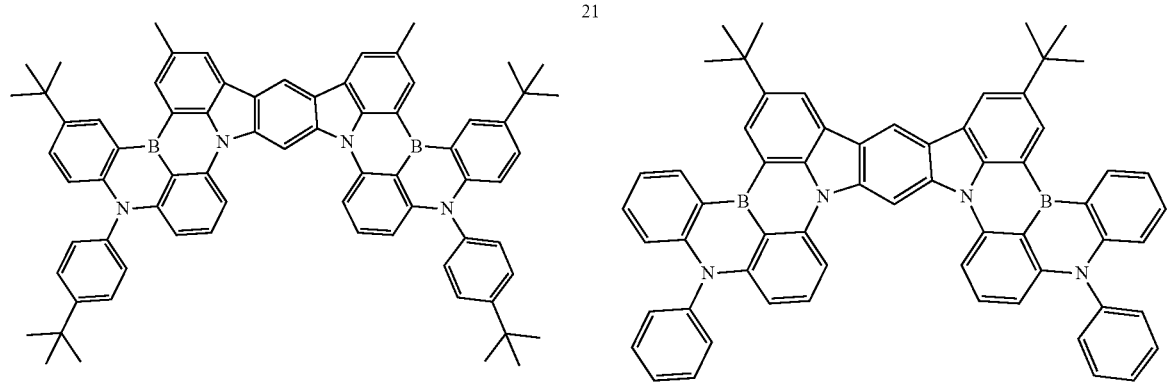
21
22

-continued
23
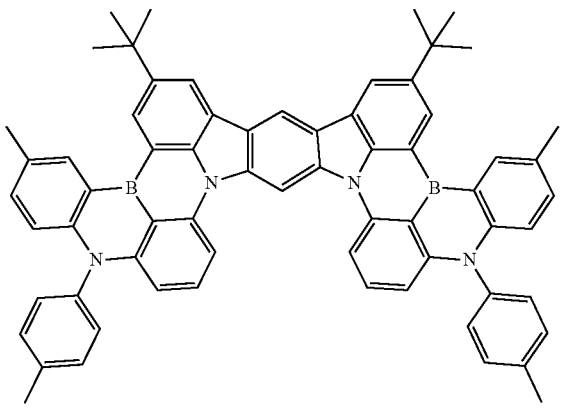
24
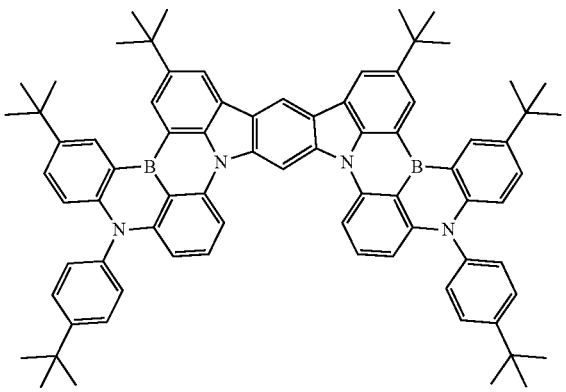
25
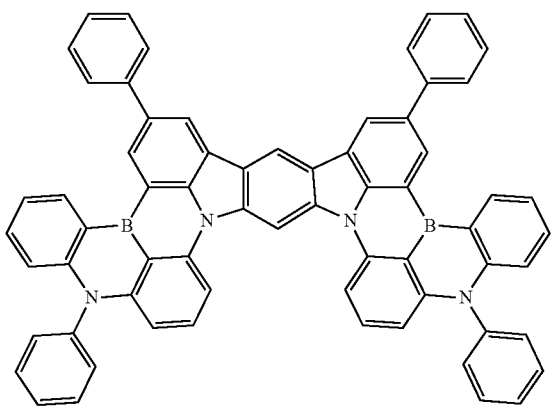
26
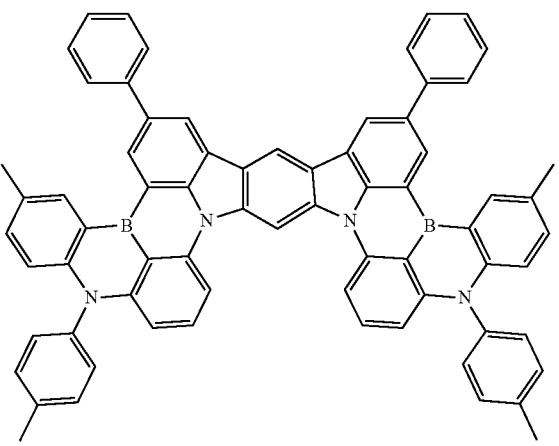
27
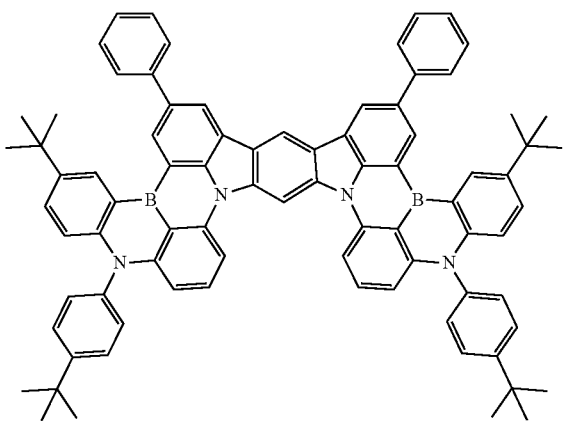
28
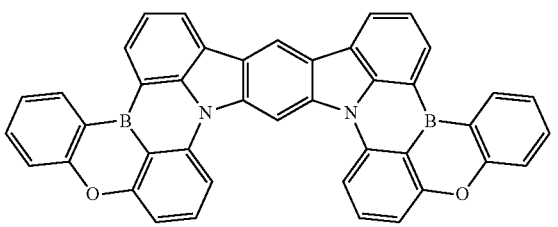
29
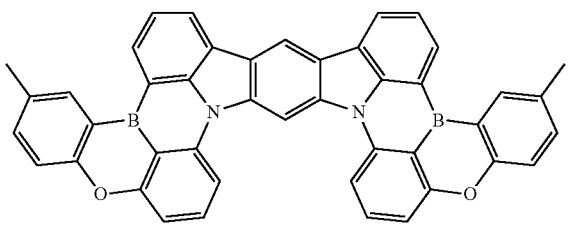
30
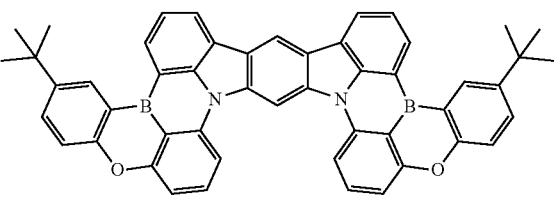

-continued
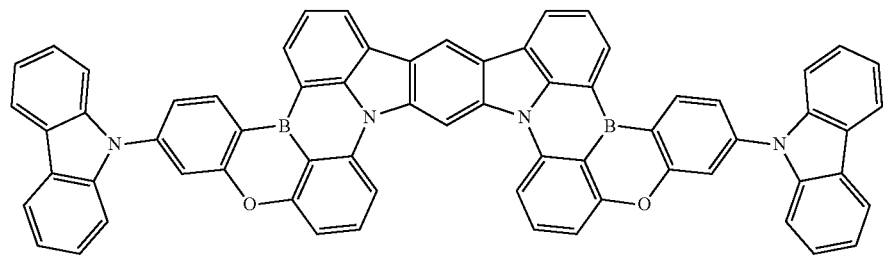
31
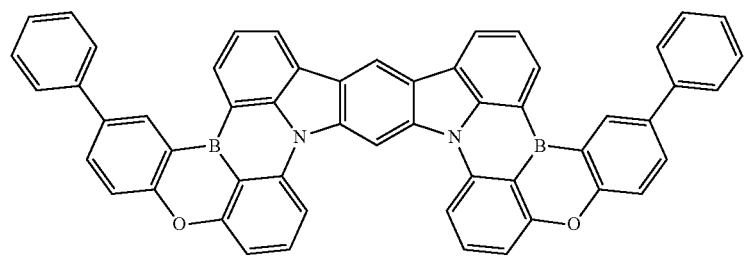
32
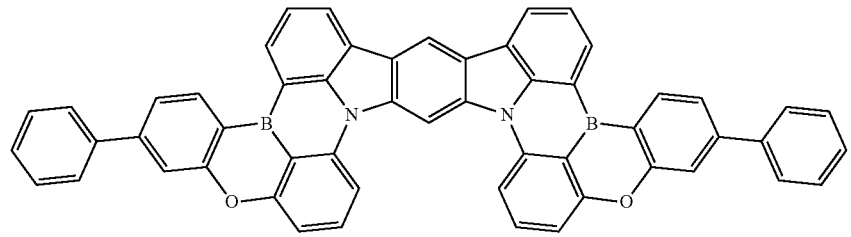
33
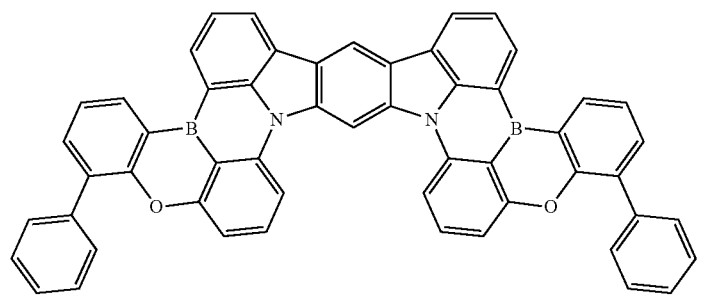
34
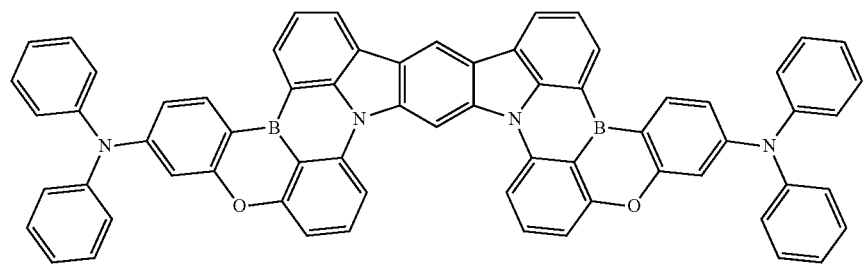
35
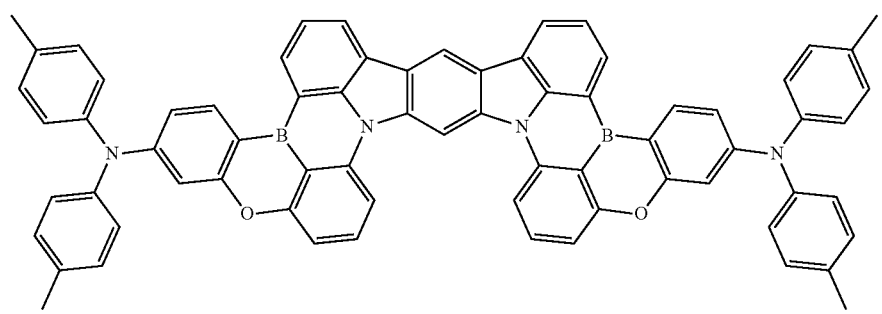
36

-continued
37
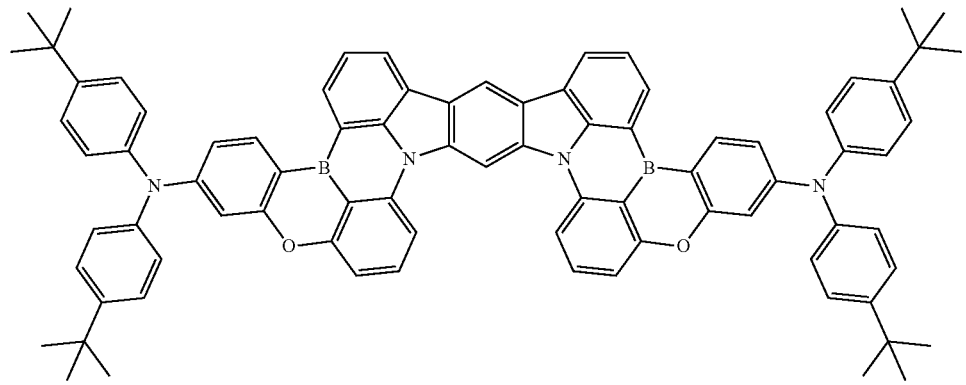
38
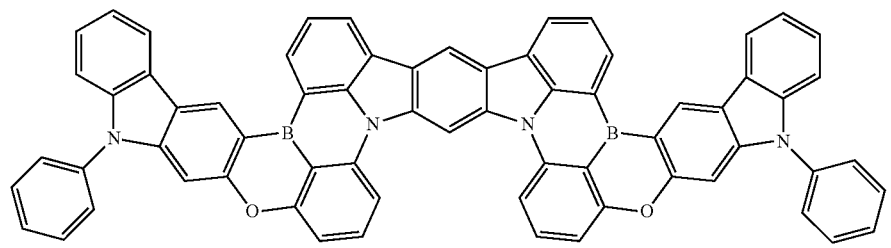
39
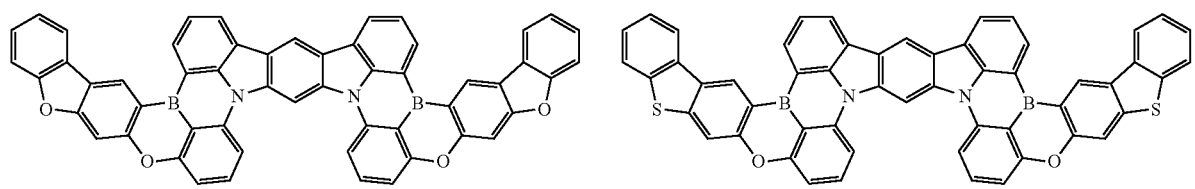
40
41
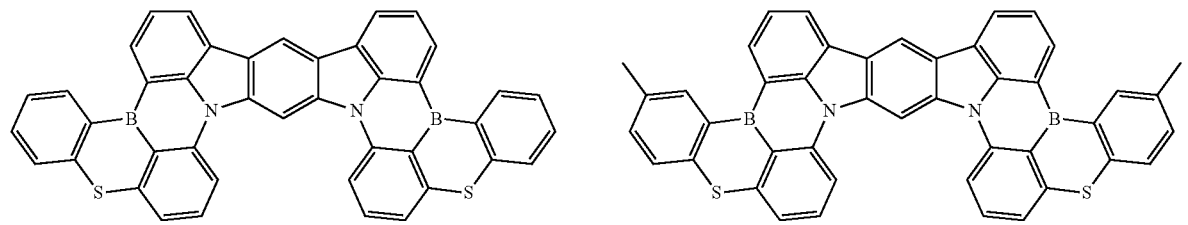
42
43
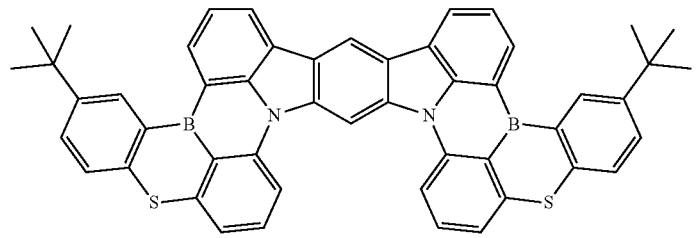
44
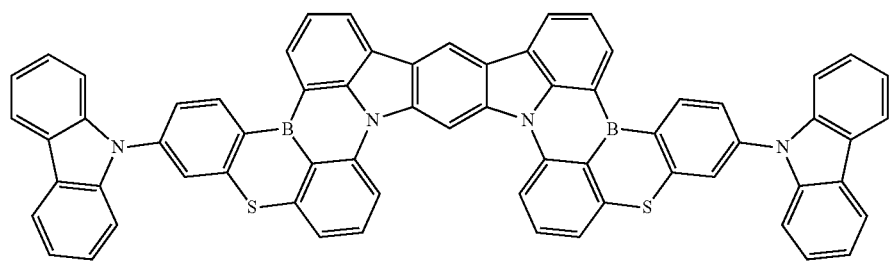

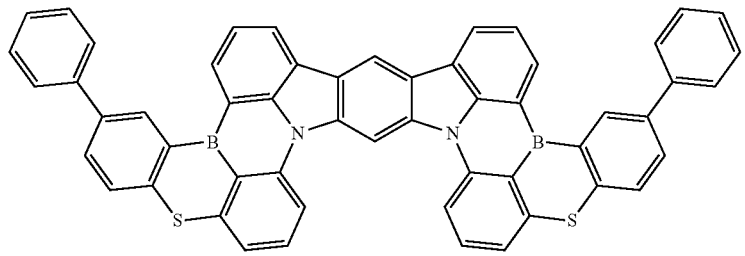
45
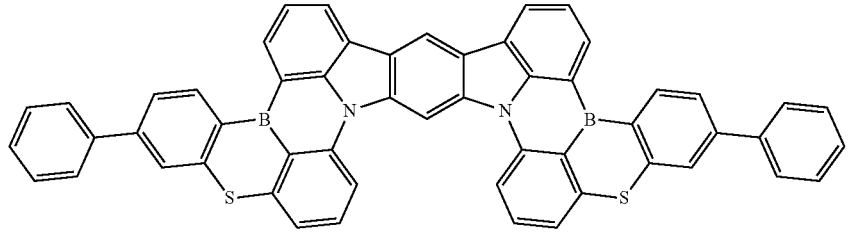
46
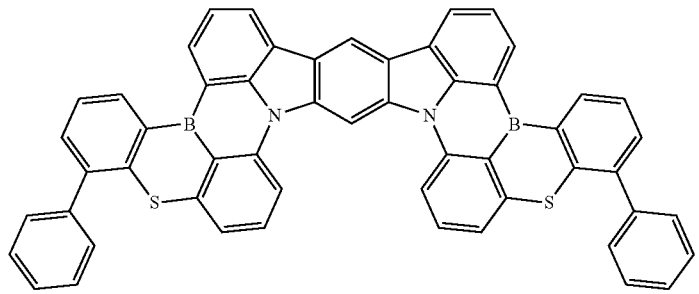
47
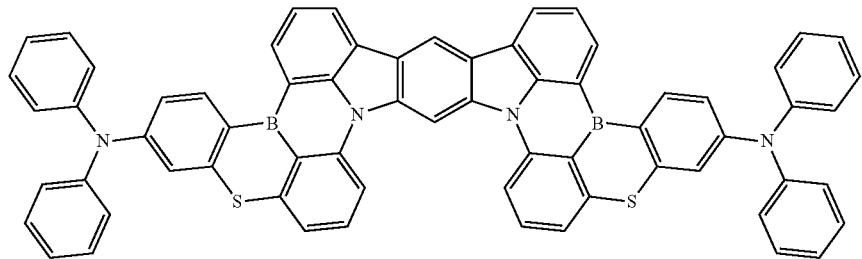
48
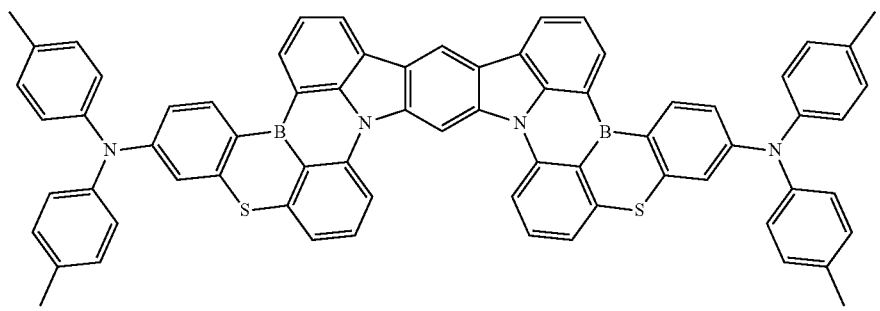
49

-continued
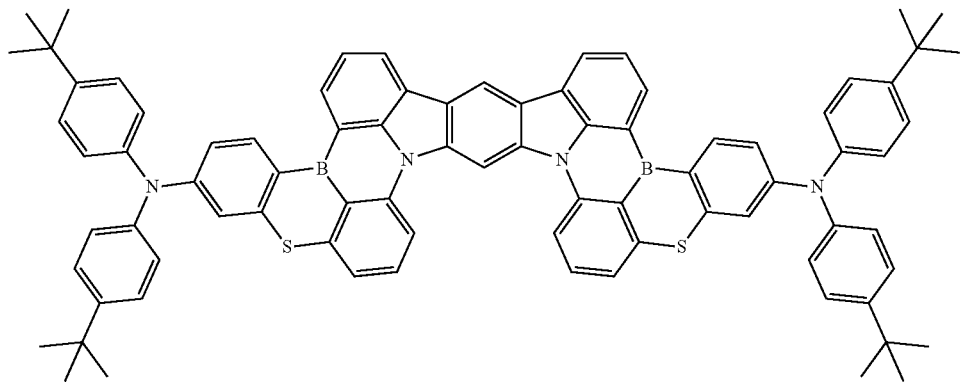
50
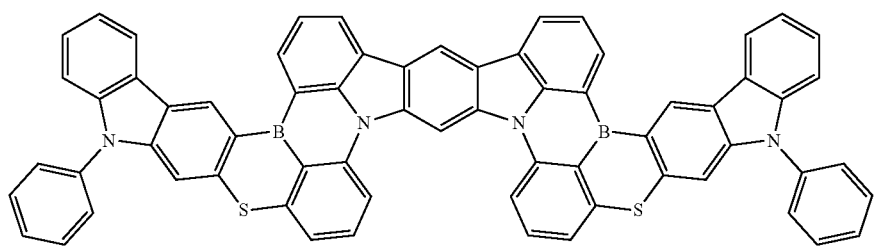
51
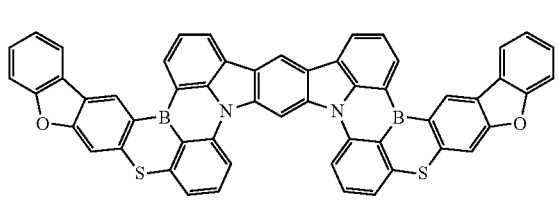
52
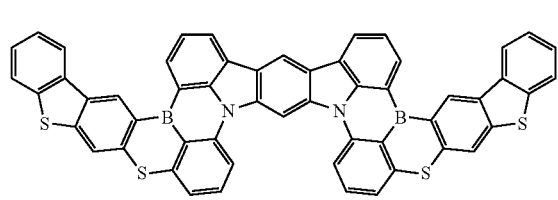
53
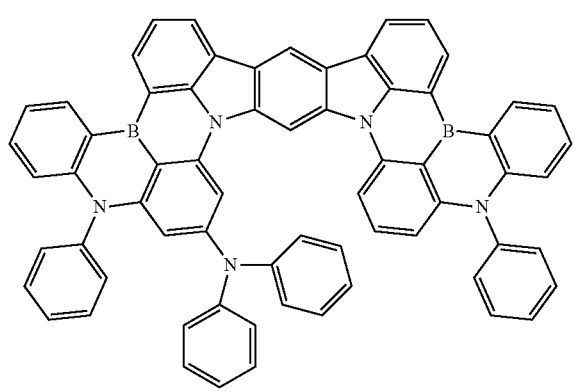
54
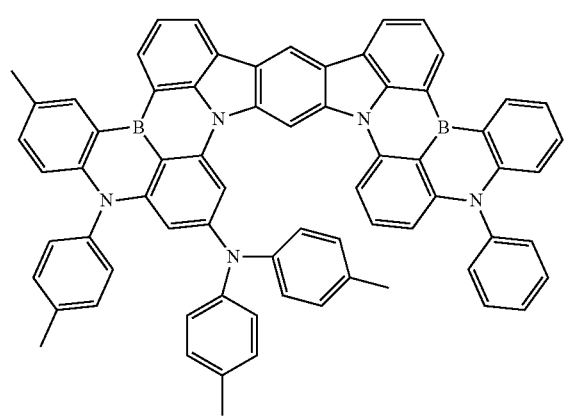
55

-continued
56
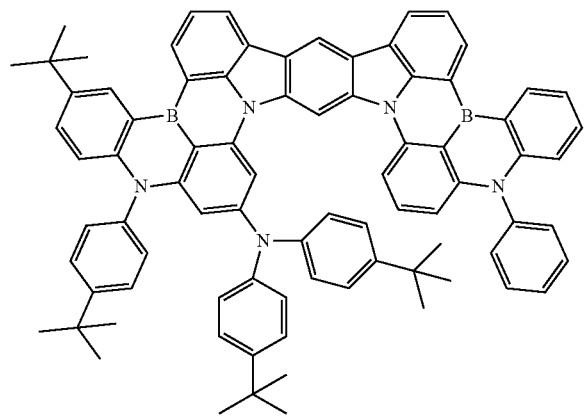
57
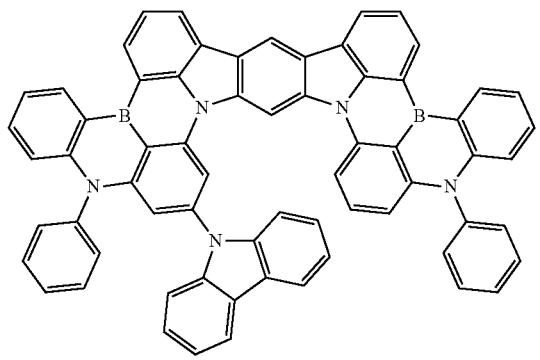
58
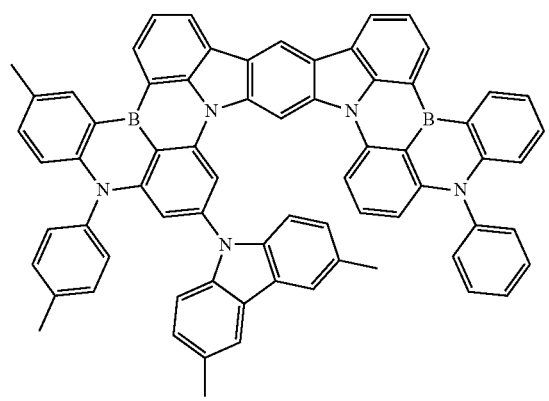
59
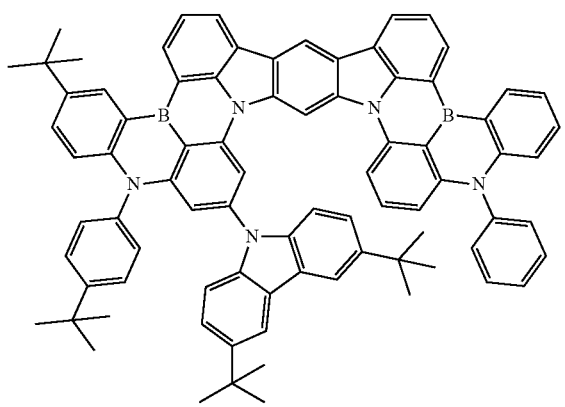
60
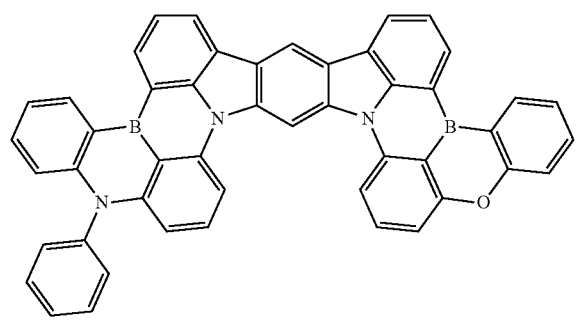
61
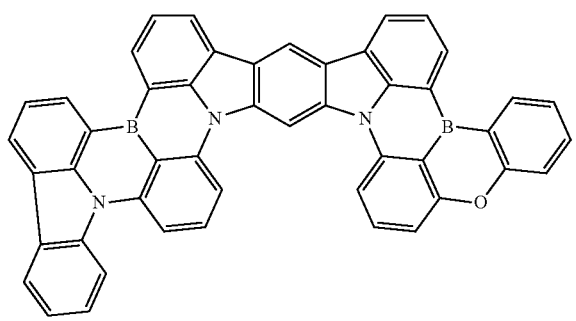
62
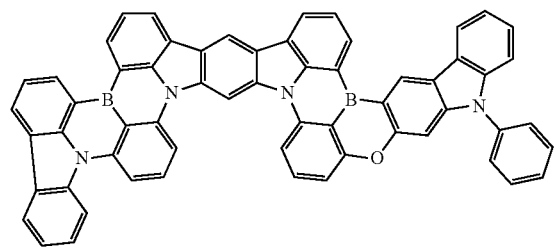
63
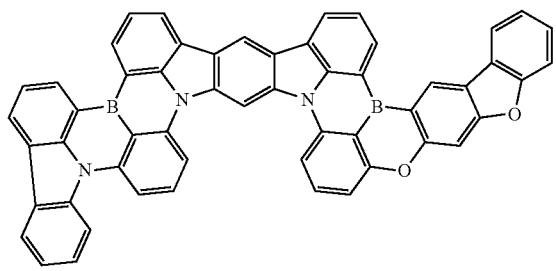

-continued
64
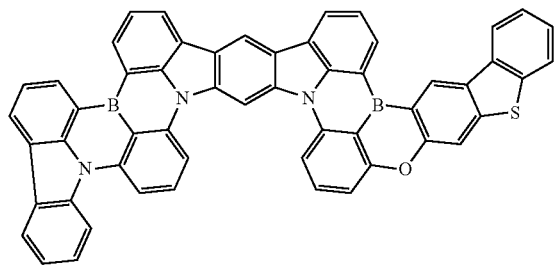
65
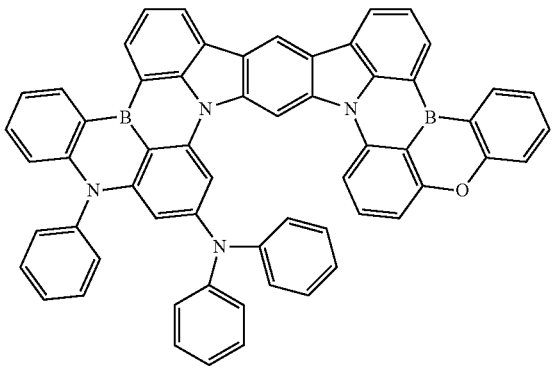
66
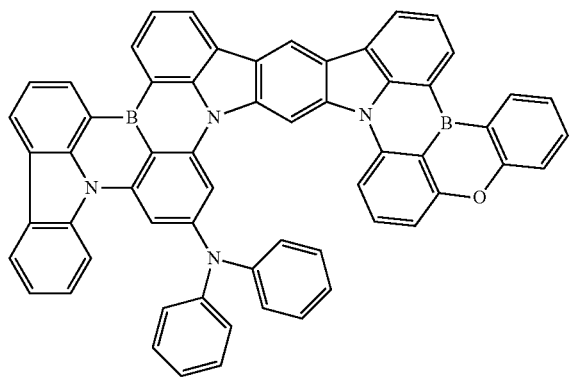
67
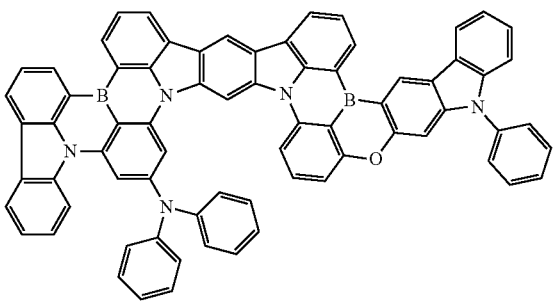
68
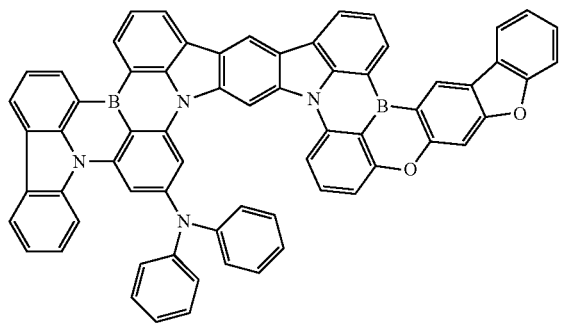
69
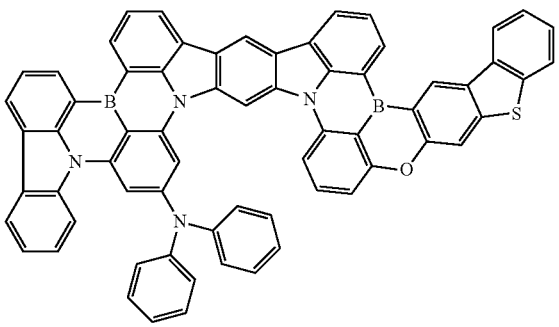
70
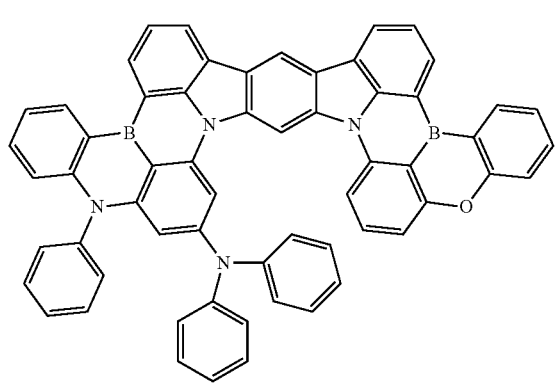
71
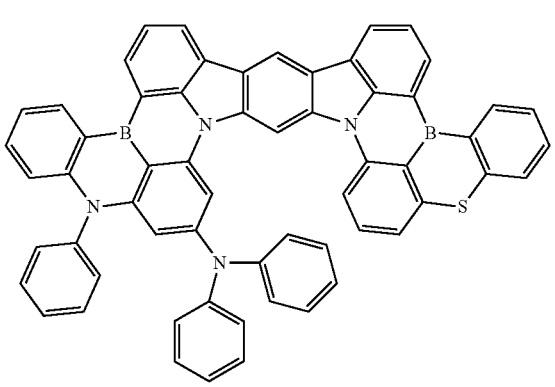

-continued
72
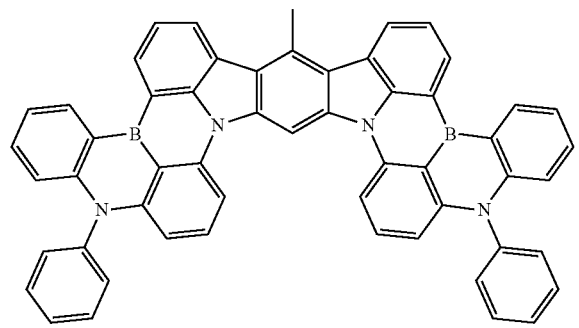
73
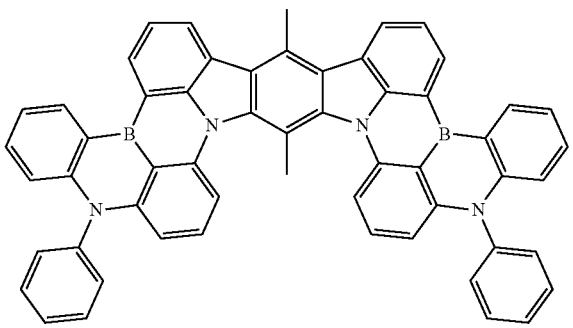
74
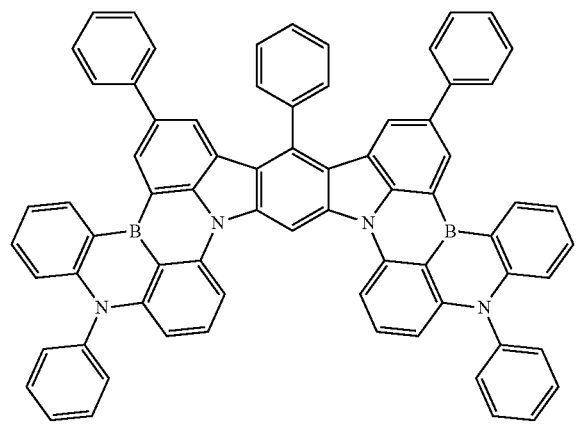
75
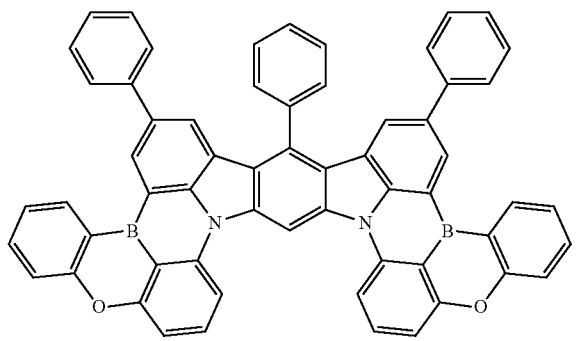
76
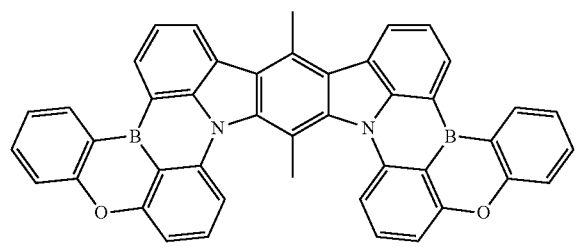
77
78
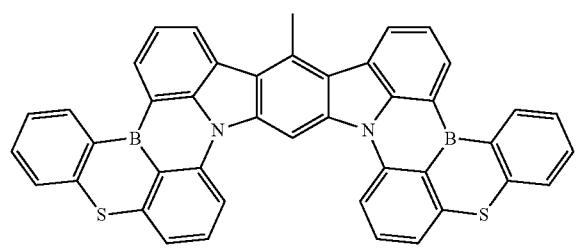
79
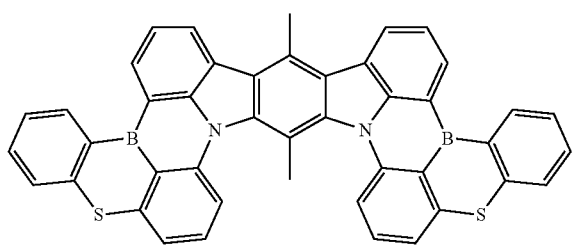

-continued
80
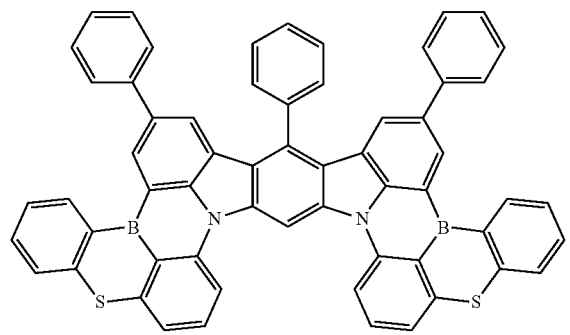
81
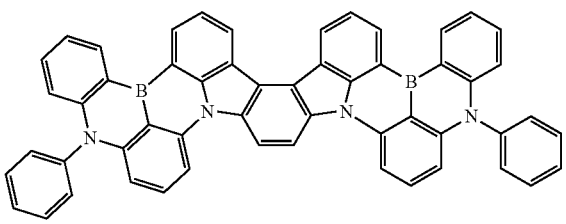
82
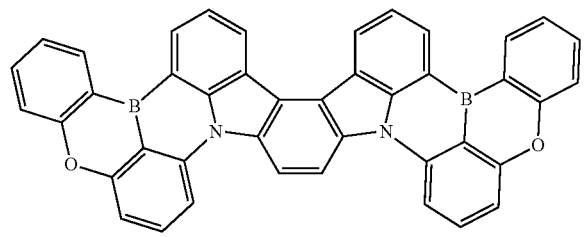
83
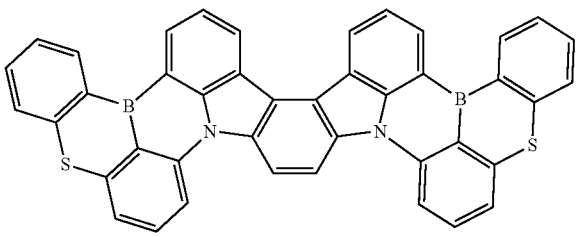
84
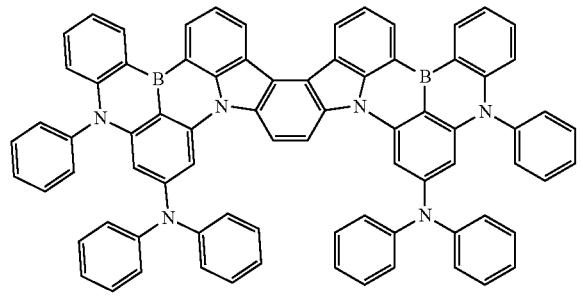
85
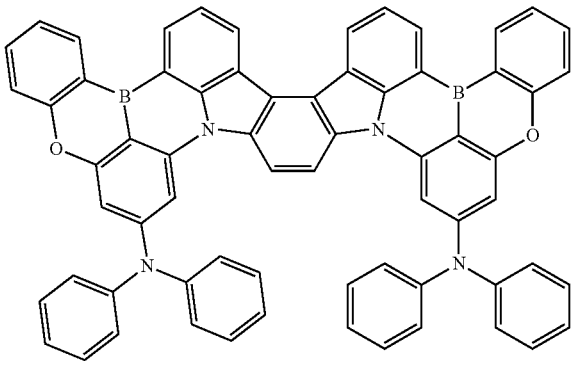
86
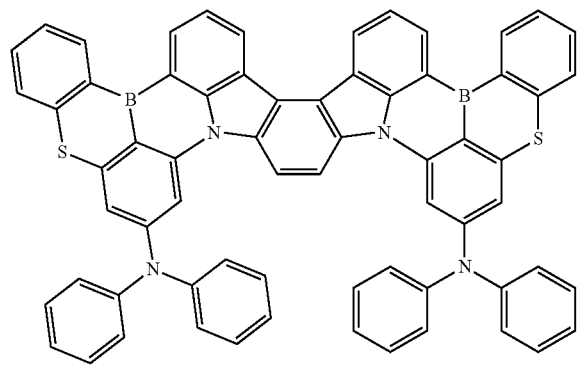
87
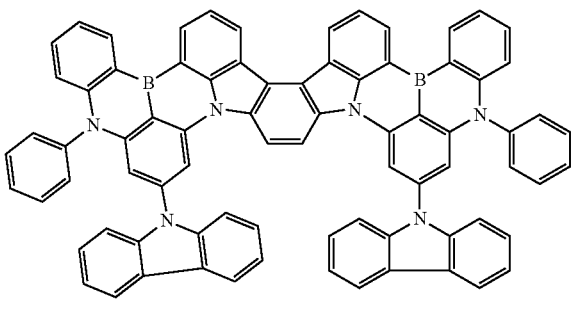

-continued
88
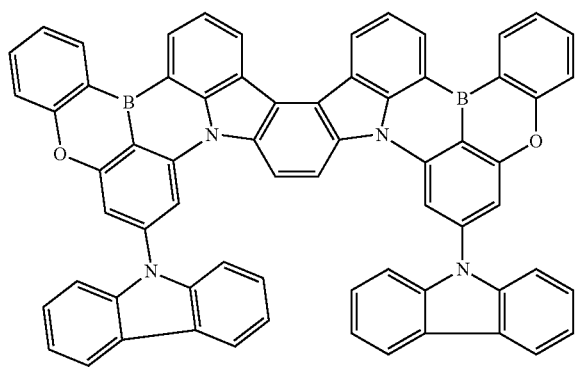
89
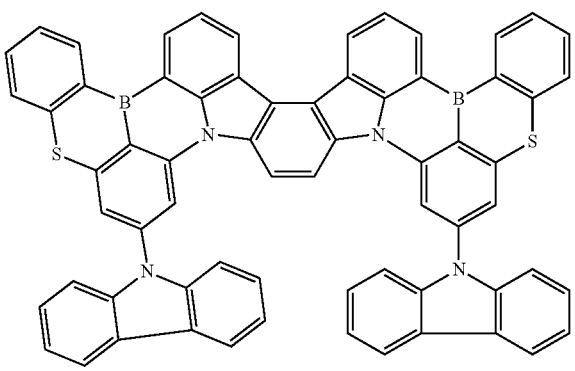
90
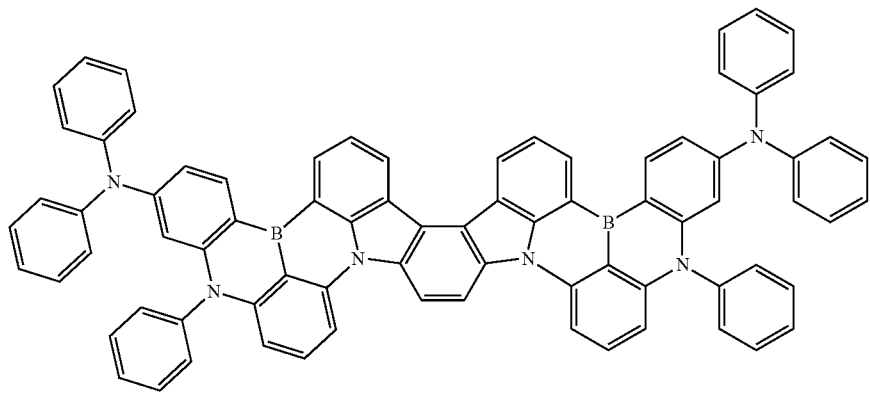
91
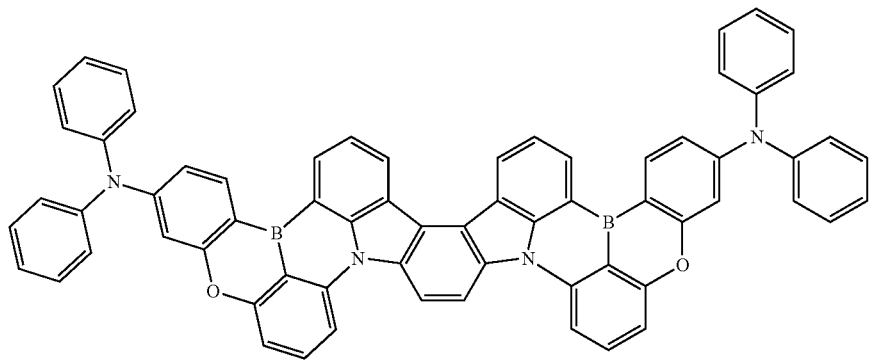
92
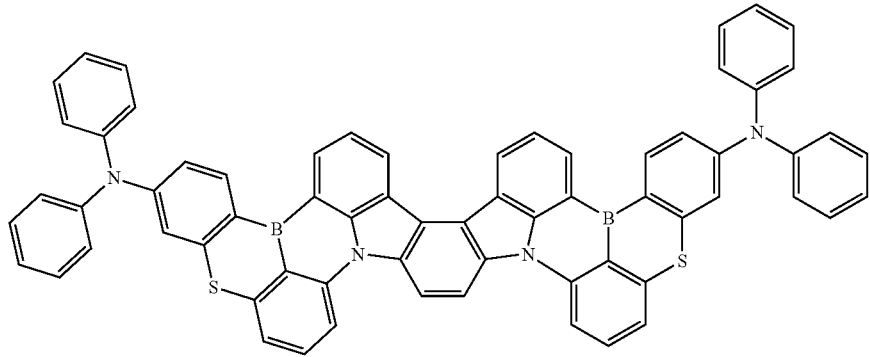

93
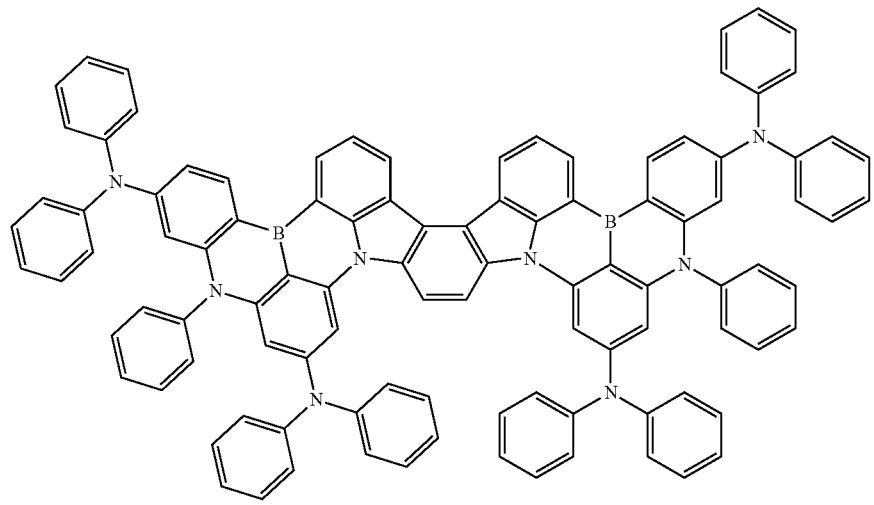
94
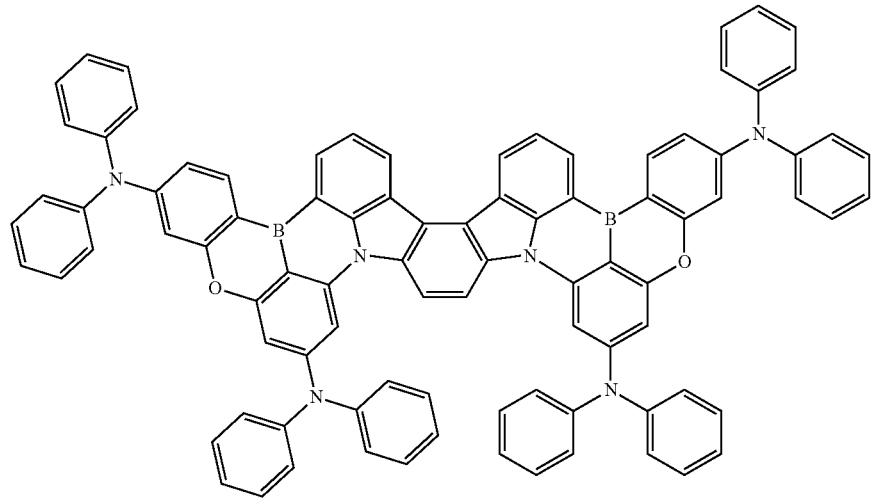
95
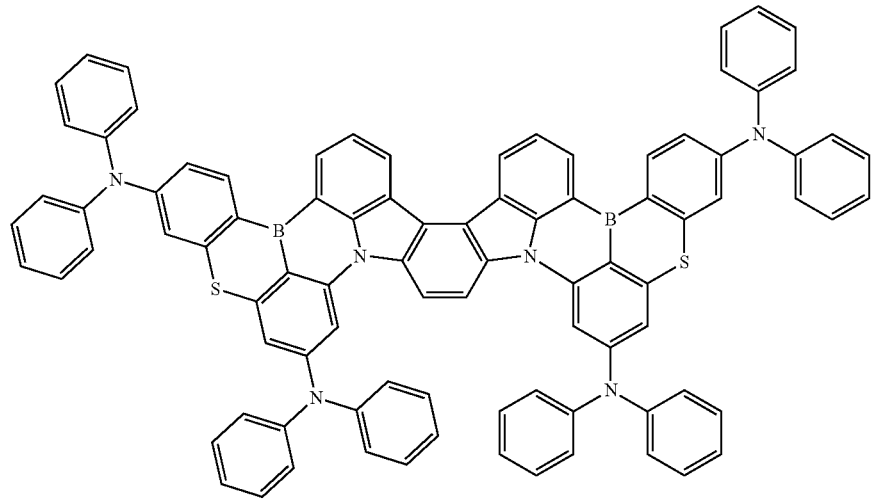

96
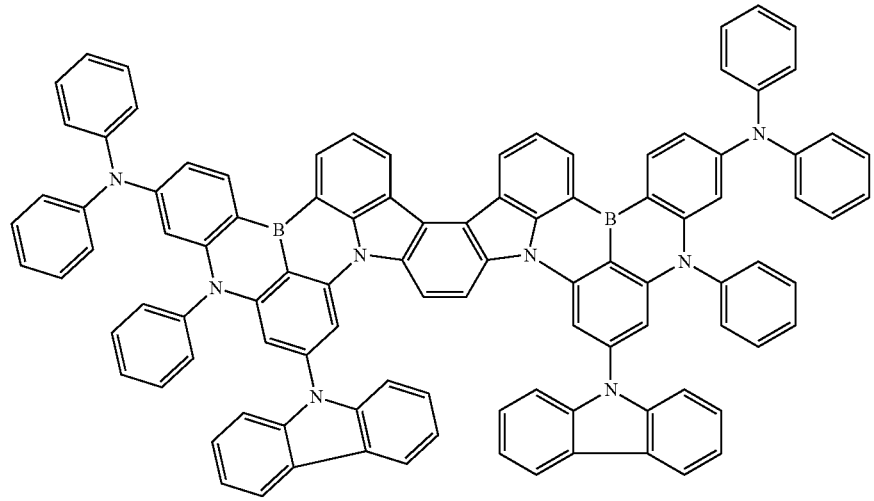
97
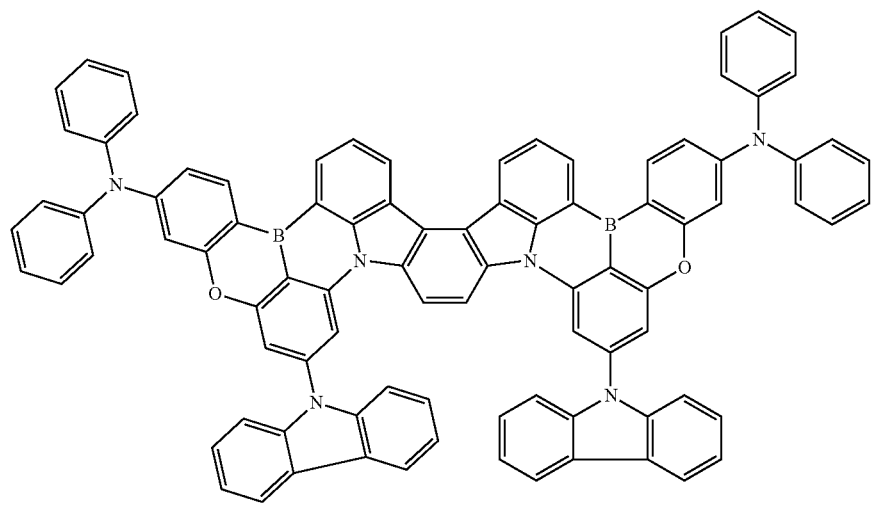
98
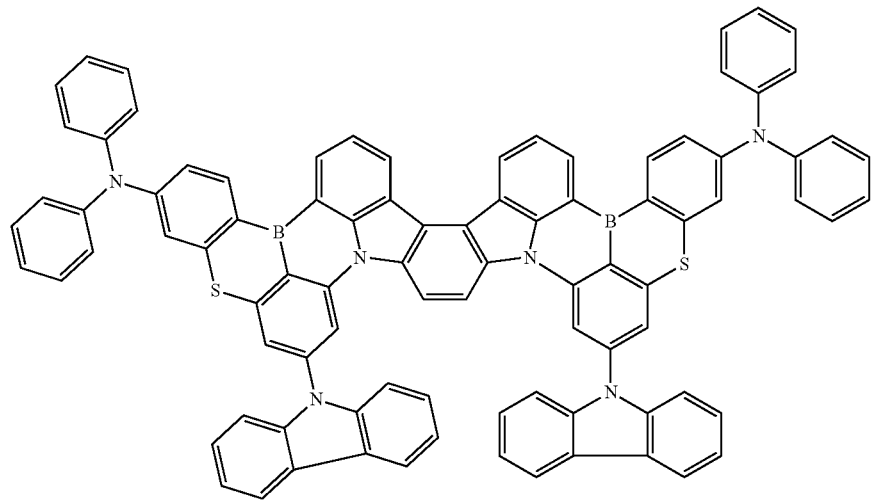

99
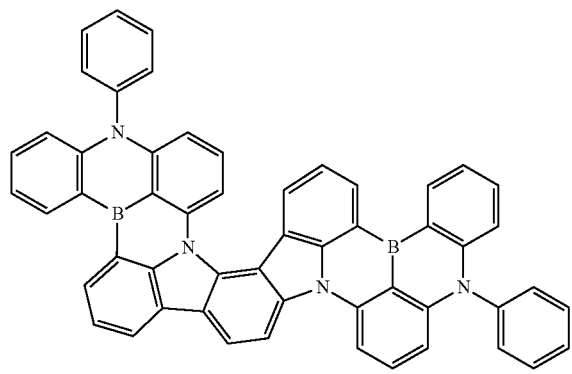
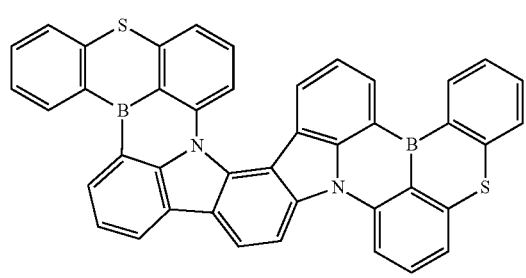
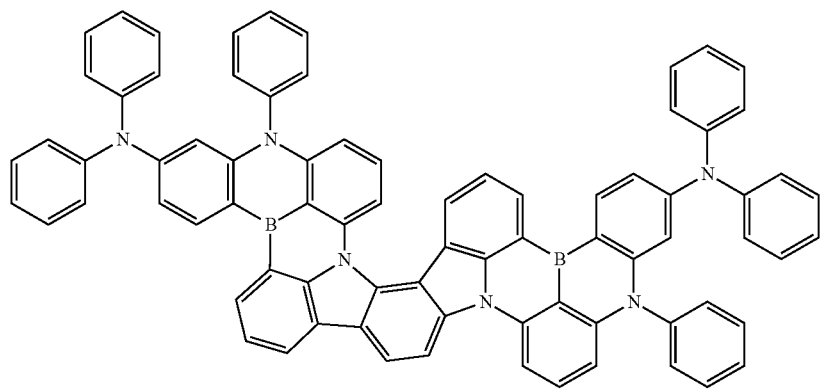
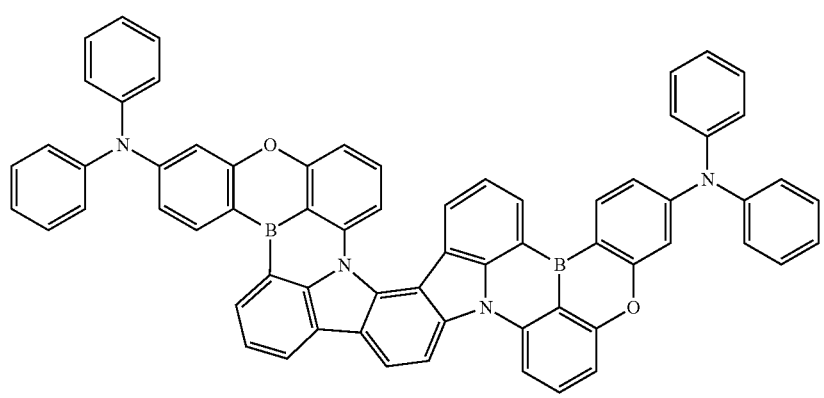
100
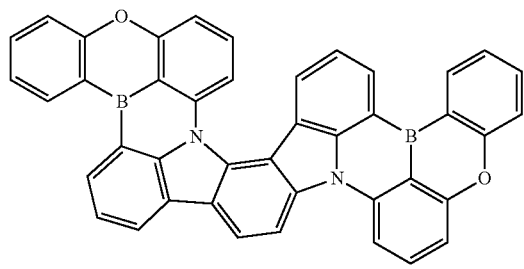
101
102
103

104
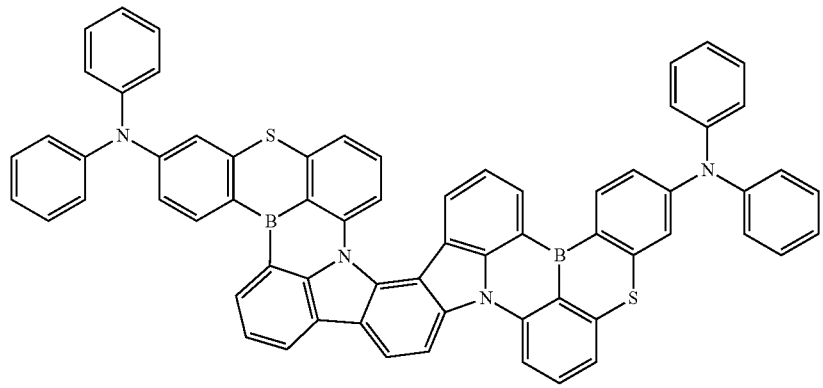
105
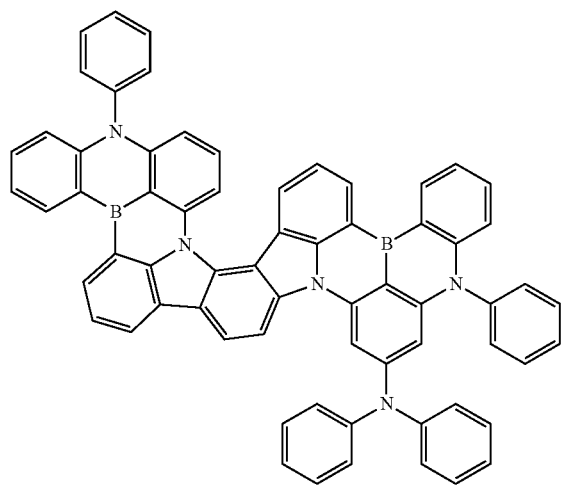
106
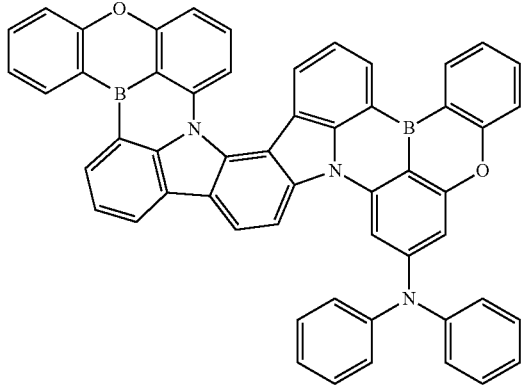
107
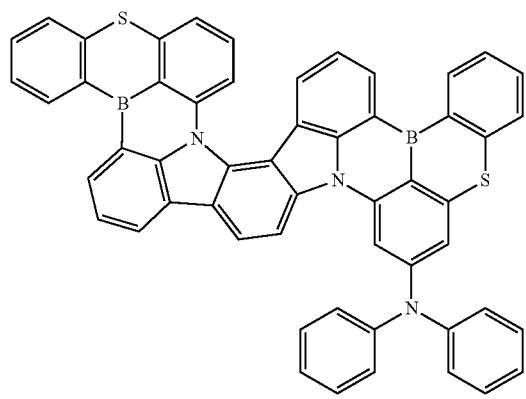
108
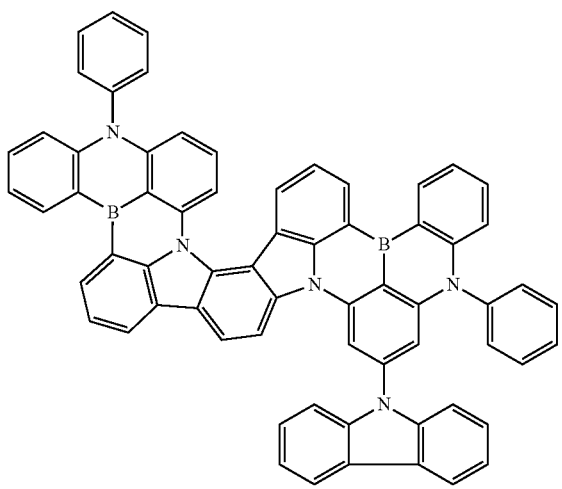

-continued
109
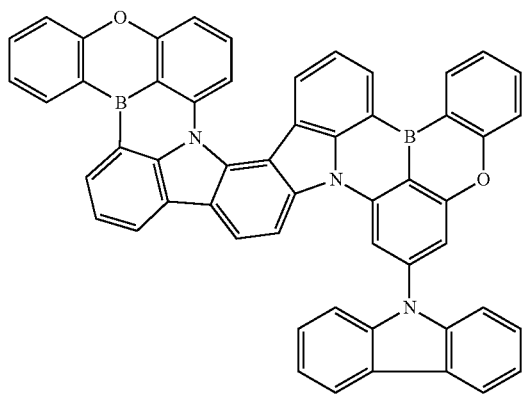
110
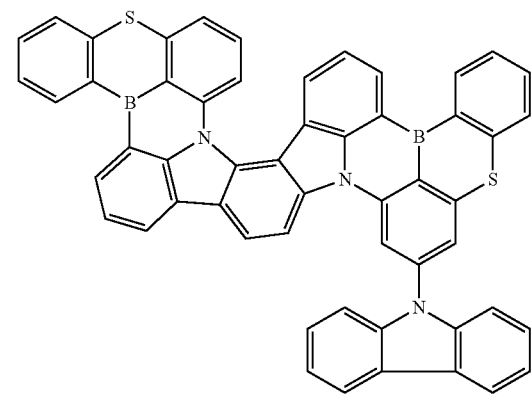
111
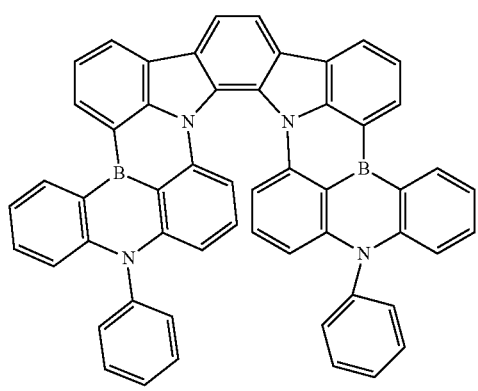
112
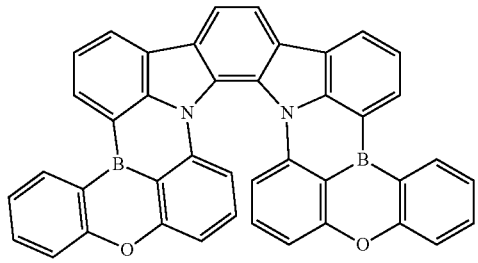
113
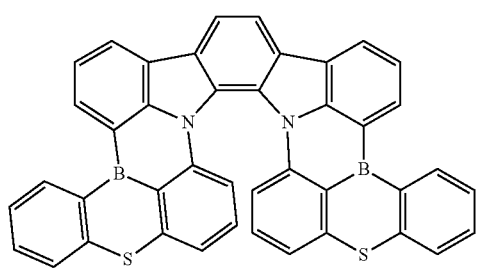
114
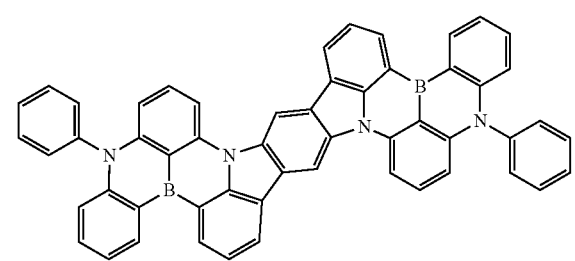
115
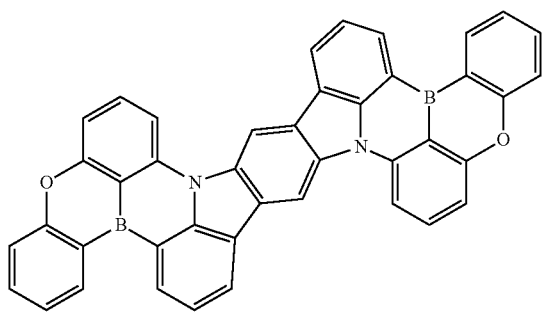
116
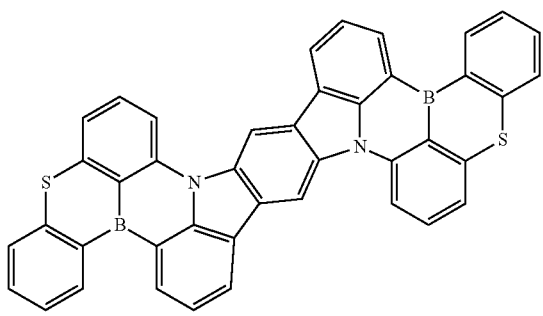

-continued
117
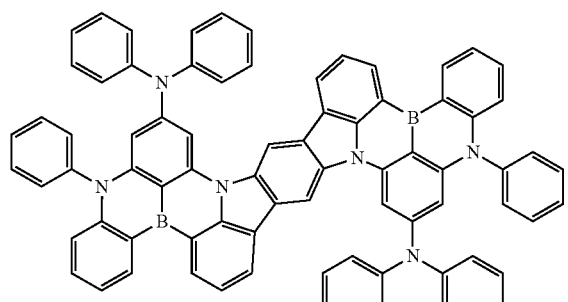
118
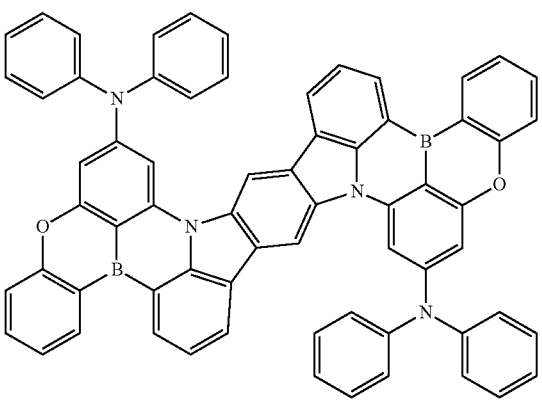
119
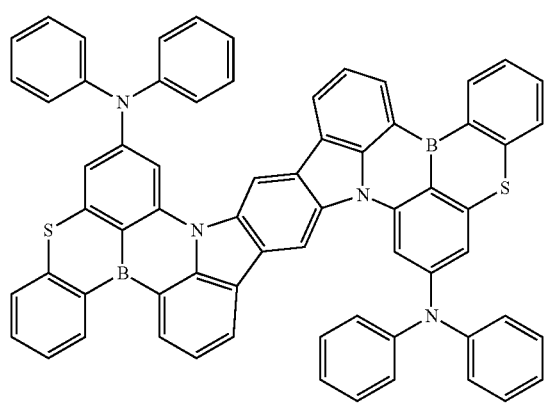
120
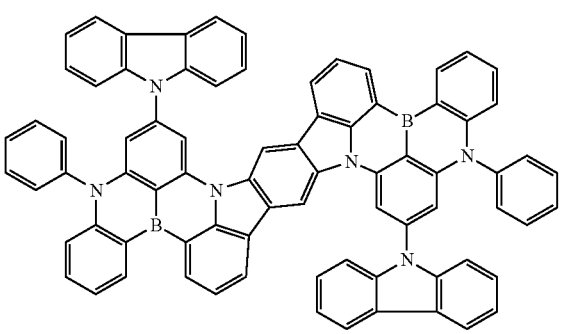
121
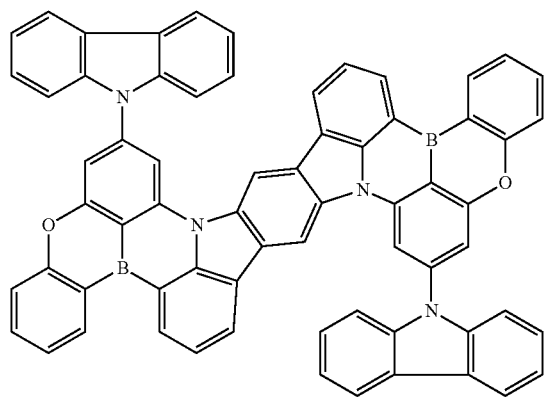
122
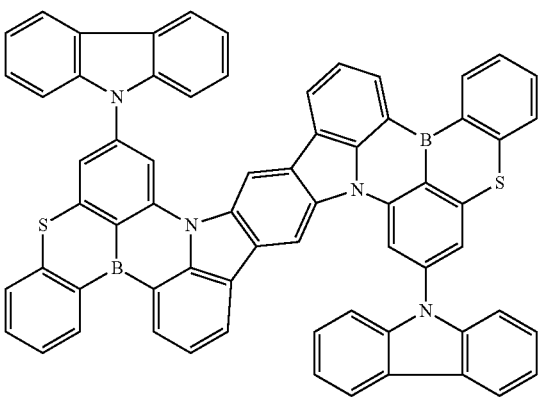
123
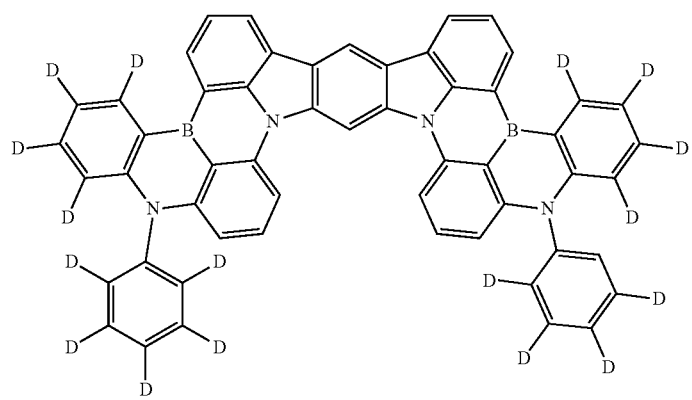

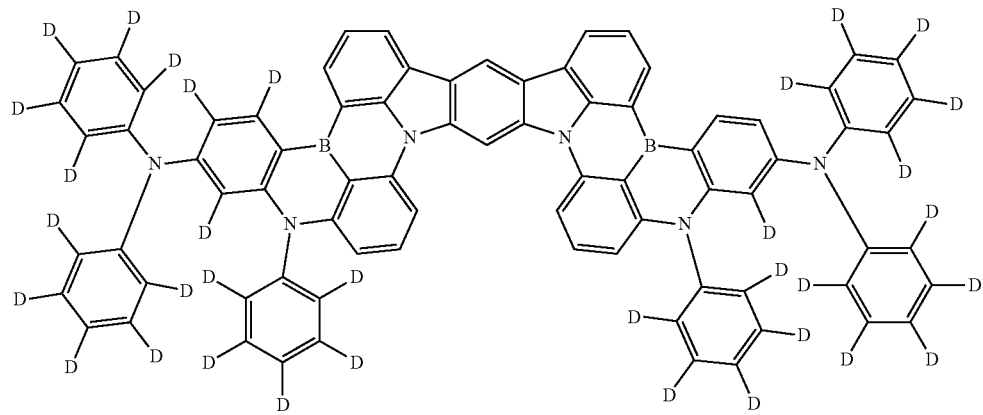
124
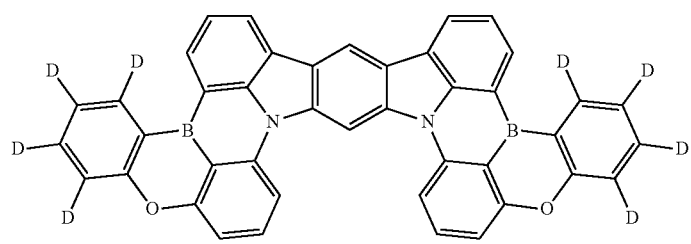
125
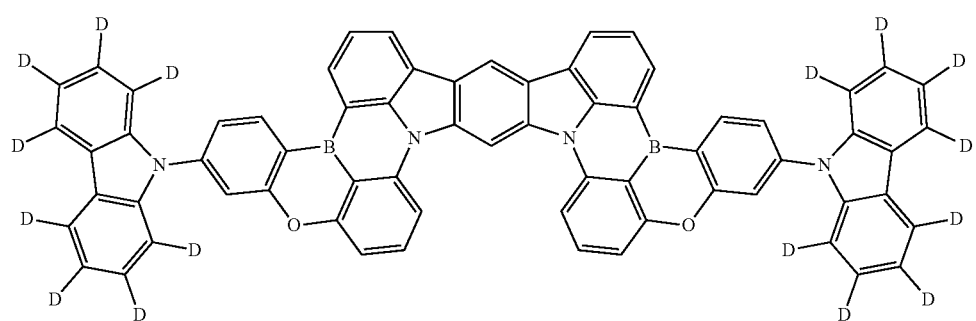
126
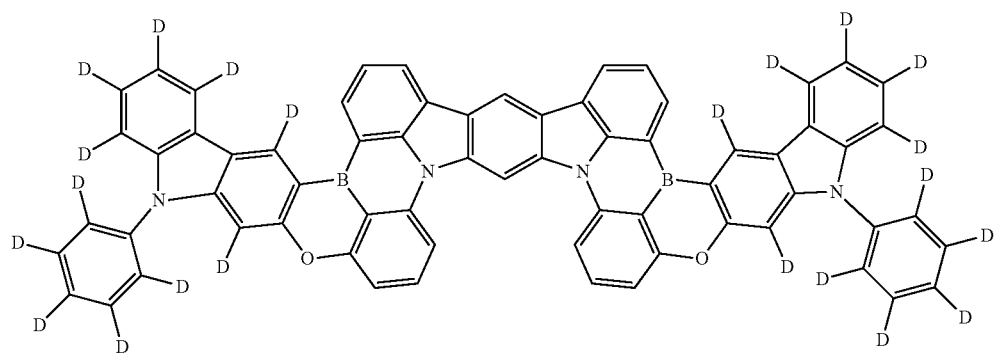
127

128
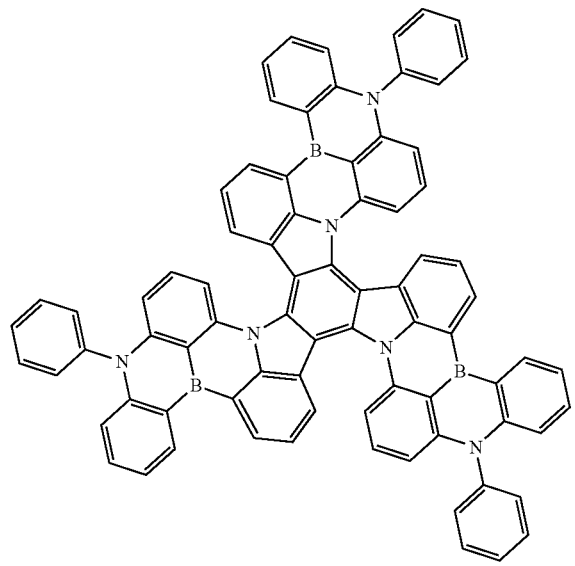
129
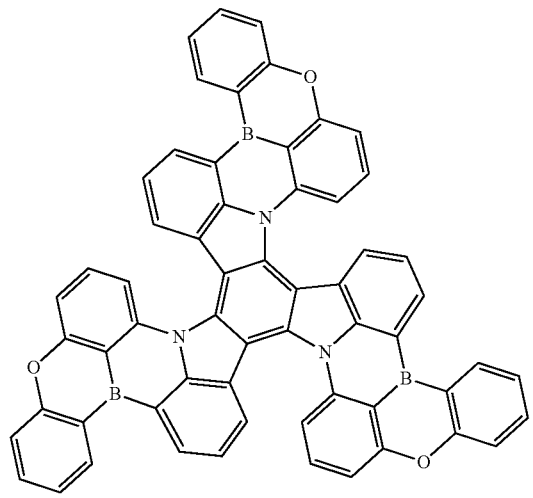
130
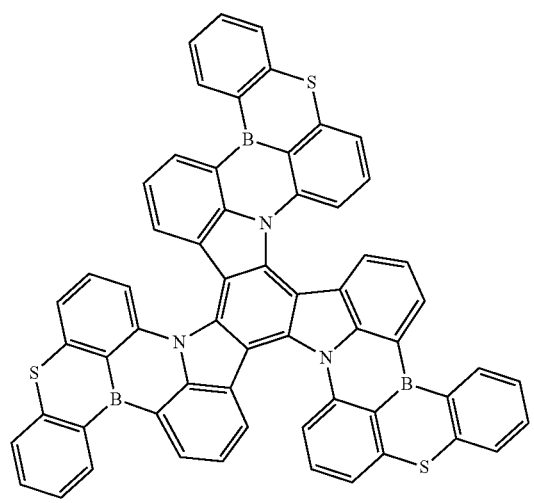
131
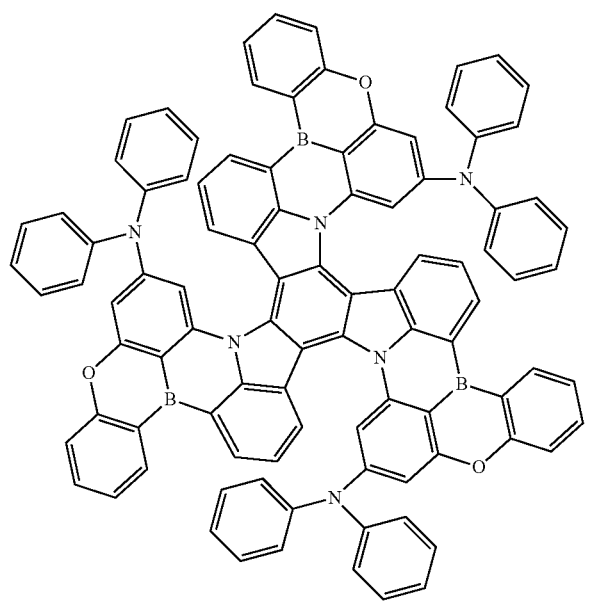

-continued

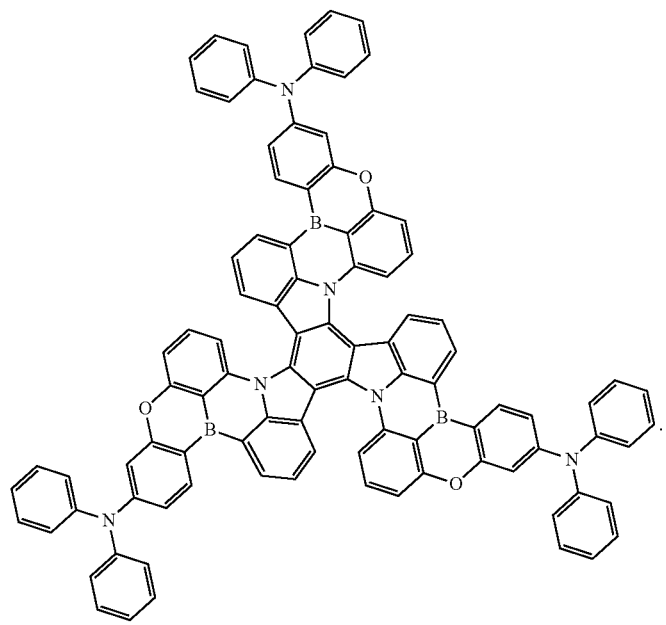
132

13. A condensed polycyclic compound represented by Formula 1:

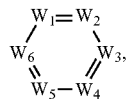
[Formula 1]

wherein, in Formula 1, $W_1$ to $W_6$ are each independently $CR_1$ or a carbon atom connected to a substituent represented by Formula 2;

$R_1$ is a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or is bonded to an adjacent ring to form a ring;

at least two adjacent positions among W $W_1$ to $W_6$ are carbon atoms connected to the substituent represented by Formula 2; and two or three of the substituent represented by Formula 2 are connected to Formula 1, wherein, in Formula 2, $X_1$ is O, S, or $NAr_1$;

$Ar_1$ is a substituted or unsubstituted aryl group having 6 to 30 ring-forming carbon atoms, or a substituted or unsubstituted heteroaryl group having 2 to 30 ring-forming carbon atoms, and/or is bonded to an adjacent group to form a ring;

$R_2$ to $R_4$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent ring to form a ring;

a and b are each independently an integer of 0 to 3; and c is an integer of 0 to 4.

14. The condensed polycyclic compound of claim 13, wherein the condensed polycyclic compound represented by Formula 1 is represented by at least one of Formula 1-1 to Formula 1-5:

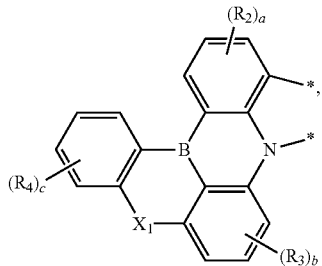
[Formula 2]

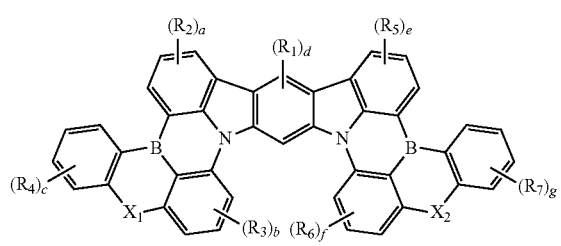
[Formula 1-1]

[Formula 1-2]

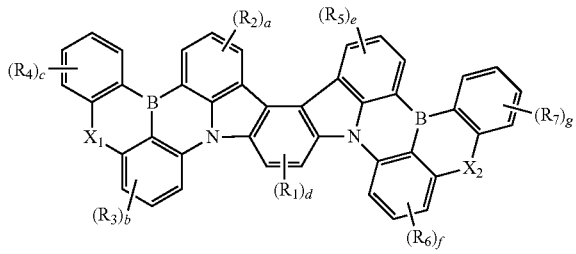

[Formula 1-3]

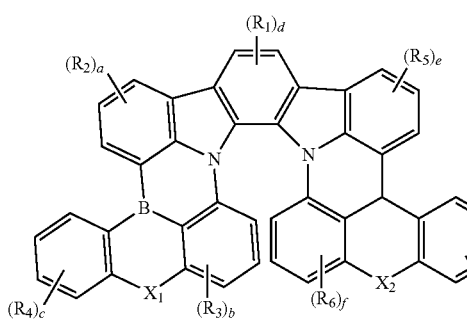

[Formula 1-4]

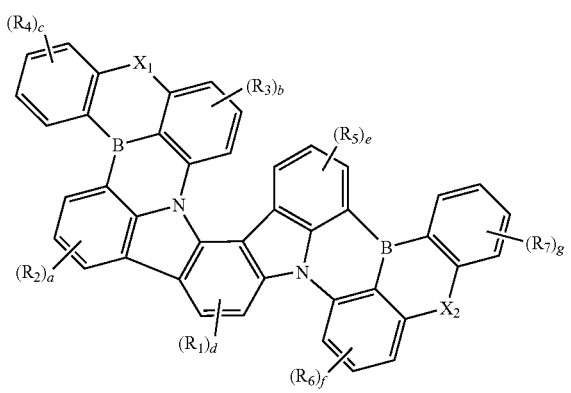

[Formula 1-5]

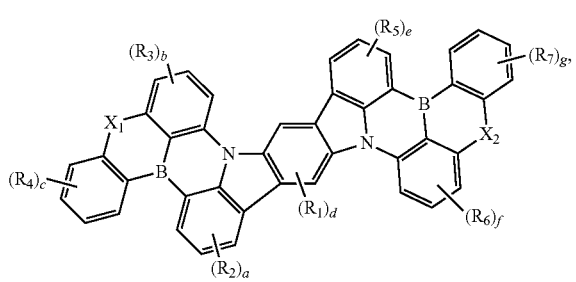

wherein, in Formula 1-1 to in Formula 1-5,
$X_2$ is O, S, or $NAr_2$;
$Ar_2$ is a substituted or unsubstituted aryl group having 6 to 30 ring-forming carbon atoms, or a substituted or unsubstituted heteroaryl group having 2 to 30 ring-forming carbon atoms, and/or is bonded to an adjacent group to form a ring;
$R_5$ to $R_7$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring;
d is an integer of 0 to 2;
e and f are each independently an integer of 0 to 3;
g is an integer of 0 to 4; and
$X_1$, $Ar_1$, $R_1$ to $R_4$, and a to c are each independently the same as defined in Formula 1.

15. The condensed polycyclic compound of claim 14, wherein, in Formula 1-1 to Formula 1-5, $X_1$ and $X_2$ are the same.

16. The condensed polycyclic compound of claim 13, wherein the two or three of the substituent represented by Formula 2 that are substituted to Formula 1 are the same.

17. The condensed polycyclic compound of claim 13, wherein the condensed polycyclic compound represented by Formula 1 is represented by Formula 3:

[Formula 3]

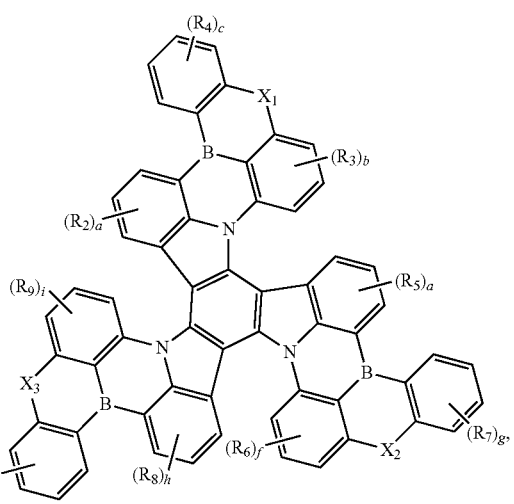

wherein, in Formula 3,
$X_2$ is O, S, or $NAr_2$;
$X_3$ is O, S, or $NAr_3$;
$Ar_2$ and $Ar_3$ are each independently substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring;
$R_5$ to $R_{10}$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent ring to form a ring;
e and f are each independently an integer of 0 to 3;
g is an integer of 0 to 4 and,
h and i are each independently an integer of 0 to 3;
j is an integer of 0 to 4; and
$X_1$, $Ar_1$, $R_1$ to $R_4$, and a to c are each independently the same as defined in Formula 1.

18. The condensed polycyclic compound of claim 17, wherein, in Formula 3, $X_1$, $X_2$, and $X_3$ are all the same.

19. The condensed polycyclic compound of claim 13, wherein $R_2$ to $R_4$ are each independently a hydrogen atom, a substituted or unsubstituted methyl group, a substituted or unsubstituted t-butyl group, a substituted or unsubstituted diphenylamine group. a substituted or unsubstituted phenyl group, or a substituted or unsubstituted carbazole group.

20. The condensed polycyclic compound of claim 13, wherein the condensed polycyclic compound represented by Formula 1 is at least one of the compounds represented by Compound Group 1:

[Compound Group 1]

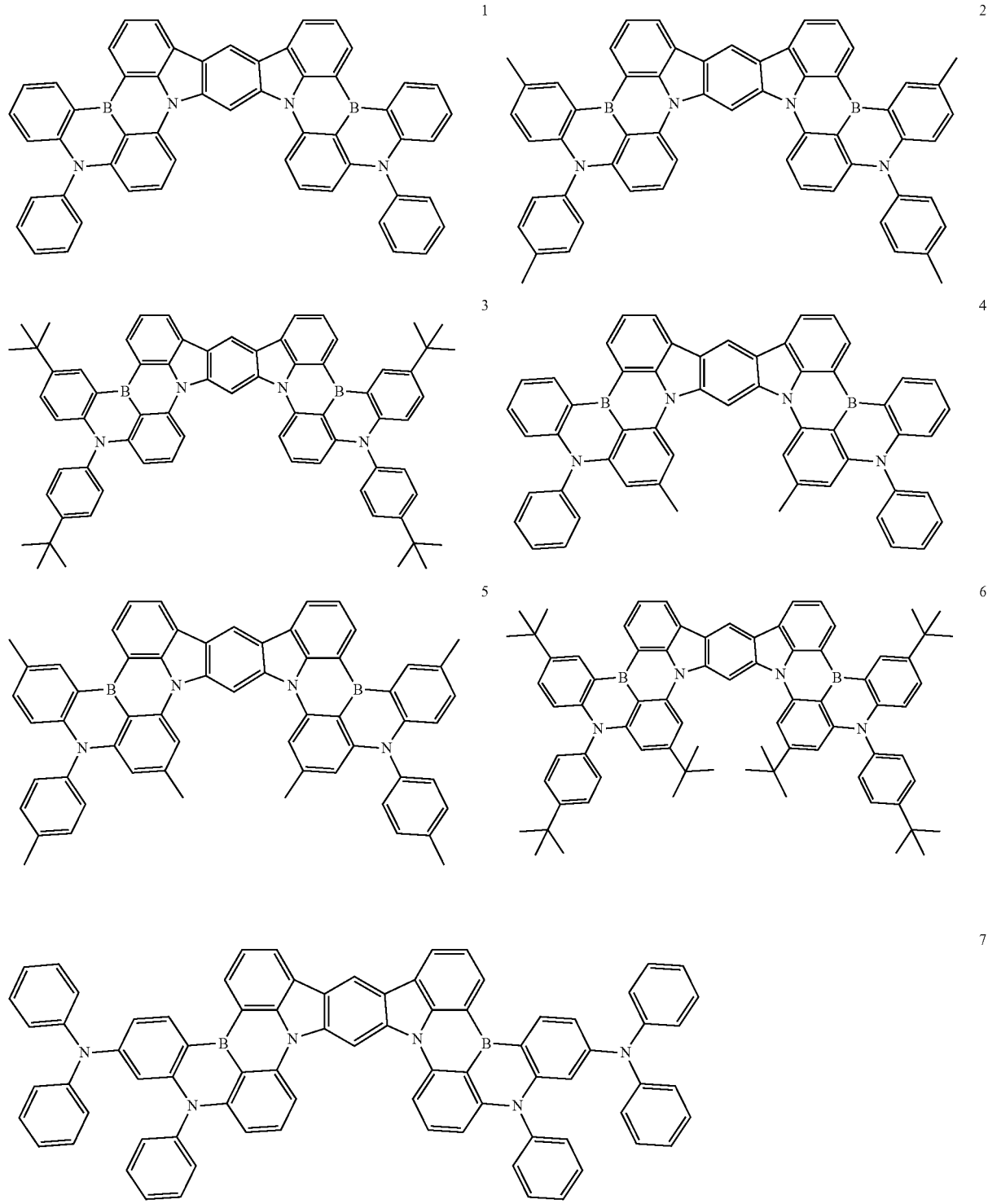

8
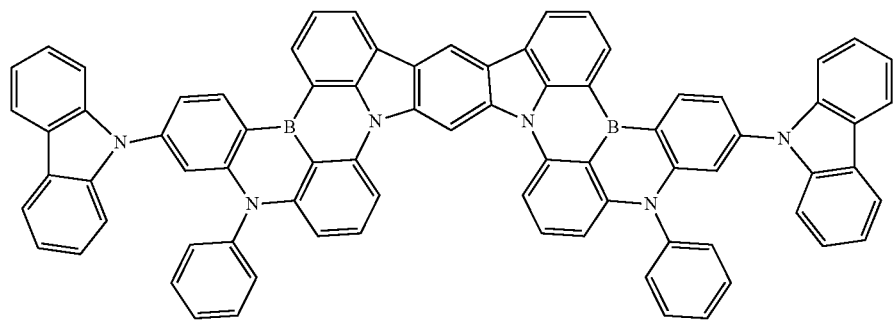
9
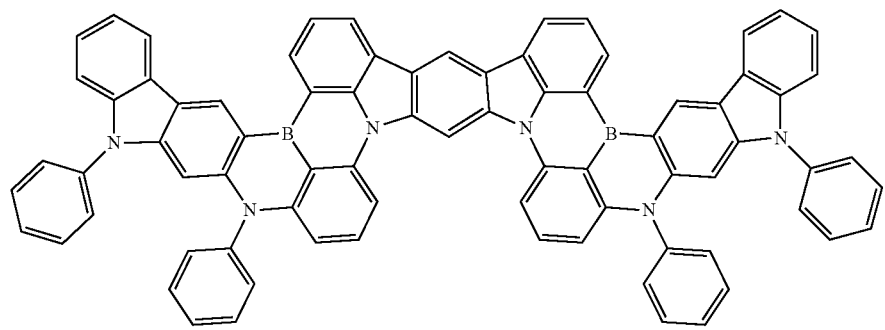
10 11
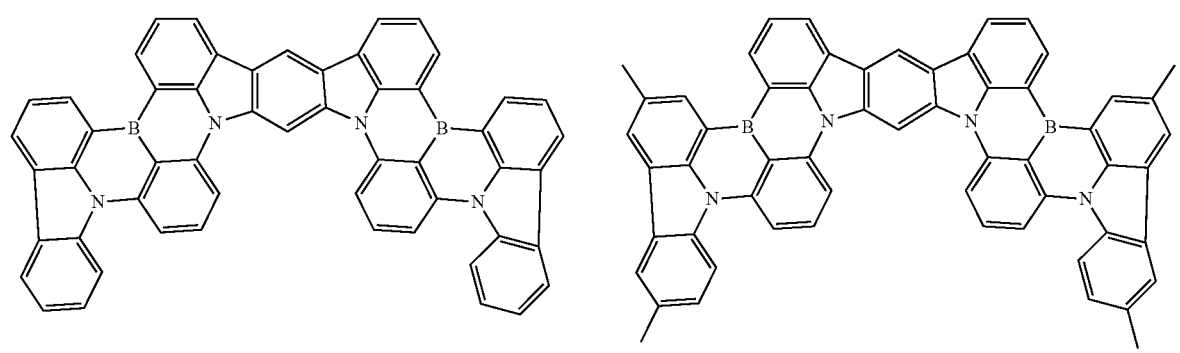
12 13
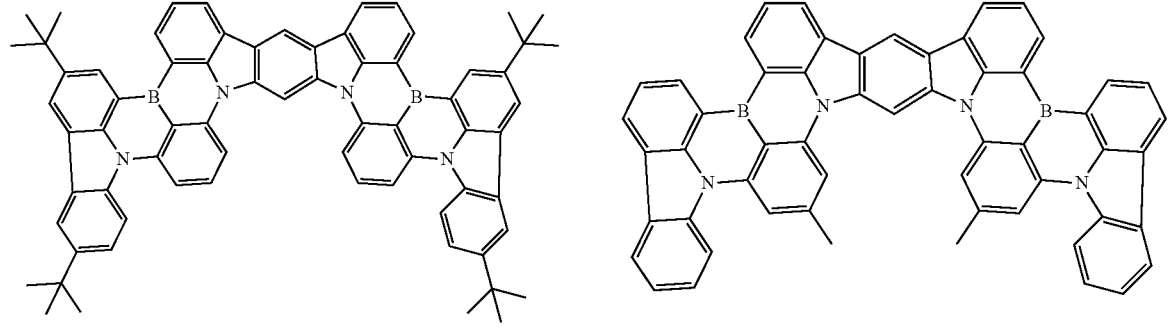

14
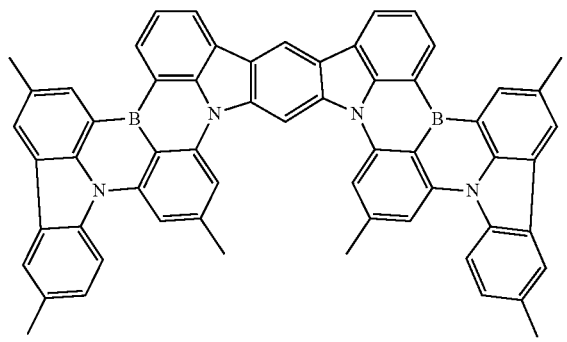
15
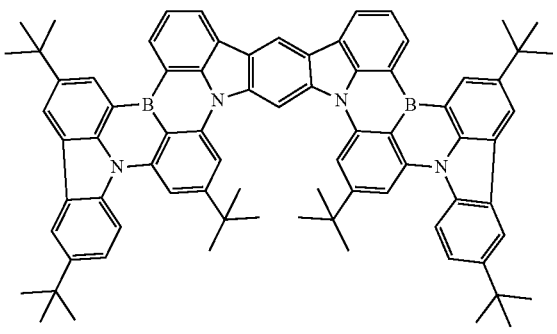
16
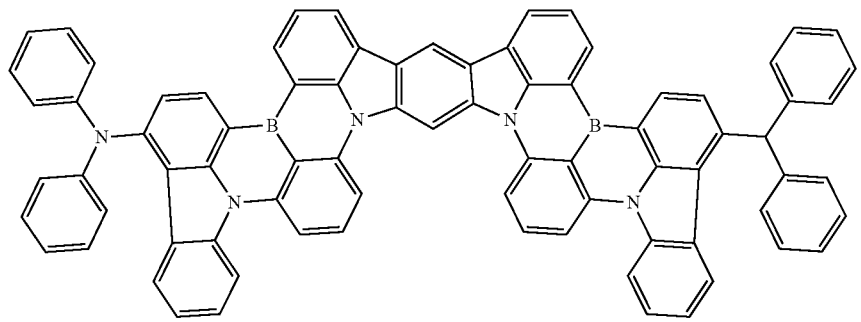
17
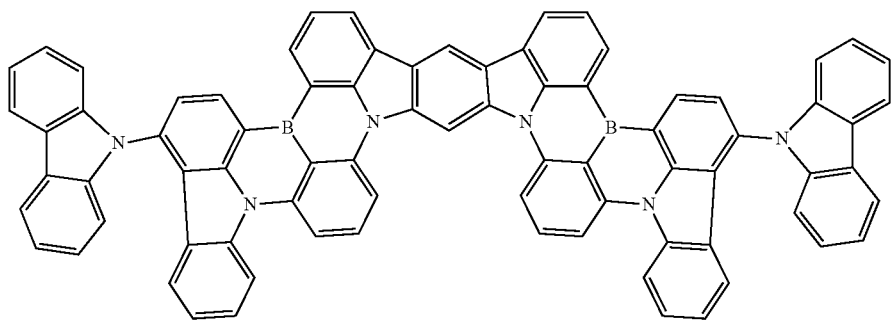
18
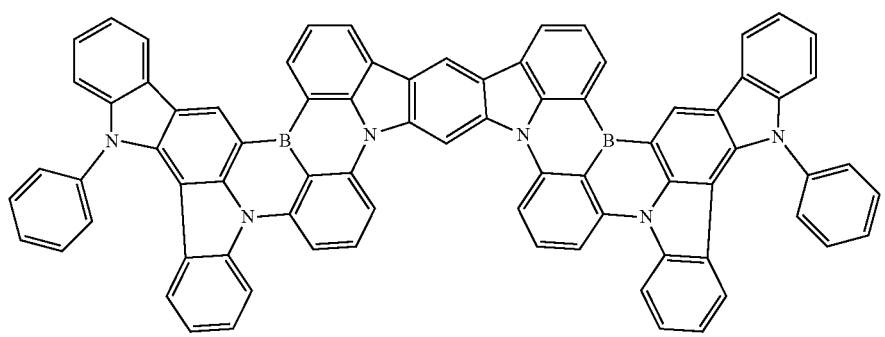

-continued
19
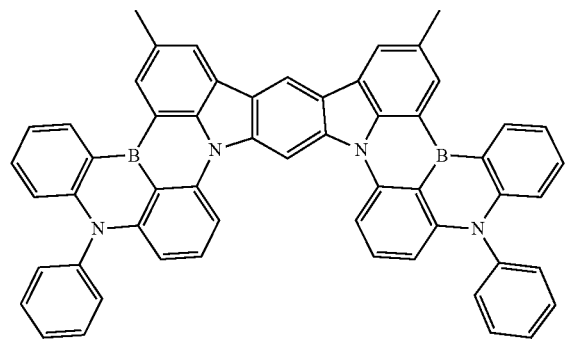
20
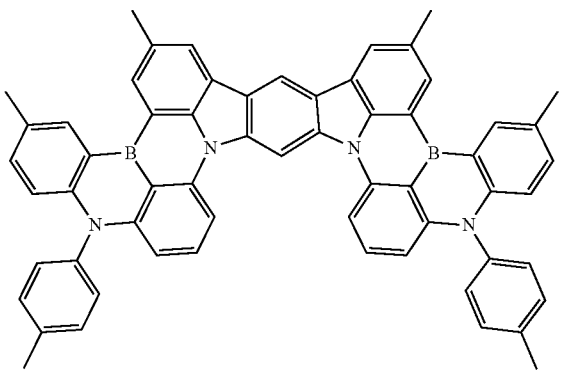
21
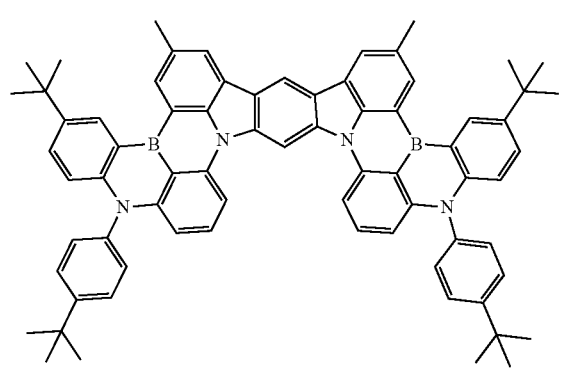
22
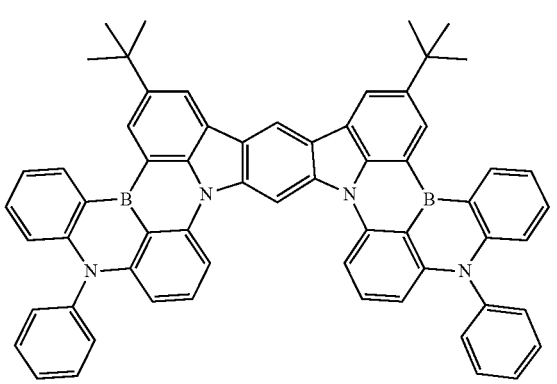
23
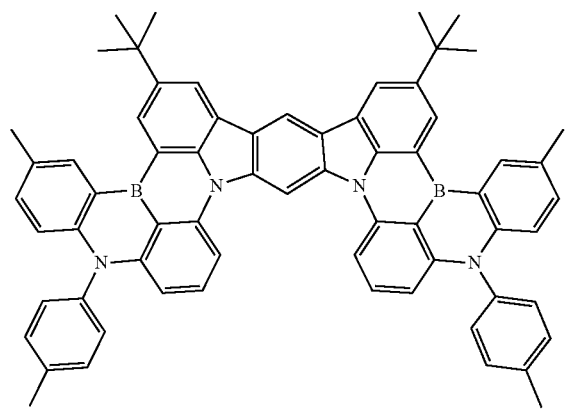
24
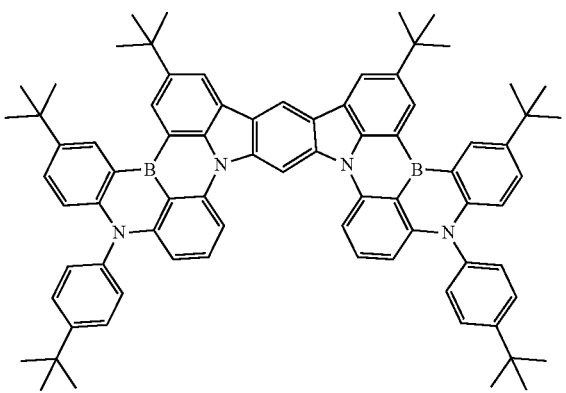
25
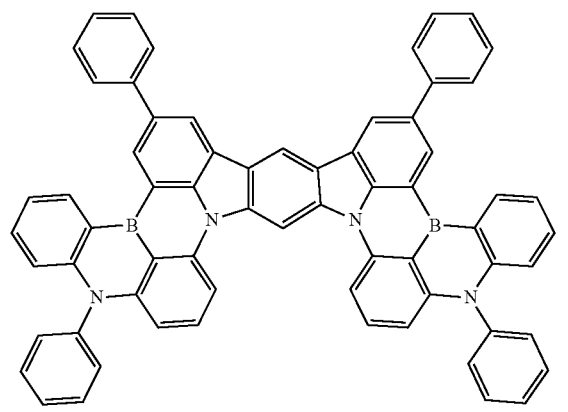
26
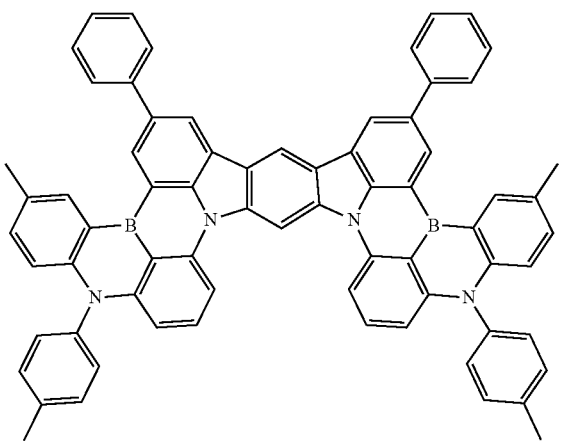

27
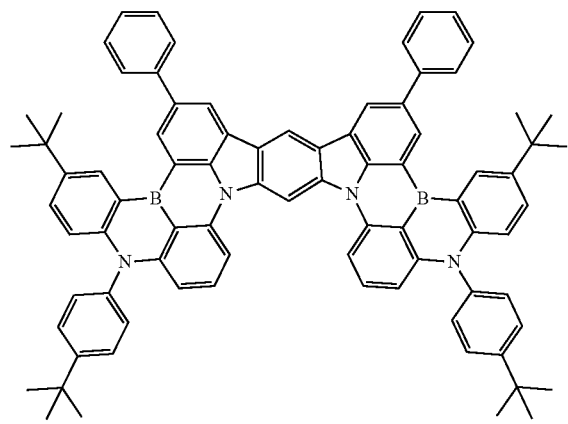
28
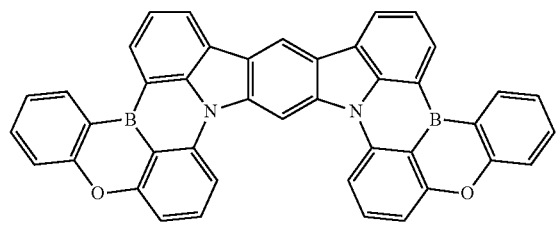
29
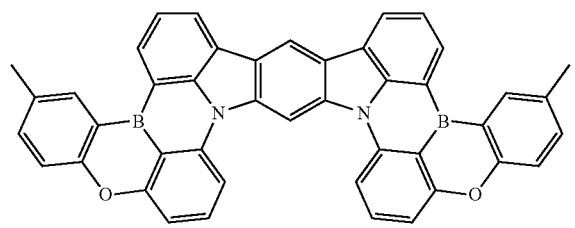
30
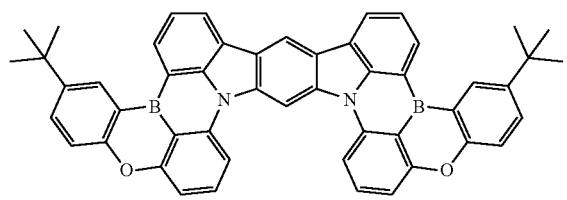
31
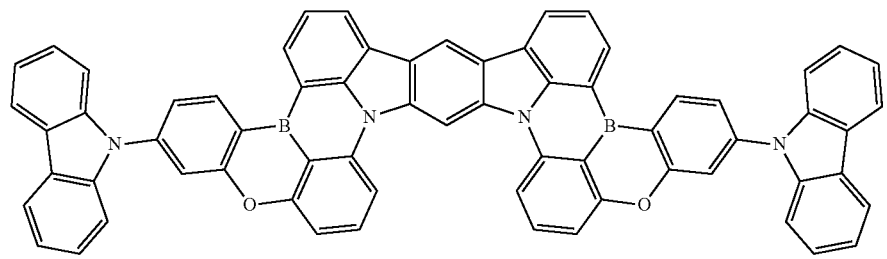
32
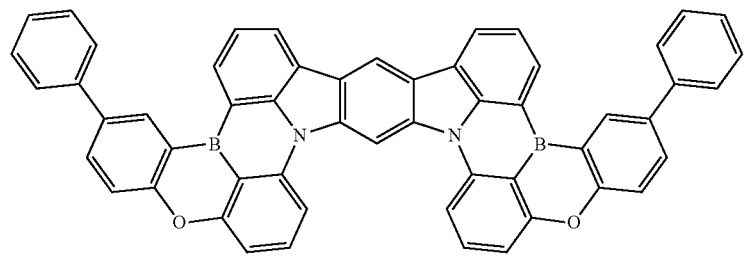
33
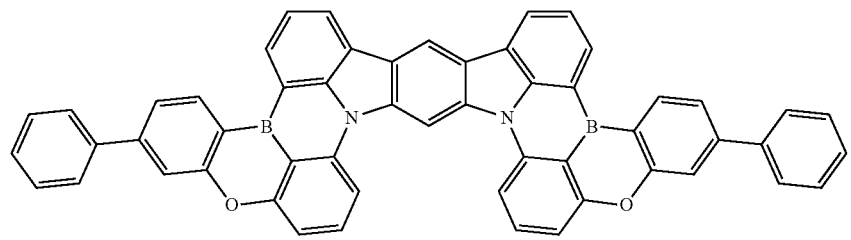

34
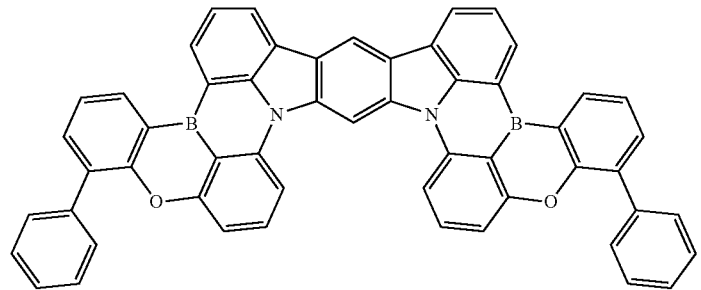
35
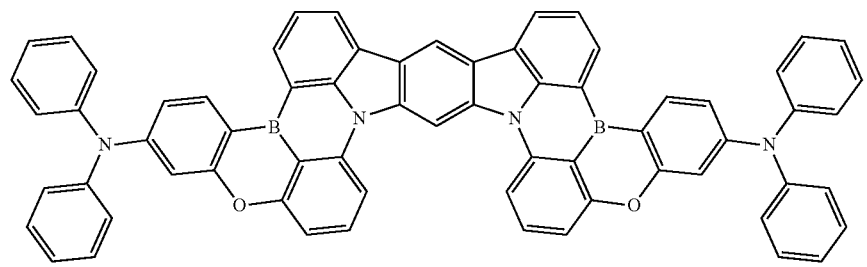
36
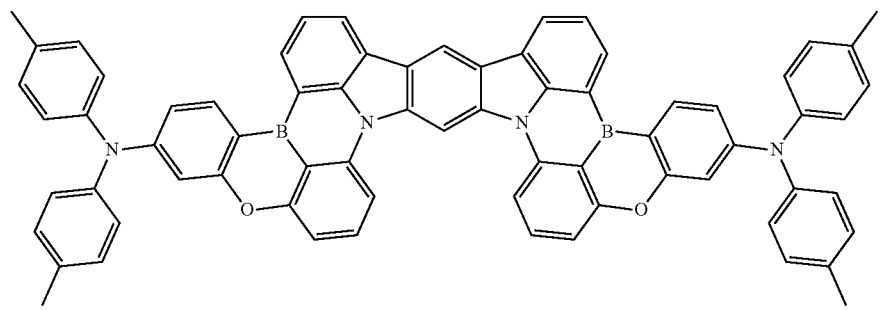
37
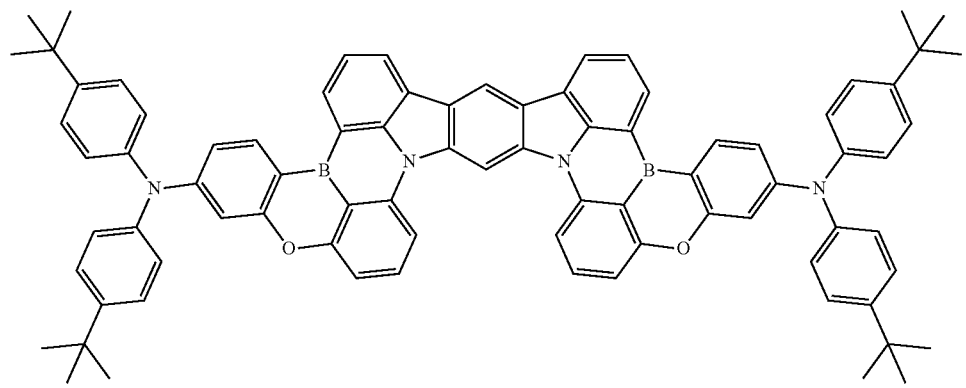
38
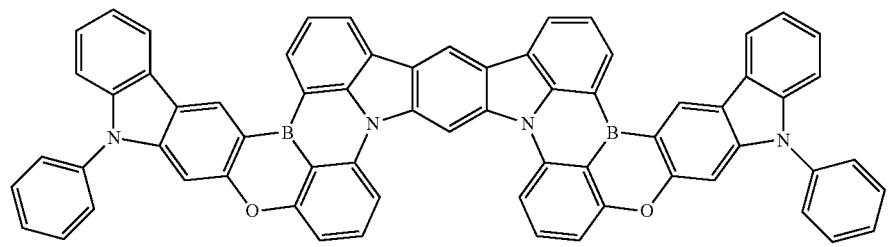

-continued
39
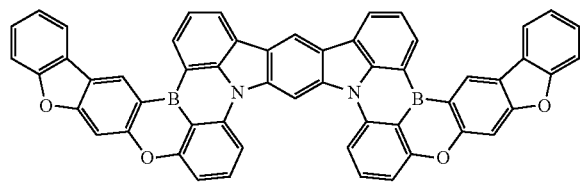
40
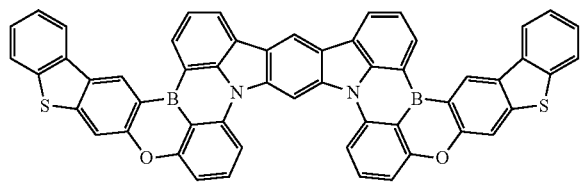
41
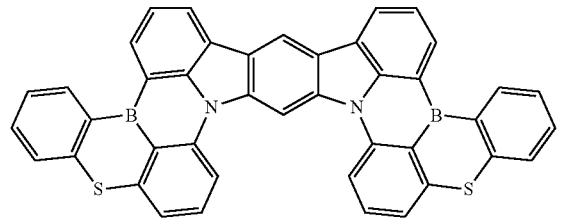
42
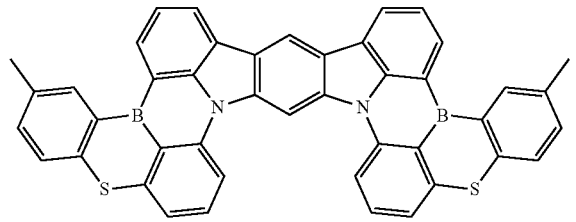
43
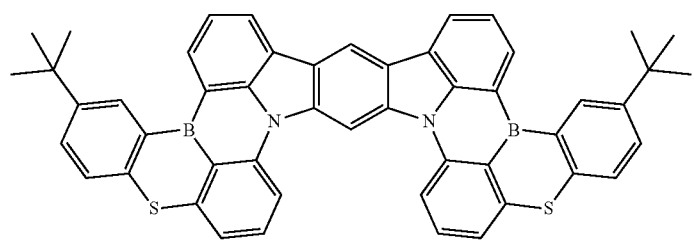
44
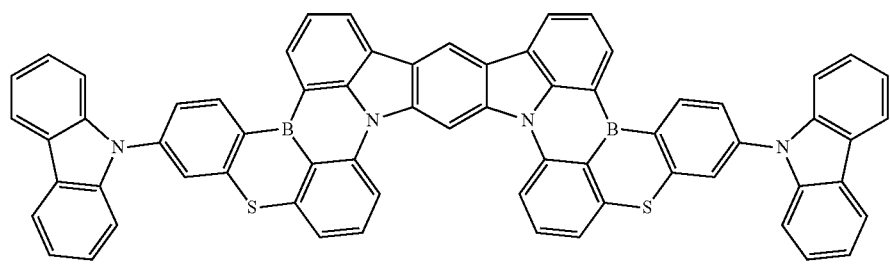
45
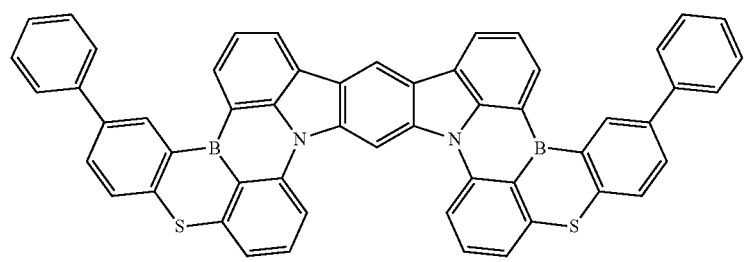
46
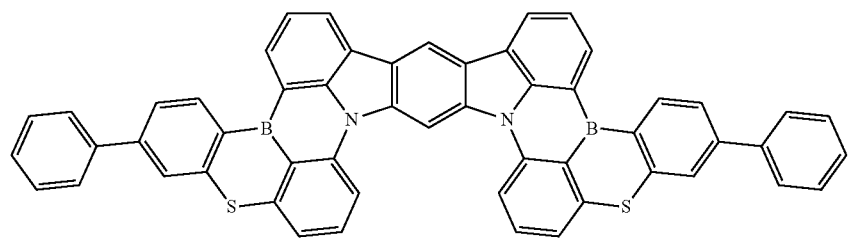

47
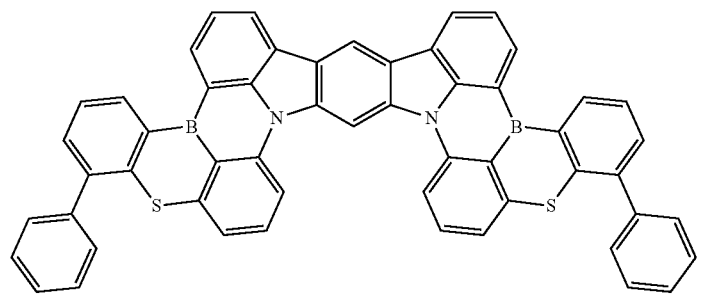
48
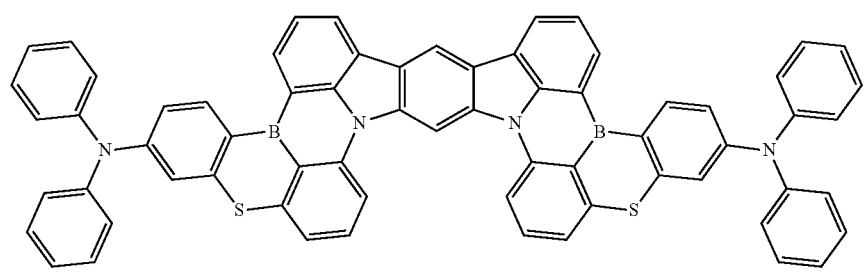
49
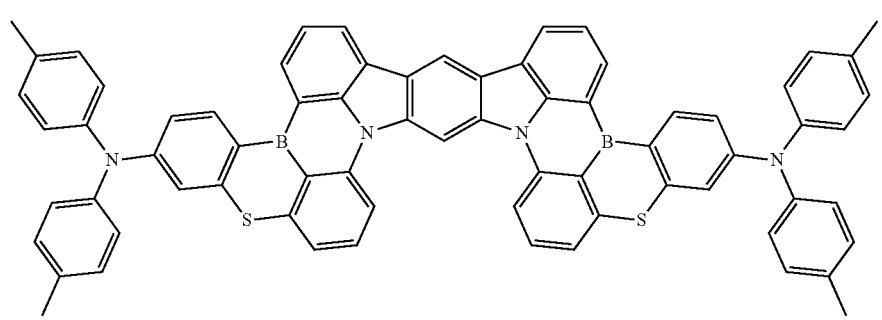
50
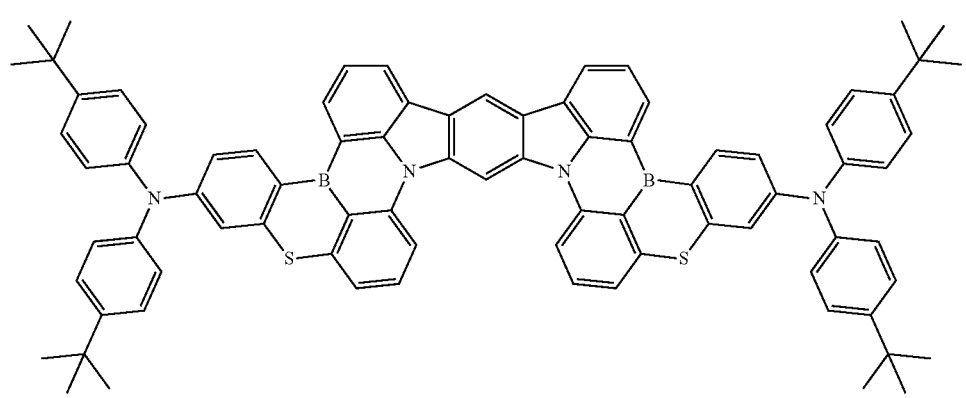
51
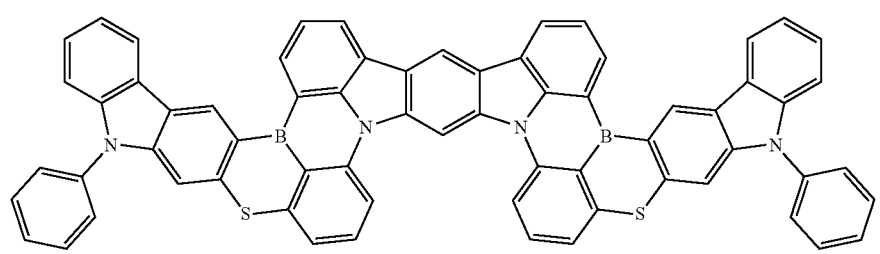

-continued
52
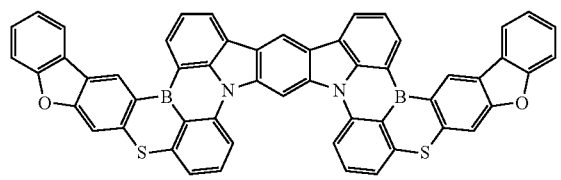
53
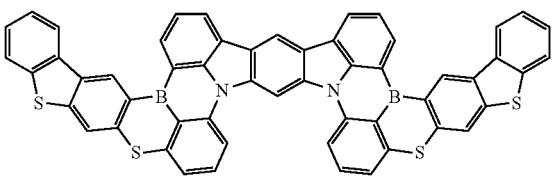
54
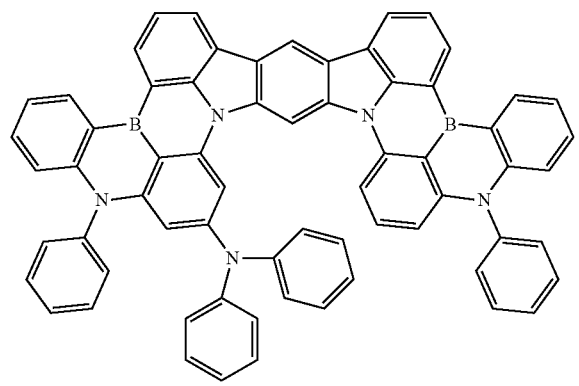
55
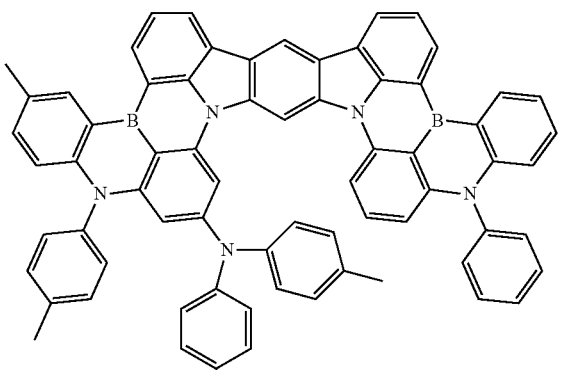
56
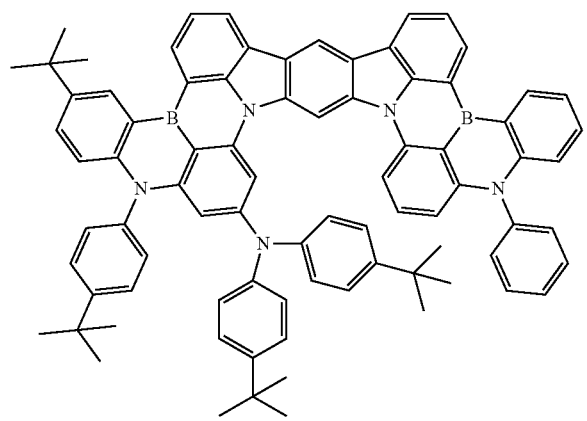
57
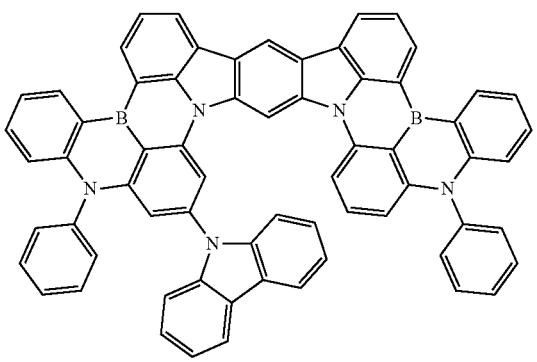
58
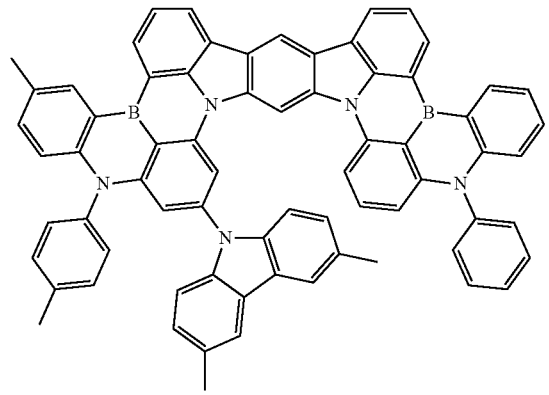
59
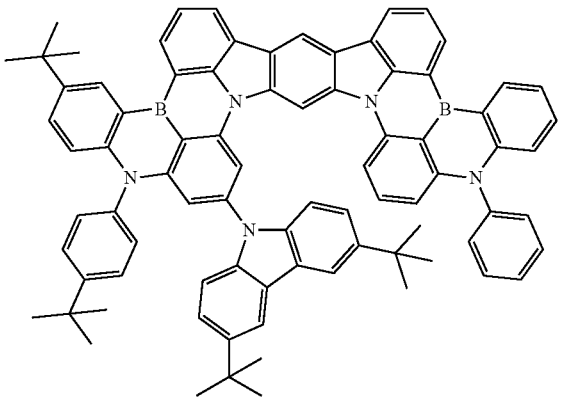

-continued
60
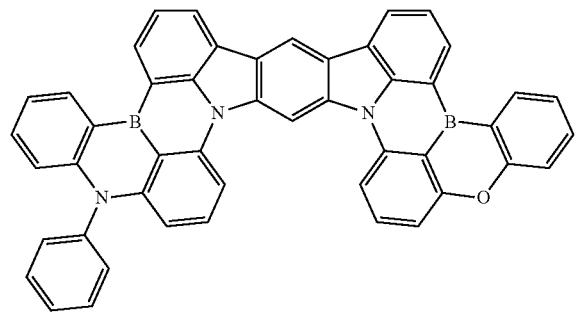
61
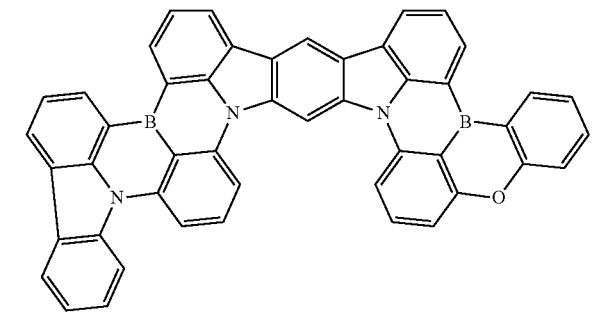
62
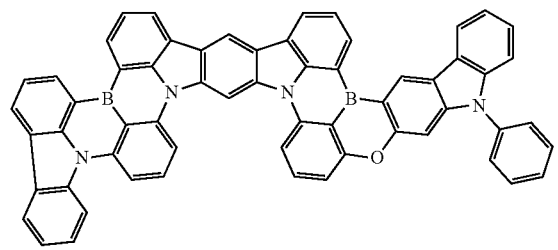
63
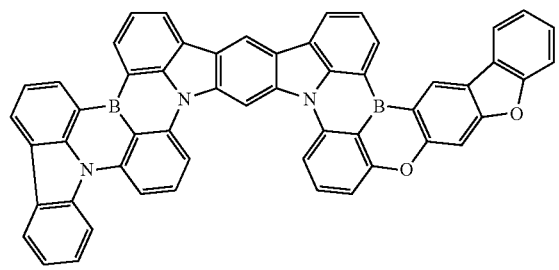
64
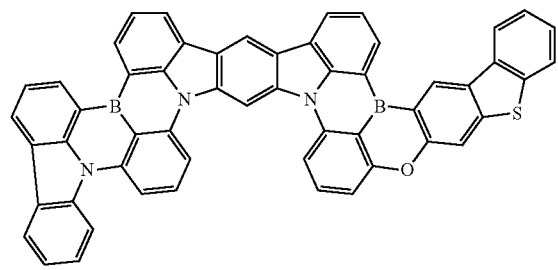
65
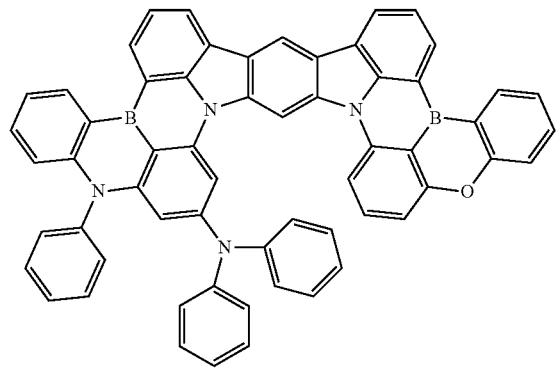
66
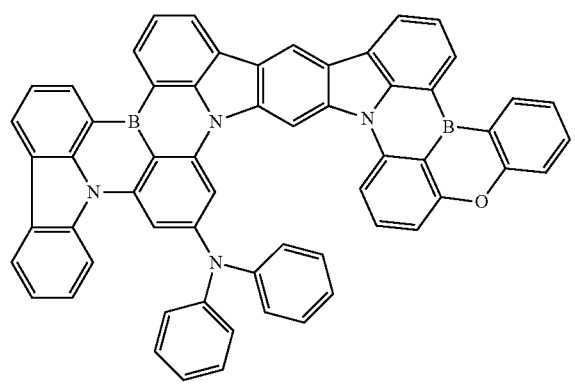
67
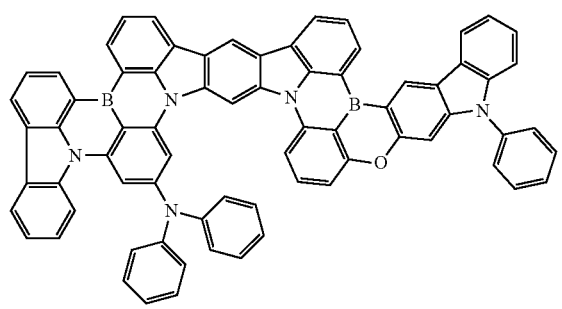

-continued
68
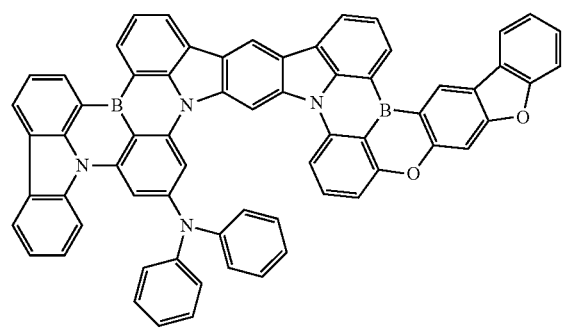
69
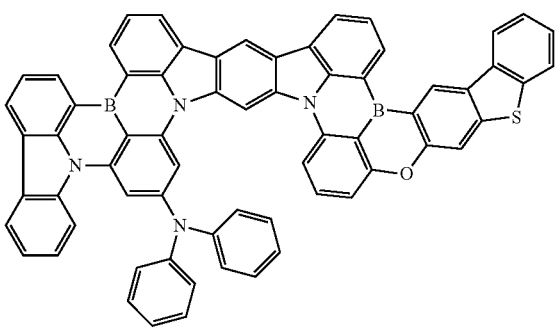
70
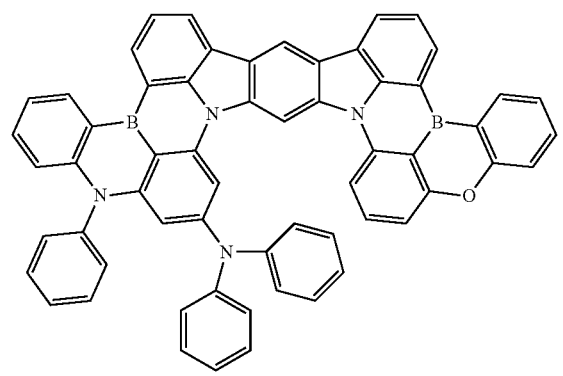
71
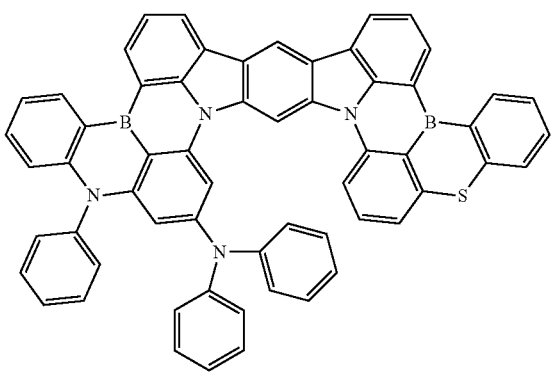
72
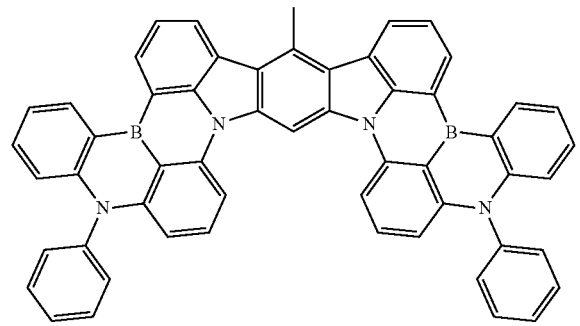
73
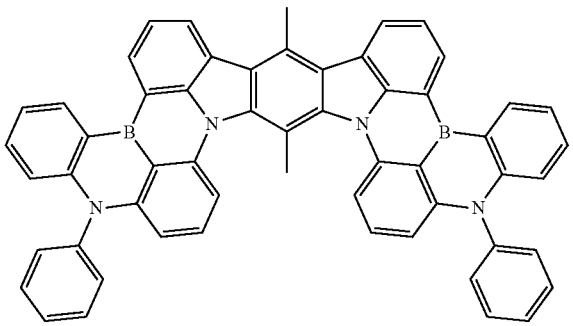
74
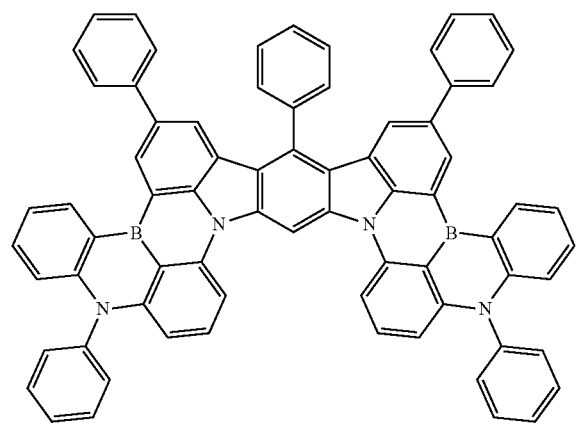
75
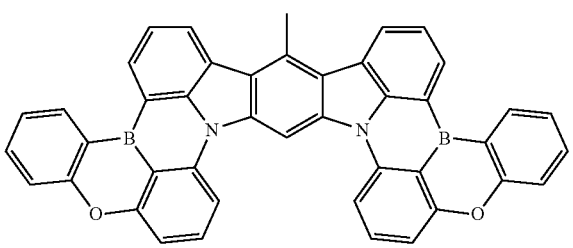

-continued
76
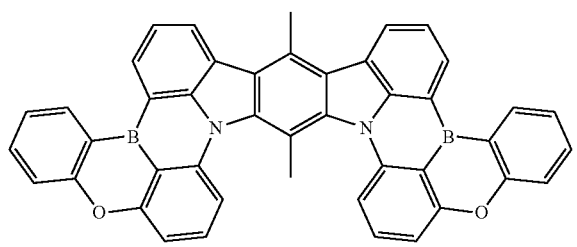
77
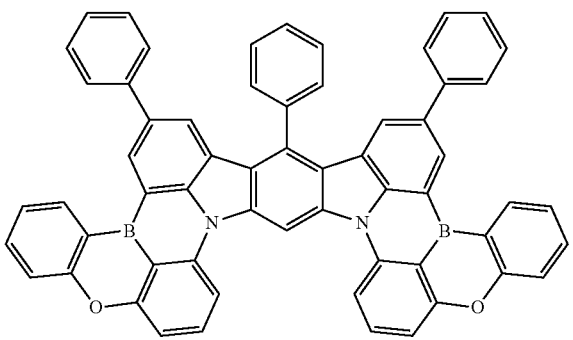
78
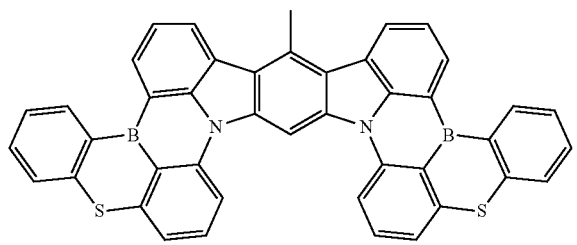
79
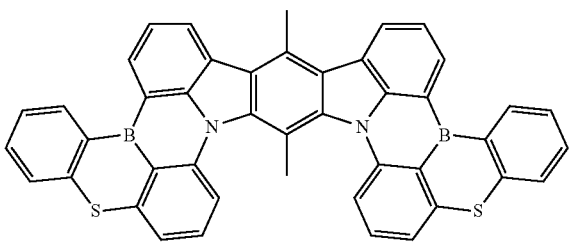
80
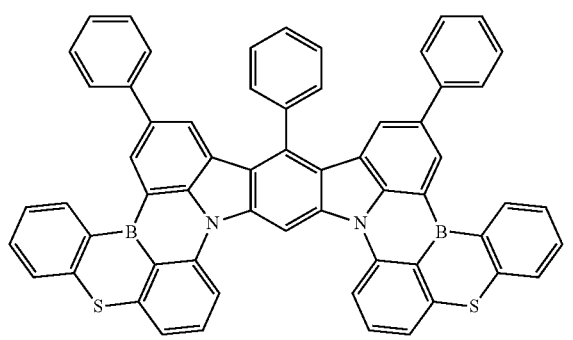
81
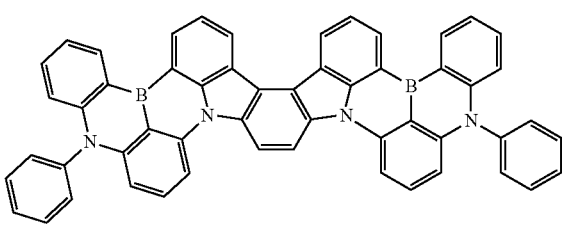
82
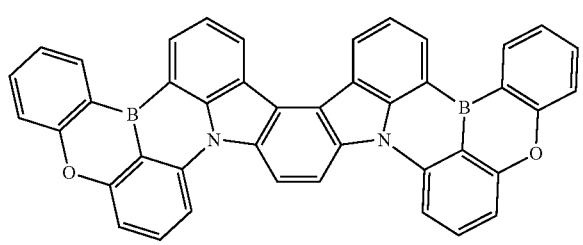
83
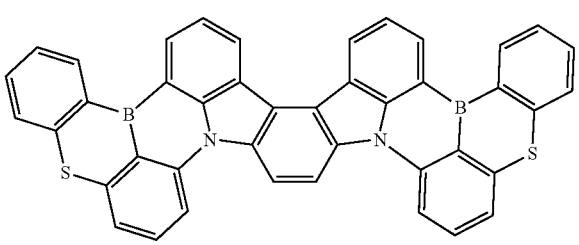
84
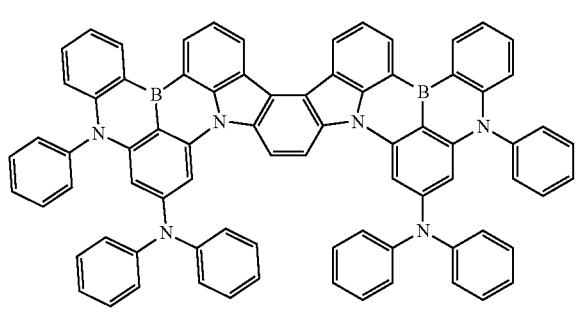
85
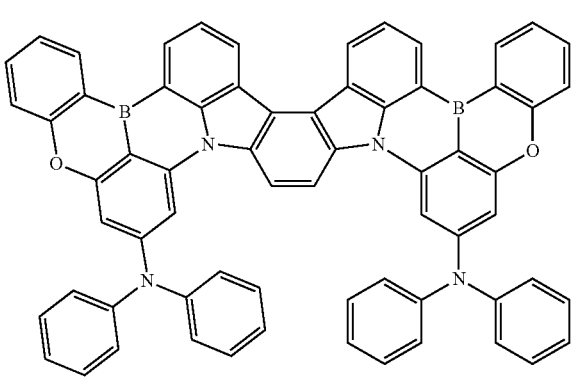

-continued
86
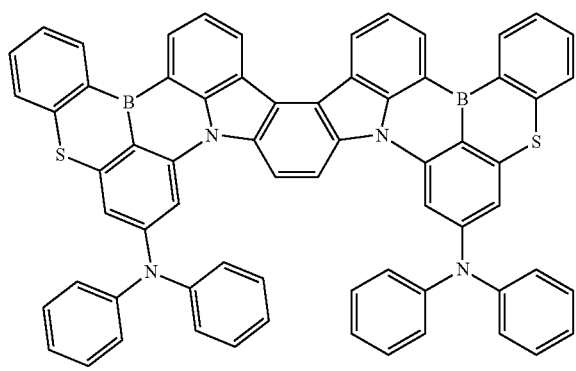
87
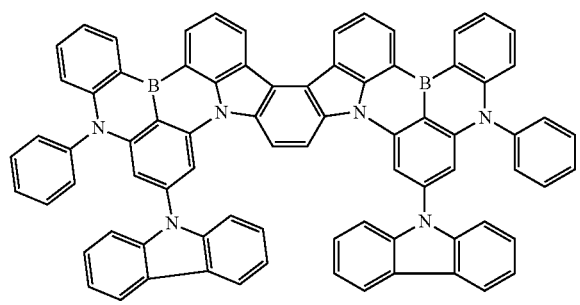
88
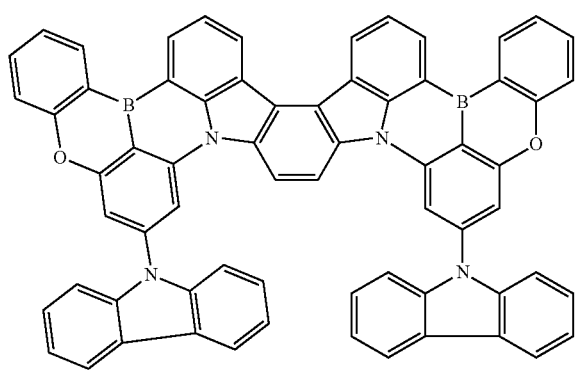
89
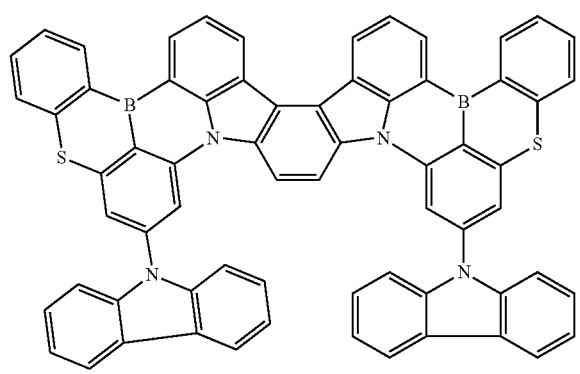
90
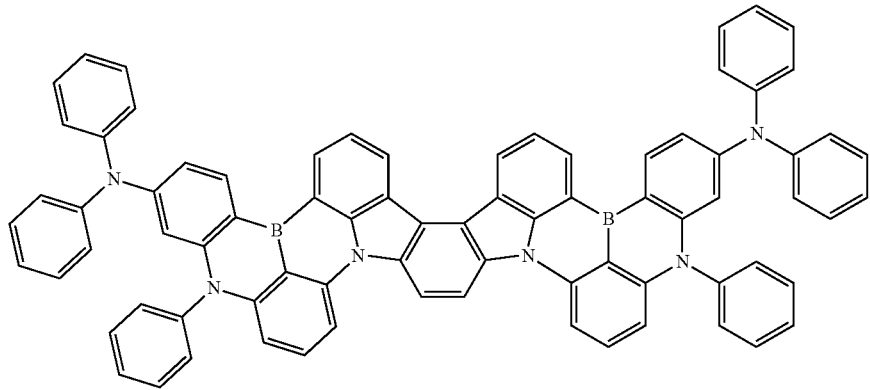
91
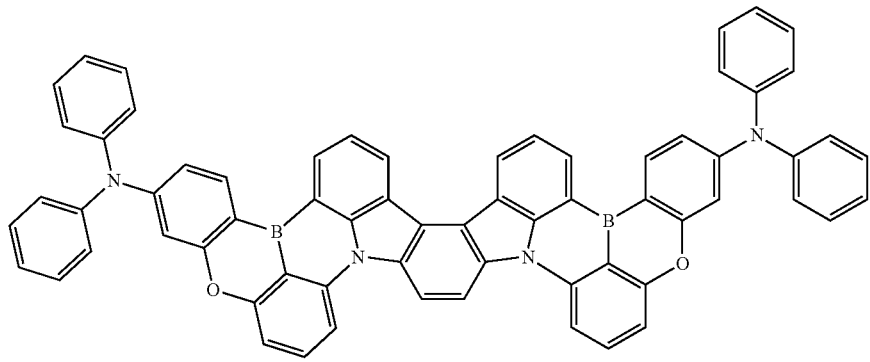

92
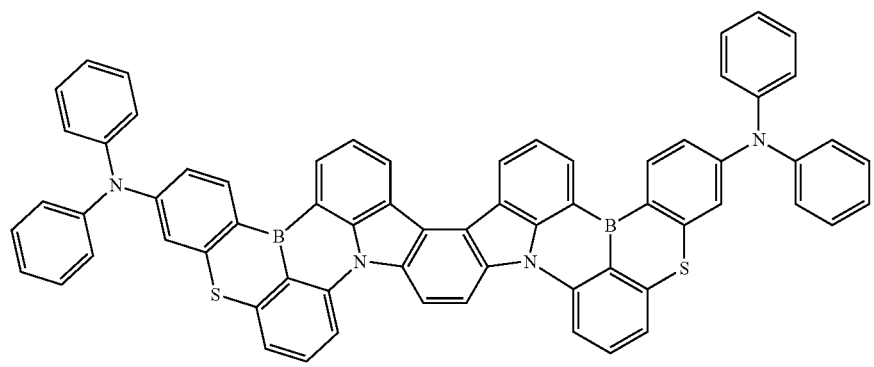
93
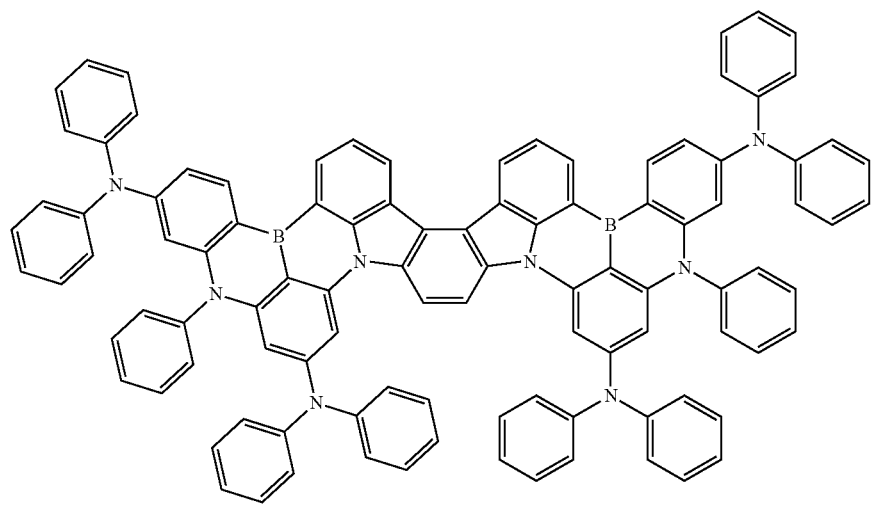
94
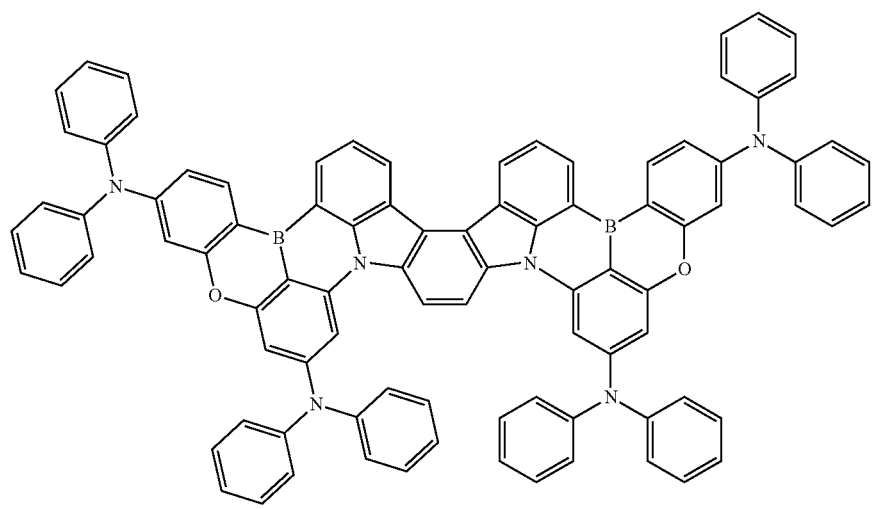

95
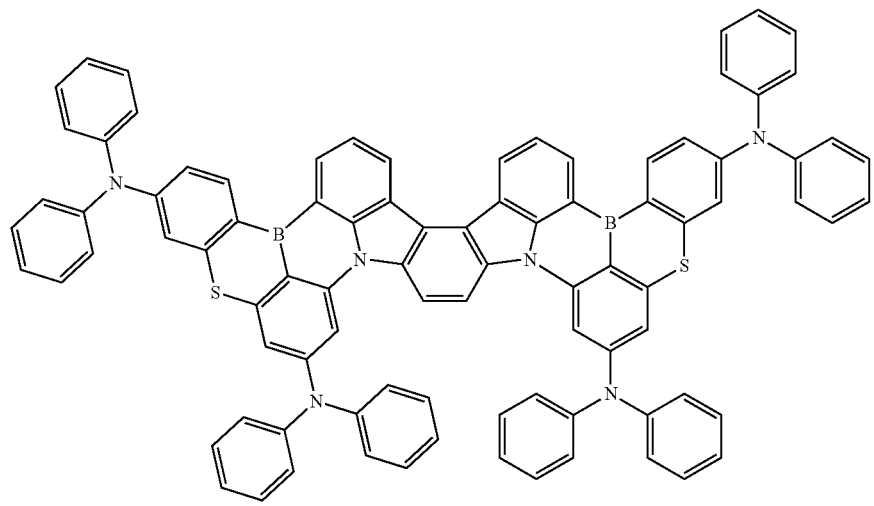
96
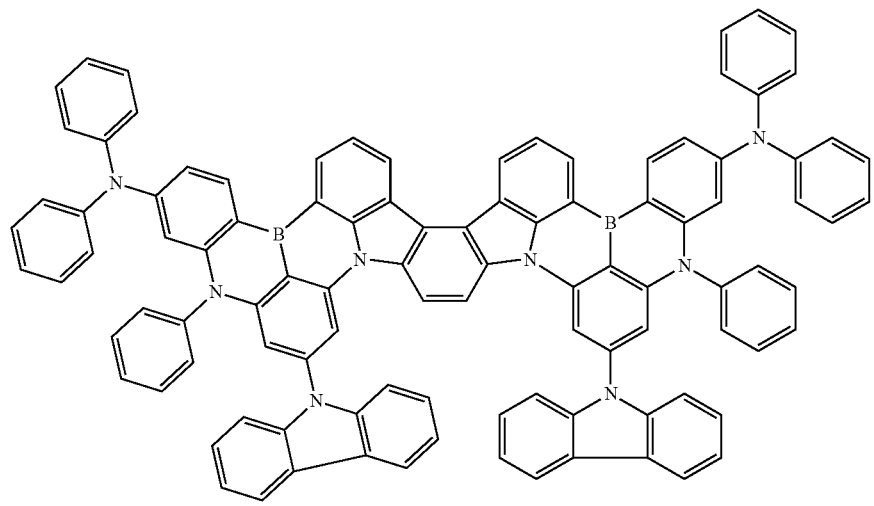
97
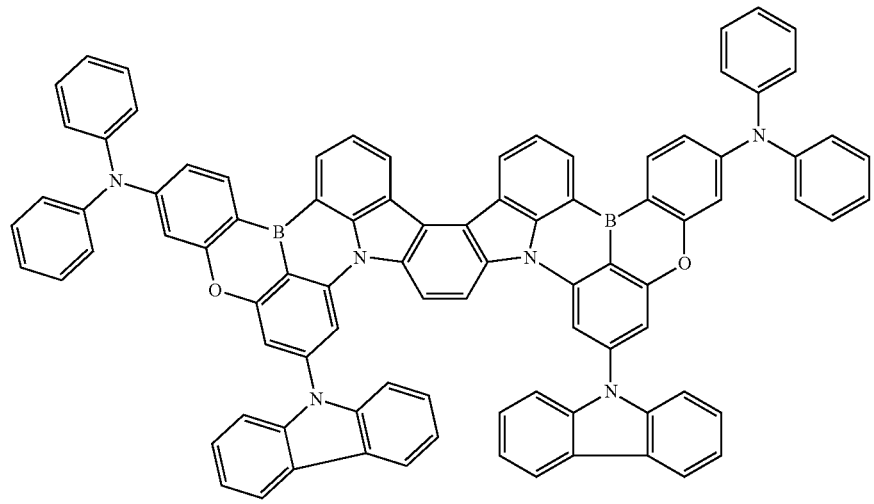

98
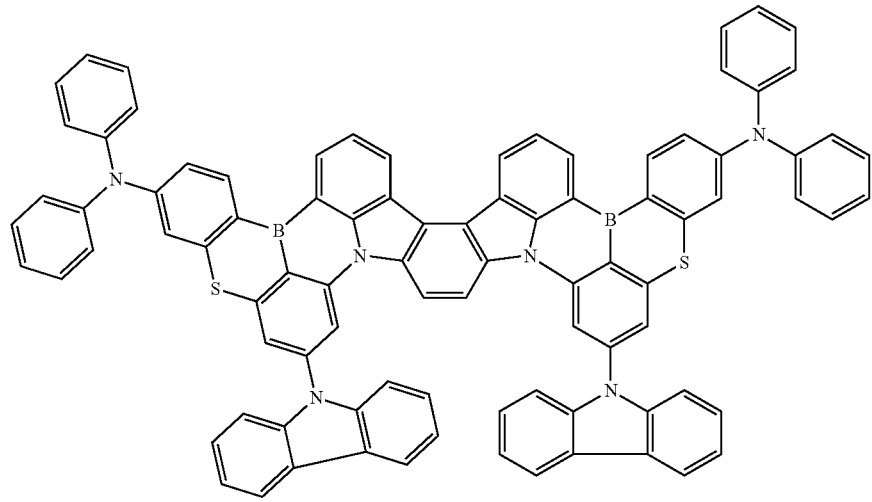
99
100
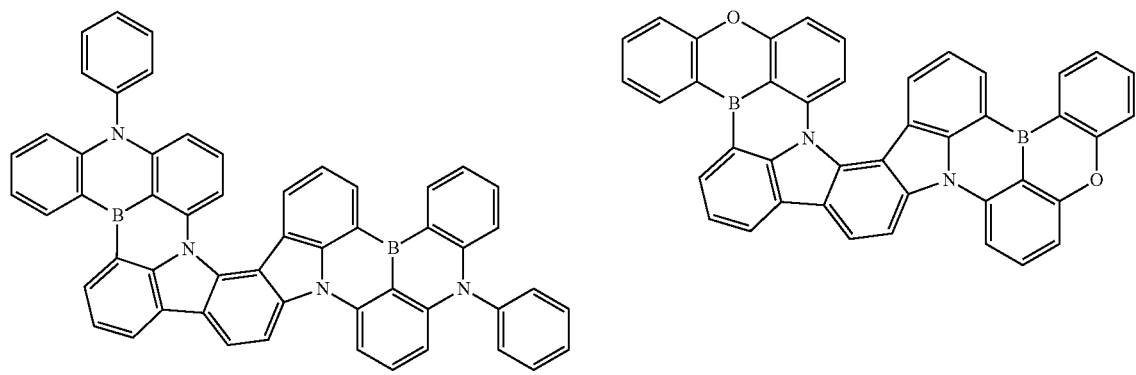
101
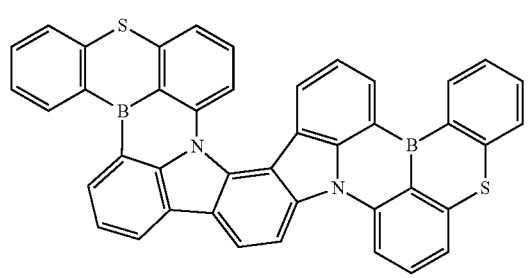
102
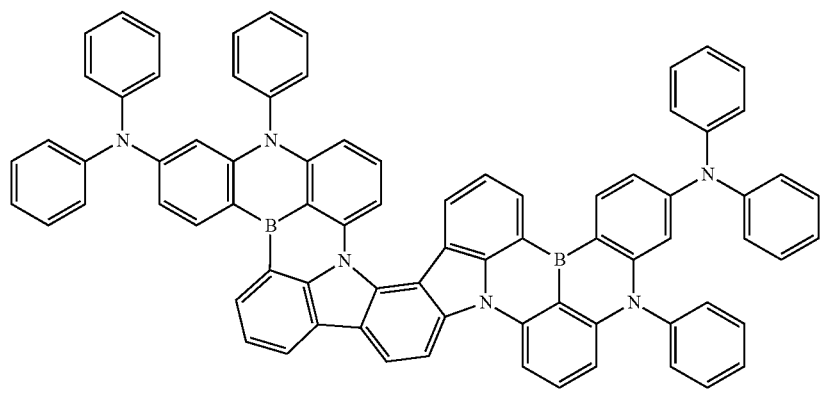

-continued
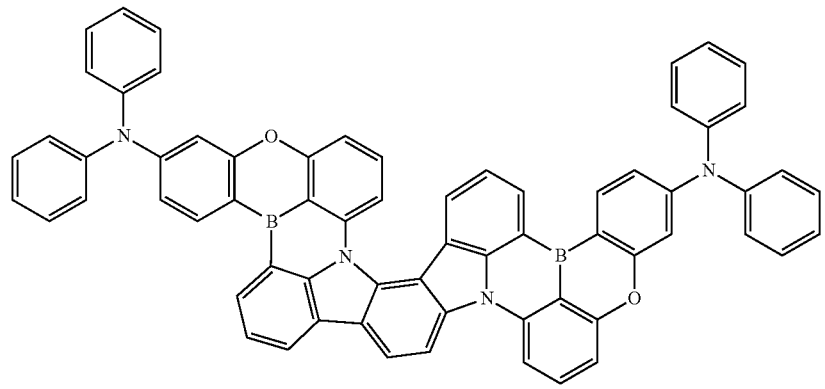
103
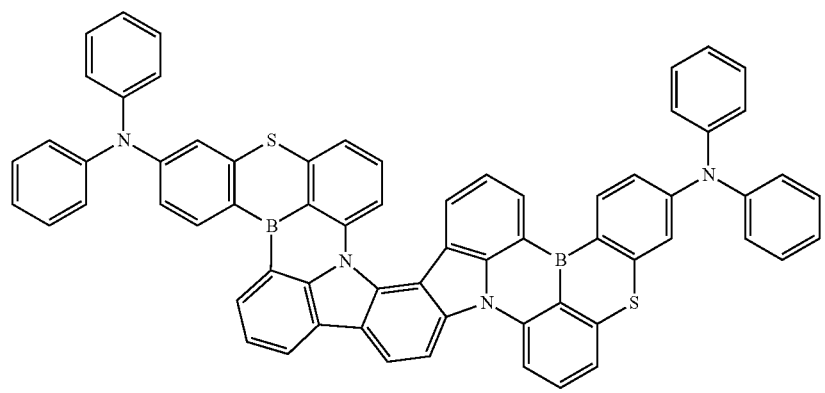
104
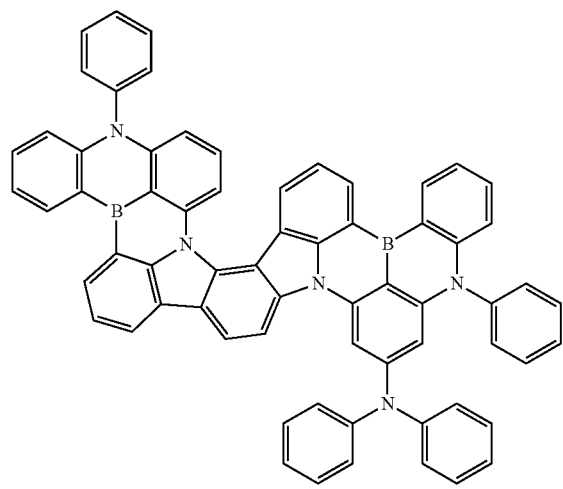
105
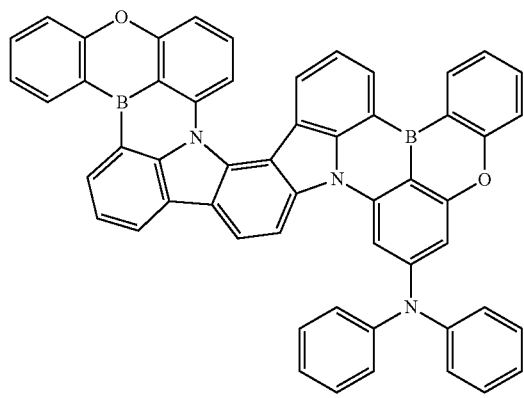
106

-continued
107
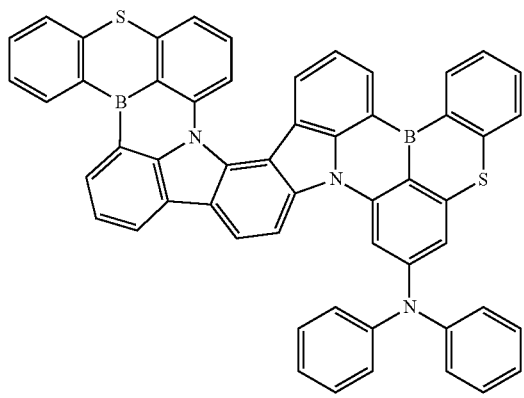
108
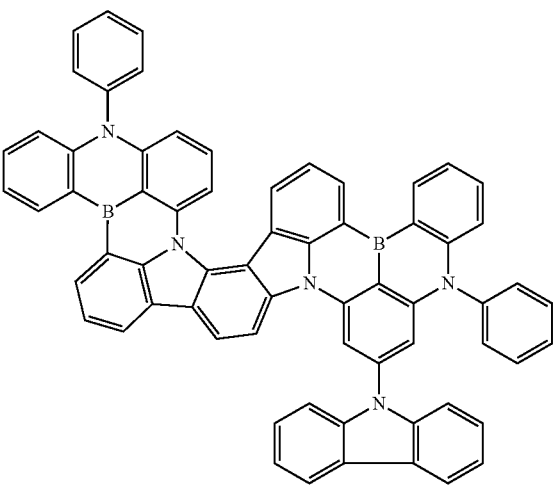
109
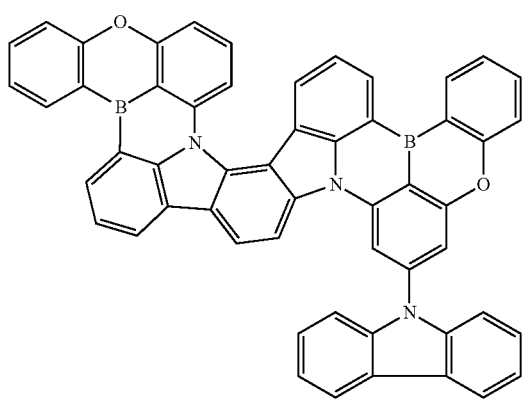
110
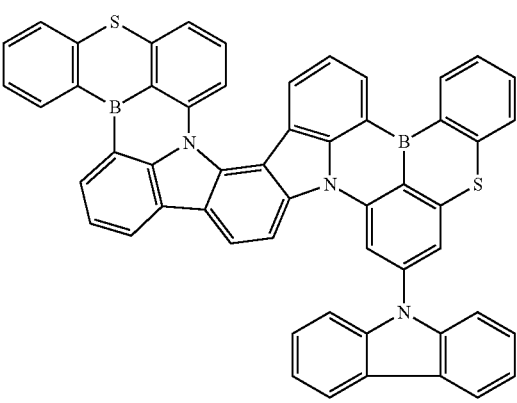
111
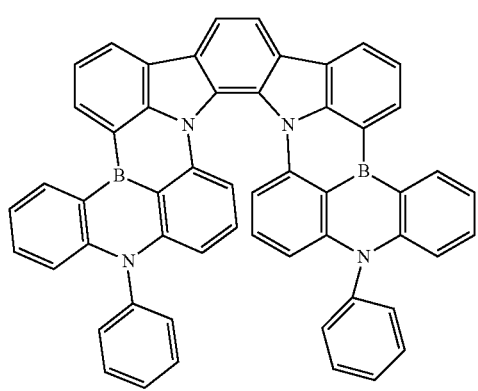
112
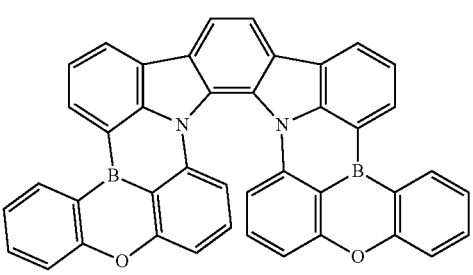
113
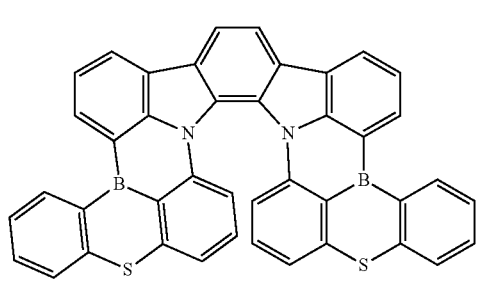
114
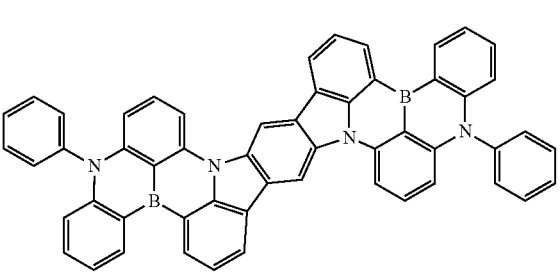

-continued
115
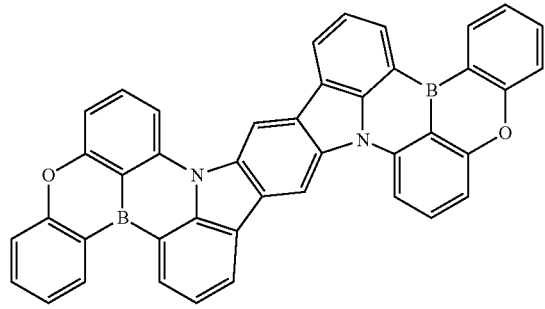
116
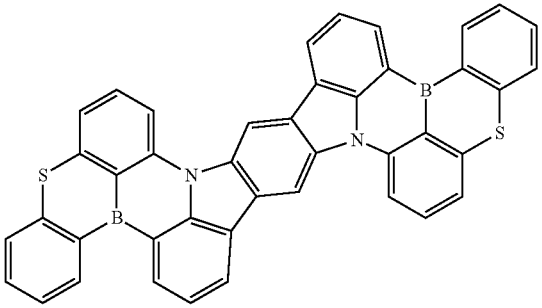
117
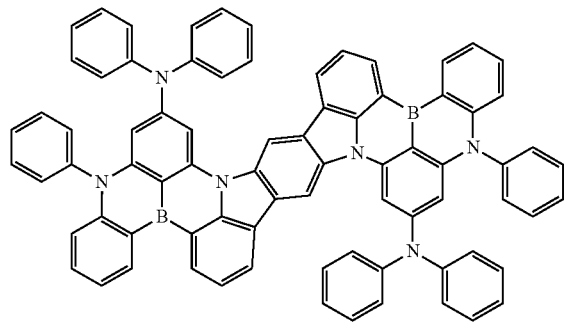
118
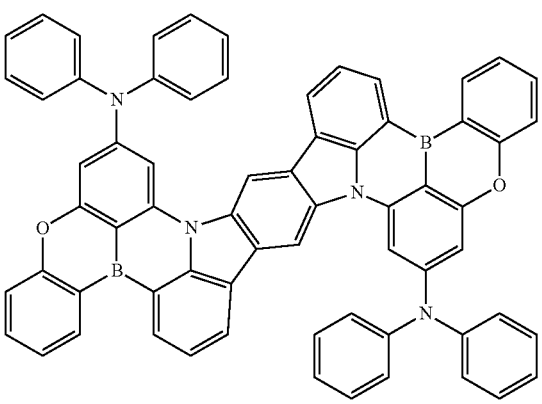
119
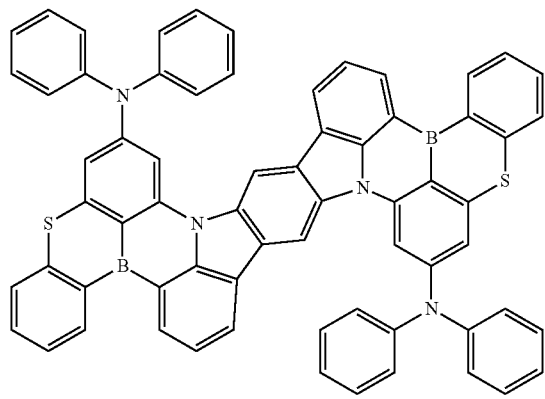
120
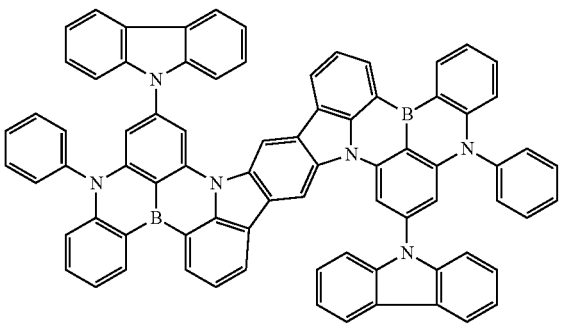
121
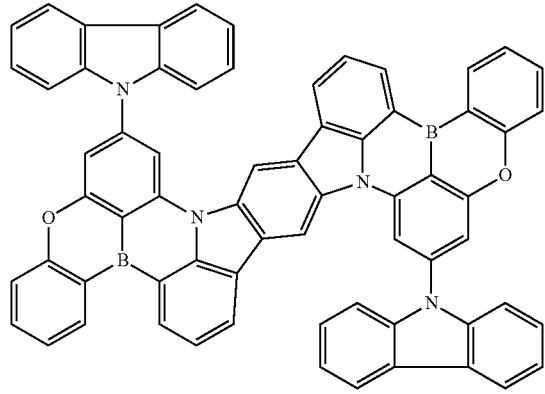
122
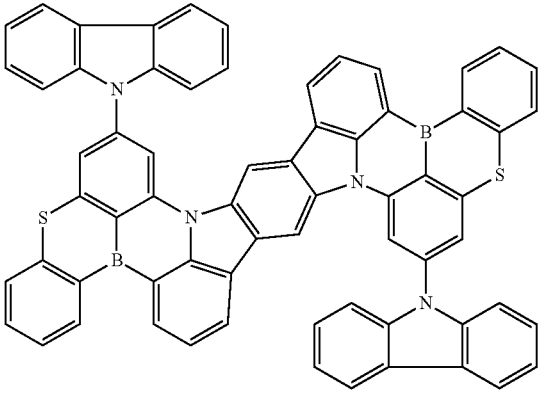

123
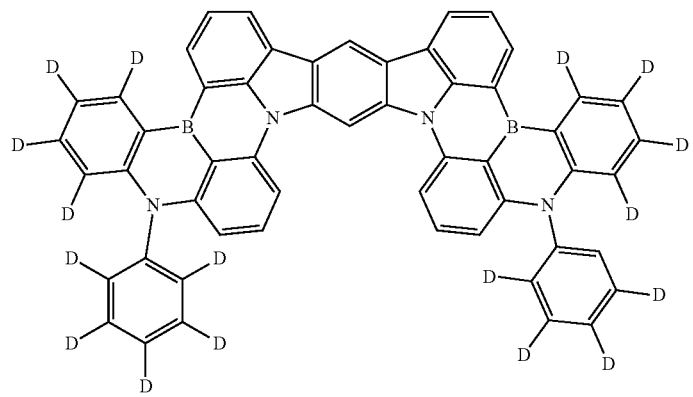
124
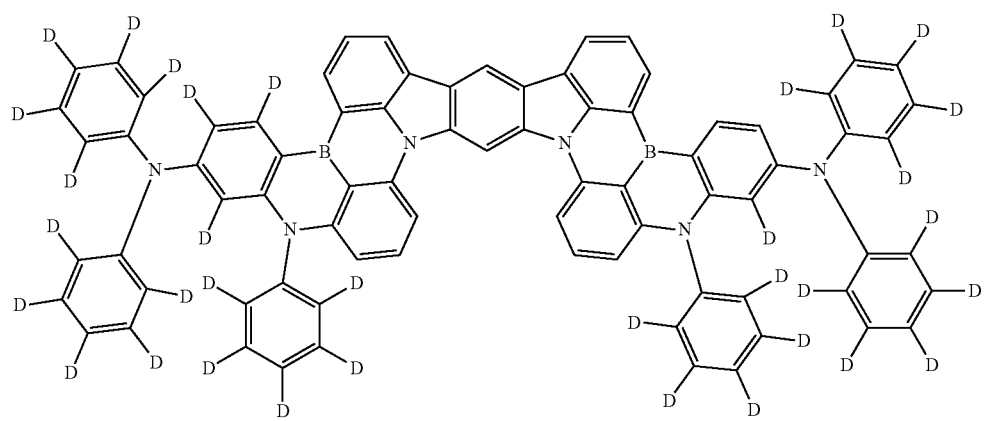
125
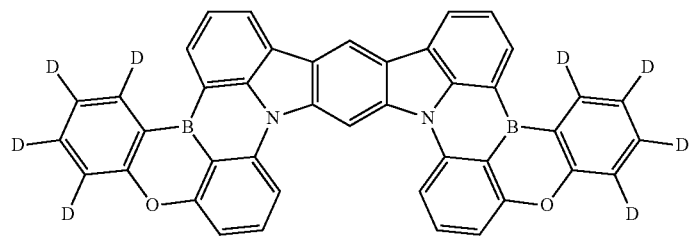
126
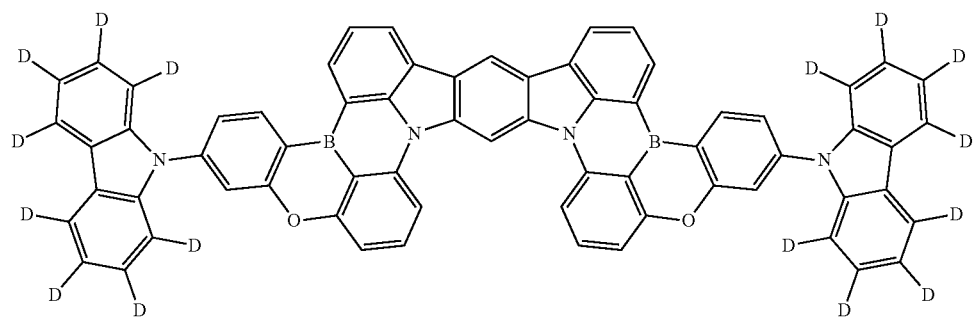

127
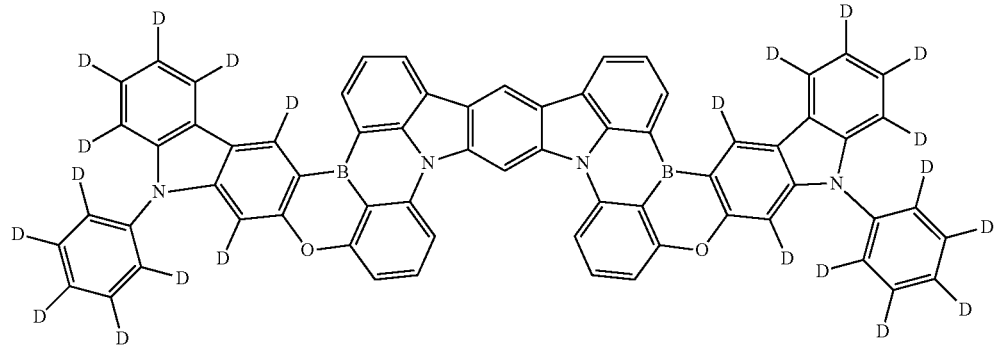
128
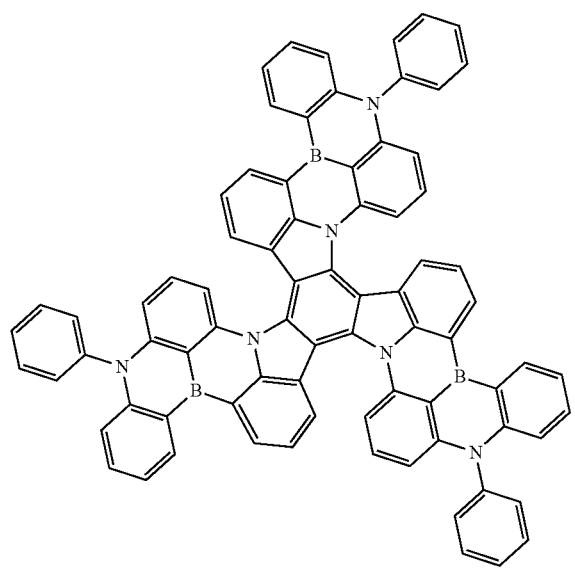
129
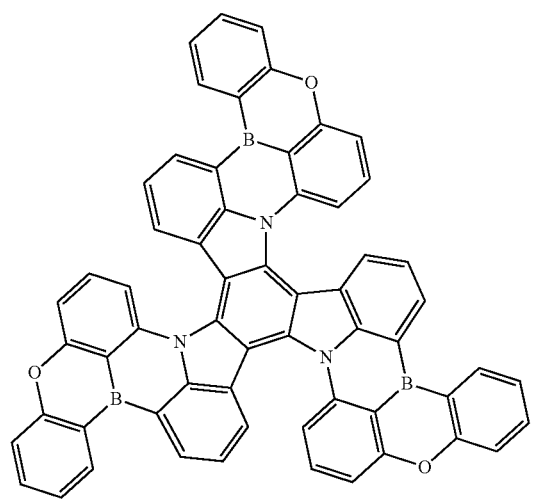
130
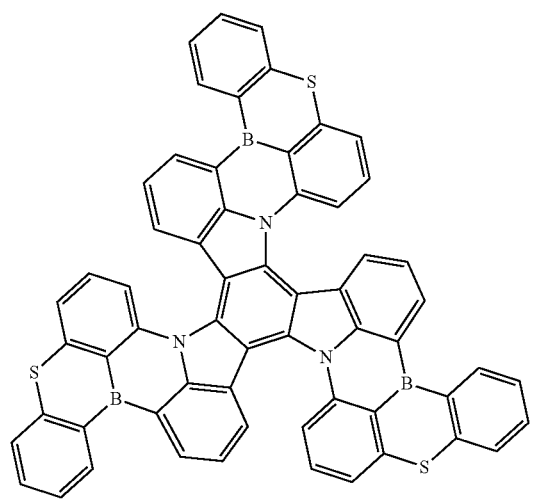
131
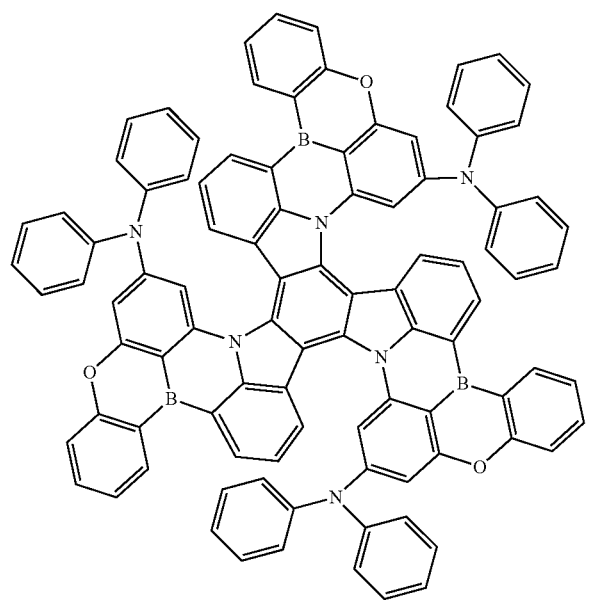

-continued
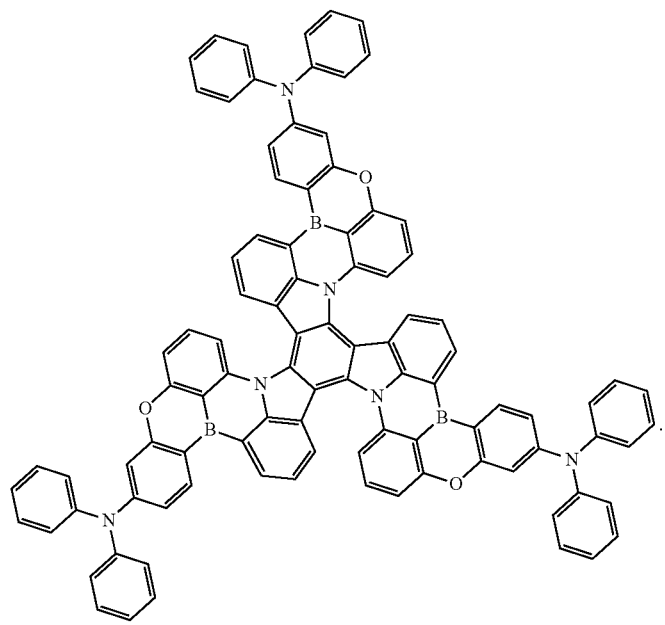
132
* * * * *

UNITED STATES PATENT AND TRADEMARK OFFICE
CERTIFICATE OF CORRECTION

PATENT NO.         : 11,581,493 B2                                          Page 1 of 2
APPLICATION NO.    : 16/998943
DATED              : February 14, 2023
INVENTOR(S)        : Hirokazu Kuwabara et al.

It is certified that error appears in the above-identified patent and that said Letters Patent is hereby corrected as shown below:

In the Claims

Column 150, Line 23, Claim 1, delete "Mg Cu," and insert -- Mg, Cu, --
Column 154, Line 20, Claim 8, delete "group." and insert -- group, --
Columns 157-158, Line 5, Claim 12, Compound 16 delete "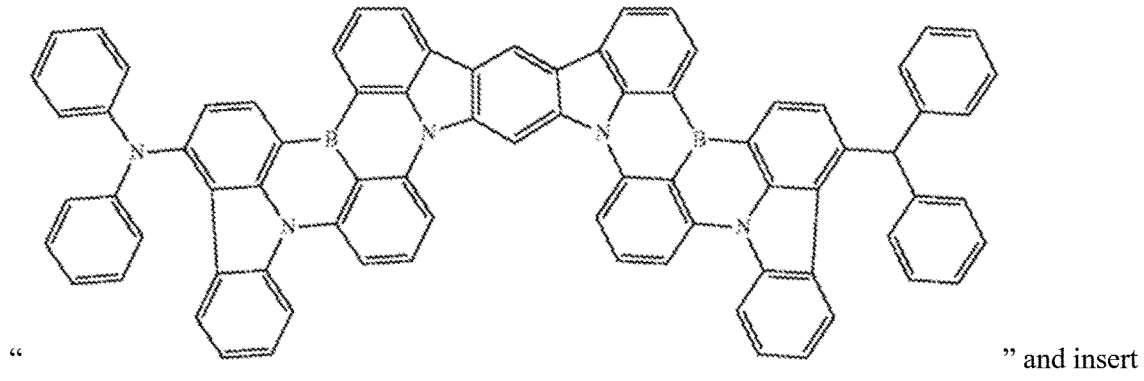" and insert

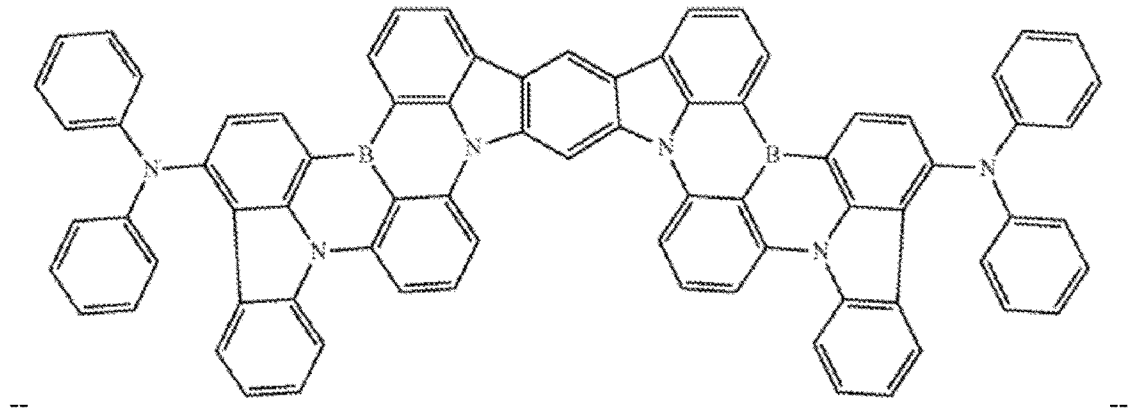

--
Column 197, Line 48, Claim 13, delete "W $W_1$ to $W_6$" and insert -- $W_1$ to $W_6$ --
Column 202, Line 1, Claim 19, delete "group." and insert -- group, --

Signed and Sealed this
Twenty-second Day of August, 2023

Katherine Kelly Vidal
*Director of the United States Patent and Trademark Office*

CERTIFICATE OF CORRECTION (continued)
U.S. Pat. No. 11,581,493 B2

Page 2 of 2

Columns 205-206, Line 3, Claim 20, Compound 16 delete

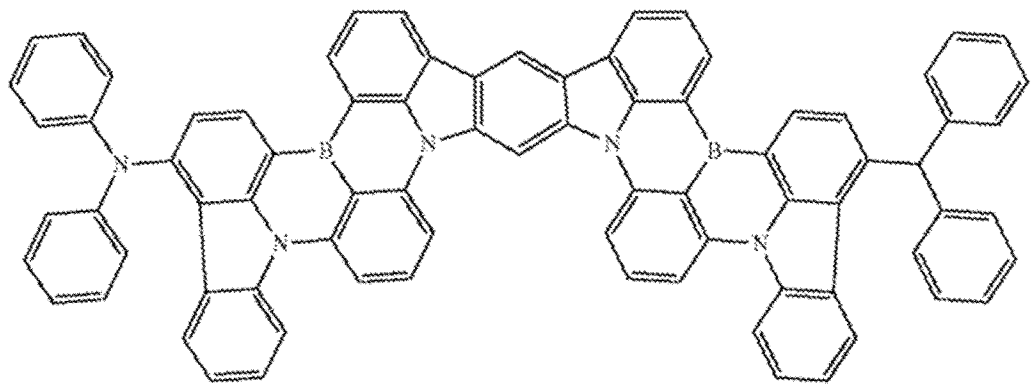

" and insert

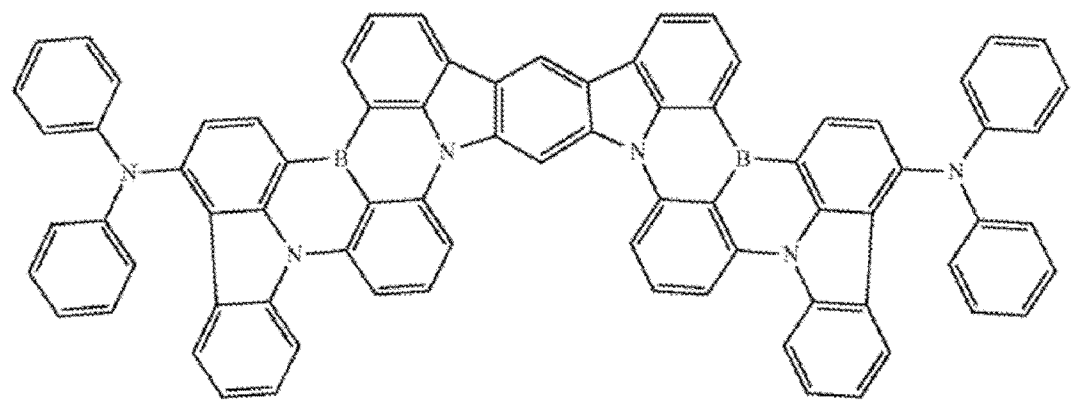

--